US008152863B2

(12) United States Patent
Taguchi et al.

(10) Patent No.: US 8,152,863 B2
(45) Date of Patent: Apr. 10, 2012

(54) PIGMENT DISPERSION COMPOSITION, RED COLORED COMPOSITION, COLORED CURABLE COMPOSITION, COLOR FILTER FOR A SOLID STATE IMAGING DEVICE AND METHOD FOR PRODUCING THE SAME, AND SOLID STATE IMAGING DEVICE

(75) Inventors: Hiroshi Taguchi, Haibara-gun (JP); Hideki Takakuwa, Haibara-gun (JP); Kazuya Oota, Haibara-gun (JP); Kaoru Aoyagi, Haibara-gun (JP); Toshihito Kuge, Haibara-gun (JP); Masahiro Higashi, Haibara-gun (JP); Nobuo Seto, Haibara-gun (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 13/118,655

(22) Filed: May 31, 2011

(65) Prior Publication Data

US 2011/0294050 A1 Dec. 1, 2011

(30) Foreign Application Priority Data

Jun. 1, 2010 (JP) ................................ 2010-126039

(51) Int. Cl.
*A61Q 5/10* (2006.01)

(52) U.S. Cl. ........... 8/637.1; 8/638; 8/639; 8/643; 8/658

(58) Field of Classification Search .................. 8/637.1, 8/638, 639, 643, 658
See application file for complete search history.

(56) References Cited

FOREIGN PATENT DOCUMENTS

| | | | |
|---|---|---|---|
| JP | 1-152449 | A | 6/1989 |
| JP | 5-005067 | A | 1/1993 |
| JP | 6-075375 | A | 3/1994 |
| WO | 2005/052074 | A1 | 6/2005 |

OTHER PUBLICATIONS

STIC Search Report dated Oct. 25, 2011.*

* cited by examiner

*Primary Examiner* — Eisa Elhilo
(74) *Attorney, Agent, or Firm* — Sughrue Mion, PLLC

(57) ABSTRACT

Provided is a pigment dispersion composition suitable for a colored curable composition which enables retaining adhesion capability of a colored pattern and inhibiting the generation of residues, even when a relatively severe development condition is employed. Furthermore, a red colored composition capable of forming a red colored thin film with excellent spectral characteristics. The pigment composition contains an azo pigment represented by the following Formula (1); at least one of acidic functional group-containing organic pigment derivative, anthraquinone derivative, and triazine derivative; and a dispersant. The red colored composition contains a red pigment; a yellow pigment; and a dispersant, in which specific spectral characteristics are satisfied when a colored transmitting film having a thickness of 0.6 μm is formed using the red colored composition.

(1)

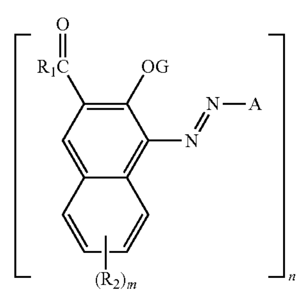

24 Claims, No Drawings

PIGMENT DISPERSION COMPOSITION, RED COLORED COMPOSITION, COLORED CURABLE COMPOSITION, COLOR FILTER FOR A SOLID STATE IMAGING DEVICE AND METHOD FOR PRODUCING THE SAME, AND SOLID STATE IMAGING DEVICE

CROSS REFERENCE TO RELATED APPLICATION

This application claims priority under 35 USC 119 from Japanese Patent Application Nos. 2010-126039 filed on Jun. 1, 2010, and 2010-189694 filed on Aug. 26, 2010, the disclosures of which are incorporated by reference herein.

BACKGROUND OF THE INVENTION

1. Field of the Invention

The present invention relates to a pigment dispersion composition, a red colored composition, a colored curable composition, a color filter for a solid state imaging device and a method for producing the same, and a solid state imaging device.

2. Description of the Related Art

As color filters used for the purpose of coloration of a solid state imaging device or a liquid crystal display device, a color filter having a red filter layer, a green filter layer and a blue filter layer, and a color filter having a yellow filter layer, a magenta filter layer and a cyan filter layer, wherein the filter layers are disposed on the same plane of a substrate and adjacent to each other, are known (in the present specification, the color filter layer of each color is also referred to as a "colored pattern").

Recently, higher microfining is desired for color filters.

However, conventional pigment dispersion system has problems of unimproved resolution, non-uniformity of color caused due to coarse particles of a pigment, and the like. Hence, the conventional pigment dispersion system is not suitable for applications like solid state imaging device, which requires a microfine pattern. To solve this problem, use of dyes has been conventionally proposed (e.g., see Japanese Patent Application Laid-Open (JP-A) No. 6-75375).

For example, it has been known to use a red dye in a red color filter array of a color filter (e.g., see JP-A No. 5-5067).

However, since the heat resistance and light resistance of a colored pattern obtained by using dyes are insufficient, use of organic pigments having excellent heat resistance and light resistance in color filters has been studied.

As a method of manufacturing a color filter using an organic pigment, there are a photolithography method in which a patterning process (including exposing and developing a composition containing an organic pigment dispersed in a photosensitive resin) is repeated a certain number of times (e.g., see, JP-A No. 1-152449), and a printing method such as offset printing or ink jet printing in which an ink containing an organic pigment is used, for example.

As an organic pigment for use in a color filter, use of an organic pigment having excellent heat resistance and light resistance, such as an anthraquinone pigment, a diketopyrrolopyrrole pigment, a quinacridone pigment, an isoindoline pigment, a perinone pigment, a perylene pigment, or a fused azo pigment, has been studied.

In International Publication No. 05/052074, a red ink composition for use in a color filter, that contains a monoazo compound having a naphthalene ring, is disclosed. Studies have been carried out to obtain a color filter having favorable spectral characteristic by using such various pigments.

Meanwhile, further microfining has been tried for the recent color filters compared to conventional ones. As the colored pattern formed by the process of manufacturing a microfine color filter is small, residues are easily generated. The residues tend to impart an adverse effect on the performance of a color filter, which is problematic.

Further, in recent days, according to miniaturization of a solid state imaging device, microfining of pigments, thinning of a colored pattern, and noise reduction in spectrophotometric spectrum are required for a color filter.

To deal with the problems, use of dyes has been suggested (e.g., see JP-A No. 6-75375). In addition, it has been known to use a red dye in a red color filter array of a color filter (e.g., see JP-A No. 5-5067).

However, since the heat resistance and light resistance of a colored pattern obtained by using dyes are insufficient, a color filter using an organic pigment having excellent heat resistance and light resistance has been studied.

As an organic pigment for use in a color filter, use of an organic pigment having excellent heat resistance and light resistance, such as an anthraquinone pigment, a diketopyrrolopyrrole pigment, a quinacridone pigment, an isoindoline pigment, a perinone pigment, a perylene pigment, or a fused azo pigment, has been studied.

In International Publication No. 05/052074, a red ink composition for use in a color filter, that contains a monoazo compound having a naphthalene ring, is disclosed.

However, there is no pigment dispersion containing a conventional red pigment such as an anthraquinone pigment or a diketopyrrolopyrrole pigment, that satisfies all of microfining of pigments, thinning of a colored pattern, and spectrophotometric spectrum.

As a method of manufacturing a color filter using an organic pigment, there are a photolithography method in which a patterning process (including exposing and developing a composition containing an organic pigment dispersed in a photosensitive resin) is repeated a certain number of times (e.g., see, JP-A No. 1-152449) and a printing method such as offset printing or ink jet printing in which an ink containing an organic pigment is used, for example.

SUMMARY OF THE INVENTION

In this regard, as a way of further reducing the residue during formation of a colored pattern, a development process performed under a relatively more strict condition (e.g., use of a developing solution having a high alkali concentration, extension of development time, or repetition of development process for several times) is often employed to reduce the residue. However, when such a severe condition is employed in a development process, there is a problem that the obtained colored pattern is easily peeled from a substrate, and therefore the yield is decreased.

Further, it is required for the red composition used for a color filter of a solid state imaging device or the like that pigments are fine and it is capable of forming a thin colored film showing spectral characteristics with reducible noise.

However, according to the study of the inventors of the present invention, especially when an azo pigment is used as red pigment, the spectrophotometric spectrum is changed by microfining and the dispersion stability of pigments in a red composition is impaired in particular, thus it is evident that thinning of a colored film that is formed with a curable composition using the red composition is difficult to obtain.

The present invention is made in view of the above circumstances, and is to approaches the objects as follows.

Specifically, an object of a first aspect of the invention is to provide a pigment dispersion composition suitable for a colored curable composition which enables both retaining adhesion capability of a colored pattern to a support and inhibiting the generation of residues, even when a relatively severe development condition is employed for forming a colored pattern on a support, and to provide a colored curable composition containing the pigment dispersion composition.

Another object of the first aspect of the invention is to provide a color filter for a solid state imaging device which has colored pattern with little peeling defect and little residue defect, and to provide a solid state imaging device having the color filter.

An object of a second aspect of the invention is to provide a red colored composition capable of forming a red colored thin film with excellent spectral characteristics.

Another object of the second aspect of the invention is to provide a colored curable composition which is useful for forming a fine red colored pattern with excellent spectral characteristics and has inhibited generation of development residue.

Still another object of the second aspect of the invention is to provide a color filter for a solid state imaging device having fine red colored pattern with excellent spectral characteristics and a method for producing the same, and a solid state imaging device having the color filter.

Hereinbelow, exemplary embodiments of the first aspect of the invention are described.

<1> A pigment dispersion composition, including:

an azo pigment represented by the following Formula (1);

at least one compound selected from the group consisting of an organic pigment derivative having an acidic functional group, an anthraquinone derivative having an acidic functional group, and a triazine derivative having an acidic functional group; and a dispersant:

(1)

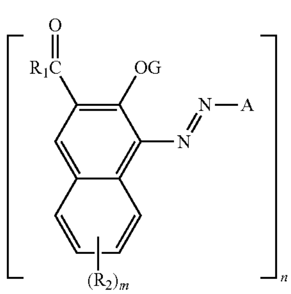

wherein, in Formula (1), G represents a hydrogen atom, an aliphatic group, an aryl group, or a heterocyclic group; $R_1$ represents an amino group, an aliphatic oxy group, an aliphatic group, or a heterocyclic group; $R_2$ represents a substituent;

A represents any one of groups represented by the following Formula (A-1) to (A-32);

m represents an integer of 0 to 5;

when m represents an integer of 2 to 5, plural $R_2$'s may be the same as or different from each other;

n represents an integer of 1 to 4;

when n represents 2, the azo pigment is a dimer in which two moieties each independently represented by Formula (1) are linked via $R_1$, $R_2$, A, or G;

when n represents 3, the azo pigment is a trimer in which three moieties each independently represented by Formula (1) are linked via $R_1$, $R_2$, A, or G;

when n represents 4, the azo pigment is a tetramer in which four moieties each independently represented by Formula (1) are linked via $R_1$, $R_2$, A, or G; and Formula (1) is free from an ionic hydrophilic group:

(A-1)

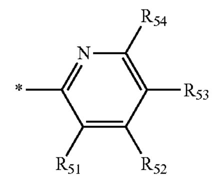

(A-2)

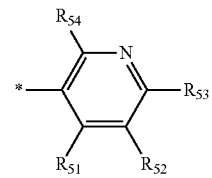

(A-3)

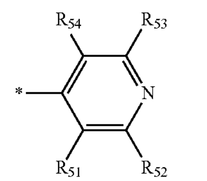

(A-4)

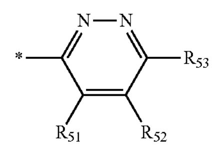

(A-5)

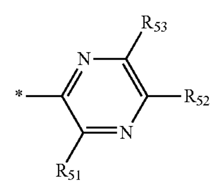

(A-6)

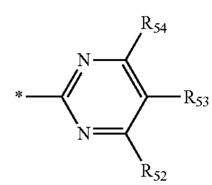

(A-7)

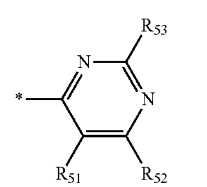

(A-8)

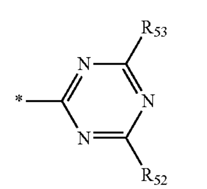

-continued
(A-9)
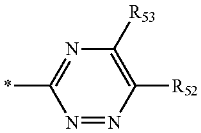
(A-10)
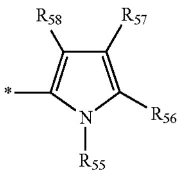
(A-11)
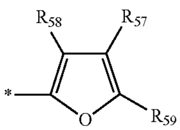
(A-12)
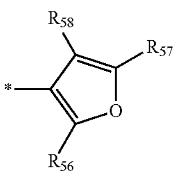
(A-13)
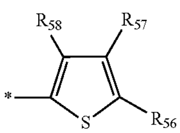
(A-14)
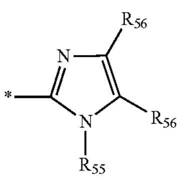
(A-15)
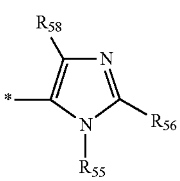
(A-16)
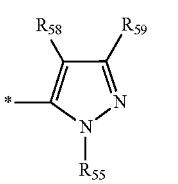
(A-17)
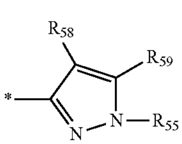
-continued
(A-18)
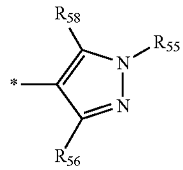
(A-19)
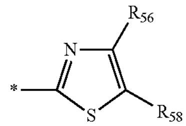
(A-20)
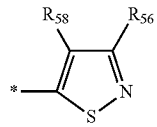
(A-21)
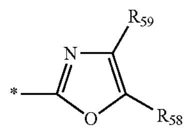
(A-22)
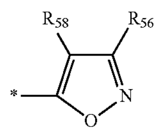
(A-23)
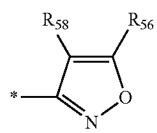
(A-24)
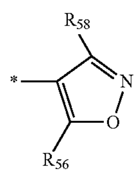
(A-25)
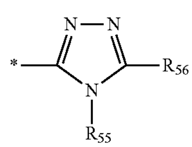
(A-26)
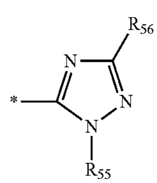
(A-27)
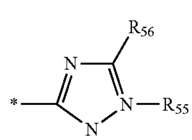
(A-28)
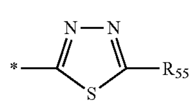

-continued (A-29)

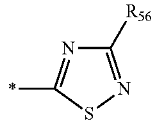

(A-30)

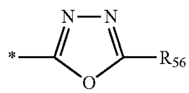

(A-31)

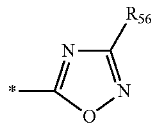

(A-32)

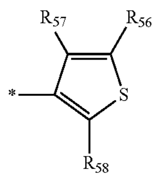

wherein, in Formulae (A-1) to (A-32), $R_{51}$ to $R_{59}$ each independently represent a hydrogen atom or a substituent; adjacent substituents may be bond to form a 5-membered or 6-membered ring; and * represents a binding position to an azo group in Formula (1).

<2> The pigment dispersion composition according to <1>, wherein the azo pigment represented by Formula (1) is an azo pigment represented by the following Formula (2):

(2)

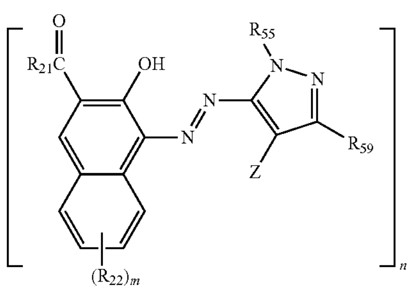

wherein, in Formula (2), $R_{21}$ represents an amino group, an aliphatic oxy group, an aliphatic group, an aryl group, or a heterocyclic group; $R_{22}$ represents a substituent; $R_{55}$ and $R_{59}$ each independently represent a hydrogen atom or a substituent;

m represents an integer of 0 to 5, and when m represents an integer of 2 to 5, plural $R_{22}$'s may be the same as or different from each other;

n represents an integer of 1 to 4;

Z represents an electron-attracting group having a Hammett's substituent constant σp of 0.2 or more;

when n represents 2, the azo pigment is a dimer in which two moieties each independently represented by Formula (2) are linked via $R_{21}$, $R_{22}$, $R_{55}$, $R_{59}$, or Z;

when n represents 3, the azo pigment is a trimer in which three moieties each independently represented by Formula (2) are linked via $R_{21}$, $R_{22}$, $R_{55}$, $R_{59}$, or Z;

when n represents 4, the azo pigment is a tetramer in which four moieties each independently represented by Formula (2) are linked via $R_{21}$, $R_{22}$, $R_{55}$, $R_{59}$, or Z;

Formula (2) is free from an ionic hydrophilic group.

<3> The pigment dispersion composition according to <1> or <2>, wherein the at least one compound selected from the group consisting of an organic pigment derivative having an acidic functional group, an anthraquinone derivative having an acidic functional group, and a triazine derivative having an acidic functional group is a triazine derivative having a sulfo group or a carboxyl group.

<4> The pigment dispersion composition according to any one of <1> to <3>, wherein the dispersant is a dispersant containing a nitrogen atom.

<5> The pigment dispersion composition according to any one of <1> to <4>, wherein the dispersant is a resin including (i) a main chain moiety having a nitrogen atom; (ii) a group X which has a functional group having a pKa of 14 or less and is bound to a nitrogen atom present on the main chain moiety, and (iii) a side chain including an oligomer chain or polymer chain Y having a number average molecular weight of from 500 to 1,000,000.

<6> The pigment dispersion composition according to any one of <1> to <5>, wherein the azo pigment represented by Formula (1) is an azo pigment which has undergone solvent salt milling.

<7> The pigment dispersion composition according to any one of <1> to <6>, further including a pigment having a color tone selected from the group consisting of red, yellow, orange, and violet.

<8> A colored curable composition, including:

the pigment dispersion composition according to any one of <1> to <7>;

a photopolymerization initiator; and a polymerizable compound.

<9> The colored curable composition according to <8>, wherein the photopolymerization initiator is an oxime photopolymerization initiator.

<10> A method of producing a color filter for a solid state imaging device, including:

applying the colored curable composition according to <8> or <9> onto a support to form a colored curable composition layer;

exposing the colored curable composition layer to light through a mask; and developing the colored curable composition layer after the exposure to form a colored pattern.

<11> A color filter for a solid state imaging device, which is produced by the method of producing a color filter according to <10>.

<12> A solid state imaging device, including the color filter according to <11>.

Hereinbelow, exemplary embodiments of the second aspect of the invention are described.

<13> A red colored composition, including:

a red pigment;

a yellow pigment; and a dispersant, wherein when a colored transmitting film having a thickness of 0.6 μm is formed using the red colored composition, the colored transmitting film satisfies all the following characteristics (1) to (5):

(1) a transmission ratio of 50% is obtained in a light wavelength range of from 583 nm to less than 587 nm;

(2) a transmission ratio for light having a wavelength of 400 nm is 15% or less;

(3) a transmission ratio for light having a wavelength of 525 nm is 5% or less;

(4) a transmission ratio for light having a wavelength of 600 nm is 75% or more; and (5) a transmission ratio for light having a wavelength of 700 nm is 95% or more.

<14> The red colored composition according to <13>, wherein the red pigment is an azo pigment represented by the following Formula (1):

(1)

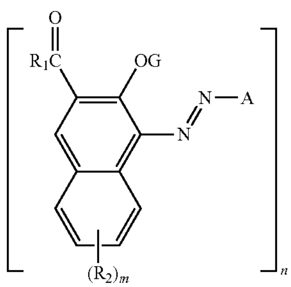

wherein, in Formula (2), G represents a hydrogen atom, an aliphatic group, an aryl group, or a heterocyclic group; $R_1$ represents an amino group, an aliphatic oxy group, an aliphatic group, or a heterocyclic group; $R_2$ represents a substituent;

A represents any one of groups represented by the following Formula (A-1) to (A-32);

m represents an integer of 0 to 5;

when m represents an integer of 2 to 5, plural $R_2$'s may be the same as or different from each other;

n represents an integer of 1 to 4;

when n represents 2, the azo pigment is a dimer in which two moieties each independently represented by Formula (1) are linked via $R_1$, $R_2$, A, or G;

when n represents 3, the azo pigment is a trimer in which three moieties each independently represented by Formula (1) are linked via $R_1$, $R_2$, A, or G;

when n represents 4, the azo pigment is a tetramer in which four moieties each independently represented by Formula (1) are linked via $R_1$, $R_2$, A, or G; and Formula (1) is free from an ionic hydrophilic group:

(A-1)

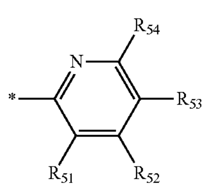

(A-2)

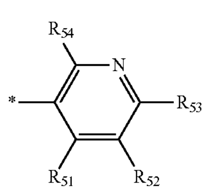

-continued (A-3)

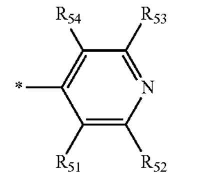

(A-4)

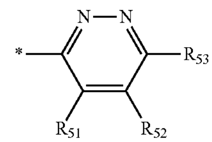

(A-5)

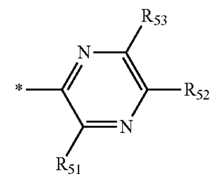

(A-6)

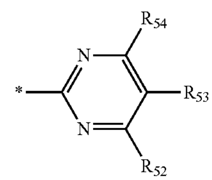

(A-7)

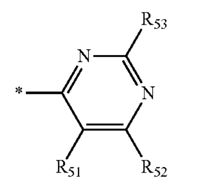

(A-8)

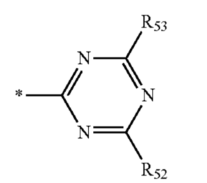

(A-9)

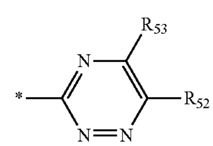

(A-10)

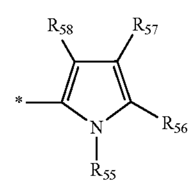

(A-11)

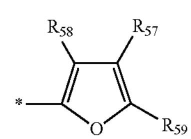

-continued
(A-12)
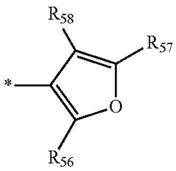
(A-13)
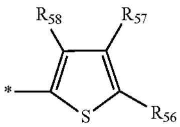
(A-14)
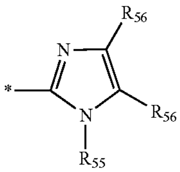
(A-15)
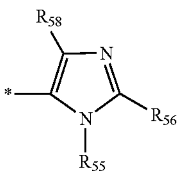
(A-16)
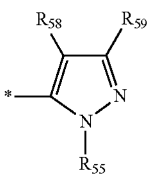
(A-17)
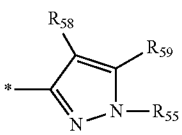
(A-18)
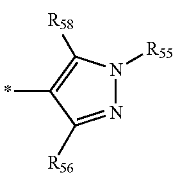
(A-19)
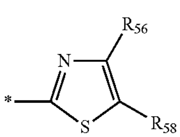
(A-20)
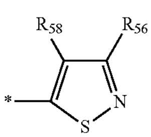
(A-21)
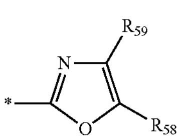
-continued
(A-22)
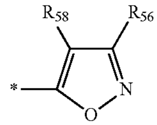
(A-23)
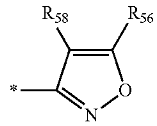
(A-24)
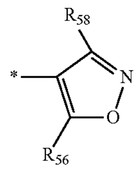
(A-25)
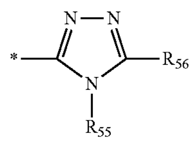
(A-26)
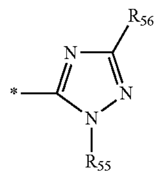
(A-27)
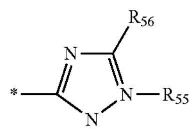
(A-28)
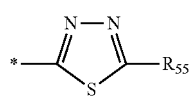
(A-29)
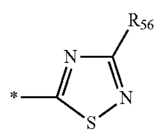
(A-30)
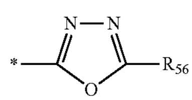
(A-31)
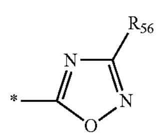
(A-32)
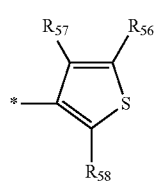
wherein, in Formulae (A-1) to (A-32), $R_{51}$ to $R_{59}$ each independently represent a hydrogen atom or a substituent;

adjacent substituents may be bond to form a 5-membered or 6-membered ring; and * represents a binding position to an azo group in Formula (1).

<15> The red colored composition according to <14>, wherein the azo pigment represented by Formula (1) is an azo pigment represented by the following Formula (2):

(2)

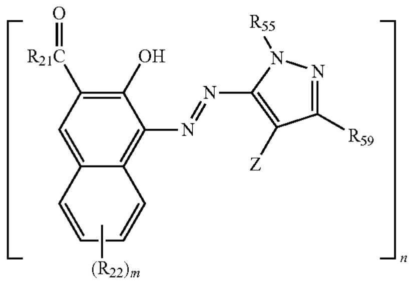

wherein, in Formula (2), $R_{21}$ represents an amino group, an aliphatic oxy group, an aliphatic group, an aryl group, or a heterocyclic group; $R_{22}$ represents a substituent; $R_{55}$ and $R_{59}$ each independently represent a hydrogen atom or a substituent;

m represents an integer of 0 to 5, and when m represents an integer of 2 to 5, plural $R_{22}$'s may be the same as or different from each other;

n represents an integer of 1 to 4;

Z represents an electron-attracting group having a Hammett's substituent constant σp of 0.2 or more;

when n represents 2, the azo pigment is a dimer in which two moieties each independently represented by Formula (2) are linked via $R_{21}$, $R_{22}$, $R_{55}$, $R_{59}$, or Z;

when n represents 3, the azo pigment is a trimer in which three moieties each independently represented by Formula (2) are linked via $R_{21}$, $R_{22}$, $R_{55}$, $R_{59}$, or Z;

when n represents 4, the azo pigment is a tetramer in which four moieties each independently represented by Formula (2) are linked via $R_{21}$, $R_{22}$, $R_{55}$, $R_{59}$, or Z;

Formula (2) is free from an ionic hydrophilic group.

<16> The red colored composition according to <14>, wherein the azo pigment represented by Formula (1) is an azo pigment which has undergone solvent salt milling, and the particle diameter of the azo pigment after the solvent salt milling is 100 nm or less.

<17> The red colored composition according to any one of <13> to <16>, wherein the yellow pigment is C. I. Pigment Yellow 139.

<18> The red colored composition according to any one of <13> to <17>, wherein the dispersant is a polymer compound containing at least one repeating unit selected from a repeating unit represented by the following Formula (I) and a repeating unit represented by the following Formula (II):

(I)

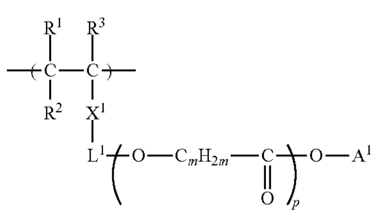

-continued (II)

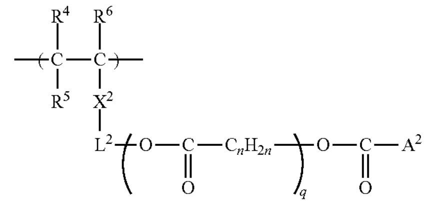

wherein, in Formula (I), $R^1$ to $R^6$ each independently represent a hydrogen atom or a monovalent organic group;

$X^1$ and $X^2$ each independently represent —CO—, —C(═O)O—, —CONH—, —OC(═O)—, or a phenylene group;

$L^1$ and $L^2$ each independently represent a single bond or a divalent organic linking group;

$A^1$ and $A^2$ each independently represent a monovalent organic group;

m and n each independently represent an integer from 2 to 8; and p and q each independently represent an integer from 1 to 100.

<19> The red colored composition according to <18>, wherein the polymer compound includes an acidic group at a side chain thereof, in an amount of from 50 mgKOH/g to 200 mgKOH/g.

<20> A colored curable composition, including:

the red colored composition according to any one of <13> to <19>;

a photopolymerization initiator; and a polymerization initiator.

<21> The colored curable composition according to <20>, wherein the photopolymerization initiator is an oxime photopolymerization initiator.

<22> A method of producing a color filter for a solid state imaging device, including:

applying the colored curable composition according to <20> or <21> onto a support to form a colored curable composition layer;

exposing the colored curable composition layer to light through a mask; and developing the colored curable composition layer after the exposure to form a colored pattern.

<23> A color filter for a solid state imaging device, which is produced by the method of producing a color filter according to <22>.

<24> A solid state imaging device, including the color filter according to <23>.

According to the first aspect of the invention, a pigment dispersion composition is provided, which is suitable for a colored curable composition that enables both retaining adhesion capability of a colored pattern to a support and inhibiting the generation of residues, even when a relatively severe development condition is employed for forming a colored pattern on a support, and a colored curable composition containing the pigment dispersion composition is also provided.

Furthermore, according to the first aspect of the invention, a color filter for a solid state imaging device is provided, which has a colored pattern with little peeling defects and little residue defects, and a solid state imaging device having the color filter is also provided.

According to the second aspect of the invention, a red colored composition capable of forming a red colored thin film with excellent spectral characteristics is provided.

According to the second aspect of the invention, a colored curable composition is provided, which is useful for forming a fine red colored pattern with excellent spectral characteristics and has inhibited generation of development residue.

Furthermore, according to the second aspect of the invention, a color filter for a solid state imaging device having fine red colored pattern with excellent spectral characteristics, and a method for producing the same, and a solid state imaging device having the color filter are also provided.

DETAILED DESCRIPTION OF THE INVENTION

Pigment Dispersion Composition According to First Aspect

The pigment dispersion composition according to the first aspect of the invention includes: an azo pigment represented by the following Formula (1); at least one compound selected from the group consisting of an organic pigment derivative having an acidic functional group, an anthraquinone derivative having an acidic functional group, and a triazine derivative having an acidic functional group; and a dispersant.

(1)

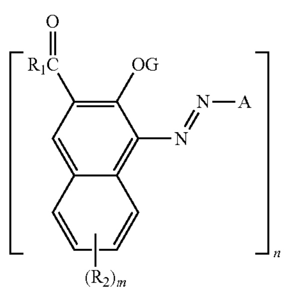

In Formula (1), G represents a hydrogen atom, an aliphatic group, an aryl group, or a heterocyclic group; $R_1$ represents an amino group, an aliphatic oxy group, an aliphatic group, an aryl group, or a heterocyclic group; and $R_2$ represents a substituent;

A represents any one of the groups represented by the following formulae (A-1) to (A-32);

m represents an integer from 0 to 5, and when m represents an integer of 2 to 5, plural R2's may be the same as of different from each other;

n represents an integer from 1 to 4;

when n represents 2 (i.e., when n=2), the azo pigment is a dimer in which two moieties each independently represented by Formula (1) are linked via $R_1$, $R_2$, A, or G;

when n represents 3 (i.e., when n=3), the azo pigment is a trimer in which three moieties each independently represented by Formula (1) are linked via $R_1$, $R_2$, A, or G;

when n represents 4 (i.e., when n=4), the azo pigment is a tetramer in which four moieties each independently represented by Formula (1) are linked via $R_1$, $R_2$, A, or G; and Formula (1) is free from an ionic hydrophilic group, in other words, Formula (1) has no ionic hydrophilic group.

(A-1)

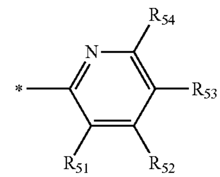

(A-2)

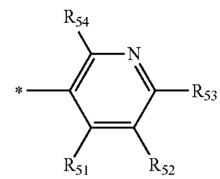

(A-3)

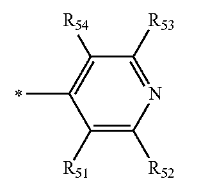

(A-4)

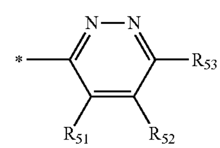

(A-5)

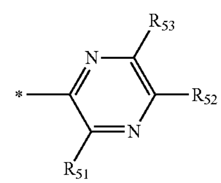

(A-6)

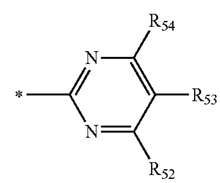

(A-7)

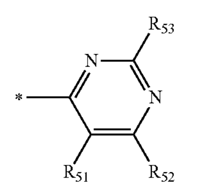

(A-8)

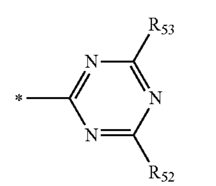

(A-9)

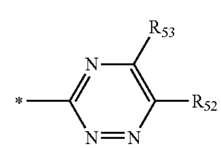

-continued
(A-10)
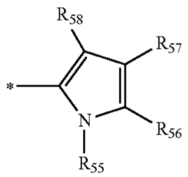
(A-11)
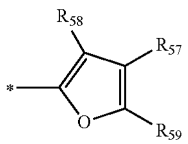
(A-12)
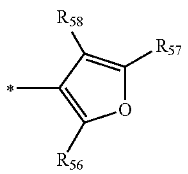
(A-13)
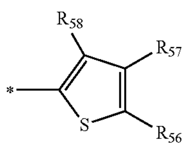
(A-14)
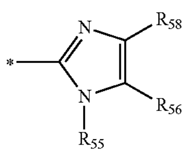
(A-15)
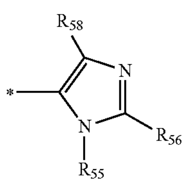
(A-16)
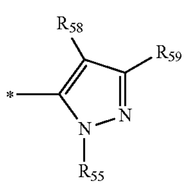
(A-17)
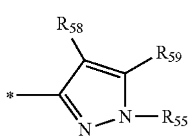
(A-18)
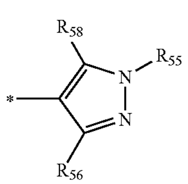
-continued
(A-19)
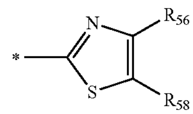
(A-20)
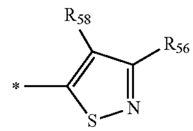
(A-21)
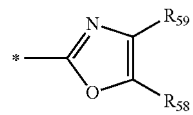
(A-22)
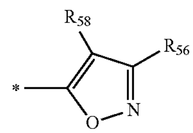
(A-23)
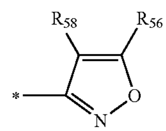
(A-24)
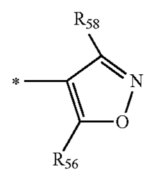
(A-25)
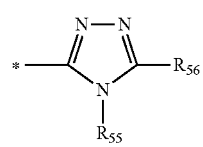
(A-26)
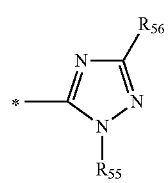
(A-27)
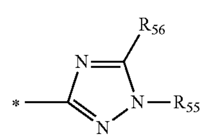
(A-28)
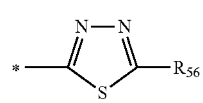
(A-29)
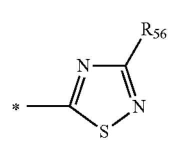

-continued (A-30)

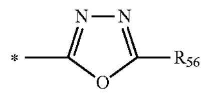

(A-31)

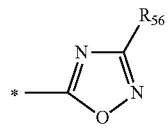

(A-32)

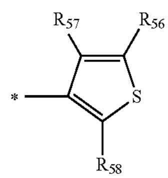

In Formulae (A-1) to (A-32), $R_{51}$ to $R_{59}$ each independently represent a hydrogen atom or a substituent, and adjacent substituents may be bound to each other to form a 5-membered or 6-membered ring; and * indicates a bonding position to an azo group in Formula (1).

The pigment dispersion composition according to the first aspect of the invention is suitable for a colored curable composition which may be used for forming a colored pattern possessed by a color filter or the like, and one of the characteristic constitutions is that it contains a specific derivative having an acidic functional group. By having such configuration, a colored curable composition containing the pigment dispersion composition according to the first aspect of the invention (i.e., a colored curable composition according to the first aspect of the invention) enables to provide retained adhesion property of a colored pattern to a support and inhibition of the generation of residues, even when a relatively severe development condition is employed for forming a colored pattern on a support.

Although it remains uncertain why the adhesion property of a colored pattern to a support is retained and also the generation of residues is inhibited by using the pigment dispersion composition according to the first aspect of the invention even when a relatively severe development condition is employed, it is believed that, due to the presence of an acidic functional group, the specific derivative having an acidic functional group, which is one of the characteristic components of the invention, greatly contributes to the improvement in developability in a region in which a colored pattern is not to be formed, and the generation of residues is effectively inhibited. It is also believed that, in a region in which a colored pattern (i.e., cured film) is to be formed, the acidic functional group contained in the specific derivative interacts with the support so that the adhesion property of the colored pattern to the substrate is improved.

Azo Pigment Represented by Formula (1)

The pigment dispersion composition and colored curable composition according to the first aspect of the invention each contains an azo pigment represented by the following Formula (1).

(1)

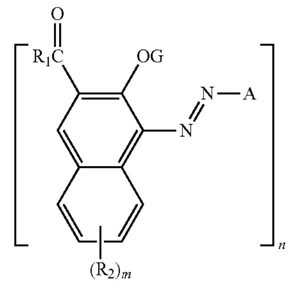

In Formula (1), G represents a hydrogen atom, an aliphatic group, an aryl group, or a heterocyclic group, $R_1$ represents an amino group, an aliphatic oxy group, an aliphatic group, an aryl group, or a heterocyclic group, and $R_2$ represents a substituent.

In Formula (1), A represents any one of the groups represented by the following Formulae (A-1) to (A-32).

In Formula (1), m represents an integer from 0 to 5, and n represents an integer from 1 to 4. When m represents an integer from 2 to 5, plural R2's may be the same as or different from each other.

When n represents 2 (i.e., when n=2), the azo pigment is a dimer in which two moieties each independently represented by Formula (1) are linked via $R_1$, $R_2$, A, or G.

When n represents 3 (i.e., when n=3), the azo pigment is a trimer in which three moieties each independently represented by Formula (1) are linked via $R_1$, $R_2$, A, or G.

When n represents 4 (i.e., when n=4), the azo pigment is a tetramer in which four moieties each independently represented by Formula (1) are linked via $R_1$, $R_2$, A, or G.

When n represents an integer of from 2 to 4 (i.e., when the azo pigment is a dimer, trimer, or tetramer), plural moieties each represented by Formula (1) may be the same as or different from each other.

The azo pigment represented by Formula (1) contains no ionic hydrophilic group.

(A-1)

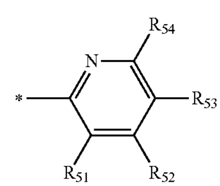

(A-2)

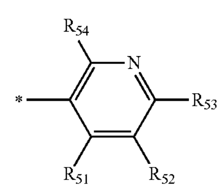

(A-3)

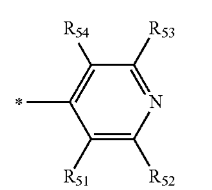

-continued
(A-4)
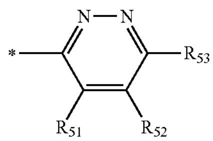
(A-5)
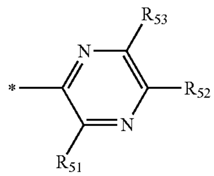
(A-6)
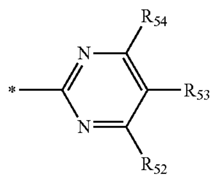
(A-7)
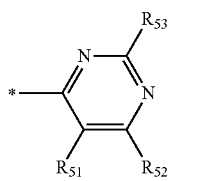
(A-8)
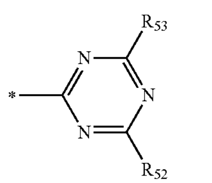
(A-9)
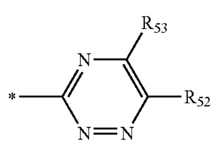
(A-10)
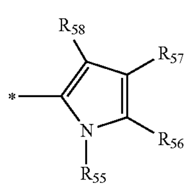
(A-11)
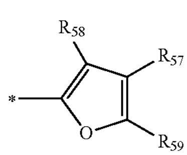
(A-12)
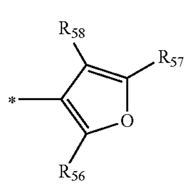
-continued
(A-13)
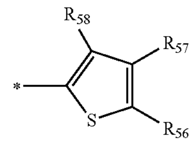
(A-14)
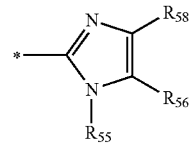
(A-15)
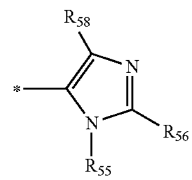
(A-16)
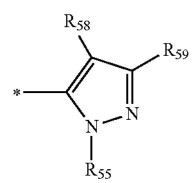
(A-17)
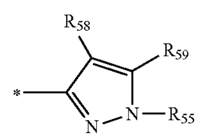
(A-18)
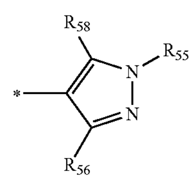
(A-19)
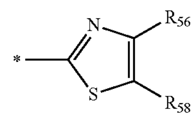
(A-20)
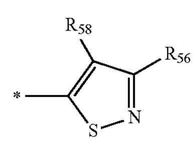
(A-21)
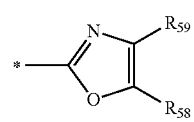
(A-22)
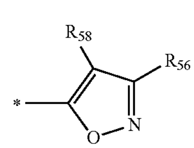

-continued (A-23)

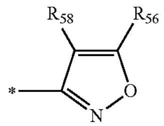

(A-24)

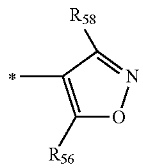

(A-25)

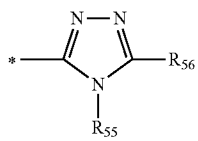

(A-26)

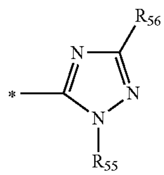

(A-27)

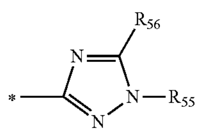

(A-28)

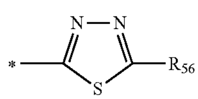

(A-29)

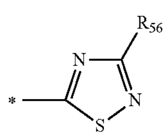

(A-30)

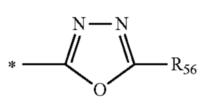

(A-31)

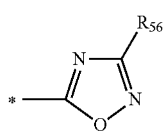

(A-32)

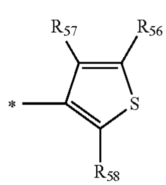

In Formulae (A-1) to (A-32), $R_{51}$ to $R_{59}$ each independently represent a hydrogen atom or a substituent, and adjacent substituents may bind to each other to form a 5-membered or 6-membered ring. In Formulae (A-1) to (A-32), * indicates a bonding position to an azo group in Formula (1).

Due to the specific structure, the compounds represented by Formula (1) may easily undergo an intermolecular interaction between pigment molecules, and as having low solubility in water or organic solvent, it can be used as an azo pigment.

Unlike dyes that are dissolved and used in a molecular dispersion state in water or an organic solvent, pigments are finely dispersed in a solvent as solid particles of molecular aggregates or the like.

Hereinbelow, pigments including an azo pigment are described.

Pigments are in a state in which molecules are strongly combined to each other due to aggregation energy caused by the strong interaction among pigment molecules. Journal of the Imaging Society of Japan, Vol. 43, page 10 (2004), for example, discloses that van der Waals force among the molecules, hydrogen binding among the molecules, or the like is required to make such a state.

To increase van der Waals force among the molecules, it may be considered to introduce an aromatic group, a polar group and/or a heteroatom to the molecules. Further, to form a hydrogen bond among the molecules, it may be considered to introduce a substituent containing a hydrogen atom for binding to a heteroatom of the molecule and/or to introduce an electron-donating substituent, or the like. Still further, it is believed that high polarity of the whole molecule is preferable. As such, for an azo pigment, it is considered that a chain group such as an alkyl group is preferably relatively short, and a molecular weight/azo group ratio is preferably relatively small.

From the viewpoints of the above, the pigment molecule preferably contains an amide bond, a sulfone amide bond, an ether bond, a sulfone group, an oxycarbonyl group, an imide group, a carbamoylamino group, a heterocycle, a benzene ring, or the like.

Further, by having the specific structure represented by Formula (1), the azo pigment exhibits excellent color characteristics like coloring power, color property, or the like, and also exhibits excellent durability like light resistance, ozone resistance, or the like.

Specifically, a red colored pattern of a color filter, which is formed using the pigment dispersion composition according to the first aspect of the invention containing the azo pigment represented by Formula (1), exhibits favorable spectral characteristics as red color.

Herein, the term “favorable spectral characteristics as red color” indicates, for example, at least one property described below. The spectral characteristics satisfying both of the following properties are the most favorable.

High transmission ratio in the wavelength range of 650 nm to 750 nm.

Low transmission ratio in the wavelength range of less than 540 nm (in particular, in the wavelength range of from 350 nm to 400 nm).

Hereinbelow, the azo pigment represented by Formula (1) is explained in detail.

First, the aliphatic group, aryl group, heterocyclic group, and substituent included in Formula (1) are explained.

As for the aliphatic group in Formula (1), the aliphatic moiety thereof may be a linear chain or a branched chain, or may have a cyclic structure. Further, the aliphatic group may be saturated or unsaturated. Specific examples of such aliphatic group include an alkyl group, an alkenyl group, a cycloalkyl group, and a cycloalkenyl group. The aliphatic group may be unsubstituted or may have a substituent.

The aryl group in Formula (1) may be either a monocycle or a condensed ring, and may be unsubstituted or may have a substituent.

The heterocyclic group in Formula (1) has a heterocyclic moiety having a hetero atom (e.g., a nitrogen atom, a sulfur atom, or an oxygen atom) in the ring thereof, and may be a saturated ring or an unsaturated ring. The heterocyclic moiety may be a monocycle or a condensed ring. Further, the heterocyclic group may be unsubstituted or have a substituent.

The "substituent" in Formula (1) may be a group which enable substitution, and examples thereof include an aliphatic group, an aryl group, a heterocyclic group, an acyl group, an acyloxy group, an acylamino group, an aliphatic oxy group, an aryloxy group, a heterocyclic oxy group, an aliphatic oxycarbonyl group, an aryloxycarbonyl group, a heterocyclic oxycarbonyl group, a carbamoyl group, an aliphatic sulfonyl group, an arylsulfonyl group, a heterocyclic sulfonyl group, an aliphatic sulfonyloxy group, an arylsulfonyloxy group, a heterocyclic sulfonyloxy group, a sulfamoyl group, an aliphatic sulfonamide group, an arylsulfonamide group, a heterocyclic sulfonamide group, an amino group, an aliphatic amino group, an arylamino group, a heterocyclic amino group, an aliphatic oxycarbonylamino group, an aryloxycarbonylamino group, a heterocyclic oxycarbonylamino group, an aliphatic sulfinyl group, an arylsulfinyl group, an aliphatic thio group, an arylthio group, a hydroxyl group, a cyano group, a sulfo group, a carboxyl group, an aliphatic oxyamino group, an aryloxyamino group, a carbamoylamino group, a sulfamoylamino group, a halogen atom, a sulfamoylcarbamoyl group, a carbamoylsulfamoyl group, a dialiphatic oxyphosphinyl group, and a diaryloxyphosphinyl group. These substituents may each be additionally substituted, and examples of the additional substituent include those selected from the substituents described above.

When the substituent is an acyl group, the acyl group may be an aliphatic carbonyl group, an arylcarbonyl group, or a heterocyclic carbonyl group, and may have a substituent, examples of the substituent including those groups described above as a substituent, and any one of them may be used if it is a substitutable group. Examples thereof include an acetyl group, a propanoyl group, a benzoyl group, and a 3-pyridine carbonyl group.

From the viewpoint of solubility, the azo pigment represented by Formula (1) does not contain an ionic hydrophilic group (for example, a carboxyl group, a sulfo group, a phosphono group, and a quaternary ammonium group) as a substituent.

The aliphatic group represented by G in Formula (1) may or may not have a substituent, and it may be saturated or unsaturated. Examples of the substituent for G include those described above as the "substituent" in Formula (1), and may be any substituent that is capable of serving as a substituent of the aliphatic group represented by G. Preferred examples of the substituent include a hydroxyl group, an aliphatic oxy group, a carbamoyl group, an aliphatic oxycarbonyl group, an aliphatic thio group, an amino group, an aliphatic amino group, an acylamino group, and a carbamoylamino group. The aliphatic group represented by G is preferably an aliphatic group having 1 to 8 carbon atoms, and more preferably an alkyl group having 1 to 4 carbon atoms, and examples thereof include a methyl group, an ethyl group, a vinyl group, a cyclohexyl group, and a carbamoylmethyl group.

The aryl group represented by G in Formula (1) may or may not be a condensed ring, and may or may not have a substituent. Examples of the substituent include those described above as the "substituent" in Formula (1), and may be any substituent that is capable of serving as a substituent of the aryl group represented by G. Preferred examples of the substituent for the aryl group represented by G include a nitro group, a halogen atom, an aliphatic oxy group, a carbamoyl group, an aliphatic oxycarbonyl group, an aliphatic thio group, an amino group, an aliphatic amino group, an acylamino group, and a carbamoylamino group. The aryl group represented by G is preferably an aryl group having 6 to 12 carbon atoms, and more preferably an aryl group having 6 to 10 total carbon atoms, and examples thereof include a phenyl group, a 4-nitrophenyl group, a 4-acetylaminophenyl group, and a 4-methanesulfonylphenyl group.

The heterocyclic group represented by G in Formula (1) may or may not have a substituent, may be saturated or unsaturated, and may be a condensed ring. Examples of the substituent for the heterocyclic group represented by G include those described above as the "substituent" in Formula (1), and may be any substituent that is capable of serving as a substituent of the heterocyclic group represented by G. Preferred examples of the substituent for the heterocyclic group represented by G include a halogen atom, a hydroxyl group, an aliphatic oxy group, a carbamoyl group, an aliphatic oxycarbonyl group, an aliphatic thio group, an amino group, an aliphatic amino group, an acylamino group, and a carbamoylamino group. The heterocyclic group represented by G is preferably a heterocyclic group which has 2 to 12 carbon atoms in total and is bound to the oxygen atom adjacent to G via a carbon atom of the heterocyclic group, and more preferably a 5-membered or 6-membered heterocycle which has 2 to 10 carbon atoms in total and is bound to the oxygen atom adjacent to G via a carbon atom of the heterocyclic group, and examples thereof include a 2-tetrahydrofuryl group and a 2-pyrimidyl group.

In Formula (1) G is preferably a hydrogen atom. The reason is that an intramolecular hydrogen bond or an intramolecular crossed hydrogen bond may be easily formed.

The amino group represented by $R_1$ may or may not have a substituent. Examples of the substituent for the amino group represented by $R_1$ include those described above as the "substituent" in Formula (1), and may be any substituent that is capable of serving as a substituent of the amino group represented by $R_1$. Preferred examples of the substituent for the amino group represented by $R_1$ include an aliphatic group, an aryl group, and a heterocyclic group.

These substituents may have an additional substituent. Examples of the additional substituent preferably include an aliphatic group, a hydroxyl group, and a substituent having an amide bond, an ether bond, an oxycarbonyl bond, or a thioether bond. From the viewpoint of ease in occurrence of an intermolecular interaction such as intermolecular hydrogen bond, a substituent which forms a hydrogen bond with a heteroatom is more preferable.

Examples of the amino group represented by $R_1$ which may have a substituent preferably include an unsubstituted amino group, an alkylamino group having 1 to 10 total carbon atoms, a dialkylamino group having 2 to 10 total carbon atoms (in which the dialkyl groups may bind to each other to form a 5-membered or 6-membered ring), an arylamino group having 6 to 12 total carbon atoms, and a saturated or unsaturated heterocyclic amino group having 2 to 12 total carbon atoms. More preferably, the amino group represented by $R_1$ is an unsubstituted amino group, an alkylamino group having 1 to 8 total carbon atoms, a dialkylamino group having 2 to 8 total carbon atoms, an arylamino group having 6 to 10 total carbon atoms, or a saturated or unsaturated heterocyclic amino group having 2 to 12 total carbon atoms, and examples thereof include a methylamino group, a N,N-dimethylamino group, a N-phenylamino group, and a N-(2-pyrimidyl)amino group.

Still more preferably, the amino group represented by $R_1$ is an arylamino group which has 6 to 13 total carbon atoms and which may have a substituent, or a saturated or unsaturated heterocyclic amino group which has 2 to 12 total carbon atoms and may have a substituent.

When $R_1$ is an arylamino group, a substituent on the aryl group is preferably present at the para position relative to the position at which the amino group is bound. It is most preferable that the arylamino group has a substituent only at the para position. Examples of the substituent include those described above as the "substituent" and which is capable of serving as a substituent on the arylamino group represented by $R_1$. Preferred examples of the substituent include an aliphatic group which has 1 to 7 total carbon atoms and may have a substituent, and more preferably an aliphatic group which has 1 to 4 total carbon atoms and may have a substituent (e.g., a methyl group, an ethyl group, an allyl group, an (i)-propyl group, and a (t)-butyl group), an aliphatic oxy group which has 1 to 7 total carbon atoms and may have a substituent (e.g., a methoxy group, an ethoxy group, an (i)-propyloxy group, and an allyloxy group), a halogen atom (e.g., fluorine, chlorine, and bromine), a carbamoyl group which has 1 to 7 total carbon atoms and may have a substituent (e.g., a carbamoyl group, a N-phenylcarbamoyl group, and a N-methylcarbamoyl group), a ureido group which has 1 to 7 total carbon atoms, more preferably 1 to 4 total carbon atoms, and may have a substituent (e.g., a ureido group, a N-methylureido group, a N,N-dimethylureido group, a N-4-pyridylureido group, and a N-phenylureido group), a nitro group, a heterocycle which has 1 to 7 total carbon atoms and is condensed with the aryl group (e.g., an imidazolone group), a hydroxyl group, an aliphatic thio group which has 1 to 7 total carbon atoms, more preferably 1 to 4 total carbon atoms, and may have a substituent (e.g., a methylthio group, an ethylthio group, a (i)-propylthio group, an allylthio group, and a (t)-butylthio group), an acylamino group which has 2 to 7 total carbon atoms, more preferably 2 to 4 total carbon atoms, and may have a substituent (e.g., an acetamino group, a propionylamino group, a pivaloylamino group, and a benzoylamino group), an aliphatic oxycarbonylamino group which has 2 to 7 total carbon atoms, more preferably 2 to 4 total carbon atoms, and may have a substituent (e.g., a methoxycarbonylamino group and a propyloxycarbonylamino group), an aliphatic oxycarbonyl group which has 2 to 7 total carbon atoms, more preferably 2 to 4 total carbon atoms, and may have a substituent (e.g., methoxycarbonyl and ethoxycarbonyl), and an acyl group which has 2 to 7 total carbon atoms, more preferably 2 to 4 total carbon atoms, and may have a substituent (the acyl group may be an aliphatic carbonyl group, an arylcarbonyl group, or a heterocyclic carbonyl group, and may have a substituent, examples of the substituent including those described above as the "substituent" and capable of serving as a substituent on the acyl group. Preferably, it is an acyl group having 2 to 7 total carbon atoms, and more preferably an acyl group having 2 to 4 total carbon atoms. Examples thereof include an acetyl group, a propanoyl group, a benzoyl group, and a 3-pyridinecarbonyl group).

When the aryl group moiety of the arylamino group is substituted with a substituent at the para position relative to the amino group bonding position, the substituent is present at the end of the molecule, and therefore an intermolecular interactions such as intermolecular hydrogen bond may be more easily formed. As a result, more sharp color can be obtained. When the substituent on the aryl group has an additional substituent, the additional substituent is preferably an aliphatic group, a hydroxyl group, or a substituent having an amide bond, an ether bond, an oxycarbonyl bond, or a thioether bond, and, from the viewpoint of easiness in occurrence of an intermolecular interaction such as intermolecular hydrogen bond, more preferably a substituent which forms a hydrogen bond with a heteroatom.

When $R_1$ is a heterocyclic amino group, the substituent therefor may be any of those described above as the "substituent" and may be a substituent that is capable of serving as a substituent on the heterocyclic amino group represented by $R_1$, and the substituent which is the same as described above for the arylamino group is preferable. When the substituent on the heterocyclic group has an additional substituent, the additional substituent is preferably an aliphatic group, a hydroxyl group, or a substituent having an amide bond, an ether bond, an oxycarbonyl bond, or a thioether bond. Further, from the viewpoint of easiness in occurrence of an intermolecular interaction such as intermolecular hydrogen bond, a substituent which forms a hydrogen bond with a heteroatom is more preferable.

When $R_1$ is an arylamino group or a heterocyclic amino group, examples of more preferred substituent include an aliphatic group, an aliphatic oxy group, a halogen atom, a carbamoyl group, a heterocycle which is condensed to the aryl group, and an aliphatic oxycarbonyl group. More preferably, the substituent is an aliphatic group having 1 to 4 total carbon atoms, an aliphatic oxy group having 1 to 4 total carbon atoms, a halogen atom, a nitro group, a carbamoyl group having 1 to 4 total carbon atoms, or an aliphatic oxycarbonyl group having 2 to 4 total carbon atoms.

The aliphatic oxy group represented by $R_1$ may or may not have a substituent. Examples of the substituent for the aliphatic oxy group represented by $R_1$ include those described above as the "substituent" and which is capable of serving as a substituent on the aliphatic oxy group represented by $R_1$. Preferred examples of the substituent include a hydroxyl group, an aliphatic oxy group, a carbamoyl group, an aliphatic oxycarbonyl group, an aliphatic thio group, an amino group, an aliphatic amino group, an acylamino group, and a carbamoylamino group. The aliphatic oxy group represented by $R_1$ is preferably an alkoxy group having 1 to 8 total carbon atoms. More preferably, it is an alkoxy group having 1 to 4 total carbon atoms, and examples thereof include a methoxy group, an ethoxy group, a (t)-butoxy group, a methoxyethoxy group, and a carbamoylmethoxy group.

The aliphatic group represented by $R_1$ may or may not have a substituent. Examples of the substituent for the aliphatic group represented by $R_1$ include those described above as the "substituent" and which is capable of serving as a substituent on the aliphatic group represented by $R_1$. Preferred examples of the substituent include a hydroxyl group, an aliphatic oxy group, a carbamoyl group, an aliphatic oxycarbonyl group, an aliphatic thio group, an amino group, an aliphatic amino group, an acylamino group, and a carbamoylamino group. The aliphatic group represented by $R_1$ is preferably an alkyl group having 1 to 8 total carbon atoms. More preferably, it is an alkyl group having 1 to 4 total carbon atoms, and examples thereof include a methyl group, an ethyl group, a (s)-butyl group, a methoxyethyl group, and a carbamoylmethyl group.

The aryl group represented by $R_1$ may or may not have a substituent. Examples of the substituent for the aryl group represented by $R_1$ include those described above as the "substituent" and which is capable of serving as a substituent on the aryl group represented by $R_1$. Preferred examples of the substituent include an aliphatic group, an aliphatic oxy group, a halogen atom, a carbamoyl group, a heterocycle condensed to the aryl group, and an aliphatic oxycarbonyl group. The aryl group represented by $R_1$ is preferably an aryl group having 6 to 12 total carbon atoms. More preferably, it is an aryl group having 6 to 10 total carbon atoms, and examples thereof include a phenyl group, a 4-methylphenyl group, and a 3-chlorophenyl group.

The heterocyclic group represented by $R_1$ may be a saturated heterocycle or an unsaturated heterocycle group, and may or may not have a substituent. Examples of the substituent for the heterocyclic group represented by $R_1$ include those described above as the "substituent" and which is capable of serving as a substituent on the heterocyclic group represented by $R_1$. Preferred examples of the substituent include an aliphatic group, an aliphatic oxy group, a carbamoyl group, a heterocycle condensed to the heterocyclic group, and an aliphatic oxycarbonyl group. The heterocyclic group represented by $R_1$ is preferably a heterocyclic group having 2 to 10 total carbon atoms. More preferably, it is a 5- to 6-membered non-aromatic heterocyclic group which has 2 to 8 total carbon atoms and is bound to the carbon atom adjacent to $R_1$ via a nitrogen atom of the heterocyclic group, and examples thereof include a 1-piperidyl group, a 4-morpholinyl group, a 1-quinolyl group, a 2-pyrimidyl group, and a 4-pyridyl group.

$R_1$ is preferably a substituted or unsubstituted amino group, a substituted or unsubstituted aliphatic oxy group, or a substituted or unsubstituted 5- to 6-membered non-aromatic heterocyclic group containing a nitrogen atom that is bound to the carbon atom adjacent to $R_1$, and more preferably a substituted or unsubstituted amino group or a substituted or unsubstituted aliphatic oxy group, and still more preferably a substituted or unsubstituted amino group.

$R_1$ is further more preferably a substituted or unsubstituted amino group.

Examples of the substituent represented by $R_2$ includes those described above as the "substituent", and any substitutable group may be used as $R_2$. Preferred examples of the substituent represented by $R_2$ include an aliphatic group, an aryl group, a heterocyclic group, an aliphatic oxycarbonyl group, a carboxyl group, a substituted or unsubstituted carbamoyl group, an acylamino group, a sulfonamide group, a substituted or unsubstituted carbamoylamino group, a substituted or unsubstituted sulfamoyl group, an aliphatic oxy group, an aliphatic thio group, a cyano group, and a halogen atom; more preferably an aliphatic oxycarbonyl group, a substituted or unsubstituted carbamoyl group, an acylamino group, a substituted or unsubstituted carbamoylamino group, an aliphatic oxy group, or a halogen atom; and most preferably an aliphatic oxy group.

When these substituents have an additional substituent, an aliphatic group, a hydroxyl group, or a substituent having an amide bond, an ether bond, an oxycarbonyl bond, or a thioether bond is preferable. From the viewpoint of easiness in occurrence of an intermolecular interaction such as intermolecular hydrogen bond, a substituent which forms a hydrogen bond with a heteroatom is more preferable.

In Formula (1), m is preferably an integer from 0 to 3, more preferably 0 or 1, and still more preferably 0.

In Formula (1), n is preferably 1 or 2.

The aliphatic group represented by $R_2$ may or may not have a substituent, and may be saturated or unsaturated. Examples of the substituent for the aliphatic group represented by $R_2$ include those described above as the "substituent" and which is capable of serving as a substituent on the aliphatic group represented by $R_2$. Preferred examples of the aliphatic group represented by $R_2$ include an alkyl group having 1 to 8 total carbon atoms. More preferably, it is an alkyl group having 1 to 6 total carbon atoms, and examples thereof include a methyl group, an ethyl group, an i-propyl group, a cyclohexyl group, and a t-butyl group.

The aryl group represented by $R_2$ may or may not have a substituent. Examples of the substituent for the aryl group represented by $R_2$ include those described above as the "substituent" and which is capable of serving as a substituent on the aryl group represented by $R_2$. Preferred examples of the aryl group represented by $R_2$ include an aryl group having 6 to 12 total carbon atoms. More preferably, it is an aryl group having 6 to 10 total carbon atoms, and examples thereof include a phenyl group, a 3-methoxyphenyl group, and a 4-carbamoylphenyl group.

The heterocyclic group represented by $R_2$ may or may not have a substituent, and may be saturated or unsaturated, or may be a condensed ring. Examples of the substituent for the heterocyclic group represented by $R_2$ include those described above as the "substituent" and which is capable of serving as a substituent on the heterocyclic group represented by $R_2$. The heterocyclic group represented by $R_2$ is preferably a heterocyclic group having 2 to 16 total carbon atoms. More preferably, it is a 5- to 6-membered heterocyclic group having 2 to 12 total carbon atoms, and examples thereof include a 1-pyrrolidinyl group, a 4-morpholinyl group, a 2-pyridyl group, a 1-pyrrolyl group, a 1-imidazolyl group, and a 1-benzimidazolyl group.

The aliphatic oxy carbonyl group represented by $R_2$ may or may not have a substituent, and may be saturated or unsaturated. Examples of the substituent for the aliphatic oxy carbonyl group represented by $R_2$ include those described above as the "substituent" and which is capable of serving as a substituent on the aliphatic oxy carbonyl group represented by $R_2$. The aliphatic oxy carbonyl group represented by $R_2$ is preferably an alkoxy carbonyl group having 1 to 8 total carbon atoms. More preferably, it is an alkoxy carbonyl group having 1 to 6 total carbon atoms, and examples thereof include a methoxycarbonyl group, an i-propyloxycarbonyl group, and a carbamoylmethoxycarbonyl group.

The carbamoyl group represented by $R_2$ may or may not have a substituent. Examples of the substituent for the carbamoyl group represented by $R_2$ include those described above as the "substituent" and which is capable of serving as a substituent on the carbamoyl group represented by $R_2$, and the substituent is preferably an aliphatic group, an aryl group, or a heterocyclic group. The substituted or unsubstituted carbamoyl group represented by $R_2$ is preferably a carbamoyl group, an alkylcarbamoyl group having 2 to 9 total carbon atoms, a dialkylcarbamoyl group having 3 to 10 total carbon atoms, an arylcarbamoyl group having 7 to 13 total carbon atoms, or a heterocyclic carbamoyl group having 3 to 12 total carbon atoms. More preferably, it is a carbamoyl group, an alkylcarbamoyl group having 2 to 7 total carbon atoms, a dialkylcarbamoyl group having 3 to 6 total carbon atoms, an arylcarbamoyl group having 7 to 11 total carbon atoms, or a heterocyclic carbamoyl group having 3 to 10 total carbon atoms. Examples thereof include a carbamoyl group, a methylcarbamoyl group, a dimethylcarbamoyl group, a phenylcarbamoyl group, and a 4-pyridinecarbamoyl group.

The acylamino group represented by $R_2$ may or may not have a substituent, and may be aliphatic, aromatic, or heterocyclic. Examples of the substituent for the acylamino group represented by $R_2$ include those described above as the "substituent" and which is capable of serving as a substituent on the acylamino group represented by $R_2$. The acylamino group represented by $R_2$ is preferably an acylamino group having 2 to 12 total carbon atoms. More preferably, it is an acylamino group having 1 to 8 total carbon atoms, and more preferably an alkylcarbonylamino group having 1 to 8 total carbon atoms. Examples thereof include an acetylamino group, a benzoylamino group, a 2-pyridinecarbonylamino group, and a propanoylamino group.

The sulfonamide group represented by $R_2$ may or may not have a substituent, and may be aliphatic, aromatic, or heterocyclic. Examples of the substituent for the sulfonamide group represented by $R_2$ include those described above as the "substituent" and which is capable of serving as a substituent on the sulfonamide group represented by $R_2$. Preferred examples of the sulfonamide group represented by $R_2$ include a sulfonamide group having 1 to 12 total carbon atoms, more preferably a sulfonamide group having 1 to 8 total carbon atoms, and still more preferably an alkylsulfonamide group having 1 to 8 total carbon atoms. Examples thereof include a methane sulfonamide group, a benzene sulfonamide group, and a 2-pyridine sulfonamide group.

The carbamoylamino group represented by $R_2$ may or may not have a substituent. Examples of the substituent for the carbamoylamino group represented by $R_2$ include those described above as the "substituent" which is capable of serving as a substituent on the carbamoylamino group represented by $R_2$, and preferably include an aliphatic group, an aryl group, and a heterocyclic group. The substituted or unsubstituted carbamoylamino group represented by $R_2$ is preferably a carbamoylamino group, an alkylcarbamoylamino group having 2 to 9 total carbon atoms, a dialkylcarbamoylamino group having 3 to 10 total carbon atoms, an arylcarbamoylamino group having 7 to 13 total carbon atoms, or a heterocyclic carbamoylamino group having 3 to 12 total carbon atoms. More preferably, it is a carbamoylamino group, an alkylcarbamoylamino group having 2 to 7 total carbon atoms, a dialkylcarbamoylamino group having 3 to 6 total carbon atoms, an arylcarbamoylamino group having 7 to 11 total carbon atoms, or a heterocyclic carbamoylamino group having 3 to 10 total carbon atoms. Examples thereof include a carbamoylamino group, a methylcarbamoylamino group, a N,N-dimethylcarbamoylamino group, a phenylcarbamoylamino group, and a 4-pyridinecarbamoylamino group.

The sulfamoyl group represented by $R_2$ may or may not have a substituent. Examples of the substituent for the sulfamoyl group represented by $R_2$ include those described above as the "substituent" and which is capable of serving as a substituent on the sulfamoyl group represented by $R_2$. Preferred examples thereof include an aliphatic group, an aryl group, and a heterocyclic group. The substituted or unsubstituted sulfamoyl group represented by $R_2$ is preferably a sulfamoyl group, an alkylsulfamoyl group having 1 to 9 total carbon atoms, a dialkylsulfamoyl group having 2 to 10 total carbon atoms, an arylsulfamoyl group having 7 to 13 total carbon atoms, or a heterocyclic sulfamoyl group having 2 to 12 total carbon atoms. More preferably, it is a sulfamoyl group, an alkylsulfamoyl group having 1 to 7 total carbon atoms, a dialkylsulfamoyl group having 3 to 6 total carbon atoms, an arylsulfamoyl group having 6 to 11 total carbon atoms, or a heterocyclic sulfamoyl group having 2 to 10 total carbon atoms. Examples thereof include a sulfamoyl group, a methylsulfamoyl group, a N,N-dimethylsulfamoyl group, a phenylsulfamoyl group, and a 4-pyridinesulfamoyl group.

The aliphatic oxy group represented by $R_2$ may or may not have a substituent, and may be saturated or unsaturated. Examples of the substituent for the aliphatic oxy group represented by $R_2$ include those described above as the "substituent" and which is capable of serving as a substituent on the aliphatic oxy group represented by $R_2$. The aliphatic oxy group represented by $R_2$ is preferably an alkoxy group having 1 to 8 total carbon atoms. More preferably, it is an alkoxy group having 1 to 6 total carbon atoms. Examples thereof include a methoxy group, an ethoxy group, an i-propyloxy group, a cyclohexyloxy group, and a methoxyethoxy group.

The aliphatic thio group represented by $R_2$ may or may not have a substituent, and may be saturated or unsaturated. Examples of the substituent for the aliphatic thio group represented by $R_2$ include those described above as the "substituent" and which is capable of serving as a substituent on the aliphatic thio group represented by $R_2$. The aliphatic thio group represented by $R_2$ is preferably an alkylthio group having 1 to 8 total carbon atoms. More preferably, it is an alkylthio group having 1 to 6 total carbon atoms. Examples thereof include a methylthio group, an ethylthio group, a carbamoylmethylthio group, and a t-butylthio group.

Examples of the halogen atom represented by $R_2$ preferably include a fluorine atom, a chlorine atom, and a bromine atom, and more preferably, it is a chlorine atom.

From the viewpoint of the effect of the first aspect of the invention, it is preferable that $R_2$ is an aliphatic oxycarbonyl group or a carbamoyl group which may have a substituent.

Explanations are given to Formulae (A-1) to (A-32) that are represented by A. The groups represented by Formulae (A-1) to (A-32) each preferably have 2 to 15 carbon atoms in total, and more preferably have 2 to 12 carbon atoms in total.

Examples of the substituent represented by each of $R_{51}$ to $R_{54}$ include those described above as the "substituent" and which is capable of serving as $R_{51}$ to $R_{54}$. Preferred examples of the substituent that is represented by $R_{51}$ to $R_{54}$ include an aliphatic group, an aryl group, a heterocyclic group, an aliphatic oxycarbonyl group, a substituted or unsubstituted carbamoyl group, an acylamino group, a sulfonamide group, an aliphatic oxy group, an aliphatic thio group, and a cyano group. More preferably, it is an aliphatic group, an aliphatic oxycarbonyl group, a substituted or unsubstituted carbamoyl group, an aliphatic oxy group, or a cyano group.

From the viewpoint of the effect of the first aspect of the invention, $R_{51}$ to $R_{54}$ each preferably represent a hydrogen atom, an aliphatic group, an aryl group, a heterocyclic group, an aliphatic oxycarbonyl group, a carbamoyl group which may or may not have a substituent, an acylamino group, a sulfonamide group, an aliphatic oxy group, an aliphatic thio group, or a cyano group, and more preferably a hydrogen atom, an aliphatic group, an aliphatic oxycarbonyl group, a carbamoyl group which may or may not have a substituent, an aliphatic oxy group, or a cyano group.

Examples of the substituent represented by $R_{55}$ include any group described above as a substituent which is capable of serving as $R_{55}$. Preferred examples of the substituent represented by $R_{55}$ include an aliphatic group, an aryl group, and a heterocyclic group. More preferably, it is an aliphatic group, an aryl group, or a 5- to 6-membered aromatic heterocyclic group which contains a nitrogen atom at a position adjacent to the binding site for a nitrogen atom contained in the hetero ring of Formulae (A-1) to (A-32).

From the viewpoint of the effect of the first aspect of the invention, $R_{55}$ is preferably an aliphatic group, an aryl group, or a heterocyclic group; more preferably an aliphatic group, an aryl group, or a 5- to 6-membered aromatic heterocyclic group which contains a nitrogen atom at a position adjacent to the binding site for a nitrogen atom contained in the hetero ring of Formulae (A-1) to (A-32); and still more preferably a 5- to 6-membered aromatic heterocyclic group which contains a nitrogen atom at a position adjacent to the binding site for a nitrogen atom contained in the hetero ring of Formulae (A-1) to (A-32). When $R_{55}$ is a 5- to 6-membered aromatic heterocyclic group which contains a nitrogen atom at a position adjacent to the binding site for a nitrogen atom contained in the hetero ring of Formulae (A-1) to (A-32), not only intermolecular interaction among pigment molecules but also intramolecular interaction is formed more easily and strongly. Accordingly, pigments having stable molecular arrangement are easily obtained, and therefore it is desirable in terms of obtaining favorable color and high fastness (i.e., resistance to light, gas, heat, and water, or the like.).

From the viewpoint of the effect of the first aspect of the invention, the 5- to 6-membered aromatic heterocyclic group which contains a nitrogen atom at a position adjacent to the binding site for a nitrogen atom contained in the hetero ring of Formulae (A-1) to (A-32), which is preferred as $R_{55}$, may or may not have a substituent. Examples of the substituent for the 5- to 6-membered aromatic heterocyclic group include those described above as the "substituent" which is capable of serving as a substituent on the 5- to 6-membered aromatic heterocyclic group. Preferred examples of the substituent include a hydroxyl group, an aliphatic oxy group, a carbamoyl group, an aliphatic oxycarbonyl group, an aliphatic thio group, an amino group, an aliphatic amino group, an acylamino group, and a carbamoylamino group. The 5- to 6-membered aromatic heterocyclic group may be a saturated heterocycle, a non-saturated heterocycle, or a condensed-ring heterocycle. The 5- to 6-membered aromatic heterocyclic group is preferably a 5- to 6-membered aromatic heterocyclic group which has 2 to 12 total carbon atoms and contains a nitrogen atom at a position adjacent to the binding site for a nitrogen atom contained in the hetero ring of Formulae (A-1) to (A-32); and more preferably a 5- to 6-membered aromatic heterocyclic group which has 2 to 10 total carbon atoms and contains a nitrogen atom at a position adjacent to the binding site for a nitrogen atom contained in the hetero ring of Formulae (A-1) to (A-32). Examples thereof include a 2-thiazolyl group, a 2-benzothiazolyl group, a 2-oxazolyl group, a 2-benzoxazolyl group, a 2-pyridyl group, a 2-pyrazinyl group, a 3-pyridazinyl group, a 2-pyrimidinyl group, a 4-pyrimidinyl group, a 2-imidazolyl group, a 2-benzimidazolyl group, and a 2-triazinyl group, and these heterocyclic groups may each have a tautomer structure together with their substituents.

From the viewpoint of the effect of the first aspect of the invention, the aryl group which is preferred as $R_{55}$ may or may not have a substituent. Examples of the substituent for the aryl group include those described above as the "substituent" and which is capable of serving as a substituent on the aryl group. Preferred examples of the substituent include a hydroxyl group, a nitro group, an aliphatic group, an aliphatic oxy group, a carbamoyl group, an aliphatic oxycarbonyl group, an aliphatic thio group, an amino group, an aliphatic amino group, an acylamino group, and a carbamoylamino group. The aryl group represented by $R_{55}$ is preferably an aryl group having 6 to 12 total carbon atoms, and more preferably an aryl group having 6 to 10 total carbon atoms. Examples include a phenyl group, a 3-methoxyphenyl group, and a 4-carbamoylphenyl group, and a phenyl group is preferable.

From the viewpoint of the effect of the first aspect of the invention, the aliphatic group which is preferred as $R_{55}$ may or may not have a substituent. Examples of the substituent for the aliphatic group include those described above as the "substituent" and which is capable of serving as a substituent on the aliphatic group. Preferred examples of the substituent include a hydroxyl group, a nitro group, an aliphatic oxy group, a carbamoyl group, an aliphatic oxycarbonyl group, an aliphatic thio group, an amino group, an aliphatic amino group, an acylamino group, and a carbamoylamino group.

The aliphatic group represented by $R_{55}$ is preferably an alkyl group having 1 to 6 total carbon atoms, and more preferably an aliphatic group having 1 to 4 total carbon atoms. Examples include a methyl group, an ethyl group, a methoxyethyl group, and a carbamoylmethyl group, and a methyl group is preferable.

$R_{55}$ in Formula (1) is preferably any one of the groups represented by the following Formulae (Y-1) to (Y-13); more preferably any one of the groups represented by the following Formulae (Y-1) to (Y-6), each of which has a 6-membered ring, from the viewpoint of achieving a structure capable of easily forming an intramolecular hydrogen bonding; and still more preferably any one of the groups represented by the following Formulae (Y-1), (Y-3), (Y-4), or (Y-6). A group represented by (Y-1) or (Y-4) is particularly preferable.

In the following Formulae (Y-1) to (Y-13), * indicates a binding site for a N atom of the pyrazole ring or the triazole ring of the groups represented by Formula (A-1) to (A-32); $Y_1$ to $Y_{11}$ each independently represent a hydrogen atom or a substituent; and $G_{11}$ in the following Formula (Y-13) represents a non-metallic atomic group capable of forming a 5- to 6-membered heterocycle. The heterocycle represented by $G_{11}$ may be unsubstituted or may have a substituent, and may be a monocycle or a condensed ring. Formulae (Y-1) to (Y-13) may have a tautomer structure together with their substituents.

(Y-1)

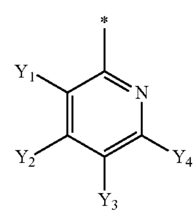

(Y-2)

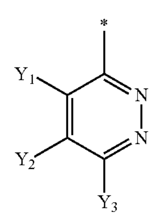

(Y-3)

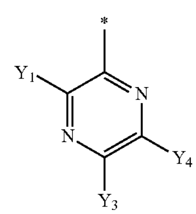

(Y-4)

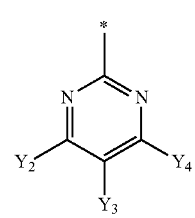

-continued (Y-5)

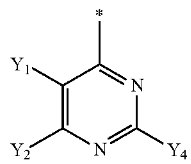

(Y-6)

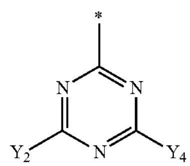

(Y-7)

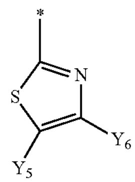

(Y-8)

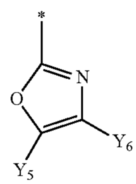

(Y-9)

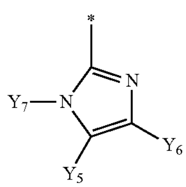

(Y-10)

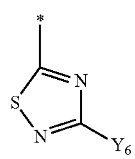

(Y-11)

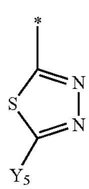

(Y-12)

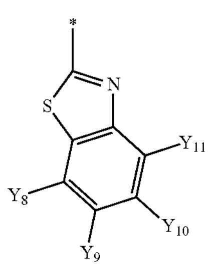

-continued (Y-13)

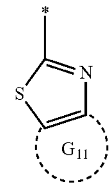

Examples of the substituent represented by each of $Y_1$ to $Y_{11}$ include those described above as the "substituent" and which is capable of serving as each of $Y_1$ to $Y_{11}$. Preferred examples of the substituent represented by any of $Y_1$ to $Y_{11}$ include an aliphatic group, an aryl group, a heterocyclic group, an aliphatic oxycarbonyl group, a substituted or unsubstituted carbamoyl group, an acylamino group, a sulfonamide group, an aliphatic oxy group, an aliphatic thio group, and a cyano group, and more preferably an aliphatic group, an aliphatic oxy group, an aliphatic thio group, and a cyano group. Two adjacent substituents in $Y_1$ to $Y_{11}$ may bind to each other to form a 5- to 6-membered ring.

From the viewpoint of the effect of the first aspect of the invention, it is preferable that $Y_1$ to $Y_{11}$ each independently represent a hydrogen atom, an aliphatic group, an aryl group, a heterocyclic group, an aliphatic oxycarbonyl group, a substituted or unsubstituted carbamoyl group, an acylamino group, a sulfonamide group, an aliphatic oxy group, an aliphatic thio group, or a cyano group, and more preferably a hydrogen atom, an aliphatic group, an aliphatic oxycarbonyl group, a substituted or unsubstituted carbamoyl group, an aliphatic oxy group, or a cyano group.

From the viewpoint of the effect of the first aspect of the invention, A is preferably a 5-membered heterocycle, more preferably a 5-membered heterocycle containing nitrogen or sulfur, and still more preferably a 5-membered heterocycle containing at least two heteroatoms, in terms of color tone.

Examples of the substituent represented by each of $R_{56}$ to $R_{57}$ or $R_{59}$ include those described above as the "substituent" and which is capable of serving as $R_{56}$ to $R_{57}$ and $R_{59}$. Preferred examples of the substituent represented by $R_{56}$ to $R_{57}$ or $R_{59}$ include an aliphatic group, an aryl group, a heterocyclic group, an aliphatic oxycarbonyl group, a substituted or unsubstituted carbamoyl group, an acylamino group, a sulfonamide group, an aliphatic oxy group, an aliphatic thio group, and a cyano group, and more preferably include an aliphatic group, an aliphatic oxy group, an aliphatic thio group, and a cyano group.

From the viewpoint of the effect of the first aspect of the invention, it is preferable that $R_{56}$ to $R_{57}$ and $R_{59}$ each independently represent an aliphatic group, an aryl group, a heterocyclic group, an aliphatic oxycarbonyl group, a substituted or unsubstituted carbamoyl group, an acylamino group, a sulfonamide group, an aliphatic oxy group, an aliphatic thio group, or a cyano group, and more preferably an aliphatic group, an aliphatic oxy group, an aliphatic thio group, or a cyano group.

Examples of the substituent represented by $R_{58}$ include those described above as the "substituent" and which is capable of serving as $R_{58}$. From the view point of the effect of the first aspect of the invention, $R_{58}$ is preferably a heterocyclic group or an electron-withdrawing group having a Hammett's substituent constant ($\sigma p$) value of 0.2 or more, and more preferably an electron-withdrawing group having a $\sigma p$ value of 0.3 or more. The upper limit of the $\sigma p$ value is 1.0 or less.

Hereinbelow, the Hammett's substituent constant (σp) value as used in the specification (i.e., in the first aspect and the second aspect) is explained.

Hammett rule is an empirical rule developed by L. P. Hammett in 1935 to determine quantitatively the influence of a substituent on the reaction or equilibrium of benzene derivatives, and it is now widely accepted all over the world. The substituent constant included in Hammett rule includes σp and σm, and these values can be found from many general publications, for example, they are described in detail in "Lange's Handbook of Chemistry", 12th edition, J. A. Dean Ed. 1979 (Mc Graw-Hill) or "Kagaku no Ryoiki", Vol. 122, pages 96 to 103, 1979 (NANKODO. Co., Ltd.). Although each substituent of the invention is defined or explained by Hammett's substituent constant σp, it does not mean that the present invention is limited to the substituents having well known values which can be easily found in the above publications and the like. Rather, even when the value is not described in publications, it is needless to say that a substituent which falls within the range of values determined based on Hammett's equation is also included. The azo pigment represented by Formula (1) of the invention is not a benzene derivative. However, as a yardstick showing the electron effect of a substituent, σp values are used regardless of substitution position. In this invention, the σp values are used with this meaning herein after.

Specific examples of $R_{58}$ as an electron-withdrawing group having a σp value of 0.2 or more include an acyl group, an acyloxy group, a carbamoyl group, an alkyloxycarbonyl group, an aryloxycarbonyl group, a cyano group, a nitro group, a dialkylphosphono group, a diarylphosphono group, a diarylphosphinyl group, an alkylsulfinyl group, an arylsulfinyl group, an alkylsulfonyl group, an arylsulfonyl group, a sulfonyloxy group, an acylthio group, a sulfamoyl group, a thiocyanate group, a thiocarbonyl group, a halogenated alkyl group, halogenated alkoxy group, a halogenated aryloxy group, a halogenated alkylamino group, a halogenated alkylthio group, and an aryl group substituted with another electron-withdrawing group having a σp value of 0.2 or more, a heterocyclic group, a halogen atom, an azo group, or a selenocyanate group.

From the viewpoint of the effect of the first aspect of the invention, $R_{58}$ is preferably a group represented by any one of Formulae (Y-1) to (Y-13); more preferably a group represented by any one of Formulae (Y-1) to (Y-6), each of which is a 6-membered ring, from the viewpoint of achieving a structure capable of easily forming an intramolecular hydrogen bonding; and still more preferably a group represented by any one of Formulae (Y-1), (Y-3), (Y-4), or (Y-6). A group represented by Formulae (Y-1) or (Y-4) is particularly preferable.

Among the heterocyclic groups represented by Formulae (A-1) to (A-32), as examples of "A", when the atom which is adjacent to the carbon atom binding to the azo group is a heteroatom, resistance against light and heat is high. By using a pigment having these structural characteristics for a color filter, a color filter exhibiting high contrast is obtained, and therefore preferable.

From the viewpoint of the effect of the first aspect of the invention, it is preferable that, in the azo pigment represented by the Formula (1), G is a hydrogen atom; $R_1$ is a substituted or unsubstituted amino group or a saturated heterocyclic group having a nitrogen atom that is bound to the carbon atom adjacent to $R_1$; m is 0 or 1, wherein when m is 1, $R_2$ is an aliphatic oxycarbonyl group, a substituted or unsubstituted carbamoyl group, or an aliphatic oxy group; A is any one of the groups represented by Formulae (A-1), (A-10) to (A-17), (A-20) to (A-23), (A-27), (A-28), and (A-30) to (A-32); and n is 1 or 2. More preferably, G is a hydrogen atom; $R_1$ is a substituted or unsubstituted amino group or a saturated heterocyclic group having a nitrogen atom that is bound to the carbon atom adjacent to $R_1$; m is 0 or 1, wherein when m is 1, $R_2$ is an aliphatic oxycarbonyl group, a substituted or unsubstituted carbamoyl group, or an aliphatic oxy group; A is any one of the groups represented by Formulae (A-1), (A-10), (A-11), (A-13) to (A-17), (A-20), (A-22) to (A-23), (A-27), (A-28), and (A-30) to (A-32); and n is 1 or 2. Still more preferably, G is a hydrogen atom; $R_1$ is a substituted or unsubstituted amino group or a saturated heterocyclic group having a nitrogen atom that is bound to the carbon atom adjacent to $R_1$; m is 0; A is any one of the groups represented by Formulae (A-10), (A-11), (A-13) to (A-17), (A-20), (A-22) to (A-23), (A-27), (A-28), and (A-30) to (A-32); and n is 1 or 2. Particularly more preferably, G is a hydrogen atom; $R_1$ is a substituted or unsubstituted amino group; m is 0; A is any one of the groups represented by Formulae (A-16) to (A-17), (A-20), (A-28) and (A-32); and n is 1 or 2. Most preferably, G is a hydrogen atom; $R_1$ is a substituted or unsubstituted amino group; m is 0; A is a group represented by Formula (A-16); and n is 1 or 2.

From the viewpoint of the effect of the first aspect of the invention, it is preferable that the azo pigment represented by Formula (1) is an azo pigment represented by Formula (2) shown below. The azo pigment represented by Formula (2) includes its tautomer, and salt and hydrate thereof.

The azo pigment represented by the Formula (2) forms a crossed hydrogen bond over azo group between Z or $R_{55}$ and the hydroxyl group of a naphthalene ring to increase a planarity of the pigment structure, and stronger intermolecular and intramolecular interactions are achieved. As a result, resistance against light, resistance against heat, and resistance to solvent, or the like are greatly improved, and therefore desirable.

Hereinbelow, the azo pigment represented by Formula (2), and tautomer, salt or hydrate thereof are explained in greater detail.

(2)

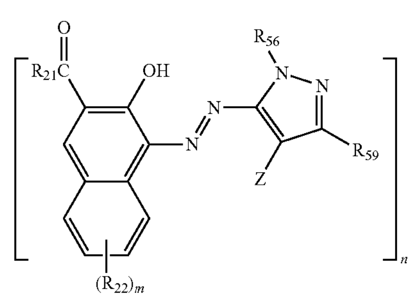

In Formula (2), $R_{21}$, $R_{22}$, $R_{55}$, $R_{59}$, m, and n have the same definitions as those of $R_1$, $R_2$, $R_{55}$, $R_{59}$, m, and n defined for Formula (1), respectively. In Formula (2), Z indicates an electron-withdrawing group having a Hammett's σp value of 0.2 or more. When n represents 2 (i.e., when n=2), the azo pigment is a dimer in which two moieties each represented by Formula (2) are linked via $R_{21}$, $R_{22}$, $R_{55}$, $R_{59}$ or Z. When n represents 3 (i.e., when n=3), the azo pigment is a trimer in which three moieties each represented by Formula (2) are linked via $R_{21}$, $R_{22}$, $R_{55}$, $R_{59}$ or Z. When n represents 4 (i.e., when n=4), the azo pigment is a tetramer in which four moieties each represented by Formula (2) are linked via $R_{21}$, $R_{22}$, $R_{55}$, $R_{59}$ or Z. The azo pigment represented by Formula (2) does not contain an ionic hydrophilic group.

Examples of the substituent having a Hammett's σp value of 0.2 or more as represented by Z include the groups that are explained with regard of $R_{58}$ in Formula (1).

The preferred scopes and substituents for $R_{21}$, $R_{22}$, $R_{55}$, $R_{59}$, m, and n in the azo pigment represented by Formula (2) are the same as those of $R_1$, $R_2$, $R_{55}$, $R_{59}$, m, and n of Formula (1), respectively.

From the viewpoint of the effect of the first aspect of the invention, Z is preferably an acyl group, a carbamoyl group, an alkyloxycarbonyl group, a cyano group, an alkylsulfonyl group, or a sulfamoyl group, and more preferably a carbamoyl group, an alkyloxycarbonyl group, or a cyano group. A cyano group is most preferable.

From the viewpoint of the effect of the first aspect of the invention, it is preferable that, in the azo pigment represented by Formula (2), $R_{21}$ is a substituted or unsubstituted amino group; m is 0 or 1, wherein when m is 1, $R_{22}$ is an aliphatic oxycarbonyl group, a substituted or unsubstituted carbamoyl group, or an aliphatic oxy group; $R_{55}$ is a 5- to 6-membered aromatic heterocyclic group which contains a nitrogen atom at a position adjacent to the binding site to the nitrogen atom adjacent to $R_{55}$; $R_{59}$ is a hydrogen atom or an aliphatic group; Z is an acyl group, a carbamoyl group, an alkyloxycarbonyl group, a cyano group, an alkylsulfonyl group, or a sulfamoyl group; and n is 1 or 2. More preferably, $R_{21}$ is a substituted or unsubstituted amino group; m is 0; $R_{55}$ is any one of the groups represented by Formulae (Y-1) to (Y-13); $R_{59}$ is a hydrogen atom or an aliphatic group; Z is a carbamoyl group, an alkyloxycarbonyl group, or a cyano group; and n is 1 or 2. Still more preferably, $R_{21}$ is a substituted or unsubstituted amino group; m is 0; $R_{55}$ is any one of the groups represented by Formulae (Y-1) to (Y-6); $R_{59}$ is a hydrogen atom or an aliphatic group; Z is a carbamoyl group, an alkyloxycarbonyl group, or a cyano group; and n is 1 or 2. Most preferably, $R_{21}$ is a substituted or unsubstituted amino group; m is 0; $R_{55}$ is any one of the groups represented by Formulae (Y-1), (Y-4), and (Y-6); $R_{59}$ is a hydrogen atom; Z is a cyano group; and n is 1 or 2.

From the viewpoint of the effect of the first aspect of the invention, the azo pigment represented by Formula (1) or Formula (2) has a ratio "total carbon number/azo group number" of 40 or less, and more preferably 30 or less. From the viewpoint of the effect of the first aspect of the invention, the azo pigment represented by Formula (1) or Formula (2) has a ratio "molecular weight/azo group number" of 700 or less. From the viewpoint of the effect of the first aspect of the invention, it is preferable that the azo pigment represented by Formula (1) or Formula (2) is not substituted by an ionic substituent such as a sulfo group or a carboxyl group.

In the azo compound represented by Formula (1) according to another embodiment of the invention, A is preferably a group represented by any one of Formulae (A-1) to (A-9), (A-11) to (A-13), (A-17), (A-20) to (A-23), (A-27), (A-28), or (A-30) to (A-32). More preferably, A is a group represented by any one of Formulae (A-11) to (A-13), (A-17), (A-20) to (A-23), (A-27), (A-28), or (A-30) to (A-32). Still more preferably, A is a group represented by any one of Formulae (A-17), (A-20), (A-22) to (A-23), (A-27), (A-28), (A-31), and (A-32). Even still more preferably, A is a group represented by Formulae (A-20), (A-28), or (A-32). Most preferably, A is a group represented by Formula (A-20). Further, it is particularly preferable that $R_{56}$ in the group represented by Formulae (A-20) is $R_{59}$ of Formula (2).

Tautomers of the azo pigment represented by Formula (1) or Formula (2) are also included in the scope of the first aspect of the invention. Although Formula (1) and Formula (2) correspond to an extreme structure of various tautomers the azo pigment can have in terms of a chemical structure, a tautomer having a structure other than those described herein may be used, or a mixture containing plural tautomers may be used.

For example, the azo pigment represented by Formula (1) includes a tautomer of azohydrazone that is represented by the following Formula (1').

The pigment represented by Formula (1'), which is a tautomer of the azo pigment represented by Formula (1), is also included in the scope of the first aspect of the invention.

Formula (1')

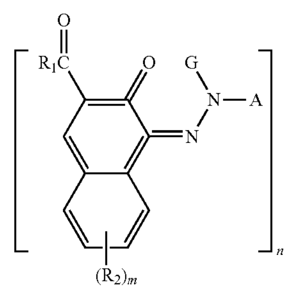

In Formula (1'), G, $R_1$, $R_2$, m, n, and A have the same definitions as defined for Formula (1).

Among the azo pigments represented by Formula (1), examples of particularly preferred azo pigment include azo pigments represented by the following Formula (3-1) to Formula (3-4). The azo pigment represented by Formula (1) is preferably an azo pigment represented by any one of Formula (3-1) to Formula (3-4).

The azo pigment represented by any one of Formula (3-1) to Formula (3-4) includes its tautomer, and salt or hydrate thereof.

Hereinbelow, the azo pigments represented by Formula (3-1) to Formula (3-4), and tautomers and salt or hydrate thereof are explained in greater detail.

(3-1)

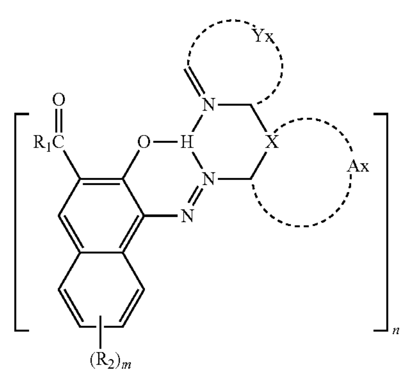

-continued

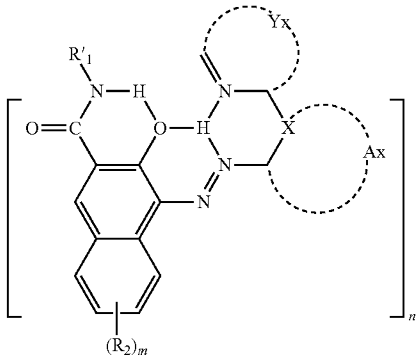

(3-2)

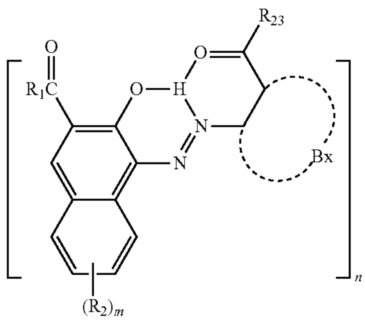

(3-3)

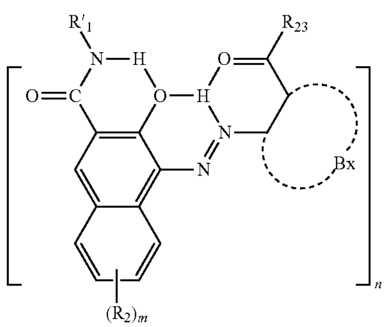

3-4)

In Formula (3-1) to Formula (3-4), $R_1$, $R_2$, m, and n have the same definitions as defined for Formula (1) and Formula (2). In Formulae (3-1) and (3-2), X represents a carbon atom or a nitrogen atom, Ax represents, together with X and the carbon atom adjacent to X, a 5- to 6-membered aromatic heterocyclic group. In Formulae (3-3) and (3-4), Bx represents, together with the two carbon atoms adjacent to Bx, a 5- to 6-membered aromatic heterocyclic group. In particular, Ax and Bx each independently represent a group which is selected from the groups represented by Formulae (A-1) to (A-32), which are defined for A of Formula (1), and is appropriate as Ax or Bx. Yx represents, together with the nitrogen atom and carbon atom adjacent to Yx, a heterocyclic group which is selected from those defined as $R_{55}$ in Formula (1), and is appropriate as Yx. In Formula (3-3) and Formula (3-4), $R_{23}$ indicates a substituent which is obtained by removing a carbonyl group from the substituent such as $R_{51}$, $R_{54}$, $R_{57}$, or $R_{58}$ that are defined for Formula (1). $R'_1$ indicates a substituent which is obtained by removing —NH— from the amino group of $R_1$ that is defined for Formula (1).

Many tautomers are present for the azo pigment represented by Formulae (1), (2), or (3-1) to (3-4).

According to the first aspect of the invention, the azo pigment represented by Formula (1) preferably has a substituent capable of forming an intramolecular hydrogen bond or an intramolecular crossed hydrogen bond. It is more preferable to have a substituent capable of forming at least one intramolecular hydrogen bond. It is particularly preferable to have a substituent capable of forming at least one intramolecular crossed hydrogen bond.

As to the reason why this structure is preferred, as shown in Formulae (3-1) to (3-4), the nitrogen atom which constitutes the heterocyclic group contained in the azo pigment structure, the hydrogen atom and oxygen atom of the hydroxyl group of a substituent on naphthalene, the nitrogen atom of the azo group or hydrazone group as a tautomer, a carbonyl group which can be substituted on the azo component contained in the azo pigment structure, the hydrogen atom and oxygen atom of the hydroxyl group of a substituent on naphthalene, and the nitrogen atom of the azo group or hydrazone group which is a tautomer of an azo group can easily form an intramolecular crossed hydrogen bond.

As a result, planarity of the molecule is increased, intermolecular/intramolecular interaction is further improved, and the crystallinity of the azo pigment represented by Formula (3-1) or Formula (3-4) is increased (i.e., high dimensional structure is more easily formed) so that the properties required for a pigment, such as fastness against light, stability against heat, stability against wet heat, resistance to water, resistance to gas, and/or resistance to solvent are significantly improved, providing more preferred example.

From the above viewpoints, the azo pigment represented by Formula (1) is preferably a pigment represented by Formula (2), (3-1) to (3-4). A pigment represented by Formula (2), (3-1), or (3-2) is more preferable, and an azo pigment represented by Formula (2) is particularly preferable.

Hereinbelow, specific examples of the azo pigment represented by Formula (1) are shown. However, the azo pigment used in the first aspect of the invention is not limited to them. In addition, although the structures shown below correspond to an extreme structure of various tautomers the azo pigment may have in terms of its chemical structure, it is needless to say that a tautomer having a structure other than the described is also possible.

D-1

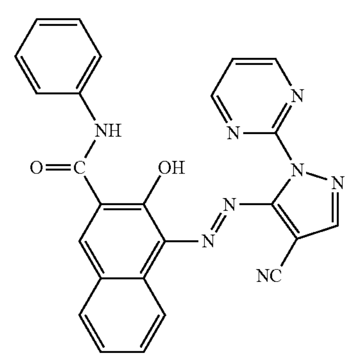

-continued
D-2
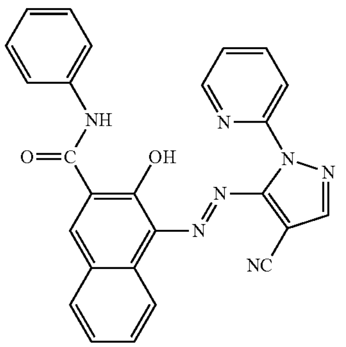
D-3
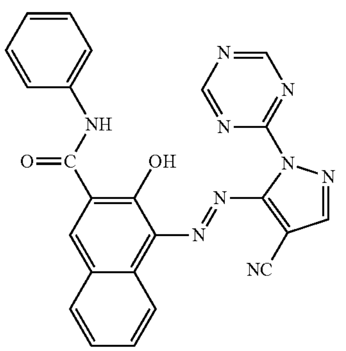
D-4
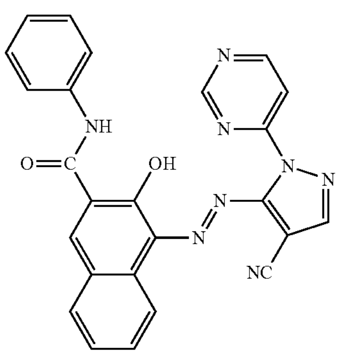
D-5
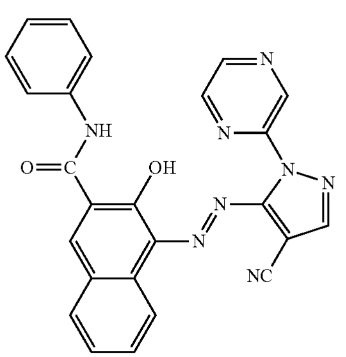
-continued
D-6
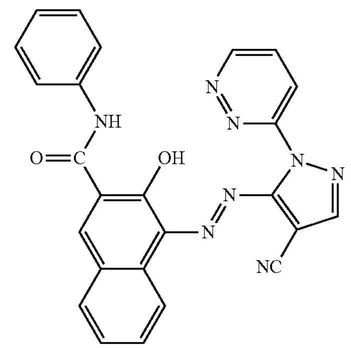
D-7
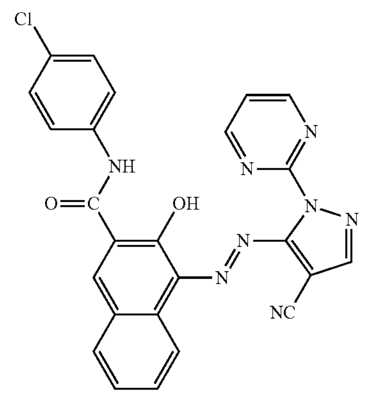
D-8
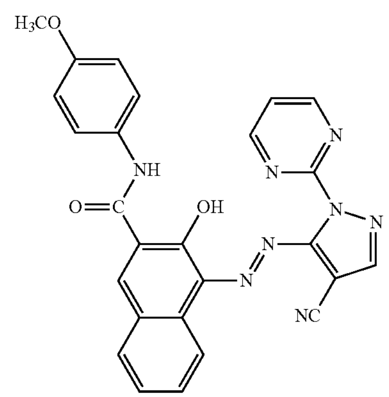
D-9
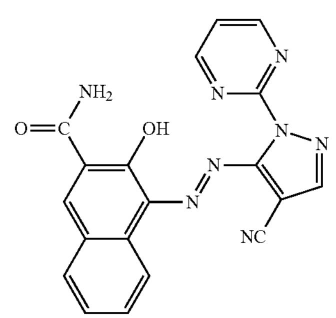

-continued
D-10
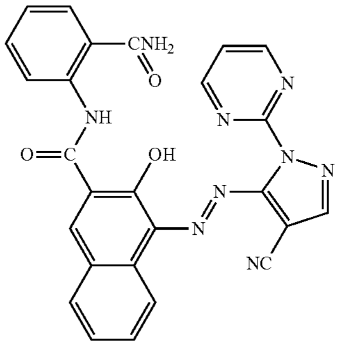
D-11
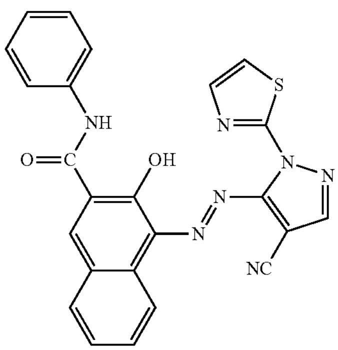
D-12
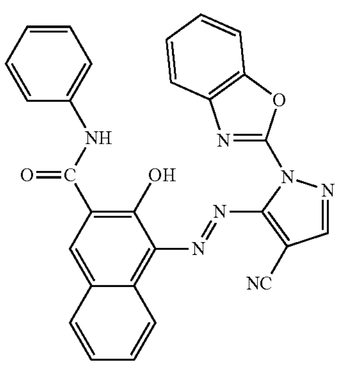
D-13
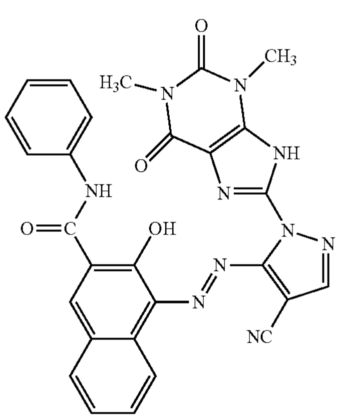
-continued
D-14
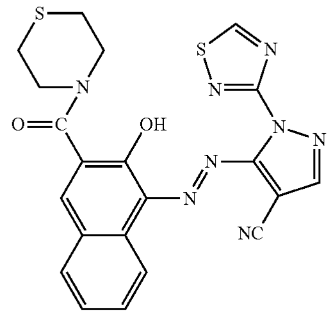
D-15
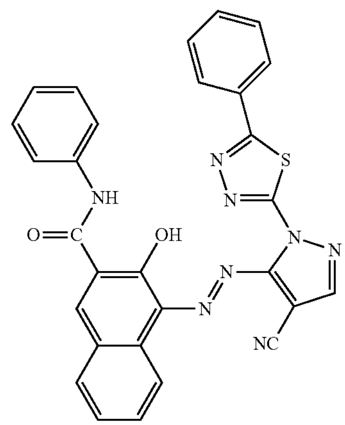
D-16
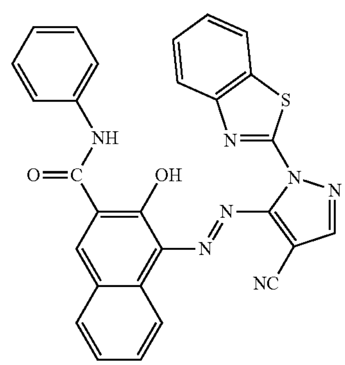
D-17
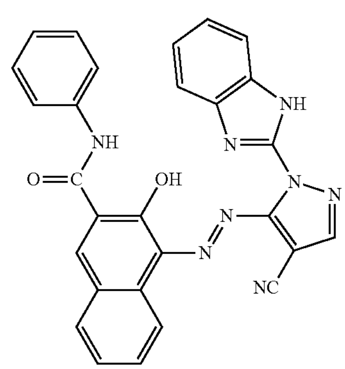

-continued
D-18
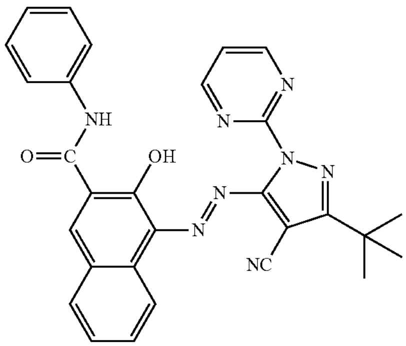
D-19
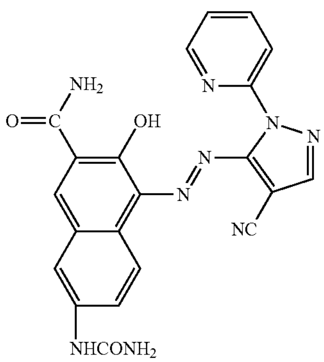
D-20
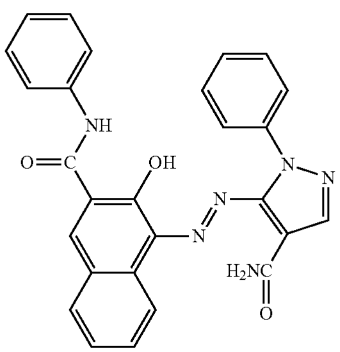
D-21
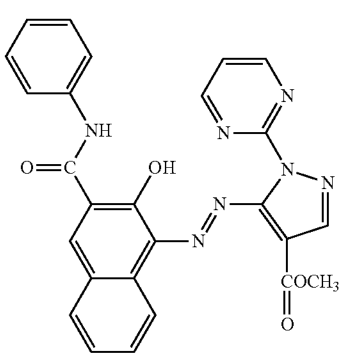
-continued
D-22
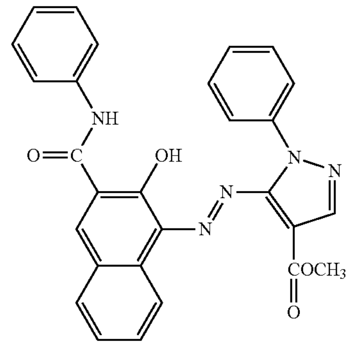
D-23
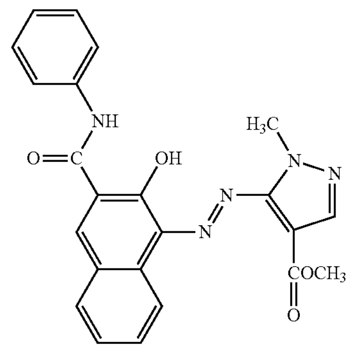
D-24
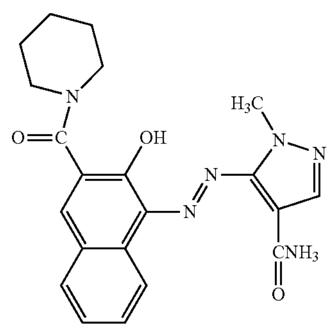
D-25
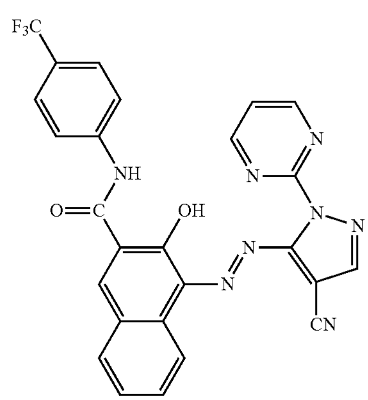

-continued
D-26
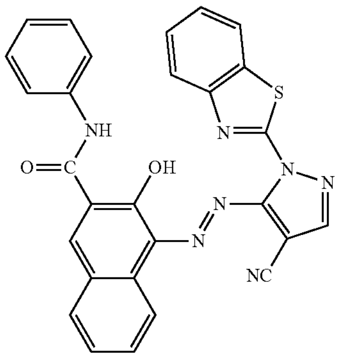
D-27
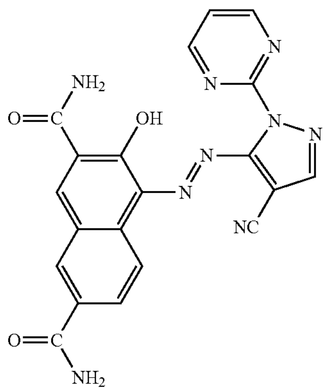
D-28
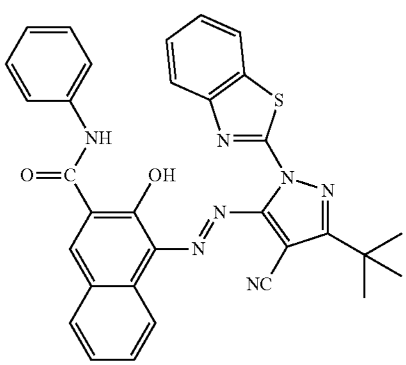
D-29
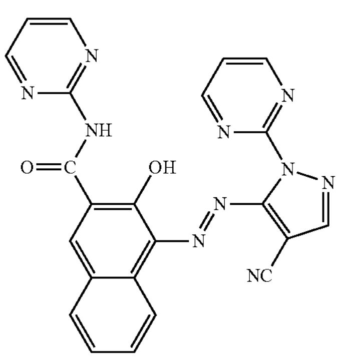
-continued
D-30
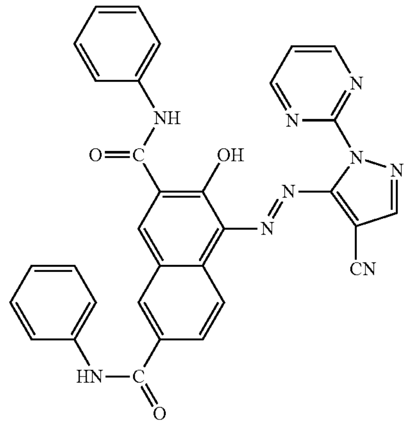
D-31
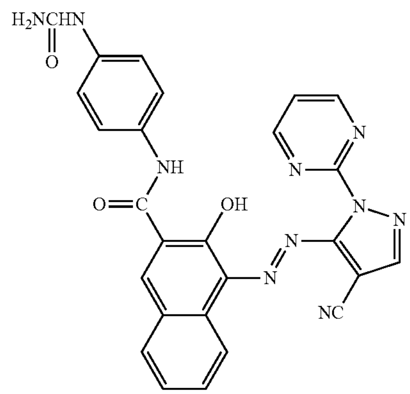
D-32
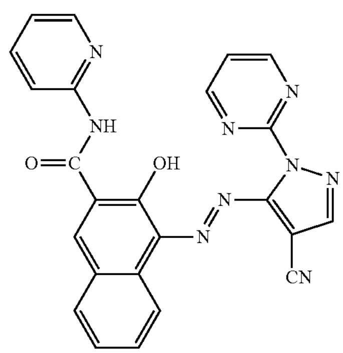
D-33
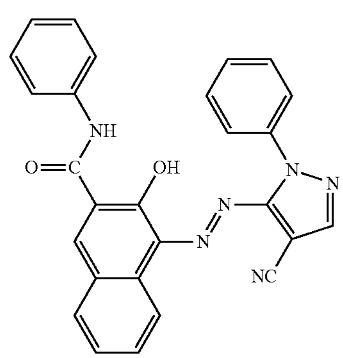

-continued
D-34
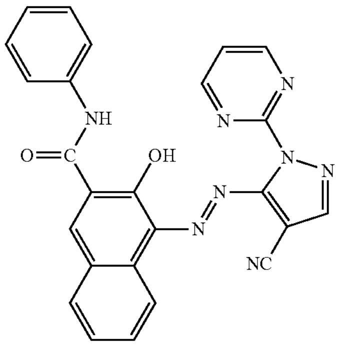
D-35
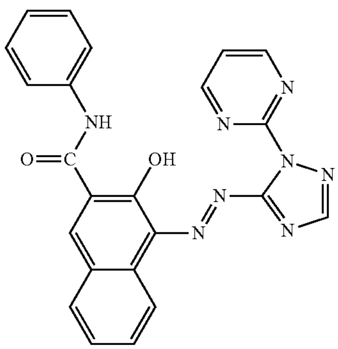
D-36
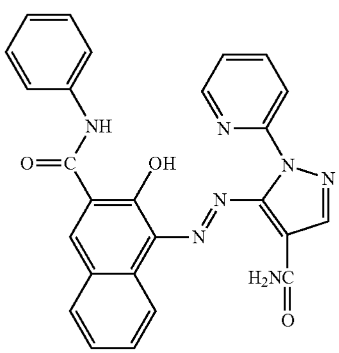
D-37
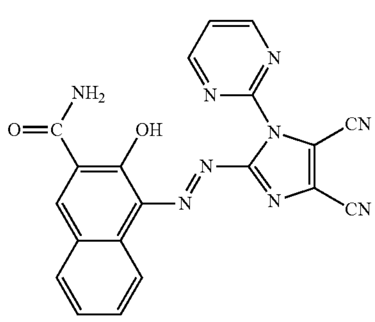
-continued
D-38
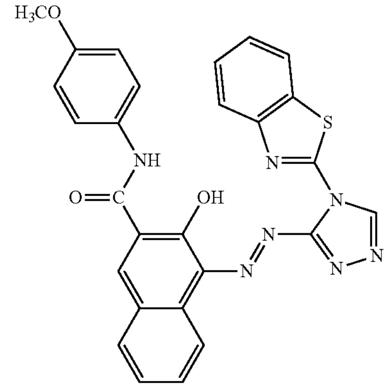
D-39
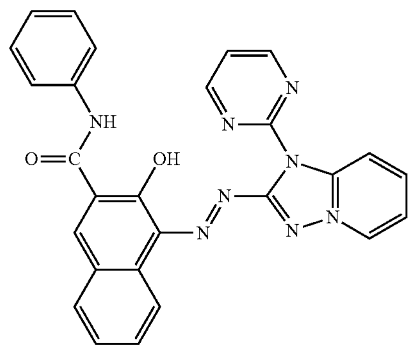
D-40
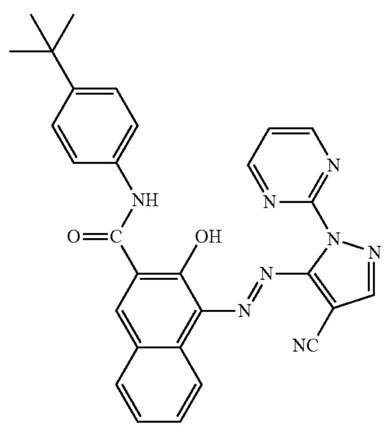
D-41
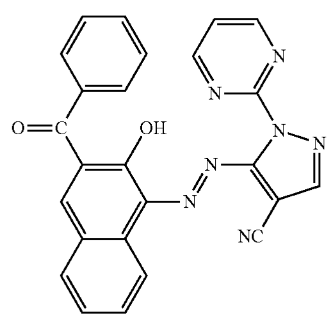

-continued
D-42
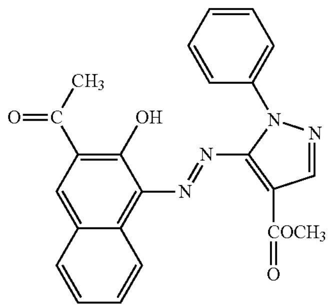
D-43
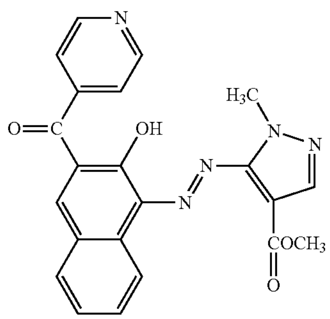
D-44
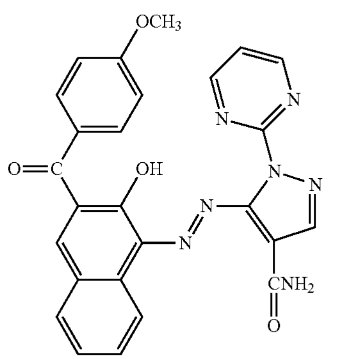
D-45
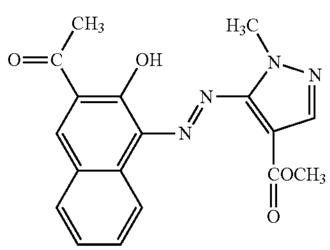
D-71
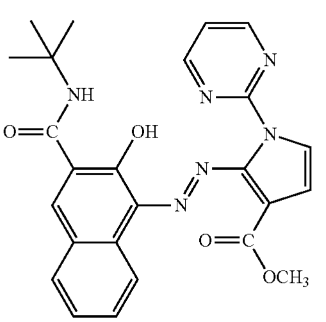
-continued
D-72
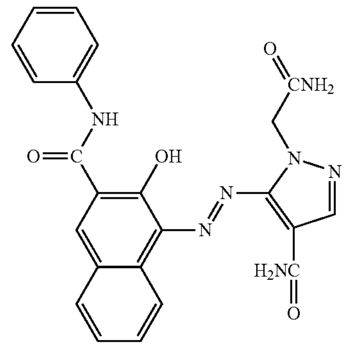
D-73
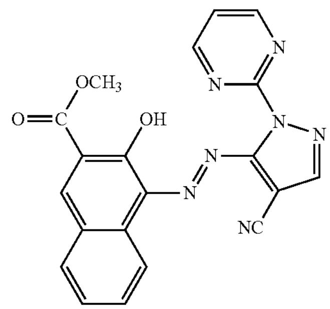
D-74
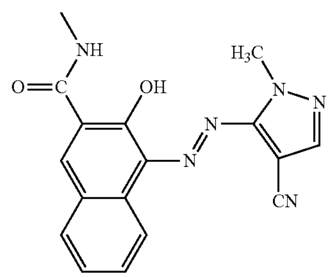
D-75
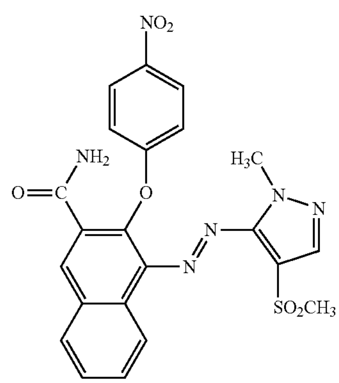
D-76
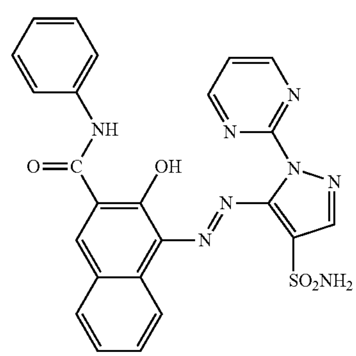

-continued
D-77
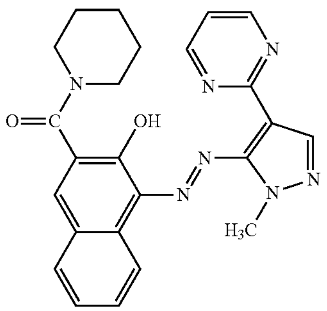
D-78
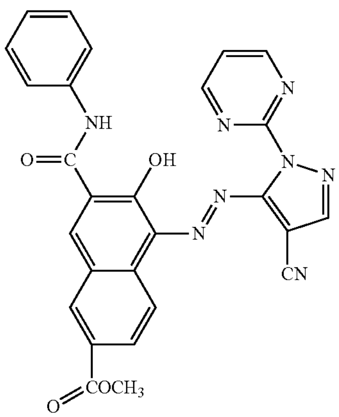
D-79
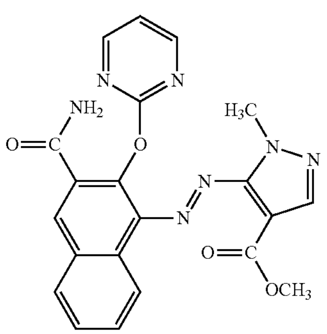
D-80
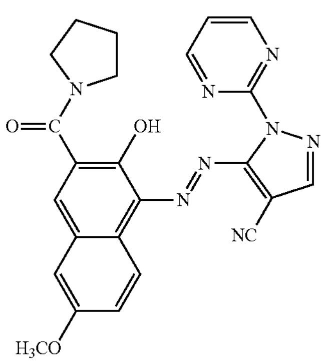
-continued
D-81
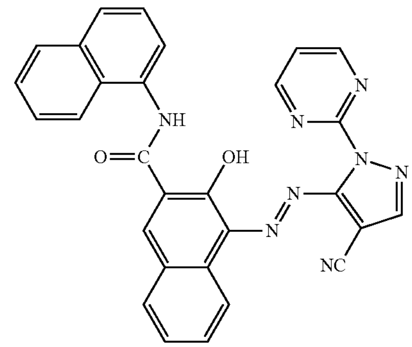
D-82
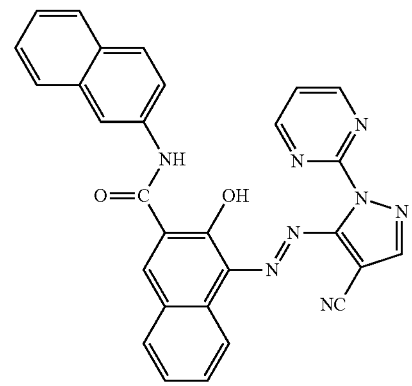
D-83
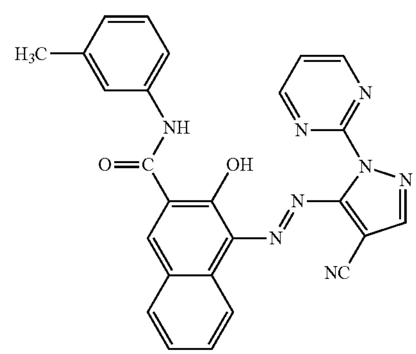
D-84
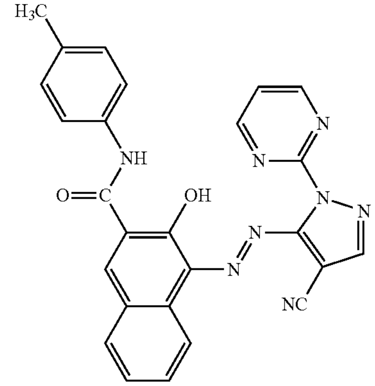

-continued
D-85
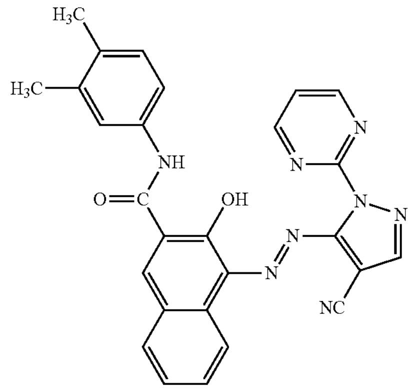
D-86
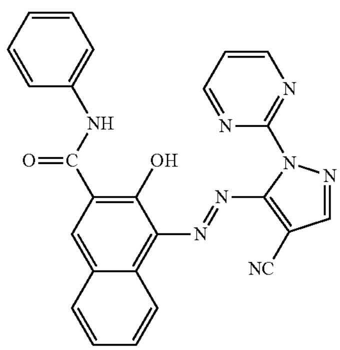
D-87
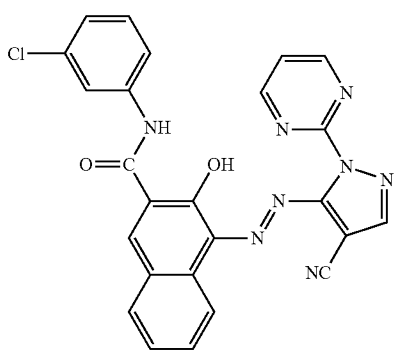
D-88
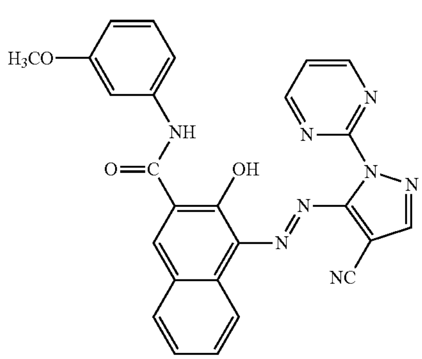
-continued
D-89
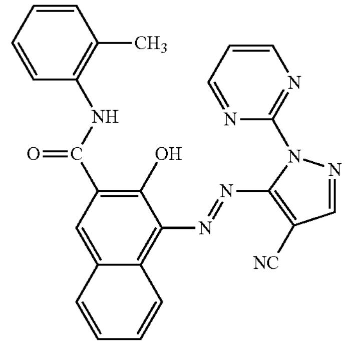
D-90
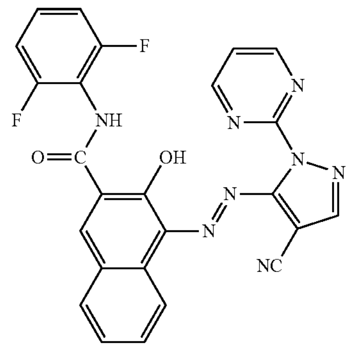
D-91
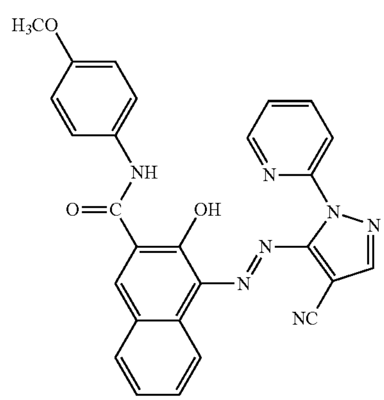
D-92
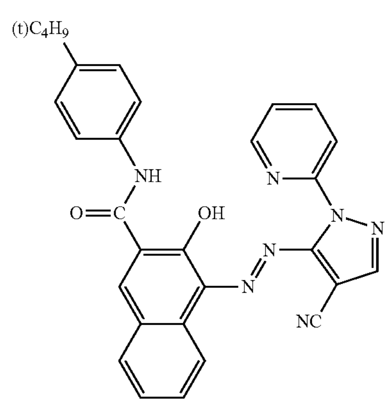

-continued
D-93
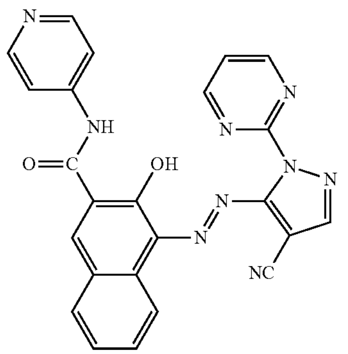
D-94
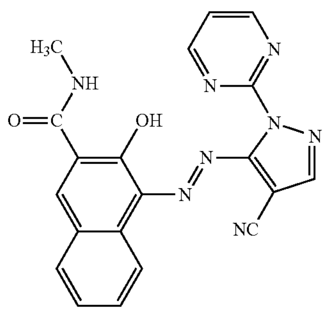
D-95
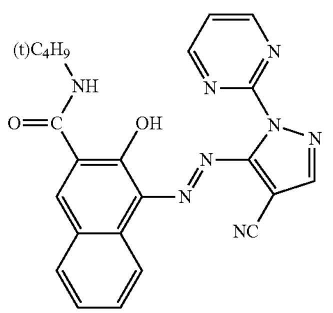
D-96
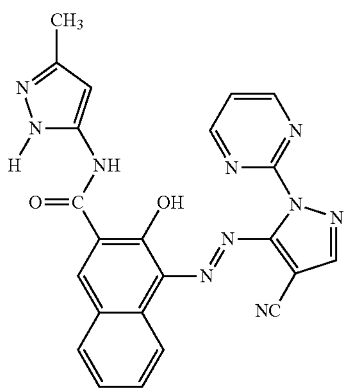
-continued
D-97
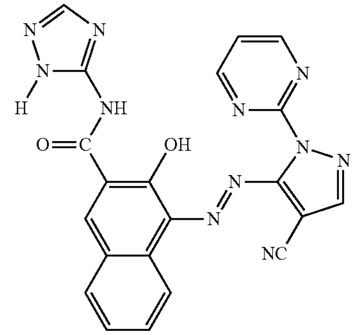
D-98
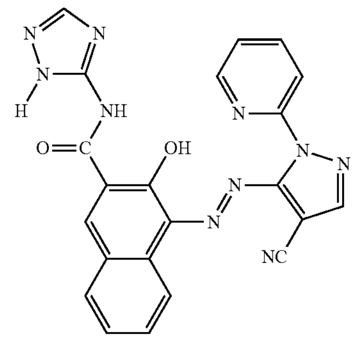
D-99
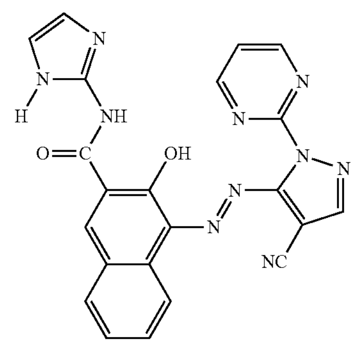
D-100
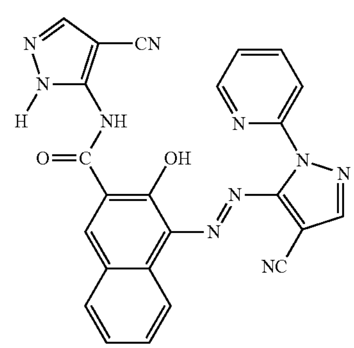

-continued
D-151
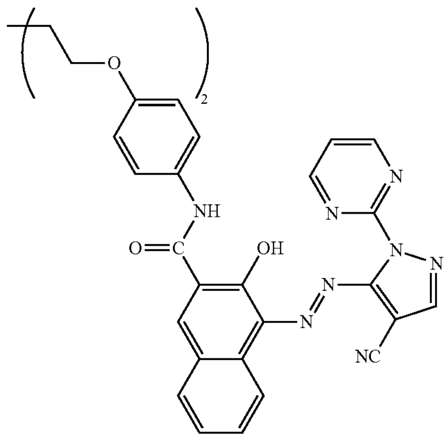
D-152
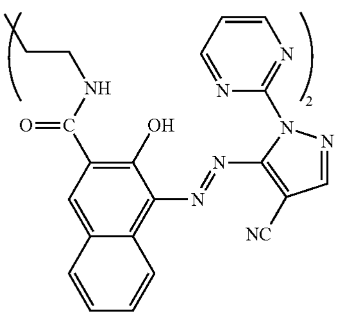
D-153
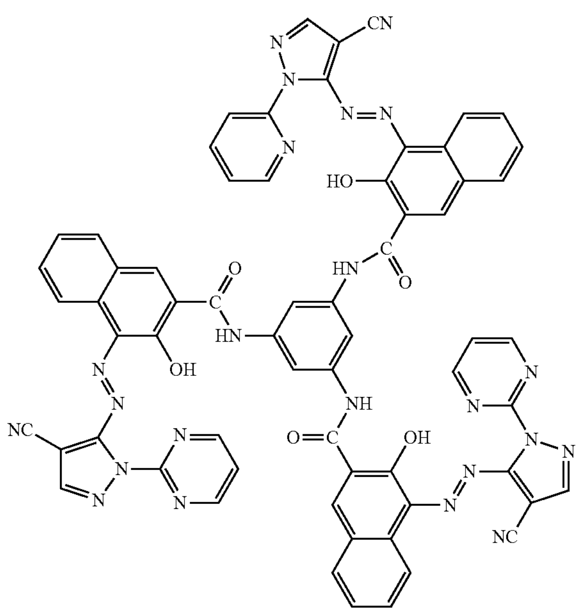
-continued
D-154
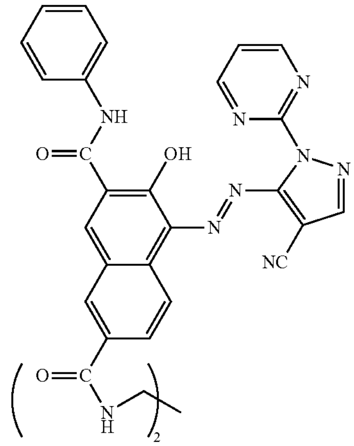
D-155
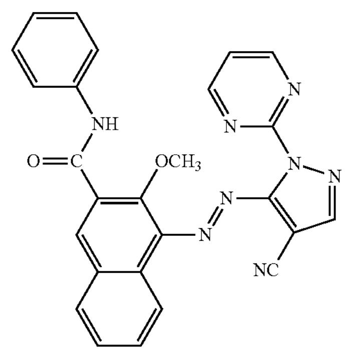
D-156
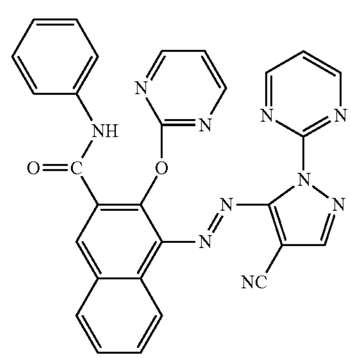

D-157
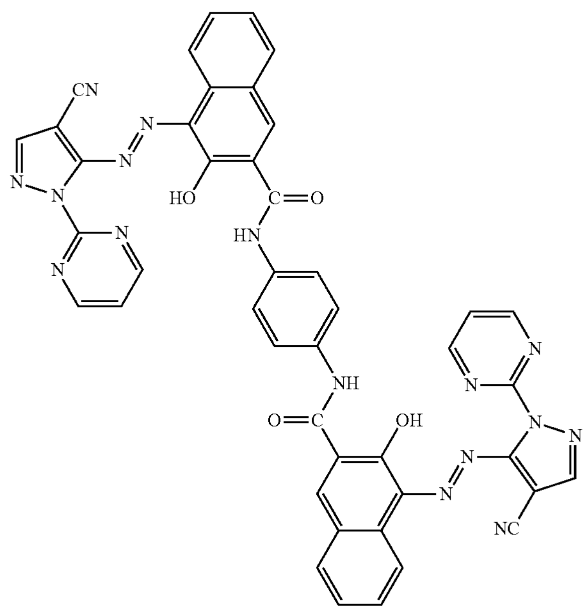
D-101
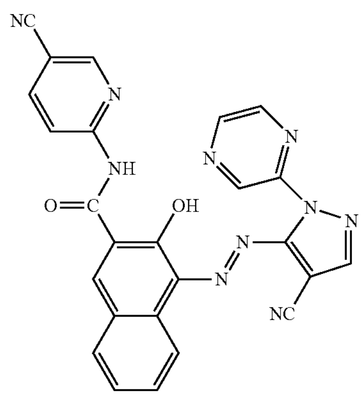
D-102
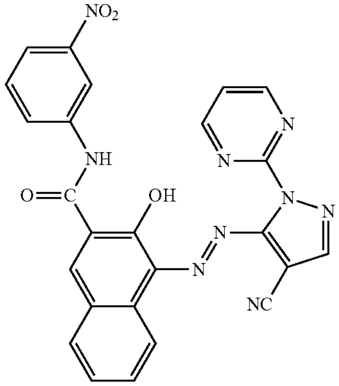
D-103
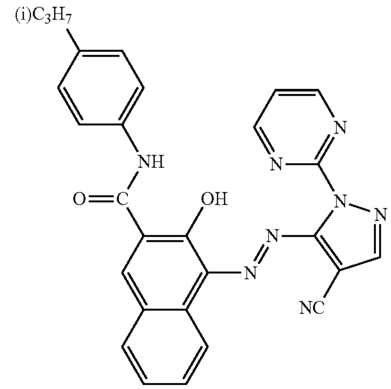
D-104
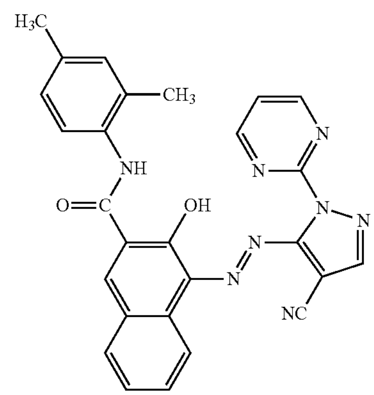
D-105
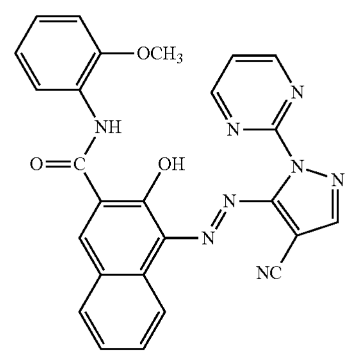
D-106
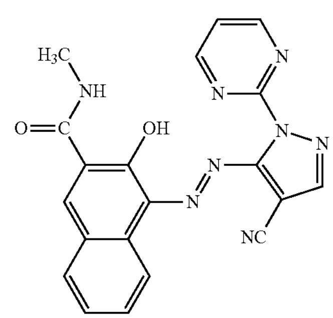

D-107
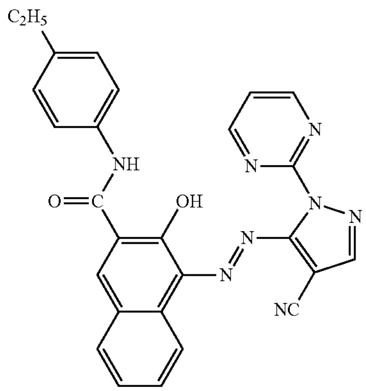
D-108
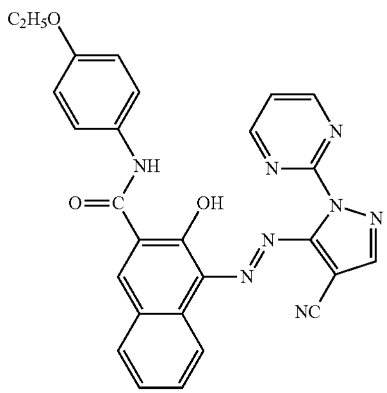
D-109
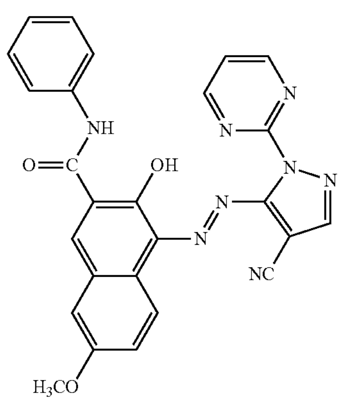
D-110
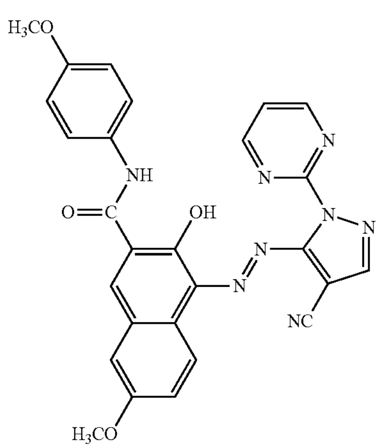
D-111
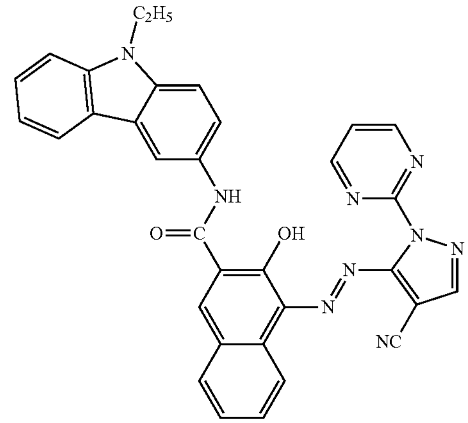
D-112
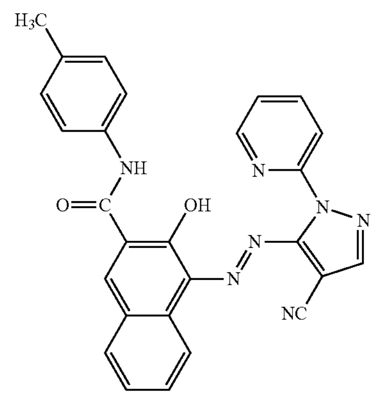
D-113
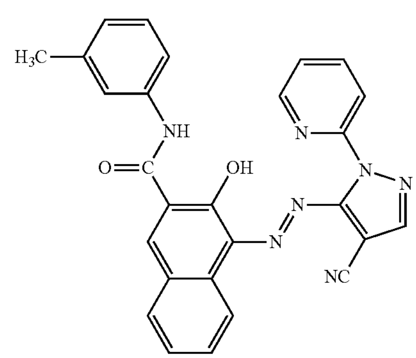
D-114
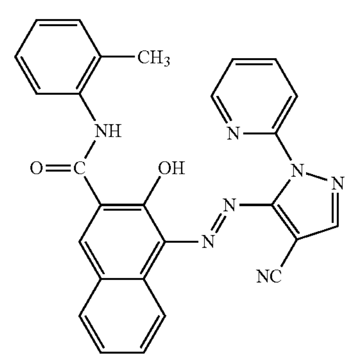

-continued
D-115
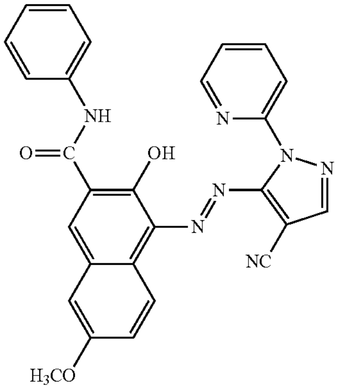
D-116
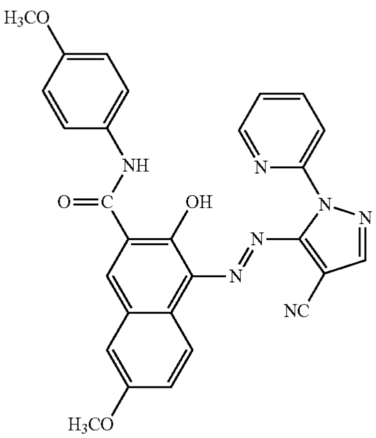
D-117
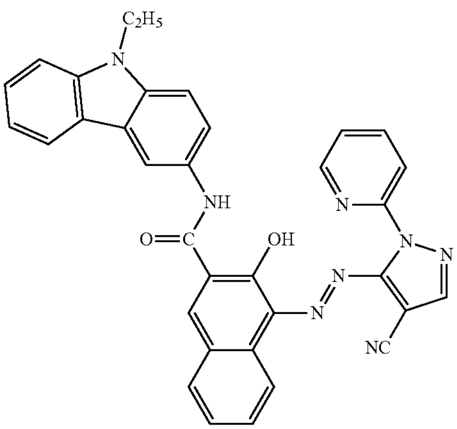
D-118
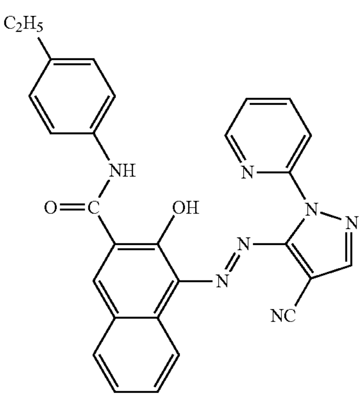
-continued
D-119
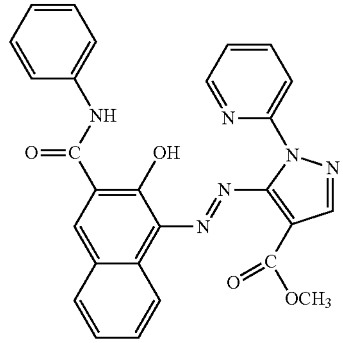
D-120
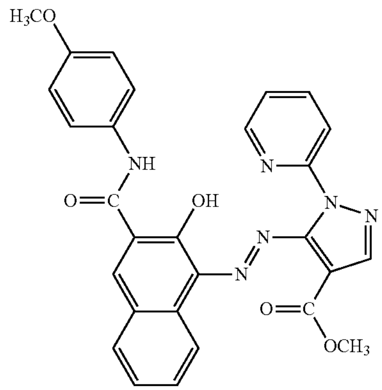
D-121
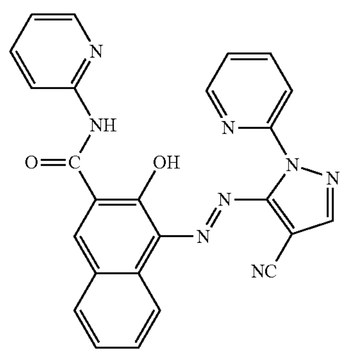
D-122
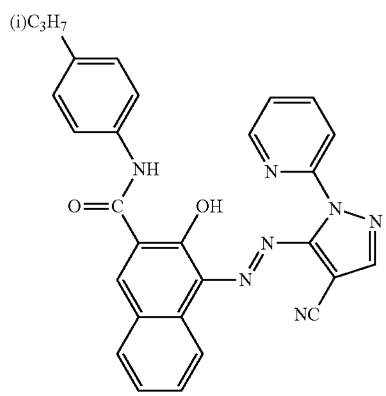

-continued
D-123
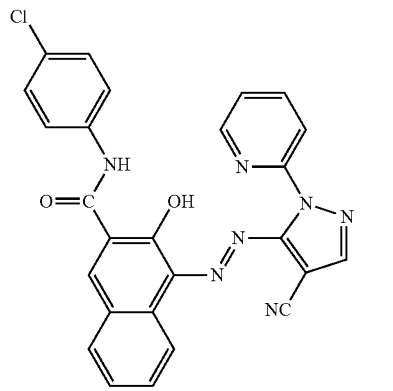
D-124
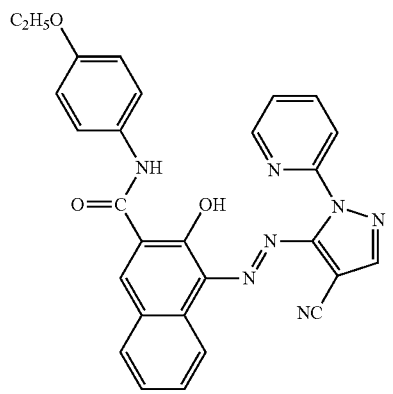
D-125
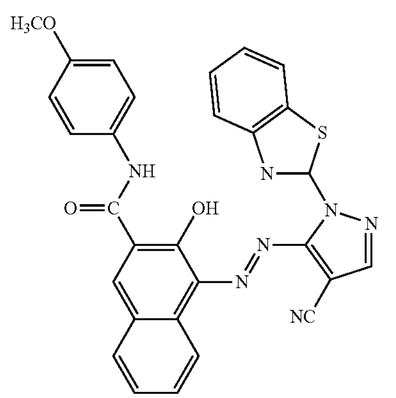
D-126
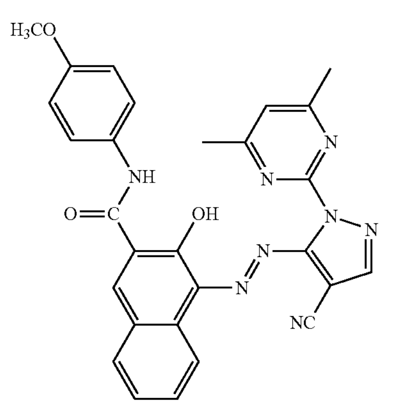
-continued
D-127
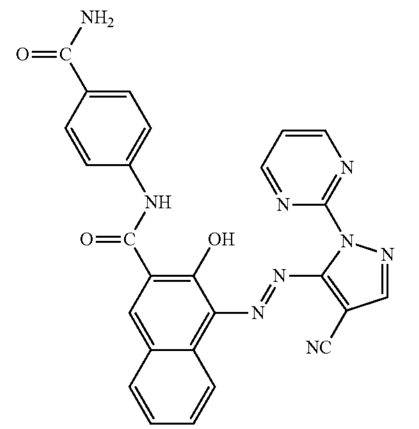
D-128
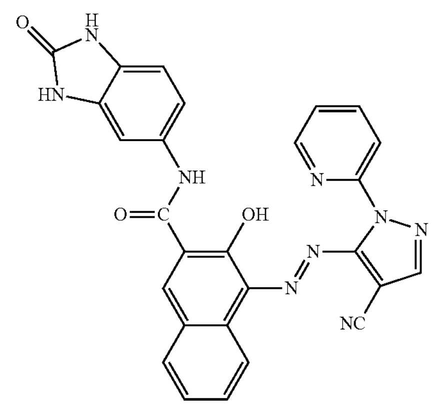
D-129
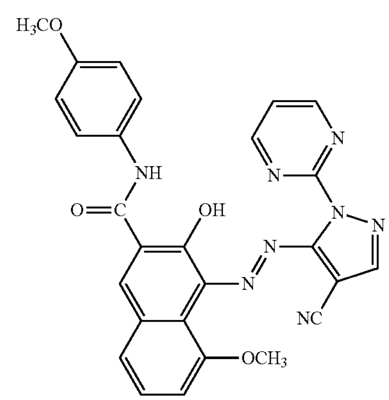
D-130
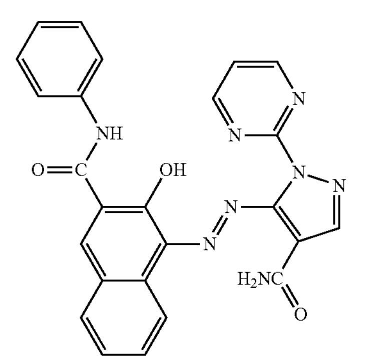

D-131
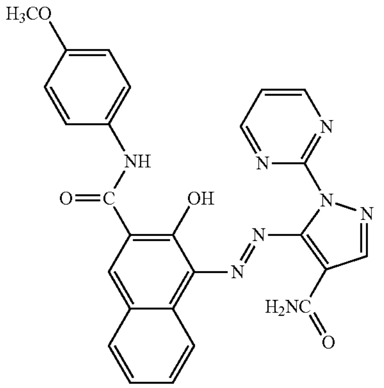
D-132
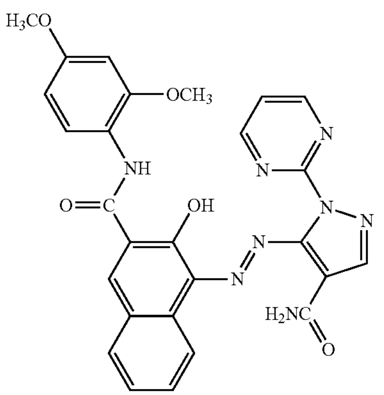
D-133
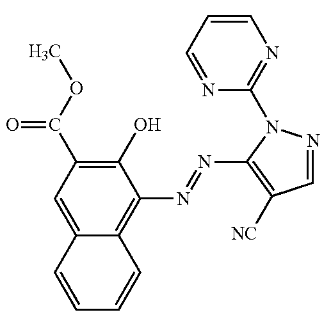
D-134
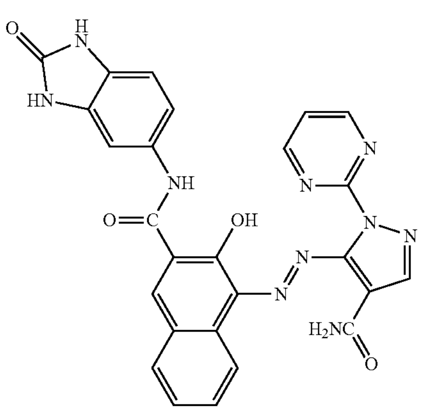
D-135
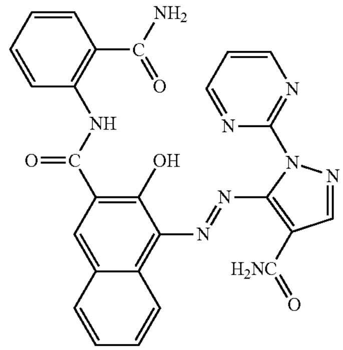
D-136
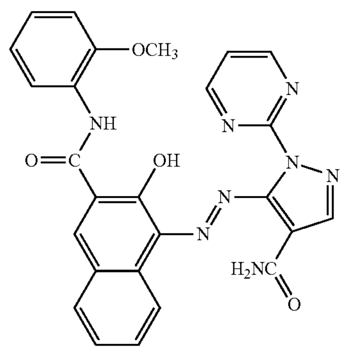
D-137
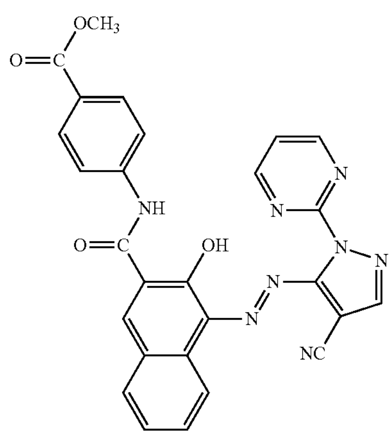
D-138
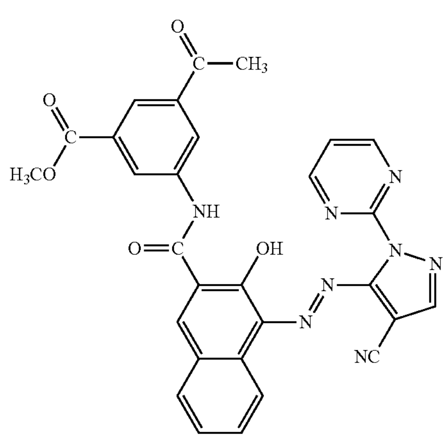

D-139
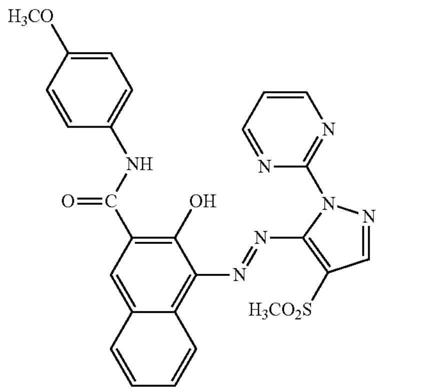
D-140
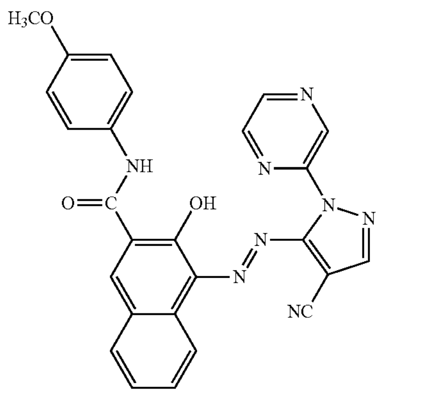
D-141
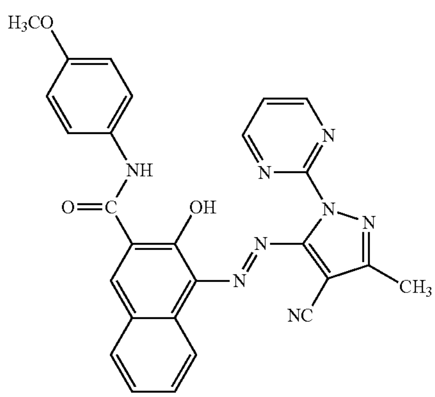
D-142
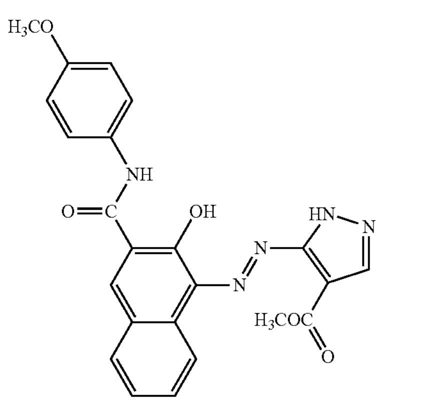
D-143
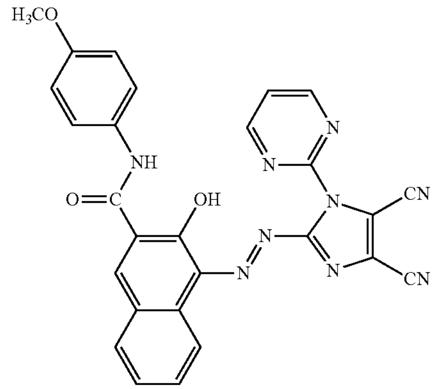
D-144
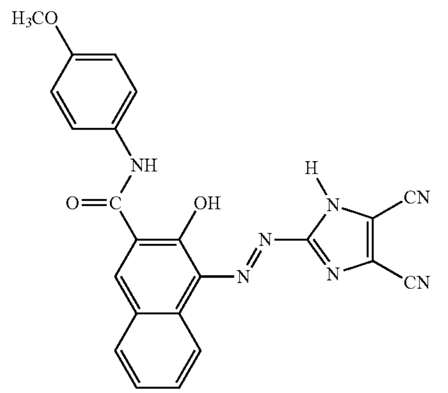
D-145
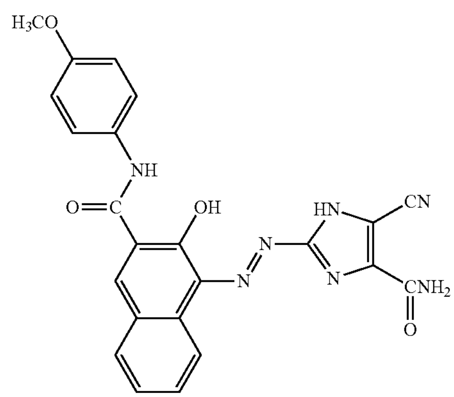
D-146
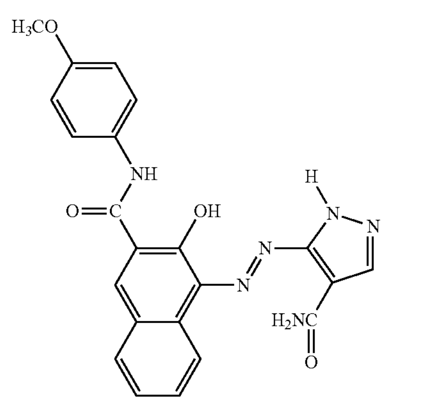

D-147
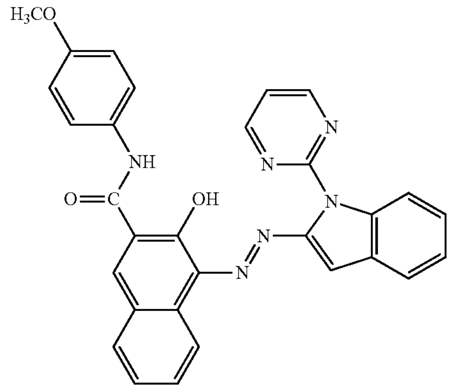
D-148
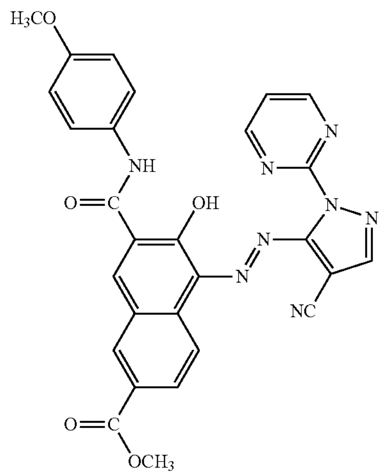
D-149
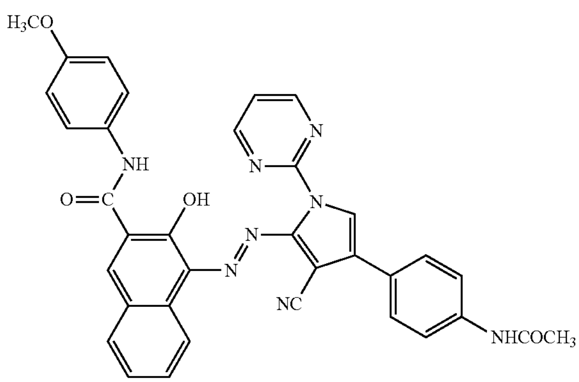
D-150
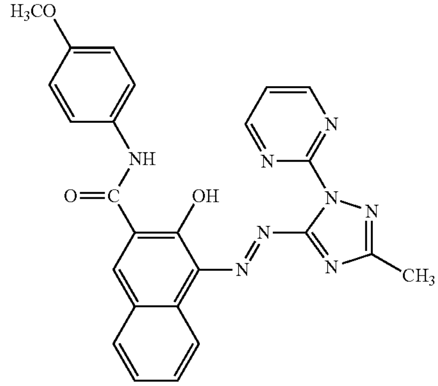
D-171
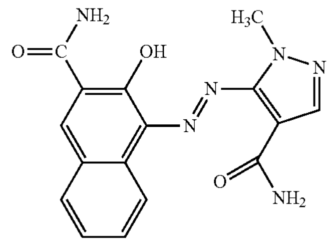
D-172
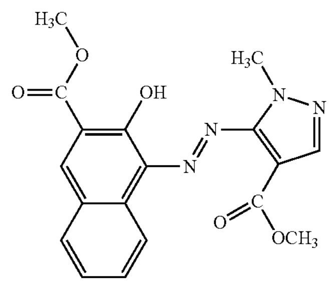
D-173
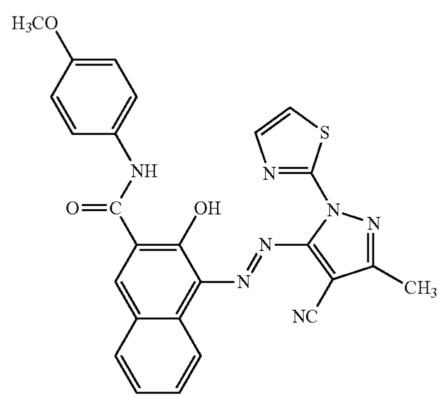
D-174
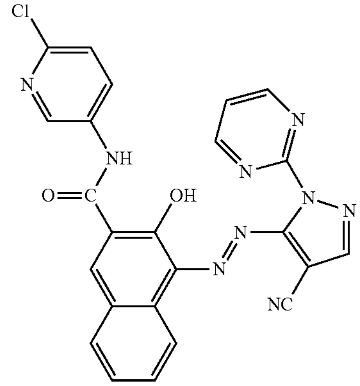

-continued
D-175
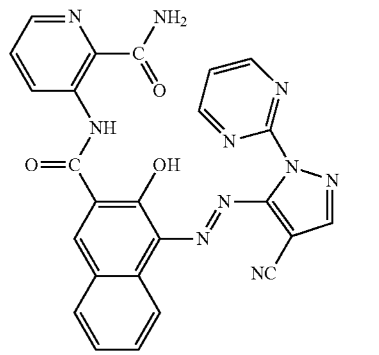
D-176
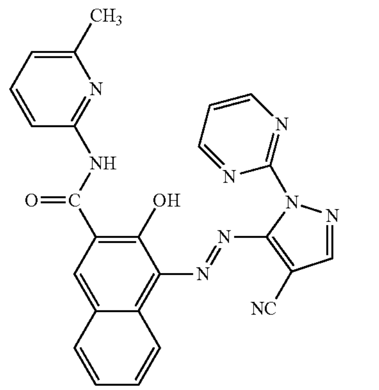
D-177
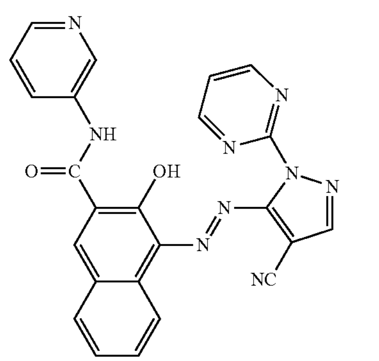
D-178
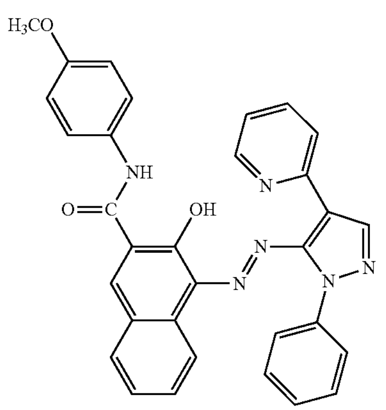
-continued
D-201
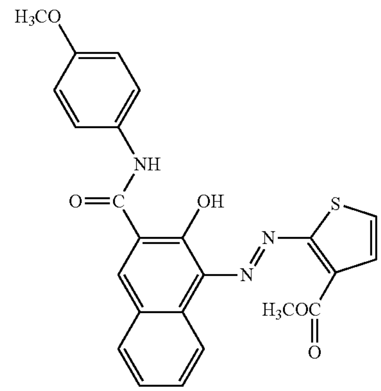
D-202
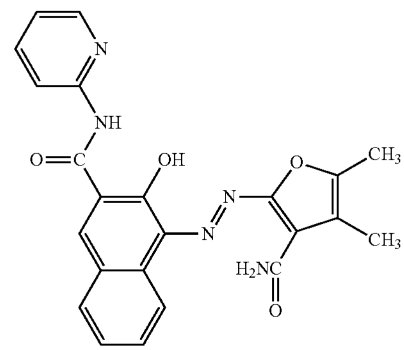
D-203
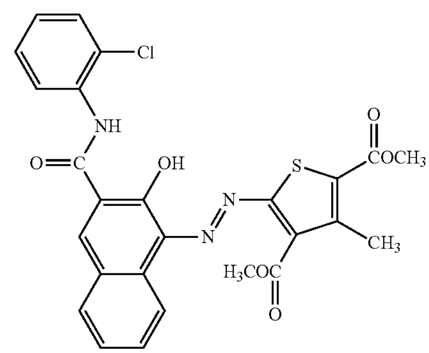
D-204
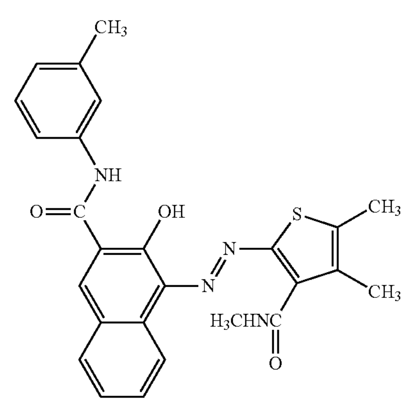

-continued
D-205
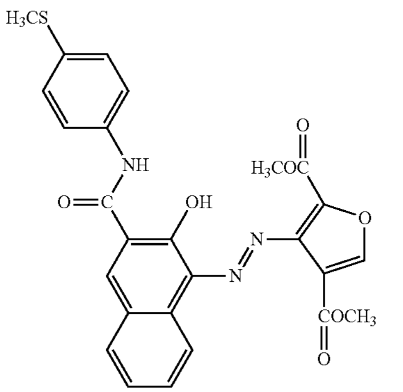
D-206
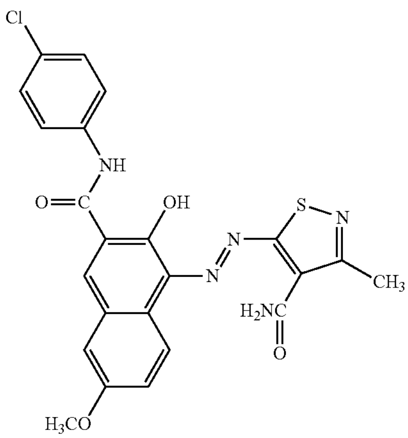
D-207
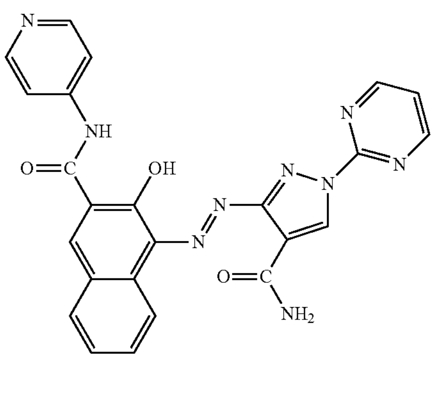
D-208
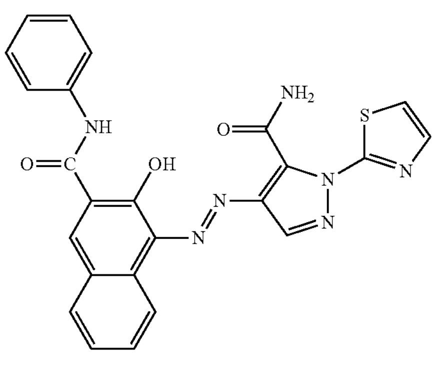
-continued
D-209
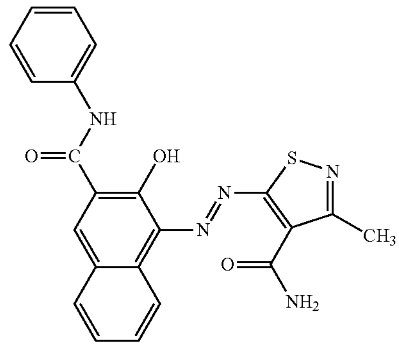
D-210
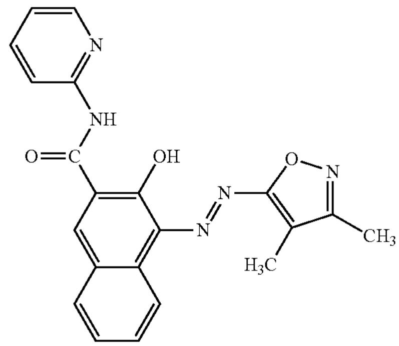
D-211
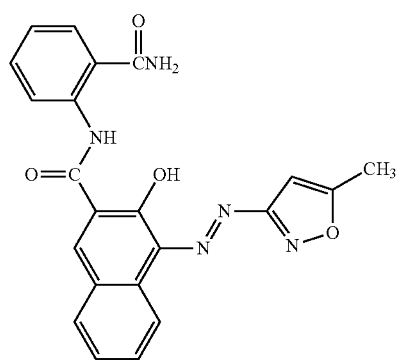
D-212
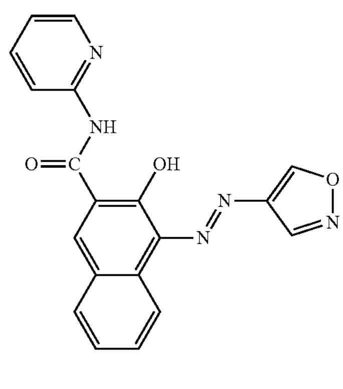

D-213
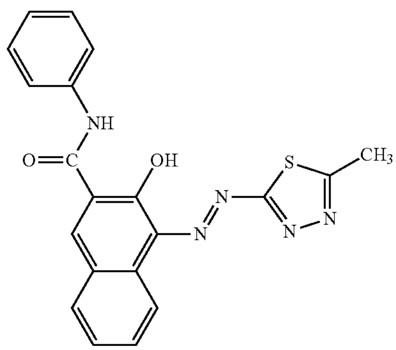
D-214
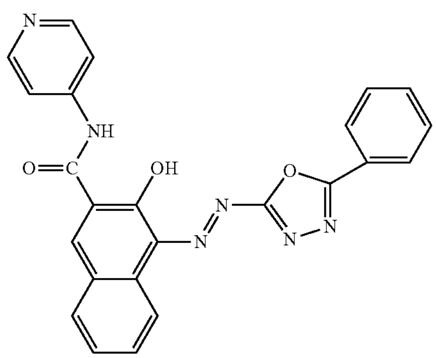
D-215
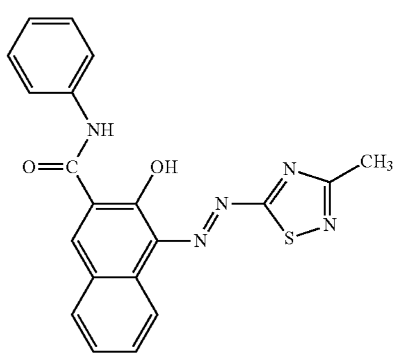
D-216
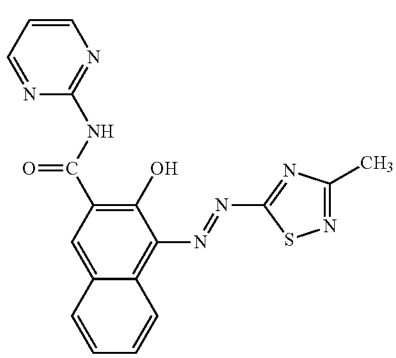
D-217
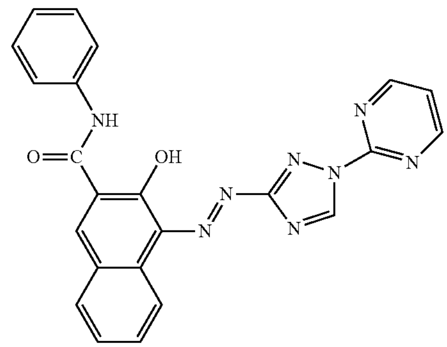
D-218
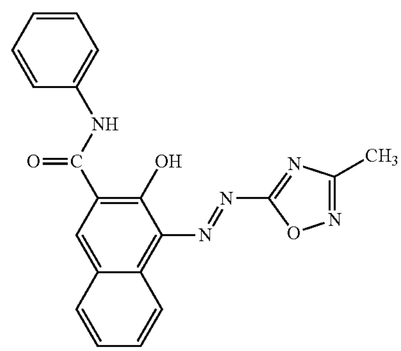
D-219
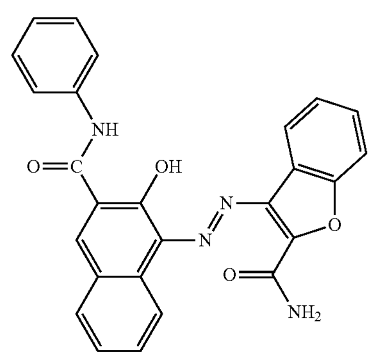
D-220
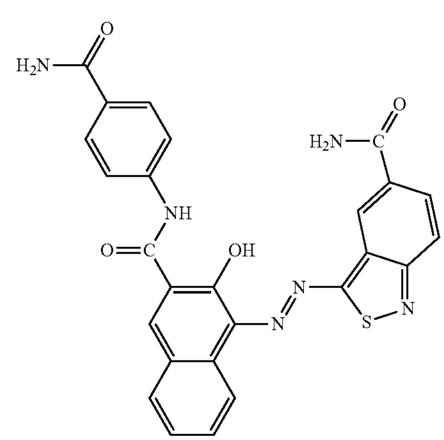

-continued
D-221
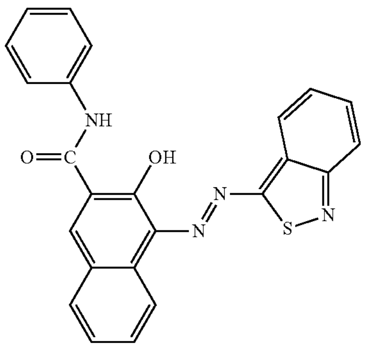
D-222
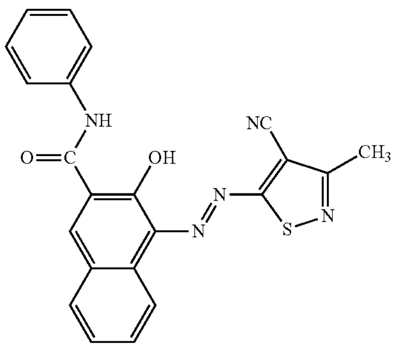
D-223
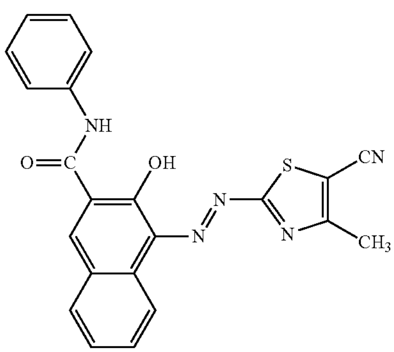
D-224
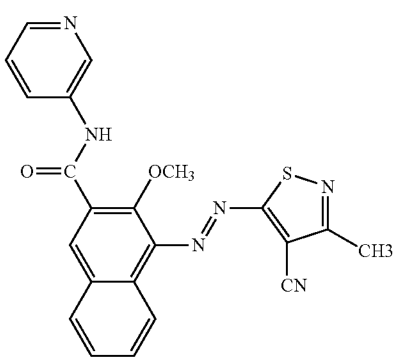
-continued
D-225
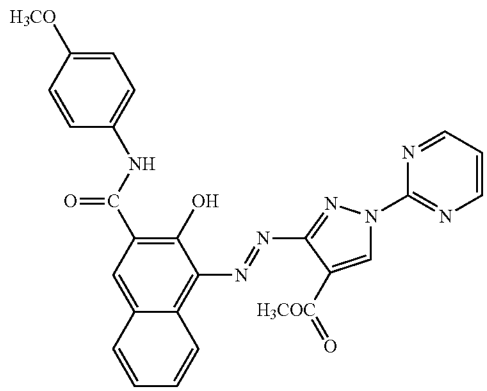
D-226
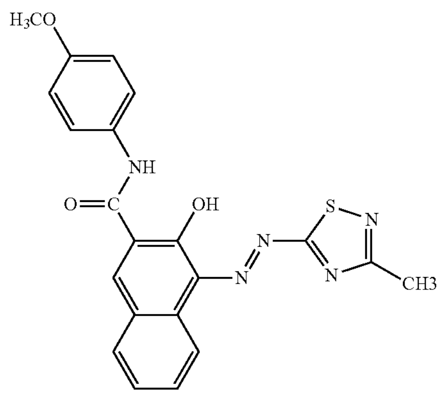
D-227
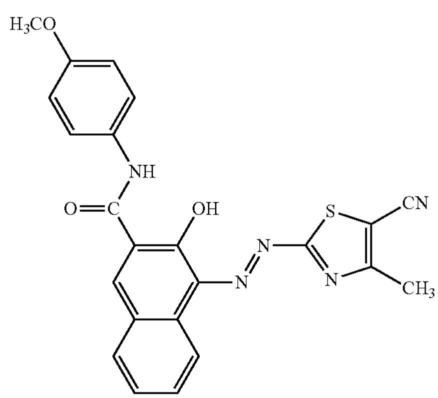
D-228
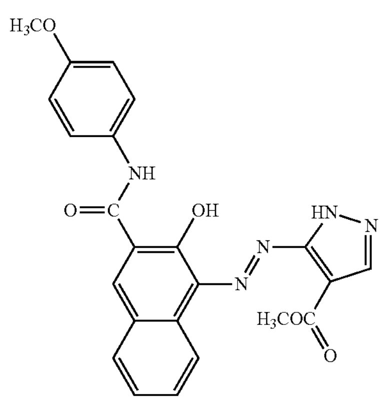

D-229
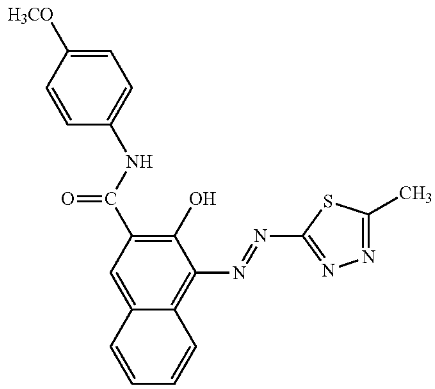
D-230
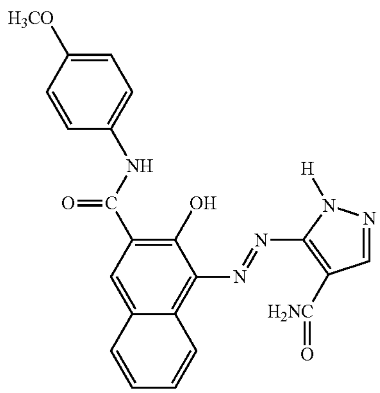
D-231
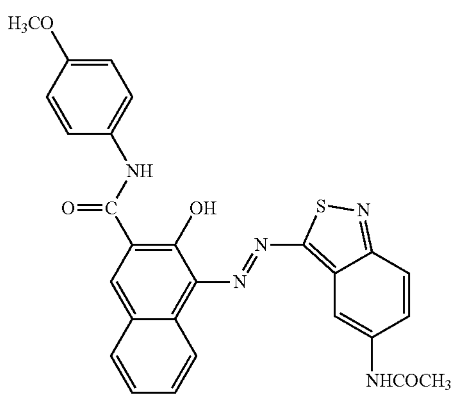
D-232
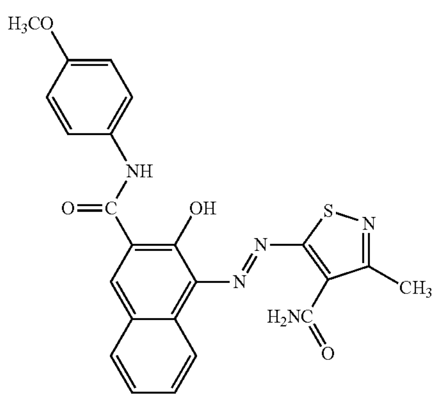
D-233
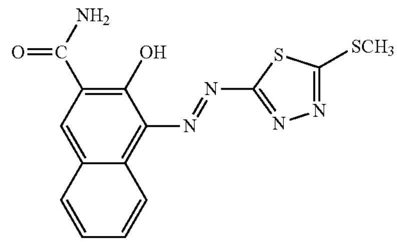
D-234
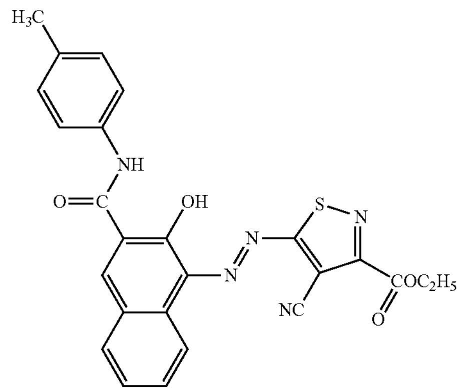
D-235
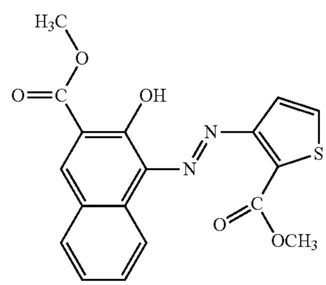
D-236
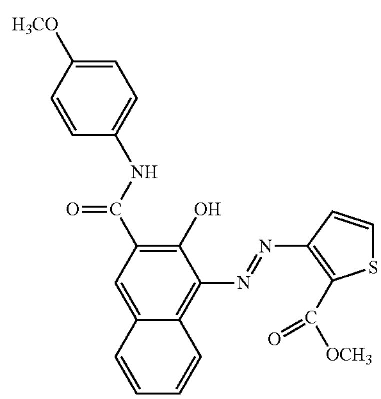

D-237
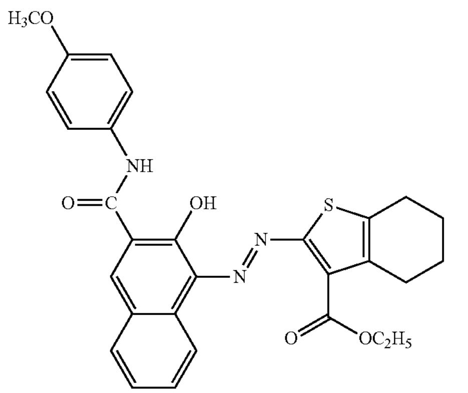
D-238
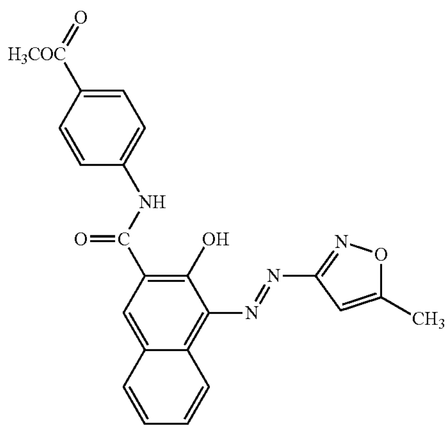
D-239
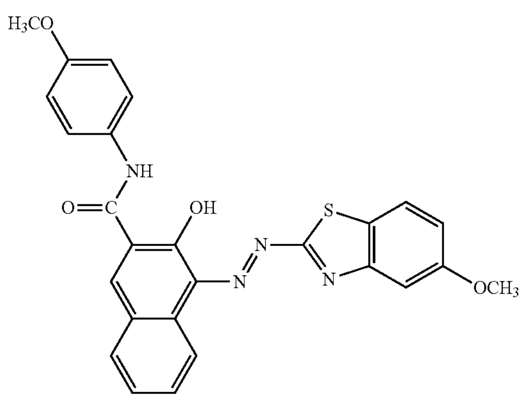
D-240
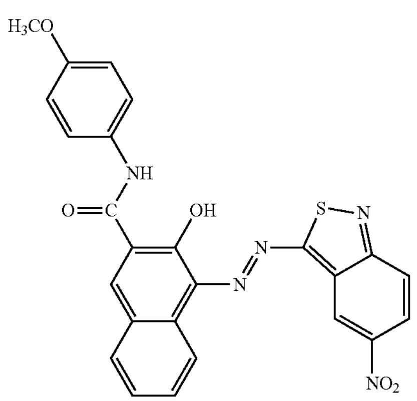
D-241
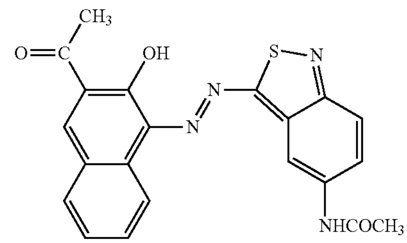
D-242
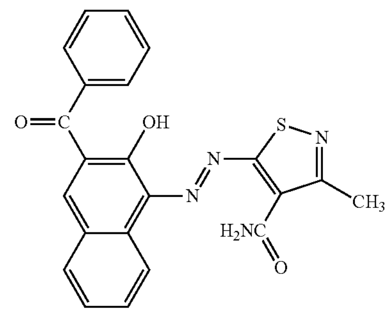
D-243
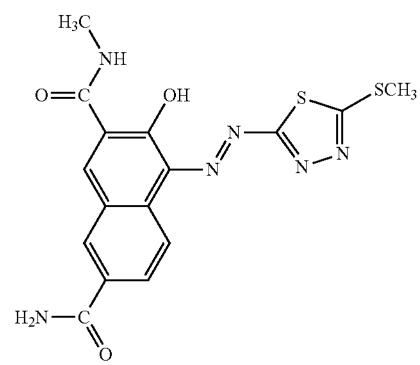
D-244
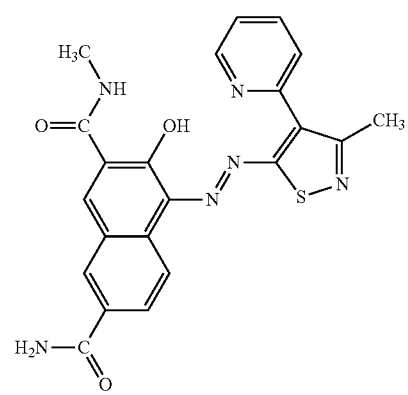
D-245
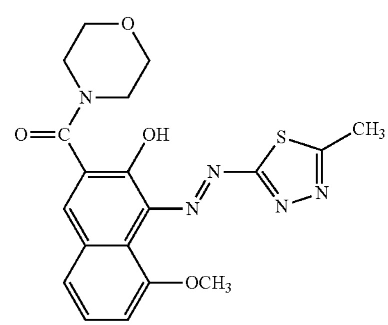

D-246
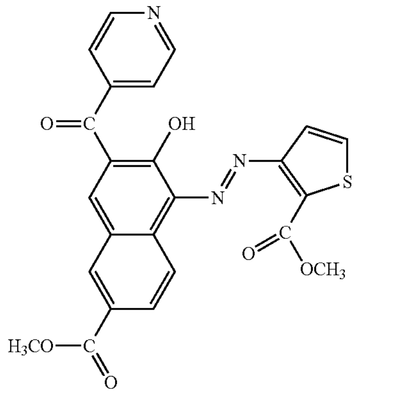
D-247
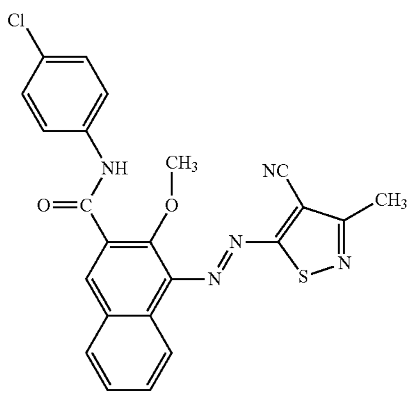
D-251
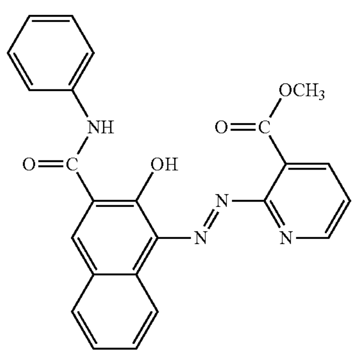
D-252
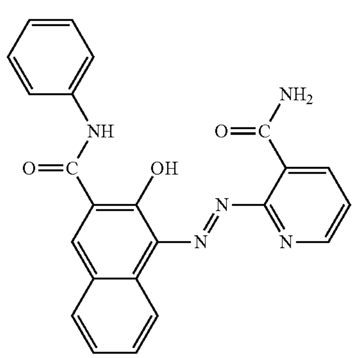
D-253
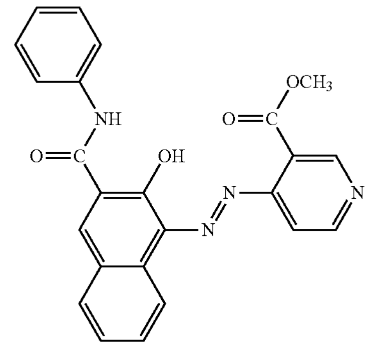
D-254
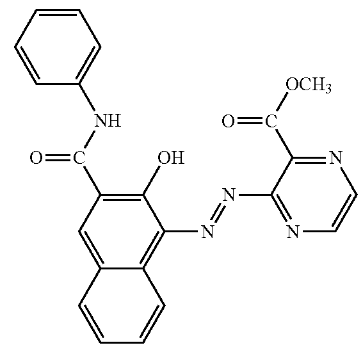
D-255
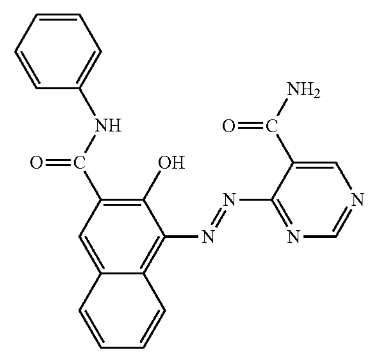
D-256
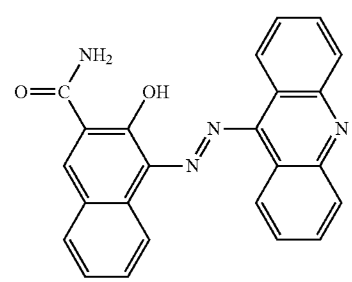

-continued
D-257
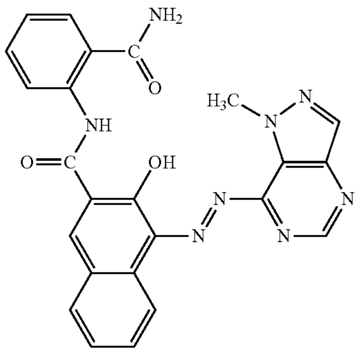
D-258
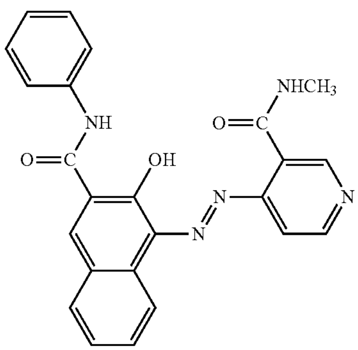
D-259
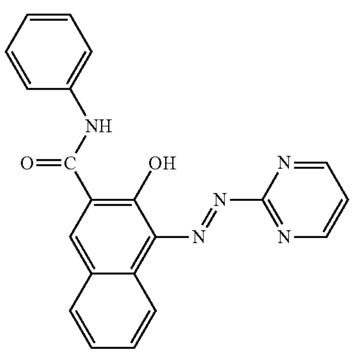
D-260
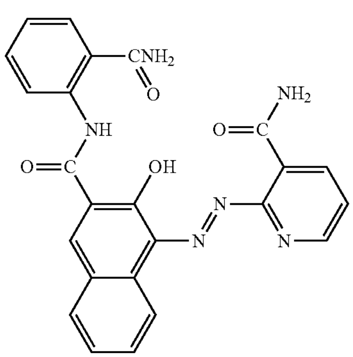
-continued
D-261
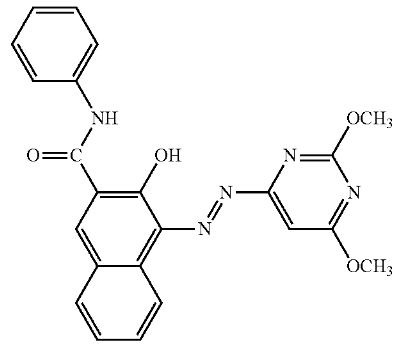
D-262
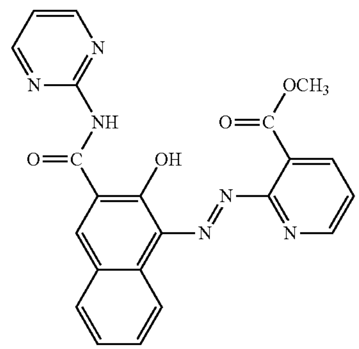
D-263
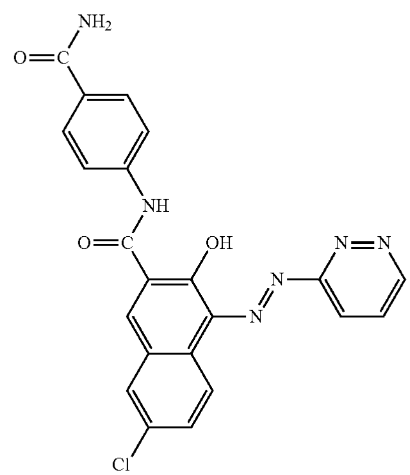
D-264
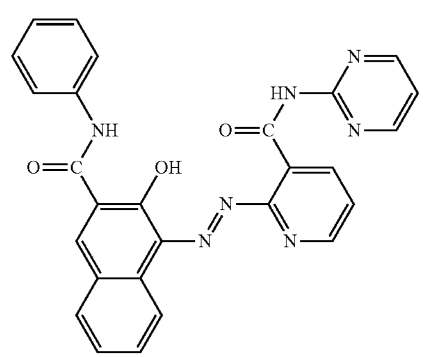

D-265

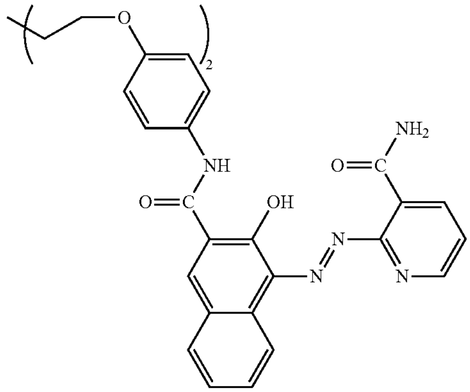

D-266

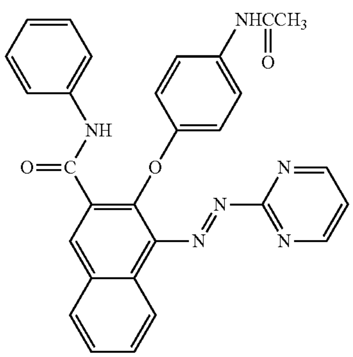

D-267

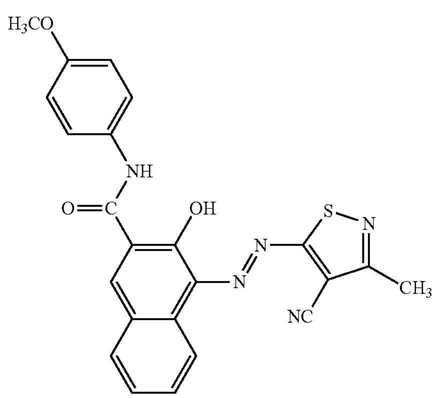

D-268

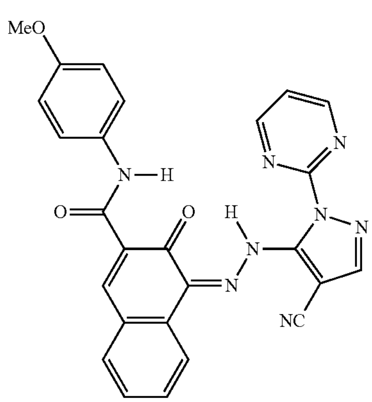

D-269

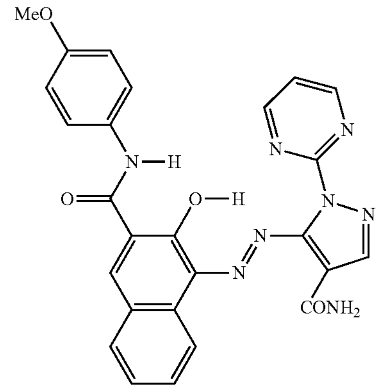

D-270

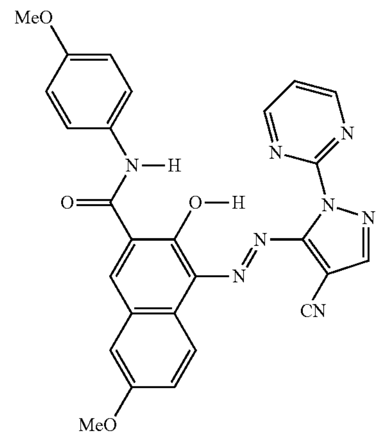

The azo pigment represented by Formula (1) has a chemical structure of Formula (1) or Formula (2), or a tautomer thereof, and may be a pigment having a crystal form, which is called "polymorph".

The crystal polymorphism means crystals have an identical chemical composition but with different arrangements of building blocks (i.e., molecules or ions). Based on the crystal structures, chemical and physical properties are determined, and polymorphs may be distinguished from each other in view of their rheology, color, and other color properties. Different polymorphs may be confirmed or distinguished by X-ray diffraction (result of powder X-ray diffraction measurement) or X-Ray Analysis (result of X-ray crystal structure analysis).

When an azo pigment represented by Formula (1) or Formula (2) has crystal polymorphism, the azo pigment may have any polymorph, and may be a mixture of two or more polymorphs. However, it is preferable that the azo pigment has a single crystal form as a main component, in other words, it is not preferable that the azo pigment has crystal polymorphism. A content of the azo pigment having a single crystal form is from 70% to 100%, preferably from 80% to 100%, more preferably from 90% to 100%, still more preferably from 95% to 100, and particularly preferably 100%, with respect to the total azo pigment. When an azo pigment having a single crystal form as a main component is used, regularity of the arrangement of pigment molecules is improved and the intermolecular/intramolecular interaction becomes stronger so that a high dimensional, i.e., three-dimensional, network can be easily formed. As a result, it is preferable in terms of the properties required for a pigment, such as improved color, fastness against light, fastness against heat, fastness against humidity, fastness against oxidizing gas, and resistance to solvent.

The mix ratio of the crystal polymorphs in the azo pigment may be determined using physicochemical measurement values of a solid, such as monocrystal X-ray crystal structure analysis, powder X-ray diffraction (XRD), microscopic image of crystal (TEM), or IR (KBr method).

The tautomer and/or the crystal polymorphism may be controlled according to manufacturing conditions for the coupling reaction.

According to the first aspect of the invention, when the azo pigment represented by Formula (1) has an acid group, part or all of the acid groups may be in a salt form, or a pigment in a salt form and a pigment in a free acid form may co-exist. Examples of the salt form include an alkali metal salt of Na, Li, K, or the like, an ammonium salt which may be substituted with an alkyl group or a hydroxyalkyl group, and an organic amine salt. Examples of the organic amine include a lower alkyl amine, a lower alkyl amine substituted with a hydroxyl group, a lower alkyl amine substituted with a carboxyl group, and polyamine having 2 to 10 alkylene imine units each having 2 to 4 carbon atoms. Type of the salt form is not limited to a single type, and plural types thereof may co-exist.

With respect to the structure of the pigment used in the first aspect of the invention, when the pigment has a structure in which plural acid groups are included in a single molecule thereof, the plural acid groups may each be in a salt form or an acid form, and may be different from each other.

According to the first aspect of the invention, the azo pigment represented by Formula (1) may be a hydrate which contains a water molecule in the crystal thereof.

The pigment dispersion composition according to the first aspect of the invention may contain two or more types of azo pigments each represented by Formula (1).

The term "azo pigment represented by Formula (1)" as used herein means not only one type of azo pigment represented by Formula (1) but also a combination of two or more types of azo compounds each represented by Formula (1), and a combination of azo pigment represented by Formula (1) with another pigment described below.

Next, an exemplary method of producing an azo pigment represented by Formula (1) is explained.

An azo pigment represented by Formula (1) may be produced as follows. For example, an azo pigment represented by Formula (6) (an example of the azo pigment represented by Formula (1)) may be produced by converting a heterocyclic amine compound represented by the following Formula (4) to a diazonium in a non-aqueous acidic condition, and then performing a coupling reaction of the diazonium with a compound represented by the following Formula (5) in an acidic state, followed by a conventional post-treatment. Another azo pigment represented by Formula (1) may be produced by substantially the same process, except that the heterocyclic amine compound represented by Formula (4) is changed to another heterocyclic amine compound which corresponds to "A" in Formula (1).

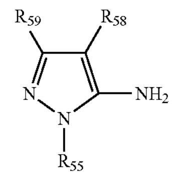

(4)

In Formula (4), $R_{55}$ and $R_{59}$ have the same definitions as defined in Formula (2), and $R_{58}$ represents a hydrogen atom or a substituent which has the same definition as that of the substituent represented by $R_{58}$ in Formula (1).

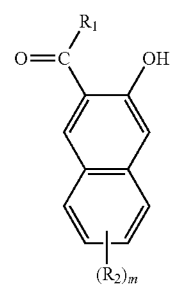

(5)

In Formula (5), $R_1$, $R_2$ and m have the same definitions as defined in Formula (1).

The reaction scheme for the azo pigment represented by Formula (6) is shown below.

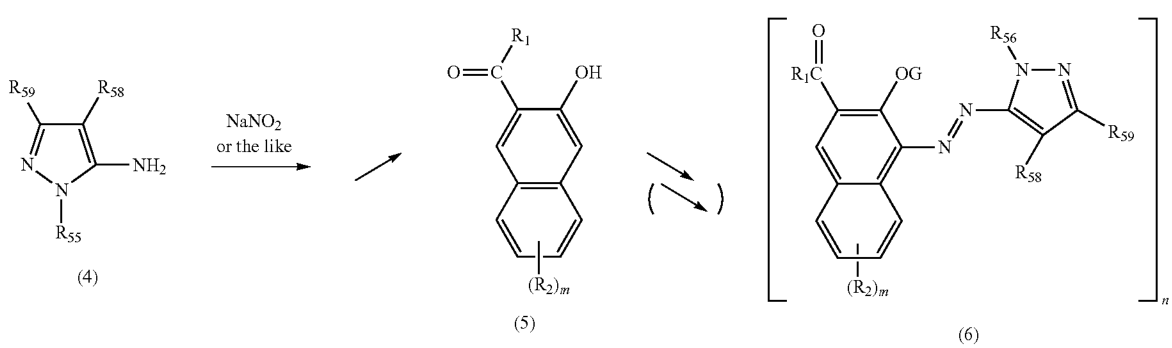

In Formulae (4) to (6), G, $R_1$, $R_2$, $R_{55}$, $R_{58}$, $R_{59}$, m, and n have the same definitions as defined in Formula (1) or Formula (2).

Some of the heterocyclic amines described as amine compounds of Formulae (4) and (A-1) to (A-32) are available as commercial products. In general, they may be produced according to a well known method, for example, the method described in Japanese Patent (JP-B) No. 4022271. The heterocyclic coupler represented by Formula (5) is available as a commercial product, or it may be produced according to the method described in JP-A No. 2008-13472 or a similar method.

The diazonium reaction of the heterocyclic amine as expressed by the above reaction scheme may be carried out, for example, by reacting the heterocyclic amine with a reagent such as sodium nitrite, nitrosyl sulfate, or isoamyl nitrite in an acidic solvent such as sulfuric acid, phosphoric acid, or acetic acid for 10 minutes to 6 hours at a temperature of 15° C. or less. The coupling reaction may be carried out by reacting the diazonium salt obtained by this method and a compound represented by Formula (5) for 10 minutes to 12 hours at a temperature of 40° C. or less, or preferably 25° C. or less.

An azo pigment represented by Formula (1) or Formula (2) in which n is 2 or more may be synthesized by producing starting materials represented by Formula (4) and Formula (5), respectively, into which a substitutable divalent, trivalent or tetravalent substituent is introduced to any one of $R_1$ to $R_2$, $R_{55}$, $R_{59}$, and $R_{58}$ of Formula (4) or Formula (5), and then performing the coupling reaction as shown by the above scheme.

The resultant of the reaction may be in the form of precipitated crystals. However, in general, by adding water or an alcohol solvent to the reaction liquid, crystals may be precipitated and filtered. Further, the precipitated crystals that are precipitated by adding an alcohol solvent, water, or the like to the reaction liquid may be filtered to collect the precipitated crystals. If necessary, the filtered crystals are washed and dried to obtain the azo pigment represented by the Formula (1).

According to the production method above, the azo pigment represented by Formula (1) or Formula (2) is obtained as a crude azo pigment. However, when used as a pigment of the invention, it is preferable that a post-treatment is carried out therefor. Examples of the post treatment include a process of controlling pigment particles by a grinding treatment or a solvent heating treatment, such as solvent salt milling, salt milling, dry milling, solvent milling, or acid pasting, and a surface treatment process using a resin, a surfactant, and/or a dispersant.

The azo pigment represented by Formula (1) or Formula (2) which is obtained as a crude azo pigment is preferably subjected to a solvent heating process and/or solvent salt milling as a post-treatment.

By performing solvent salt milling, the average primary particle diameter of the azo pigment represented by Formula (1) may be easily adjusted to be in the preferred ranges described above.

Examples of the solvent used for the solvent heating treatment include water, an aromatic hydrocarbon solvent such as toluene or xylene, a halogenated hydrocarbon solvent such as chlorobenzene or o-dichlorobenzene, an alcohol solvent such as isopropanol or isobutanol, a polar aprotic organic solvent such as N,N-dimethylformamide, N,N-dimethylacetamide, or N-methyl-2-pyrrolidone, glacial acetic acid, pyridine, and a mixture of these solvents. To the solvent, an inorganic or organic acid or a base may be further added. The temperature of the solvent heating treatment varies depending on a desired primary particle diameter (i.e., average primary particle diameter) of the pigment, and is preferably from 40 to 150° C., and more preferably from 60 to 100° C. The treatment time is preferably from 30 minutes to 24 hours.

In an example of the solvent salt milling, the crude azo pigment, an inorganic salt, and an organic solvent which does not dissolve the salt may be added into a mixing machine, and then kneaded and ground.

As for the inorganic salt, a water-soluble inorganic salt may be appropriately used. Examples thereof include inorganic salts such as sodium chloride, potassium chloride, or sodium sulfate.

Further, an inorganic salt having an average particle diameter (i.e., average primary particle diameter) of from 0.5 μm to 50 μm is more preferable. The amount of the inorganic salt to be used is preferably 3 to 20 times the mass of the crude azo pigment, and more preferably 5 to 15 times the mass of the crude azo pigment.

The organic solvent may be a water-soluble organic solvent. Since the solvent tends to be easily evaporated according to the temperature increase during kneading, a solvent having a high boiling point is preferable in terms of safety. Examples of the organic solvent include diethylene glycol, glycerin, ethylene glycol, propylene glycol, liquid polyethylene glycol, liquid polypropylene glycol, 2-(methoxymethoxy)ethanol, 2-butoxyethanol, 2-(isopentyloxy)ethanol, 2-(hexyloxy)ethanol, diethylene glycol monomethyl ether, diethylene glycol monoethyl ether, diethylene glycol monobutyl ether, triethylene glycol, triethylene glycol monomethyl ether, 1-methoxy-2-propanol, 1-ethoxy-2-propanol, dipropylene glycol, dipropylene glycol monomethyl ether, dipropylene glycol monomethyl ether, dipropylene glycol, and a mixture thereof. The amount of the water-soluble organic solvent to be used is preferably 0.1 to 5 times the mass of the crude azo pigment. The kneading temperature is preferably from 20 to 130° C., and particularly preferably from 40 to 110° C. As a mixing machine, a kneader or a MIXMULLER may be used.

For the solvent salt milling, the method described in paragraphs [0007] to [0071] of JP-A No. 2009-263501 may be preferably used.

Specifically, in the solvent salt milling, anhydrous sodium sulfate for pigment grinding having an average particle diameter of 5.5 μm or less is used as a grinding agent, and the content of particles having particle diameters of 10.0 μm or more is 5% by volume or less.

Herein, it is preferable that the anhydrous sodium sulfate for pigment grinding has an average particle diameter of from 2.0 μm to 4.0 μm, and the content of particles having particle diameters of 10.0 μm or more is 1% by volume or less. The water content of the anhydrous sodium sulfate for pigment grinding is preferably 1.0% by mass or less. The anhydrous sodium sulfate for pigment grinding preferably contains an anti-tacking agent.

Other Pigments

The pigment dispersion composition according to the first aspect of the invention may further contain, together with the azo pigment represented by Formula (1), an additional pigment other than the azo pigment represented by Formula (1), as long as the purpose of the first aspect of the invention is not impaired.

The additional pigment is not particularly limited, and at least one pigment selected from an azo pigment, a disazo pigment, a benzimidazolone pigment, a condensed azo pigment, an azo lake pigment, an anthraquinone pigment, a diketopyrrolopyrrole pigment, a quinacridone pigment, an isoindoline pigment, an isoindolinone pigment, a perinone pigment, and a perylene pigment and derivatives thereof may be used as the additional pigment.

Other examples of the additional pigment include compounds classified as "pigment" according to COLOR INDEX (C. I.; published by The Society of Dyers and Colourists), i.e., a compound given with the color index (C. I.) number as follows:

C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279;

C. I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214;

C. I. Pigment Orange 2, 5, 13, 16, 17:1, 31, 34, 36, 38, 43, 46, 48, 49, 51, 52, 55, 59, 60, 61, 62, 64, 71, 73;

C. I. Pigment Green 7, 10, 36, 37;

C. I. Pigment Blue 1, 2, 15, 15:1, 15:2, 15:3, 15:4, 15:6, 16, 22, 60, 64, 66, 79, a pigment in which Cl substituent of 79 is modified to OH, 80;

C. I. Pigment Violet 1, 19, 23, 27, 32, 37, 42;

C. I. Pigment Brown 25, 28; and

C. I. Pigment Black 1, 7, or the like.

However, the invention is not limited to them.

Among the above, pigments that are preferably used include the followings:

C. I. Pigment Yellow 11, 24, 108, 109, 110, 138, 139, 150, 151, 154, 167, 180, 185;

C. I. Pigment Orange 36, 71;

C. I. Pigment Red 122, 150, 171, 175, 177, 209, 224, 242, 254, 255, 264;

C. I. Pigment Violet 19, 23, 29, 32;

C. I. Pigment Blue 15:1, 15:3, 15:6, 16, 22, 60, 66;

C. I. Pigment Green 7, 36, 37; and

C. I. Pigment Black 1, 7.

An inorganic pigment may be also used, and specific examples thereof include titanium oxide, barium sulfate, calcium carbonate, zinc oxide, lead sulfate, lead yellow, zinc chromate, red iron oxide, cadmium red, ultramarine, Prussian blue, chromium oxide green, cobalt green, amber, titan black, synthetic iron black, and carbon black. In the invention, the pigment may be used singly or in combination of two or more thereof.

In particular, from the viewpoint of further improving spectral characteristics (i.e., color tone) of a red colored pattern (i.e., red color filter), the pigment dispersion composition according to the first aspect of the invention preferably contains at least one pigment having a color selected from red, yellow, orange and violet, in addition to the azo pigment represented by Formula (1). The pigment which may be used in combination with the azo pigment represented by Formula (1) may be at least one pigment selected from the above-mentioned pigments given with C. I. numbers. As a result, a transmission ratio in a relatively short wavelength range (e.g., wavelength of 500 nm or less, and more preferably wavelength of 400 nm or less) is additionally inhibited, and thus more favorable red color is obtained.

When a pigment (in particular, a pigment having a color selected from red, yellow, orange and violet) other than the azo pigment represented by Formula (1) is used in combination therewith, the content of the additional pigment is preferably 50% by mass or less, more preferably 40% by mass or less, and still more preferably 30% by mass or less, with respect to the total mass of the pigments contained in the pigment dispersion composition (or the colored curable composition) according to the first aspect of the invention.

The lower limit of content of additional pigment (in particular, a pigment having a color selected from red, yellow, orange and violet) is not particularly limited. However, from the viewpoint of controlling the spectral characteristics, the lower limit is content of additional pigment is preferably 5% by weight, and more preferably 10% by weight.

A volume average particle diameter of the pigment (including the azo pigment represented by Formula (1)) in the pigment dispersion composition according to the first aspect of the invention is preferably from 1 nm to 250 nm. Herein, the volume average particle diameter of pigment particles means the particle diameter of pigment itself or the particle diameter including an adhered additive when an additive such as a dispersant has been adhered on the pigment.

In the first aspect of the invention, as an apparatus for measuring the volume average particle diameter of the pigment, a particle size analyzer NANOTRAC UPA-EX150 (trade name, manufactured by Nikkiso Co., Ltd.) is used. The measurement is carried out using 3 ml of the pigment dispersion composition placed in a measuring cell, and according to a predetermined measuring method. As parameters incorporated for the measurement, viscosity of the pigment dispersion composition and density of the pigment are used for measurement of viscosity and density of the dispersion particle, respectively.

The volume average particle diameter of the pigment is preferably from 1 nm to 200 nm, and more preferably from 1 nm to 150 nm. When the volume average particle diameter of the particle in the pigment dispersion composition is 250 nm or less, higher optical density is obtained.

Further, from the viewpoint of further improving dispersion stability, the volume average particle diameter of the pigment is particularly preferably from 2 nm to 100 nm, and most preferably from 2 nm to 50 nm.

The total content of the pigment(s) included in the pigment dispersion composition according to the first aspect of the invention is preferably in the range of from 1 to 35% by mass, and more preferably in the range of from 2 to 25% by mass, with respect to the pigment dispersion composition. When the content is within the ranges, physical properties of dispersed materials, such as surface tension and viscosity, may be easily controlled, and therefore desirable.

At Least One Compound Selected from Group Consisting of Organic Pigment Derivative Having Acidic Functional Group, Anthraquinone Derivative Having Acidic Functional Group, and Triazine Derivative Having Acidic Functional Group The pigment dispersion composition according to the first aspect of the invention further contain at least one compound selected from the group consisting of an organic pigment derivative having an acidic functional group, an anthraquinone derivative having an acidic functional group, and a triazine derivative having an acidic functional group (hereinbelow, may be collectively referred to as "derivative having an acidic functional group" or "acidic functional group-containing derivative").

Examples of the acidic functional group contained in the acidic functional group-containing derivative include a sulfo group, a carboxyl group, a phosphate group, and an acetylacetonate group. From the viewpoint of inhibiting generation of residues, a sulfo group or a carboxyl group is preferable. These acidic functional groups may each have a salt structure.

Hereinbelow, the derivative having an acidic functional group according to the first aspect of the invention is explained in greater detail.

Organic Pigment Derivative Having an Acidic Functional Group

Examples of the organic pigment derivative having an acidic functional group include an organic pigment derivative represented by the following Formula (I).

$$P—[X_1—(Y_1)_k]_m \quad (I)$$

In Formula (I), P represents an organic pigment residue; $X_1$ represents a single bond, —O—, —S—, —CO—, —$SO_2$—, —$NR_1$—, —$CONR_1$—, —$SO_2NR_1$—, —$NR_1CO$—, or —$NR_1SO_2$— (wherein, $R_1$ represents a hydrogen atom, an alkyl group, or a hydroxyalkyl group), a linear or branched alkylene group having 1 to 12 carbon atoms, a benzene or triazine residue which may be substituted by an alkyl group, an amino group, a nitro group, a hydroxyl group, an alkoxy group, or a halogen atom, or a linking group which is formed from a combination of two or more thereof; $Y_1$ represents —$SO_3$.M/n or —COO.M/n, wherein M represents a hydrogen ion, a mono- to trivalent metal ion, or an ammonium ion substituted with at least one alkyl group, and n represents the valency of M; k represents an integer of 1 or 2; and m represents an integer from 1 to 4.

Examples of the organic pigment residue P in Formula (I) include pigment residues of a diketopyrrolopyrrole pigment; an azo-based pigment such as an azo pigment, a disazo pigment or a polyazo pigment; a phthalocyanine pigment; an anthraquinone-based pigment such as a diaminodianthraquinone pigment, an anthrapyrimidine pigment, a flavanthrone pigment, an anthanthrone pigment, an indanthrone pigment, a pyranthrone pigment, or a bioranthrone pigment; a quinacridone pigment; a dioxazine pigment; a perinone pigment; a perylene pigment; a thioindigo pigment; an isoindoline pigment; an isoindolinone pigment; a quinophthalone pigment; a threne pigment; a metal complex pigment, or the like.

Of these, a pigment residue of a diketopyrrolopyrrole pigment, an azo or disazo pigment or a quinacridone pigment is more preferable as P.

When $Y_1$ in Formula (I) is —$SO_3$.M/n, specific examples thereof include a sulfo group, a sodium sulfonate group, a calcium sulfonate group, a strontium sulfonate group, a barium sulfonate group, an aluminum sulfonate group, a 4-(aluminum sulfonate)phenylcarbamoylmethyl group, a dodecyl ammoniosulfonate group, an octadecyl ammoniosulfonate group, a trimethyloctadecyl ammoniosulfonate group, and a dimethyldidecyl ammoniosulfonate group.

When $Y_1$ in Formula (I) is —COO.M/n, specific examples thereof include a carboxyl group, a 2-ammoniumcarboxylate-5-nitrobenzamide methyl group, and a 4-carboxyphenylaminocarbonyl group.

As for the organic pigment derivative represented by Formula (I), a derivative in which $Y_1$ is —$SO_3$.M/n is preferable. Among them, derivatives in which $Y_1$ is a sulfo group, a sodium sulfonate group, or an aluminum sulfonate group are preferable. Among them, a combination in which P is a diketopyrrolopyrrole pigment or an azo pigment and $Y_1$ is a sulfo group or a sodium sulfonate group is particularly preferable.

Anthraquinone Derivative Having Acidic Functional Group

Examples of the anthraquinone derivative having an acidic functional group include an anthraquinone derivative represented by the following Formula (II).

$$Q\text{-}[X^2—(Y_2)_k]_m \quad (II)$$

In Formula (II), Q represents an anthraquinone residue which may be substituted with an alkyl group, an amino group, a nitro group, a hydroxyl group, an alkoxy group, or a halogen atom; $X_2$ represents a single bond, —O—, —S—, —CO—, —$SO_2$—, —$NR_1$—, —$CONR_1$—, —$SO_2NR_1$—, —$NR_1CO$—, —$NR_1$ $SO_2$— (wherein, $R_1$ represents a hydrogen atom, an alkyl group, or a hydroxyalkyl group), a linear or branched alkylene group having 1 to 12 carbon atoms, a benzene or triazine residue which may be substituted by an alkyl group, an amino group, a nitro group, a hydroxyl group, an alkoxy group, or a halogen atom, or a linking group which is formed from a combination of two or more thereof; $Y_2$ represents —$SO_3$.M/n or —COO.M/n, wherein M represents a hydrogen ion, a mono- to trivalent metal ion, or an ammonium ion substituted with at least one alkyl group, and n represents the valency of M; k represents an integer of 1 or 2; and m represents an integer from 1 to 4.

Examples of the anthraquinone residue represented by Q in Formula (II) include an anthraquinone residue which may or may not be substituted with an alkyl group such as a methyl group or an ethyl group, an amino group, a nitro group, a hydroxyl group, an alkoxy group such as a methoxy group or an ethoxy group, or a halogen atom such as chlorine.

When $Y_2$ in Formula (II) is —$SO_3$.M/n, specific examples thereof include a sulfo group, a sodium sulfonate group, a calcium sulfonate group, a strontium sulfonate group, a barium sulfonate group, an aluminum sulfonate group, a 4-(aluminum sulfonate)phenylcarbamoylmethyl group, a dodecyl ammoniosulfonate group, an octadecyl ammoniosulfonate group, a trimethyloctadecyl ammoniosulfonate group, and a dimethyldidecyl ammoniosulfonate group.

When $Y_2$ in Formula (II) is —COO.M/n, specific examples thereof include a carboxyl group and a 4-(aluminum carboxylato)phenylaminocarbonyl group.

As for the anthraquinone derivative represented by Formula (II), a derivative in which $Y_2$ is —$SO_3$.M/n is preferable. Among them, derivatives in which $Y_2$ is a sulfo group, a sodium sulfonate group, or an aluminum sulfonate group are preferable, and in particular, a combination in which Q is an anthraquinone is particularly preferable.

Triazine Derivative Having Acidic Functional Group

Examples of the triazine derivative having an acidic functional group include a triazine derivative represented by the following Formula (III).

(III)

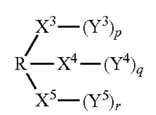

In Formula (III), R represents a triazine residue; $X^3$, $X^4$ and $X^5$ each independently represent a single bond, —O—, —S—, —CO—, —$SO_2$—, —$NR^1$—, —$CONR^1$—, —$SO_2NR^1$—, —$NR^1CO$—, —$NR^1SO_2$— (wherein, $R_1$ represents a hydrogen atom, an alkyl group, or a hydroxyalkyl group), a linear or branched alkylene group having 1 to 12 carbon atoms, a benzene residue which may be substituted by an alkyl group, a nitro group, a hydroxyl group, an alkoxy group, or a halogen atom, or a linking group which is formed from a combination of two or more thereof; $Y^3$ represents —$SO_3$.M/n or —COO.M/n, wherein M represents a hydrogen ion, a mono- to trivalent metal ion, or an ammonium ion substituted with at least one alkyl group, and n represents the valency of M; $Y^4$ and $Y^5$ each independently may represent the same group as that of $Y^3$, or may represent an alkyl group, a nitro group, a hydroxyl group, an alkoxy group, a halogen atom, or a phenyl group which may be substituted with a methyl group, a methoxy group, or hydroxyl group; p, q and r each independently represent an integer of 1 or 2. $Y^3$, $Y^4$, and $Y^5$ may be the same as or different from each other. When p represents 2, plural $Y^3$'s may be the same as or different from each other. When q represents 2, plural $Y^4$'s may be the same as or different from each other. When r represents 2, plural $Y^5$'s may be the same as or different from each other.

The triazine group in the triazine residue represented by R is preferably 1,3,5-triazine.

When $Y^3$, $Y^4$ or $Y^5$ is —$SO_3$.M/n, specific examples thereof include an aluminum sulfonate ethylamino group and a 4-sulfophenylamino group.

When $Y^3$, $Y^4$ or $Y^5$ is —COO.M/n, specific examples thereof include a 4-carboxyphenylamino group.

As for the triazine derivative represented by Formula (III), derivatives in which at least one of $Y_3$, $Y_4$ and $Y_5$ is —$SO_3$.M/n are preferable. Among them, derivatives in which at least one of $Y_3$, $Y_4$ and $Y_5$ is a sulfo group, a sodium sulfonate group, or an aluminum sulfonate group are preferable. In particular, a combination in which at least one of $Y_3$, $Y_4$ and $Y_5$ is —$SO_3$.M/n and R is 1,3,5-triazine is particularly preferable.

Specific examples of the organic pigment derivative represented by Formula (I), the anthraquinone derivative represented by Formula (II), and the triazine derivative represented by Formula (III) include the compounds shown below. However, the invention is not limited to them.

Compound 1

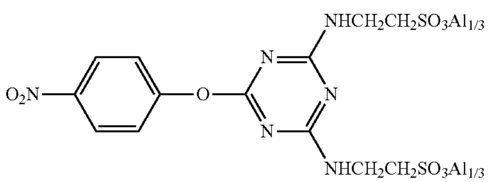

Compound 2

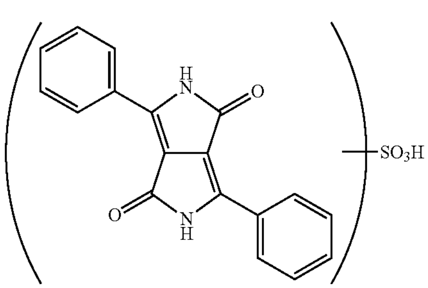

-continued

Compound 3

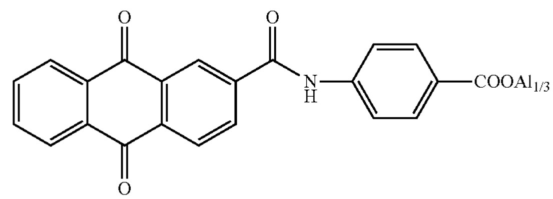

Compound 4

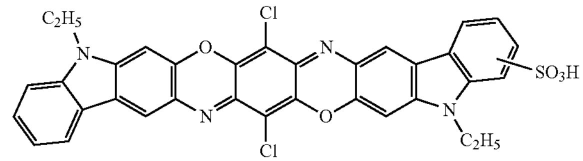

The organic pigment derivative represented by Formula (I), the anthraquinone derivative represented by Formula (II), and the triazine derivative represented by Formula (III) may each be produced by the methods described in JP-B Nos. 39-28884, 58-028303, and 63-17101, JP-A No. 56-81371, JP-B Nos. 01-34268, 01-34269, 05-9496, 02-62893, and 07-33485, or Japanese Patent Nos. 2584515, 2906833, and 3518300, for example.

The pigment dispersion composition according to the first aspect of the invention may contain one type or at least two types of the acidic functional group-containing derivatives (i.e., derivatives having an acidic functional group).

Among the derivatives having an acidic functional group, the triazine derivative represented by Formula (III) in which a sulfo group or a carboxyl group is included is most preferable because the amount of residues is extremely small.

The content of the acidic functional group-containing derivative (or the total content when two or more derivatives are used) in the pigment dispersion composition according to the first aspect of the invention is preferably in the range of from 0.1% by mass to 80% by mass, more preferably in the range of from 1% by mass to 65% by mass, and particularly preferably in the range of from 3% by mass to 50% by mass, with respect to the total amount of the pigment(s) including at least the azo pigment represented by Formula (1). When the content of the derivative having an acidic functional group is within the above ranges, not only good dispersion of the pigment is be obtained but also dispersion stability after dispersion is be improved while the viscosity of the pigment dispersion composition is maintained low.

By applying such a pigment dispersion composition to manufacture of a color filter, heat resistance of a color filter is be improved. Further, a color filter having high transmission ratio, excellent color characteristics, and high contrast is be obtained.

Dispersant

The pigment dispersion composition according to the first aspect of the invention contains at least one dispersant.

The dispersant is not particularly limited, and a well known pigment dispersant may be used.

As a dispersant for use in the first aspect of the invention, a nitrogen atom-containing dispersant is preferable.

As a nitrogen atom-containing dispersant, a surfactant, a polymer dispersant, or the like is generally used. The polymer dispersant is particularly preferable.

Preferred examples of the polymer dispersant include a urethane dispersant, a nitrogen atom-containing graft copolymer dispersant, and a nitrogen atom-containing block copolymer dispersant.

An example of the polymer dispersant which may be used in the first aspect of the invention is a resin (hereinbelow, may be referred to as "specific resin" according to the first aspect) having (i) a main chain moiety having a nitrogen atom, (ii) a group "X" which has a functional group having a pKa of 14 or less and is bound to a nitrogen atom present on the main chain moiety, and (iii) a side chain having an oligomer or polymer chain "Y" having a number average molecular weight of from 500 to 1,000,000. An amphoteric dispersant such as HINOACT T-8000E (trade name, manufactured by Kawaken Fine Chemical Co., Ltd) may be suitably used.

Hereinbelow, the polymer dispersant which is suitably used in the first aspect of the invention is explained in greater detail.

Urethane Dispersant

The urethane dispersant which may be used in the first aspect of the invention may be a urethane dispersion resin which is obtained by reacting (1) a polyisocyanate compound, (2) a compound having one or two hydroxyl groups in a molecule thereof, and (3) a compound having an active hydrogen and a tertiary amino group in a molecule thereof.

(1) Polyisocyanate Compound

Examples of the polyisocyanate compound include aromatic diisocyanates such as paraphenylene diisocyanate, 2,4-tolylene diisocyanate, 2,6-tolylene diisocyanate, 4,4'-diphenylmethane diisocyanate, naphthalene-1,5-diisocyanate, or tolidine diisocyanate; aliphatic diisocyanates such as hexamethylene diisocyanate, lysine methyl ester diisocyanate, 2,4,4-trimethylhexamethylene diisocyanate, or dimer acid diisocyanate; alicyclic diisocyanates such as isophorone diisocyanate, 4,4'-methylenebis(cyclohexylisocyanate) or ω,ω'-diisocyanatedimethylcyclohexane; aliphatic diisocyanates having an aromatic ring, such as xylene diisocyanate or α,α,α',α'-tetramethylxylylene diisocyanate; triisocyanates such as lysine ester triisocyanate, 1,6,11-undecane triisocyanate, 1,8-diisocyanate-4-isocyanate methyloctane, 1,3,6-hexamethylenetriisocyanate, bicycloheptane triisocyanate, tris(isocyanatephenylmethane), or tris(isocyanatephenyl)thiophosphate and trimers thereof, hydrate adducts thereof, and polyol adducts thereof. The polyisocyanate is preferably a trimer of an organic diisocyanate, and most preferably a trimer of tolylene diisocyanate or a trimer of isophorone diisocyanate. These may be used either singly or in a combination of two or more thereof.

A trimer of isocyanate may be produced, for example, by a method including performing partial trimerization of an isocyanate group of the polyisocyanates using an appropriate catalyst for trimerization, such as a tertiary amine, a phosphine, an alkoxide, a metal oxide, or a carboxylate salt, terminating the trimerization by adding a catalyst poison, and removing unreacted polyisocyanate by solvent extraction and thin-film distillation, thereby obtaining a polyisocyanate containing a desired isocyanurate group.

(2) Compound Having One or Two Hydroxyl Groups in Molecule

Examples of the compound having one or two hydroxyl groups in a molecule thereof include polyether glycol, polyester glycol, polycarbonate glycol, polyolefin glycol, compounds in which a terminal hydroxyl group of these glycols is alkoxylated using an alkyl group having 1 to 25 carbon atoms, and a mixture of two or more of them.

Examples of polyether glycol include polyether diol, polyether ester diol, and a mixture of two or more of them.

The polyether diol may be a product of homopolymerization or copolymerization of alkylene oxide, and examples thereof include polyethylene glycol, polypropylene glycol, polyethylene-propylene glycol, polyoxytetramethylene glycol, polyoxyhexamethylene glycol, polyoxyoctamethylene glycol, and a mixture of two or more of them.

Examples of the polyether ester diol include a reaction product between an ether group-containing diol or a mixture thereof with another glycol, and a dicarboxylic acid or its anhydride, or a reaction product between a polyester glycol and alkylene oxide, and specific examples thereof include poly(polyoxytetramethylene)adipate.

Examples of the most preferred polyether glycol include polyethylene glycol, polypropylene glycol, polyoxytetramethylene glycol, or a compound thereof in which a terminal hydroxyl group thereof is alkoxylated with an alkyl group having 1 to 25 carbon atoms.

Examples of polyester glycol include a polycondensation product between a dicarboxylic acid (such as succinic acid, glutaric acid, adipic acid, sebacic acid, fumaric acid, maleic acid, or phthalic acid) or its anhydride with a glycol (such as aliphatic glycols such as ethylene glycol, diethylene glycol, triethylene glycol, propylene glycol, dipropylene glycol, tripropylene glycol, 1,2-butane diol, 1,3-butane diol, 1,4-butane diol, 2,3-butane diol, 3-methyl-1,5-pentane diol, neopentyl glycol, 2-methyl-1,3-propane diol, 2-methyl-2-propyl-1,3-propane diol, 2-butyl-2-ethyl-1,3-propane diol, 1,5-pentane diol, 1,6-hexane diol, 2-methyl-2,4-pentane diol, 2,2,4-trimethyl-1,3-pentane diol, 2-ethyl-1,3-hexane diol, 2,5-dimethyl-2,5-hexane diol, 1,8-octamethylene glycol, 2-methyl-1,8-octamethylene glycol, or 1,9-nonane diol; alicyclic glycols such as bishydroxymethylcyclohexane; aromatic glycols such as xylylene glycol and bishydroxyethoxybenzene; and N-alkyldialkanol amines such as N-methyldiethanol amine), such as polyethylene adipate, polybutylene adipate, polyhexamethylene adipate, and polyethylene/propylene adipate; a polylactone diol or polylactone mono-ol which is obtained using the diols or a monovalent alcohol having 1 to 25 carbon atoms as a starting material, such as polycaprolactone glycol, polymethylvalerolactone, and a mixture of two or more of them. Examples of the most preferred polyester glycol is polycaprolactone glycol or a polycaprolactone obtained using an alcohol with 1 to 25 carbon atoms as a starting material, more specifically, a compound obtained by ring-opening addition polymerization of ϵ-caprolactone and mono-ol.

Examples of polycarbonate glycol include poly(1,6-hexylene)carbonate and poly(3-methyl-1,5-pentylene)carbonate.

Examples of polyolefine glycol include polynbutadiene glycol, hydrogenated polynbutadiene glycol, and hydrogenated polyisoprene glycol.

Among the compounds having one or two hydroxyl groups in a molecule thereof, polyether glycol and polyester glycol are particularly preferable.

A number average molecular weight of the compound having one or two hydroxyl groups in a molecule thereof is generally from 300 to 10,000, preferably from 500 to 6,000, and more preferably from 1,000 to 4,000.

(3) Compound Having Active Hydrogen and Tertiary Amino Group in Molecule

Examples of the active hydrogen, i.e., a hydrogen atom which is directly bonded to an oxygen atom, a nitrogen atom, or a sulfur atom, include a hydrogen atom in a functional group such as a hydroxyl group, an amino group, or a thiol group. Among them, a hydrogen atom in an amino group, in particular primary amino group, is preferable.

The tertiary amino group is not specifically limited. Examples thereof include a dialkyl amino group having an alkyl group having 1 to 4 carbon atoms, such as a methyl group, an ethyl group, an isopropyl group, or a n-butyl group, and a group in which the dialkyl amino groups are linked to form a heterocyclic group, more specifically, an imidazole ring or a triazole ring.

Examples of such a compound having an active hydrogen and a tertiary amino group in a molecule thereof include N,N-dimethyl-1,3-propane diamine, N,N-diethyl-1,3-propane diamine, N,N-dipropyl-1,3-propane diamine, N,N-dibutyl-1,3-propane diamine, N,N-dimethylethylene diamine, N,N-diethylethylene diamine, N,N-dipropylethylene diamine, N,N-dibutylethylene diamine, N,N-dimethyl-1,4-butane diamine, N,N-diethyl-1,4-butane diamine, N,N-dipropyl-1,4-butane diamine, and N,N-dibutyl-1,4-butane diamine.

Examples of the compounds having a nitrogen-containing heterocycle as a tertiary amino group include a 5-membered N-containing heterocycle such as a pyrazole ring, an imidazole ring, a triazole ring, a tetrazole ring, an indole ring, a carbazole ring, an indazole ring, a benzimidazole ring, a benzotriazole ring, a benzoxazole ring, a benzothiazole ring, or a benzothiadiazole ring, and a 6-membered N-containing heterocycle such as a pyridine ring, a pyridazine ring, a pyrimidine ring, a triazine ring, a quinoline ring, an acridine ring, or an isoquinoline ring. The nitrogen-containing heterocycle is preferably an imidazole ring or a triazole ring.

Specific examples of the compound having an imidazole ring and a primary amino group include 1-(3-aminopropyl) imidazole, histidine, 2-aminoimidazole, and 1-(2-amino ethyl)imidazole. Specific examples of the compound having a triazole ring and a primary amino group include 3-amino-1,2,4-triazole, 5-(2-amino-5-chlorophenyl)-3-phenyl-1H-1,2,4-triazole, 4-amino-4H-1,2,4-triazol-3,5-diol, 3-amino-5-phenyl-1H-1,3,4-triazole, 5-amino-1,4-diphenyl-1,2,3-triazole, and 3-amino-1-benzyl-1H-2,4-triazole. Of these, N,N-dimethyl-1,3-propane diamine, N,N-diethyl-1,3-propane diamine, 1-(3-aminopropyl)imidazole, and 3-amino-1,2,4-triazole are preferable.

A mix ratio of the reacting materials used for obtaining the urethane dispersion resin is as follows: the compound having one or two hydroxyl groups in a molecule thereof is used in an amount of from 10 to 200 parts by mass, preferably from 20 to 190 parts by mass, and more preferably from 30 to 180 parts by mass, with respect to 100 parts by mass of a polyisocyanate compound, and the compound having an active hydrogen and a tertiary amino group in a molecule thereof is used in an amount of from 0.2 to 25 parts by mass, and preferably from 0.3 to 24 parts by mass, with respect to 100 parts by mass of a polyisocyanate compound.

From the viewpoint of dispersability, dispersion stability, solubility, and controllability of the reaction, or the like, the urethane dispersion resin has a weight average molecular weight in terms of polystyrene measured by GPC in the range of from 1,000 to 200,000, preferably from 2,000 to 100,000, and more preferably from 3,000 to 50,000.

The urethane dispersion resin may be produced according to a well known method for producing a polyurethane resin.

Examples of a solvent used for production include ketones such as acetone, methyl ethyl ketone, methyl isobutyl ketone, cyclopentanone, cyclohexanone, or isophorone; esters such as ethyl acetate, butyl acetate, or cellosolve acetate; hydrocarbons such as benzene, toluene, xylene, or hexane; some alcohols such as diacetone alcohol, isopropanol, secondary butanol, or tertiary butanol chlorides such as methylene chloride or chloroform; ethers such as tetrahydrofuran or diethyl ether; and aprotic polar solvents such as dimethyl formamide, N-methylpyrrolidone, or dimethylsulfoxide.

As a catalyst used for production, a typical catalyst for urethanization reaction is used. Examples of the catalyst include a tin-containing catalyst such as dibutyl tin dilaurate, dioctyl tin dilaurate, dibutyl tin dioctoate, or stannous octoate, an iron-containing catalyst such as iron acetylacetonate or ferric chloride, and a tertiary amine catalyst such as triethylamine or triethylene diamine.

The amount of the compound having an active hydrogen and a tertiary amino group in a molecule thereof to be added may be controlled so that the amine value of the dispersion resin after the reaction is in the range of preferably from 1 to 100 mgKOH/g, and more preferably in the range of from 5 to 95 mgKOH/g. When the amine value is lower than the lower limit of the above ranges, dispersion ability tends to decrease. On the other hand, when the amine value is higher than the upper limit of the above ranges, developability tends to decrease. When an isocyanate group remains in the dispersion resin after the reaction, elimination of the isocyanate group using an alcohol or amino compound is desirable because the stability of the dispersion resin over time is improved.

Nitrogen Atom-Containing Graft Copolymer

The nitrogen atom-containing graft copolymer preferably has a repeating unit in which a nitrogen atom is contained in the main chain. It is preferable that the graft copolymer has a repeating unit represented by the following Formula (A) and/or a repeating unit represented by the following Formula (B).

(A)

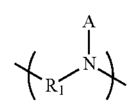

In Formula (A), $R_1$ represents an alkylene group having 1 to 5 carbon atoms, and A represents a hydrogen atom or any group represented by the following Formulae (C) to (E).

In Formula (A), $R_1$ represents a linear or branched alkylene group having 1 to 5 carbon atoms such as a methylene group, an ethylene group, or a propylene group. It is preferably that $R_1$ represents an alkylene group having 2 to 3 carbon atoms, and more preferably an ethylene group. In Formula (A), A represents a hydrogen atom or a group represented by any one of the following Formulae (C) to (E), and preferably a group represented by the following Formula (C).

(B)

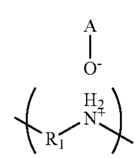

In Formula (B), $R_1$ and A have the same definitions as $R_1$ and A in Formula (A), respectively.

(C)

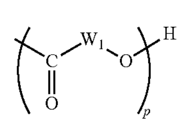

In Formula (C), $W_1$ represents a linear or branched alkylene group having 2 to 10 carbon atoms, and preferably an alkylene group having 4 to 7 carbon atoms such as a butylene group, a pentylene group or a hexylene group; and p represents an integer from 1 to 20, and preferably from 5 to 10.

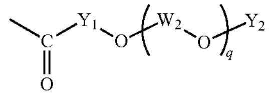

(D)

In Formula (D), $Y_1$ represents a divalent linking group, and preferably an alkylene group having 1 to 4 carbon atoms such as an ethylene group or a propylene group, or an alkylene oxy group having 1 to 4 carbon atoms such as an ethyleneoxy group or a propyleneoxy group. In Formula (D), $W_2$ represents a linear or branched alkylene group having 2 to 10 carbon atoms such as an ethylene group, a propylene group, or a butylene group, and preferably an alkylene group having 2 to 3 carbon atoms such as an ethylene group or a propylene group. In Formula (D), $Y_2$ represents a hydrogen atom or CO—$R_2$ (in which $R_2$ represents an alkyl group having 1 to 10 carbon atoms such as an ethyl group, a propyl group, a butyl group, a pentyl group, or a hexyl group, and preferably an alkyl group having 2 to 5 carbon atoms such as an ethyl group, a propyl group, a butyl group, or a pentyl group). In Formula (D), q represents an integer from 1 to 20, and preferably from 5 to 10.

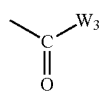

(E)

In Formula (E), $W_3$ represents an alkyl group having 1 to 50 carbon atoms, or a hydroxyalkyl group having 1 to 50 carbon atoms and 1 to 5 hydroxyl groups. In particular, an alkyl group having 10 to 20 carbon atoms such as a stearyl group, or a hydroxyalkyl group having 10 to 20 carbon atoms and 1 to 2 hydroxyl groups, such as a monohydroxystearyl group is preferable.

It is preferable that the "nitrogen atom-containing graft copolymer" has a high content of the repeating unit represented by Formula (A) or (B). In general, the content is 50 mol % or more, and preferably 70 mol % or more. The nitrogen atom-containing graft copolymer may contain both the repeating unit represented by Formula (A) and the repeating unit represented by Formula (B). In this case, content ratios thereof are not specifically limited, but it is preferable that the repeating unit represented by Formula (A) is contained in a greater amount. The total number of the repeating units represented by the Formula (A) or (B) is generally 1 to 100, preferably 10 to 70, and more preferably 20 to 50. The nitrogen atom-containing graft copolymer may further contain a repeating unit other than Formula (A) and Formula (B), and examples of the additional repeating unit include an alkylene group and an alkylene oxy group. The "nitrogen atom-containing graft copolymer" preferably has —$NH_2$ or —$R_1$—$NH_2$ (in which $R_1$ has the same definition as $R_1$ described above) at an end thereof.

The main chain (or backbone) of "the nitrogen atom-containing graft copolymer" may be either linear or branched. The amine value of the graft copolymer is generally from 5 to 100 mgKOH/g, preferably from 10 to 70 mgKOH/g, and more preferably from 15 to 40 mgKOH/g or less.

When the amine value is 5 mgKOH/g or more, dispersion stability is further improved, and therefore more stable viscosity is obtained. When the amine value is 100 mgKOH/g or less, generation of residues is further inhibited, and therefore deterioration of electric properties after forming a liquid crystal panel is further inhibited.

The weight average molecular weight of the "nitrogen atom-containing graft copolymer", which is measured by GPC is preferably from 3,000 to 100,000, and particularly preferably from 5,000 to 50,000. When the weight average molecular weight is 3,000 or more, aggregation of color materials is further inhibited, and therefore high viscosity or gellation are further inhibited. When it is 100,000 or less, the copolymer itself is further inhibited from having high viscosity, and insufficient solubility in an organic solvent is further suppressed.

The dispersant may be produced according to a well known method, for example, the method described in JP-B No. 63-30057.

Nitrogen Atom-Containing Block Copolymer Dispersant

Examples of a copolymer which may be used as a nitrogen atom-containing block copolymer dispersant include at least one of an A-B block copolymer and a B-A-B block copolymer, each of which includes a block A having a quaternary ammonium base in a side chain thereof and a block B having no quaternary ammonium base.

The block A, which is a component of the block copolymer, has a quaternary ammonium base, and preferably a quaternary ammonium base represented by —$N^+R_{1a}R_{2a}R_{3a}.Y^-$, in which $R_{1a}$, $R_{2a}$ and $R_{3a}$ each independently represent a hydrogen atom, or a cyclic or chain hydrocarbon group which may or may not be substituted, or two or more of $R_{1a}$, $R_{2a}$ and $R_{3a}$ may bind to each other to form a cyclic structure, and $Y^-$ represents a counter anion. The quaternary ammonium base may directly bind to the backbone, or may bind to the backbone via a divalent linking group.

In —$N^+R_{1a}R_{2a}R_{3a}$, examples of a cyclic structure which is formed by binding of two or more of $R_{1a}$, $R_{2a}$ and $R_{3a}$ include a 5- to 7-membered nitrogen-containing hetero monocycle or a condensed ring formed by condensation of two monocycles. The nitrogen-containing heterocycle preferably has no aromaticity, and a saturated ring is more preferable. Specific examples thereof include nitrogen-containing heterocycles shown below.

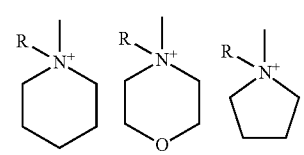

In the nitrogen-containing heterocycles shown above, R represents any one of the groups represented by $R_{1a}$ to $R_{3a}$.

The cyclic structures may have an additional substituent.

Preferable examples of $R_{1a}$ to $R_{3a}$ in —$N^+R_{1a}R_{2a}R_{3a}$ include an alkyl group which has 1 to 3 carbon atoms and which may have a substituent or a phenyl group which may have a substituent.

It is particularly preferable that the block A has a partial structure represented by the following Formula (1A).

Formula (1A)

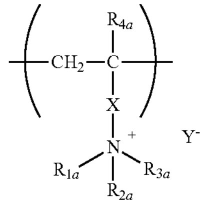

In Formula (1A), $R_{1a}$, $R_{2a}$ and $R_{3a}$ each independently represent a hydrogen atom or a cyclic or chain hydrocarbon group which may or may not be substituted, or two or more of $R_{1a}$, $R_{2a}$ and $R_{3a}$ may bind to each other to form a cyclic structure; $R_{4a}$ represents a hydrogen atom or a methyl group; X represents a divalent linking group; and $Y^-$ represents a counter anion.

Examples of the divalent linking group represented by X in Formula (1A) include an alkylene group having 1 to 10 carbon atoms, an arylene group, —CONH—$R_{5a}$—, and —COO—$R_{6a}$—, in which $R_{5a}$ and $R_{6a}$ each represent a direct bond, an alkylene group having 1 to 10 carbon atoms, or an ether group having 1 to 10 carbon atoms (e.g., —$R_{7a}$—O—$R_{8a}$— wherein $R_{7a}$ and $R_{8a}$ each independently represent an alkylene group), and —COO—$R_{6a}$— is preferable.

Examples of $Y^-$ as a counter anion include $Cl^-$, $Br^-$, $I^-$—, $ClO_4^-$, $BF_4^-$, $CH_3COO^-$, and $PF_6^-$.

At least two kinds of the partial structures each having the specific quaternary ammonium base may be included in a single block A. In this case, a block A may include a random copolymer or block copolymer formed from at least two kinds of the partial structures each having a quaternary ammonium base. Further, a partial structure having no quaternary ammonium base may be included in a block A, and examples of such a partial structure include a partial structure derived from a (meth)acrylic acid ester monomer described below. The content of a partial structure having no quaternary ammonium base in block A is preferably from 0 to 50% by mass, and more preferably from 0 to 20% by mass. However, it is most preferable that the partial structure having no quaternary ammonium base is not included in a block A.

Meanwhile, examples of a block B which is another component of a block copolymer include polymer structures obtained by copolymerizing co-monomers such as: styrene monomers such as styrene or α-methylstyrene; (meth)acrylic acid ester monomers such as methyl(meth)acrylate, ethyl (meth)acrylate, propyl(meth)acrylate, isopropyl(meth)acrylate, butyl(meth)acrylate, glycidyl(meth)acrylate, benzyl (meth)acrylate, hydroxyethyl(meth)acrylate, glycidyl ethylacrylate, or N,N-dimethylamino ethyl(meth)acrylate; (meth)acrylic acid salt monomers such as (meth)acrylyl chloride; (meth)acrylamide monomers such as (meth)acryl amide, N-methylol acrylamide, N,N-dimethylacrylamide, or N,N-dimethylamino ethylacrylamide; vinyl acetate; acrylonitrile; allyl glycidyl ether, crotonic acid glycidyl ether; and N-methacryloyl morpholine.

As for the block B, a partial structure which is derived from a (meth)acrylic acid ester monomer and represented by the following Formula (1B) is preferable. In the specification, the terms "(meth)acryl" and "(meth)acrylate", or the like means "acryl or methacryl", "acrylate or methacrylate", or the like, and, for example, "(meth)acrylic acid" means "acrylic acid or methacrylic acid".

Formula (1B)

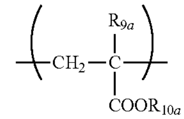

In Formula (1B), $R_{9a}$ represents a hydrogen atom or a methyl group; and $R_{10a}$ represents a cyclic or chain alkyl group which may have a substituent, an allyl group which may have a substituent, or an aralkyl group which may have a substituent.

At least two kinds of partial structures each derived from a (meth)acrylic acid ester monomer may be included in a single block B. The block B may further contain an additional partial structure. When a block B having no quaternary ammonium base contains at least two kinds of partial structures derived from monomers, each partial structure may be included in a form of a random copolymer or block copolymer in the block B.

When the block B further contains an additional partial structure other than the partial structure derived from a (meth) acrylic acid ester monomer, the content of a partial structure other than the (meth)acrylic acid ester monomer in a block B is preferably from 0 to 50% by mass, and more preferably from 0 to 20% by mass. However, it is most preferable that the partial structure other than the (meth)acrylic acid ester monomer is not included in the block B.

The A-B block or B-A-B block copolymer formed from a block A and a block B may be produced, for example, by living polymerization described below.

Examples of living polymerization includes anion living polymerization, cation living polymerization, and radical living polymerization. Anion living polymerization employs an anion as a polymerization active species, and is represented by the following scheme, for example.

Anion Living Polymerization

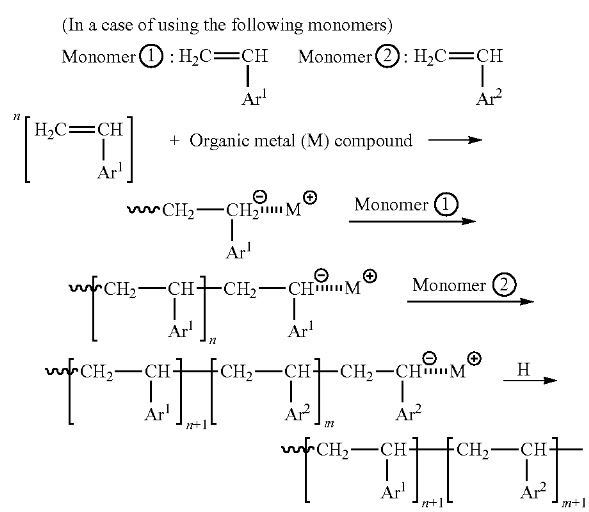

The radical living polymerization employs a radical as a polymerization active species, and is represented by the following schemes, for example.

Radical Living Polymerization: Nitroxyl Method (In a case of using the following monomers)

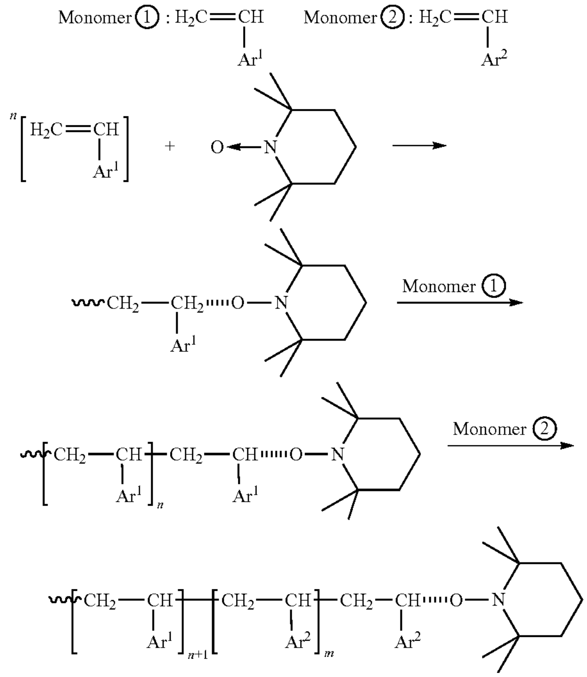

Radical Living Polymerization: ATRP Method (In a case of using the following monomers)

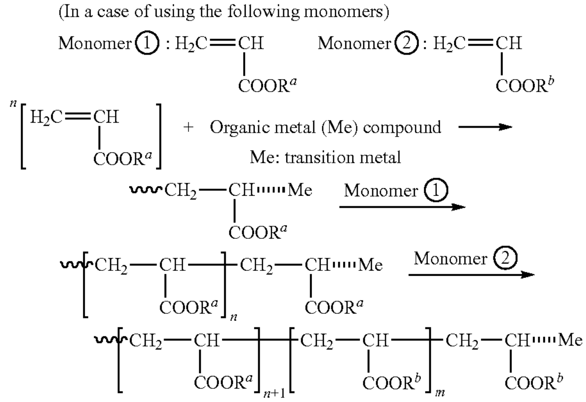

For the synthesis of the block copolymer, any one of known methods described, for example, in JP-A No. 9-62002, P. Lutz, P. Masson et al, Polym. Bull. 12, 79 (1984), B. C. Anderson, G. D. Andrews et al, Macromolecules, 14, 1601 (1981), K. Hatada, K. Ute, et al, Polym. J. 17, 977 (1985), 18, 1037 (1986), Ute Koichi, Hatada Koichi, Polymer Processing, 36, 366 (1987), Higashimura Toshinobu, Sawamoto Mitsuo, Polymer Journal, 46, 189 (1989), M. Kuroki, T. Aida, J. Am. Chem. Soc, 109, 4737 (1987), Aida Takuzo, Inoue Shohei, Chemistry of Organic Synthesis, 43, 300 (1985), or D. Y. Sogoh, W. R. Hertler et al, Macromolecules, 20, 1473 (1987) may be employed.

For any of an A-B block copolymer or a B-A-B block copolymer as the block copolymer described above, from the viewpoint of good resistance to heat and good dispersability, the ratio of block A/block B (mass ratio) in the copolymer is generally 1/99 or more, and preferably 5/95 or more, and generally 80/20 or less, and preferably 60/40 or less.

The content of the quaternary ammonium base per one gram of an A-B block copolymer or a B-A-B block copolymer is generally in the range of from 0.1 to 10 mmol, from the viewpoint of good resistance to heat and good dispersability.

In such a block copolymer, an amino group generated during the production process thereof may be contained in some cases, but the amine value thereof is approximately 1 to 100 mg-KOH/g. The amine value is a value obtained by neutralizing titration of a basic amino group with an acid and converting the acid value into a corresponding mg number of KOH.

Specific Resin

Examples of the dispersant which is most preferably used in the first aspect of the invention include a resin (i.e., a specific resin) having (i) a main chain moiety having a nitrogen atom, (ii) group "X" which has a functional group having a pKa of 14 or less and is bound to a nitrogen atom present on the main chain moiety, and (iii) a side chain having an oligomer chain or polymer chain "Y" having a number average molecular weight of from 500 to 1,000,000.

Hereinbelow, the specific resin is explained in greater detail.

(i) Main Chain Moiety Having Nitrogen Atom

The specific resin is formed from (i) a main chain moiety having a nitrogen atom. Accordingly, adsorptivity to surface of the pigment is improved, and interactions among the pigments are inhibited.

The specific resin preferably has a main chain moiety formed from a known oligomer or polymer containing an amino group, more preferably a primary or secondary amino group. Specific examples of an oligomer or polymer containing an amino group preferably include a main chain structure selected from a poly(lower alkylene imine), a polyallylamine, a polydiallylamine, a metaxylene diamine-epichlorohydrin polycondensate, a polyvinylamine, and a 2-dialkylamino ethyl (meth)acrylic acid-(meth)acrylic acid ester copolymer, or the like.

The poly(lower alkylene imine) may be a chain polymer or a web polymer. When a web polymer is used, dispersion stability and material availability are improved.

The number average molecular weight of the main chain moiety in the specific resin is preferably from 100 to 10,000, more preferably from 200 to 5,000, and still more preferably from 300 to 2,000. It is most preferable that the number average molecular weight is in the range of from 500 to 1,500, from the viewpoints of dispersion stability and developability. The molecular weight of the main chain moiety may be obtained from an accumulated value of hydrogen atoms in the terminal group and main chain moiety as measured by nuclear magnetic resonance spectroscopy, or by measurement of the molecular weight of an oligomer or polymer having an amino group, which is a reaction material.

The main chain part of the specific resin is particularly preferably formed from a poly(lower alkyleneimine) or polyallylamine skeleton. In the invention, the term "lower" as used in the context of the poly(lower alkyleneimine) indicates a carbon atom number of 1 to 5, and the "lower alkyleneimine" indicates an alkyleneimine having 1 to 5 carbon atoms.

The specific resin preferably has a structure having a repeating unit represented by Formula (I-1) and a repeating unit represented by Formula (I-2), or a structure having a repeating unit represented by Formula (II-1) and a repeating unit represented by a Formula (II-2).

Repeating Units Represented by Formula (I-1) and Formula (I-2)

The repeating unit represented by Formula (I-1) and the repeating unit represented by Formula (I-2), which are preferred constitutional elements of the specific resin, are explained below in greater detail.

Formula (I-1)

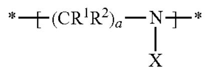

Formula (I-2)

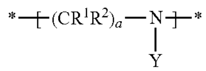

In Formulae (I-1) and (I-2), $R_1$ and $R_2$ each independently represent a hydrogen atom, a halogen atom, or an alkyl group; a represents an integer from 1 to 5; * represents a linking part between repeating units; X indicates a group including a functional group having a pKa of 14 or less; and Y represents an oligomer chain or polymer chain having a number average molecular weight of from 500 to 1,000,000.

The specific resin preferably has, in addition to the repeating units represented by Formula (I-1) and Formula (I-2), a repeating unit represented by the following Formula (I-3) as a copolymerization component. By using a combination of such repeating units, dispersion performance is further improved when the resin is used as a dispersant for fine particle including a pigment, or the like.

Formula (I-3)

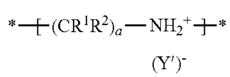

In Formula (I-3), $R_1$, $R_2$ and a have the same definitions as those of Formula (I-1); Y' represents an oligomer chain or polymer chain which has an anionic group and has a number average molecular weight of from 500 to 1,000,000. The repeating unit represented by the Formula (I-3) can be formed by adding an oligomer or polymer having a group capable of reacting with an amine to form a salt, to a resin having a primary or secondary amino group in the main chain moiety thereof. Herein, the anionic group is preferably $CO_2^-$ or $SO_3^-$, and it is most preferably $CO_2$. The anionic group is preferably located at a terminal of the oligomer chain or polymer chain included in Y'.

With regard to Formula (I-1), Formula (I-2) and Formula (I-3), it is particularly preferable that each of $R_1$ and $R_2$ is a hydrogen atom. From the viewpoint of availability of raw materials, "a" is preferably 2.

The specific resin may further contain, in addition to the repeating units represented by Formula (I-1), Formula (I-2), and/or Formula (I-3), a lower alkyleneimine having a primary or tertiary amino group as a repeating unit. A group represented by X, Y or Y' in Formulae (I-1), (I-2) or (I-3) may bind to the nitrogen atom in the lower alkyleneimine repeating unit. A resin having such a main chain structure including a repeating unit having X and a repeating unit having Y, may be used as the specific resin.

The repeating unit represented by Formula (I-1) is a repeating unit having group X including a functional group having a pKa of 14 or less. From the viewpoints of dispersion stability and developability, the repeating unit is contained in the resin in an amount of preferably from 1 to 80 mol %, and more preferably from 3 to 50 mol %, with respect to the total repeating units included in the resin of the invention.

The repeating unit represented by Formula (I-2) is a repeating unit which contains an oligomer or polymer chain Y having a number average molecular weight of from 500 to 1,000,000. From the viewpoint of storage stability, the repeating unit is contained in the resin in an amount of preferably from 10 to 90 mol %, and more preferably from 30 to 70 mol %, with respect to the total repeating units included in the resin of the invention.

The content ratio (molar ratio) between the repeating unit (I-1) and the repeating unit (I-2), i.e., "(I-1):(I-2)" is in the range of preferably from 10:1 to 1:100, and more preferably from 1:1 to 1:10, in molar ratio, from the viewpoints of dispersion stability and balance between hydrophilicity and hydrophobicity.

In the repeating unit represented by Formula (I-3), which is additionally used if required, a partial structure containing an oligomer chain or polymer chain having a number average molecular weight of from 500 to 1,000,000 forms an ionic bond with a nitrogen atom of the main chain. From the viewpoint of effect, the repeating unit represented by Formula (I-3) is preferably contained in an amount of from 0.5 to 20 mol %, and more preferably in an amount of from 1 to 10 mol %, with respect to the total repeating units included in the specific resin of the invention.

The ionic bonding of polymer chain "Y" may be confirmed by infrared spectrophotometry, acid value titration or base titration.

Repeating Units Represented by Formula (II-1) and Formula (II-2)

The repeating unit represented by Formula (II-1) and the repeating unit represented by Formula (II-2), which are other preferred constitutional elements of the specific resin, are explained below in greater detail.

Formula (II-1)

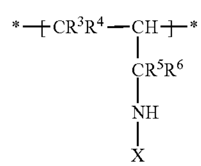

Formula (II-2)

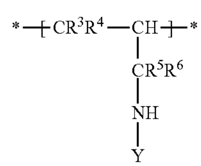

In Formulae (II-1) and (II-2), $R^3$, $R^4$, $R^5$ and $R^6$ each independently represent a hydrogen atom, a halogen atom, or an alkyl group; and *, X and Y have the same definitions as *, X and Y in Formulae (I-1) and (I-2), respectively.

The specific resin preferably contains, in addition to the repeating units represented by Formula (II-1) and Formula (II-2), a repeating unit represented by the following Formula (II-3) as a copolymerization component. By using a combination of such repeating units, dispersion performance is improved.

Formula (II-3)

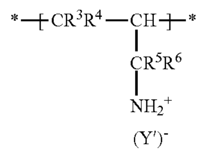

In Formulae (II-3), $R^3$, $R^4$, $R^5$ and $R^6$ have the same definitions as those in Formula (II-1), respectively; and Y' has the same definition as Y' in Formula (I-3).

With regard to Formula (II-1), Formula (II-2) and Formula (II-3), it is particularly preferable that $R^3$, $R^4$, $R^5$ and $R^6$ are a hydrogen atom, from the viewpoint of availability of raw materials.

Formula (II-1) is a repeating unit having a group including a functional group X having a pKa of 14 or less. From the viewpoints of storage stability and developability, the repeating unit is contained in the resin preferably in an amount of from 1 to 80 mol %, and most preferably from 3 to 50 mol %, with respect to the total repeating units included in the resin of the invention.

Formula (II-2) corresponds to a repeating unit which contains an oligomer or polymer chain Y having a number average molecular weight of 500 to 1,000,000. From the viewpoint of dispersion stability, the repeating unit is contained in the resin preferably in an amount of from 10 to 90 mol %, and more preferably from 30 to 70 mol %, with respect to the total repeating units included in the resin of the invention.

The content ratio (molar ratio) between the repeating unit (II-1) and the repeating unit (II-2), i.e., "(II-1):(II-2)" is in the range of preferably from 10:1 to 1:100, and more preferably from 1:1 to 1:10, in molar ratio, from the viewpoints of dispersion stability and balance between hydrophilicity and hydrophobicity.

Further, the repeating unit represented by Formula (II-3), which is additionally used if required, is preferably contained in an amount of from 0.5 to 20 mol %, and most preferably in an amount of from 1 to 10 mol %, with respect to the total repeating units included in the specific resin of the invention.

From the viewpoint of the dispersability, it is most preferable that both the repeating unit represented by Formula (I-1) and the repeating unit represented by Formula (I-2) are included in the specific resin.

(ii) Group "X" Having Functional Group Having pKa of 14 or Less

X represents a group which has a functional group having a pKa of 14 or less at a water temperature of 25° C. Herein, "pKa" is as defined in Chemistry Handbook (II) (revised $4^{th}$ edition, 1993, The Chemical Society of Japan, Maruzen Company, Limited).

The structure of the "functional group having a pKa of 14 or less" is not specifically limited as long as the physical property is satisfied, and well known functional groups satisfying the pKa range described above may be mentioned. Specific examples thereof include carboxylic acid (pKa of about 3 to 5), sulfonic acid (pKa of about −3 to −2), phosphoric acid (pKa of about 2), $—COCH_2CO—$ (pKa of about 8 to 10), $—COCH_2CN$ (pKa of about 8 to 11), —CONHCO—, phenolic hydroxyl group, $—R_FCH_2OH$ or $—(R_F)_2CHOH$ (in which $R_F$ represents a perfluoroalkyl group; pKa of about 9 to 11), and sulfonamide group (pKa of about 9 to 11). In particular, carboxylic acid (pKa of about 3 to 5), sulfonic acid (pKa about of −3 to −2), and $—COCH_2CO—$ (pKa of about 8 to 10) are preferable.

The group "X" having a functional group having a pKa of 14 or less is directly bonded to the nitrogen atom contained in the main chain structure. However, the nitrogen atom in the main chain moiety of the specific resin and X may be linked to each other not only by a covalent bond but also by an ionic bond to form a salt.

The molecular weight of the group "X" having a functional group having a pKa of 14 or less is preferably from 50 to 1,000, and most preferably from 50 to 500. By having the molecular weight in the range, developability and dispersability are improved.

As for the group "X" having a functional group with a pKa of 14 or less, a group having the structure represented by the following Formula (V-1), Formula (V-2), or Formula (V-3) is preferable.

Formula (V-1)

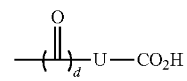

Formula (V-2)

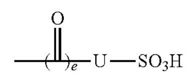

Formula (V-3)

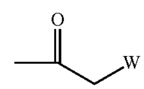

In Formula (V-1) and Formula (V-2), U represents a single bond or a divalent linking group; and d and e each independently represent 0 or 1. In Formula (V-3), W represents an acyl group or an alkoxycarbonyl group.

Examples of a divalent linking group represented by U include an alkylene group (more specifically, $—CH_2—$, $—CH_2CH_2—$, $—CH_2CHMe-$, $—(CH_2)_5—$, or $—CH_2CH(n\text{-}C_{10}H_{21})—$), an oxygen-containing alkylene group (more specifically, $—CH_2OCH_2—$ or $—CH_2CH_2OCH_2CH_2—$), a cycloalkylene group (such as a cyclobutylene group, a cyclopentylene group, a cyclohexylene group, or a cyclooctylene group), an arylene group (such as a phenylene group, a tolylene group, a biphenylene group, a naphthylene group, a furanylene group, or a pyrrolylene group), and an alkyleneoxy group (such as an ethyleneoxy group, a propyleneoxy group, or a phenyleneoxy group). In particular, an alkylene group having 1 to 30 carbon atoms, a cycloalkylene group having 5 to 20 carbon atoms, and an arylene group having 6 to 20 carbon atoms are preferable. An alkylene group having 1 to 20 carbon atoms, a cycloalkylene group having 5 to 10 carbon atoms, and an arylene group having 6 to 15 carbon atoms are most preferable. Further, from the viewpoint of productivity, d is preferably 1, and e is preferably 0.

In Formula (V-3), W represents an acyl group or an alkoxycarbonyl group. The acyl group represented by W is preferably an acyl group having 1 to 30 carbon atoms (such as a formyl group, an acetyl group, a n-propanoyl group, or a benzoyl group), and particularly preferably an acteyl group. The alkoxycarbonyl group represented by W is preferably an acyl group, and an acetyl group is preferable from the viewpoint of easy production and availability of raw materials (i.e., X' as a precursor of X).

"X" is characterized in that it is bonded to a nitrogen atom of a main chain moiety. As a result, dispersability and dispersion stability of the pigment are dramatically improved. Although it remains uncertain, the reason might be as follows. That is, the nitrogen atom of the main chain moiety is present in the structure of an amino group, an ammonium group, or an amide group, and these are adsorbed by interaction such as a hydrogen bond or ionic bond with an acidic moiety present on the surface of a pigment. Further, as the "X" functions as an acidic group, it is capable of interacting with a base moiety (e.g., a nitrogen atom or the like) or a metal atom (e.g., a copper atom in copper phthalocyanine, or the like) in the pigment. In other words, since the resin according to the first aspect of the invention is capable of adsorbing onto both the basic moiety and acidic moiety of the pigment via the nitrogen atom and the "X" group, adsorption property is increased, and therefore dispersability and storage stability are dramatically improved.

Further, since the "X" is a group containing a functional group having a pKa of 14 or less as a partial structure, it also functions as an alkali-soluble group. Based on this property, it is considered that, when the specific resin is used for a curable composition and partially cured by adding energy to a coating film thereof to form a pattern by dissolving and removing a non-exposed area, developability of a non-cured area using an alkali developer is improved. It is also considered that, in a colored curable composition obtained by using a pigment dispersion containing ultrafine pigments, a pigment dispersion and a colored curable composition which have a high pigment content ratio, and the like, it becomes possible to achieve simultaneously the dispersability, dispersion stability, and developability.

The content of the functional group having a pKa of 14 or less for X is not specifically limited, but is preferably from 0.01 to 5 mmol, and most preferably from 0.05 to 1 mmol, with respect to one gram of the specific resin. When the content is within the above ranges, dispersability and dispersion stability of the pigment in the pigment dispersion composition are improved. Further, when the pigment dispersion composition is used for a curable composition, developability of a non-cured area is improved. In terms of the acid value, the specific resin is preferably included in an amount to provide an acid value of about 5 to about 50 mgKOH/g from the viewpoint of developability of the specific resin when it is used in a pattern-forming curable composition.

Acid titration may be carried out by a method known in the art. For example, an indicator method (i.e., a method in which the neutralization point is determined using an indicator) or a potentiometric method may be used. As a titrant used for the acid value titration, a commercially available aqueous sodium hydroxide solution may be used. However, when it is difficult to measure the acid value by using an aqueous sodium hydroxide solution, for example, when an acid value of a functional group having a relatively high pKa (e.g., —$COCH_2CO$— or a phenolic hydroxyl group) is to be measured, a non-aqueous titrant such as a sodium methoxide dioxane solution may be prepared, and used for the acid value measurement based on a non-aqueous solvent system.

(iii) Oligomer Chain or Polymer Chain "Y" Having Number Average Molecular Weight of 500 to 100,000

Herein, "Y" represents an oligomer chain or polymer chain having a number average molecular weight of from 500 to 100,000. Examples of Y include a well known polymer chain capable of being linked to the main chain moiety of the specific resin, such as polyester, polyamide, polyimide, and poly(meth)acrylic acid ester. The binding site of Y to the main chain moiety of the specific resin is preferably at a terminal.

Y is preferably bonded to a nitrogen atom of the main chain moiety. The binding mode of Y to the main chain moiety includes a covalent bond, an ionic bond, or a combination of a covalent bond and an ionic bond. The ratio of binding modes (i.e., covalent bond:ionic bond) of Y to the main chain moiety is as follows: covalent bond:ionic bond =from 100:0 to 0:100, preferably from 95:5 to 5:95, more preferably from 90:10 to 10:90, and most preferably from 95:5 to 80:20. When the ratio between the covalent bond and ionic bond is within the above ranges, dispersability and dispersion stability are improved, and solvent solubility is improved.

It is preferable that Y is bonded to the nitrogen atom of the main chain moiety by an amide bond, or by an ionic bond as a carboxylate.

The number average molecular weight of Y may be measured by GPC in terms of polystyrene. The number average molecular weight of Y is particularly preferably from 1,000 to 50,000, and most preferably from 1,000 to 30,000, in terms of dispersability, dispersion stability and developability.

In a single molecule of the specific resin, at least two side chain structures represented by Y are preferably linked to the main chain moiety, and most preferably, at least five structures are linked to the main chain moiety.

In particular, it is preferable that Y has a structure represented by the following Formula (III-1).

Formula (III-1)

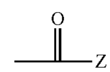

In Formula (III-1), Z is a polymer or oligomer which has a polyester chain as a partial structure, and represents a polyester having a free carboxylic acid represented by the following Formula (IV) from which a carboxyl group is removed.

Formula (IV)

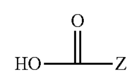

In Formula (IV), Z has the same definition as Z in Formula (III-1).

When the specific resin contains a repeating unit represented by Formula (I-3) or (II-3), it is preferable that Y' is represented by the following Formula (III-2).

Formula (III-2)

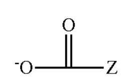

In Formula (III-2), Z has the same definition as Z in Formula (III-1).

The polyester having a carboxyl group at an end thereof (i.e., a polyester represented by Formula (IV)) may be obtained by polycondensation between (IV-1) carboxylic acid and lactone, polycondensation of (IV-2) hydroxyl group-containing carboxylic acid, or polycondensation between (IV-3) dihydric alcohol and dihydric carboxylic acid (or cyclic acid anhydride).

Examples of the carboxylic acid used for polycondensation between (IV-1) carboxylic acid and lactone include aliphatic carboxylic acid (preferably, a linear or branched carboxylic acid having 1 to 30 carbon atoms, such as formic acid, acetic acid, propionic acid, butyric acid, valeric acid, n-hexanoic acid, n-octanoic acid, n-decanoic acid, n-dodecanoic acid, palmitic acid, 2-ethylhexanoic acid, or cyclohexanoic acid), and hydroxyl group-containing carboxylic acid (preferably, a linear or branched hydroxyl group-containing carboxylic acid having 1 to 30 carbon atoms, such as glycolic acid, lactic acid, 3-hydroxypropionic acid, 4-hydroxydodecanoic acid, 5-hydroxydodecanoic acid, licinolic acid, 12-hydroxydodecanoic acid, 12-hydroxystearic acid, or 2,2-bis(hydroxymethyl)butyric acid). In particular, a linear carboxylic acid having 6 to 20 carbon atoms or a hydroxyl group-containing carboxylic acid having 1 to 20 carbon atoms are preferable. These carboxylic acids may be used as a mixture thereof. The lactone may be a well known lactone, and examples thereof include β-propiolactone, β-butyrolactone, γ-butyrolactone, γ-hexanolactone, γ-octanolactone, δ-valerolactone, δ-hexanoactone, δ-octanolactone, ε-caprolactone, δ-dodecanolactone, and α-methyl-γ-butyrolactone. Of these, ε-caprolactone is particularly preferable from the viewpoints of reactivity and availability.

Two or more kinds of these lactones may be used as a mixture.

The ratio of carboxylic acid and lactone used at the time of the reaction cannot be simply decided as it varies depending on the molecular weight of a desired polyester chain. However, it is preferable that "carboxylic acid:lactone"=1:1 to 1:1,000, and most preferably 1:3 to 1:500.

Examples of the hydroxyl group-containing carboxylic acid used for polycondensation of (IV-2) hydroxyl group-containing carboxylic acid are the same as hydroxyl group-containing carboxylic acid described above for above (IV-1), and the preferred scopes thereof are also the same.

Examples of the dihydric alcohol used for the polycondensation between (IV-3) dihydric alcohol and dihydric carboxylic acid (or cyclic acid anhydride) is preferably a linear or branched aliphatic diol (preferably a diol having 2 to 30 carbon atoms, such as ethylene glycol, diethylene glycol, triethylene glycol, dipropylene glycol, 1,2-propane diol, 1,3-propane diol, 1,5-pentane diol, 1,6-hexane diol, or 1,8-octane diol), and aliphatic diol having 2 to 20 carbon atoms is particularly preferable.

Examples of the dihydric carboxylic acid include a linear or a branched dihydric aliphatic carboxylic acid (preferably, a dihydric aliphatic carboxylic acid having 1 to 30 carbon atoms, such as succinic acid, maleic acid, adipic acid, sebacic acid, dodecanedioic acid, glautaric acid, suberic acid, tartaric acid, oxalic acid, or malonic acid). In particular, a dihydric carboxylic acid having 3 to 20 carbon atoms is particularly preferable. Further, an acid anhydride which is equivalent to these dihydric carboxylic acids (e.g., succinic anhydride or glutaric anhydride) may be used.

The dihydric carboxylic acid and the dihydric alcohol are preferably added in a molar ratio (dihydric carboxylic acid: dihydric alcohol) of 1:1. As a result, it becomes possible to introduce a carboxylic acid to the end.

The polycondensation at a time of production of a polyester is preferably carried out with the addition of a catalyst. The catalyst is preferably a catalyst which functions as a Lewis acid, and examples thereof include a Ti compound (for example, $Ti(OBu)_4$, $Ti(O{-}Pr)_4$, and the like), an Sn compound (for example, tin octylate, dibutyl tin oxide, dibutyl tin laurate, monobutyl tin hydroxybutyl oxide, stannic chloride, butyl tin dioxide, and the like), and protonic acid (for example, sulfuric acid, paratoluene sulfonic acid, and the like). The amount of the catalyst is preferably from 0.01 to 10 mol %, and most preferably from 0.1 to 5 mol %, with respect to the number of moles of the total monomers. The reaction temperature is preferably from 80 to 250° C., and most preferably from 100 to 180° C. The reaction time depends on the reaction condition, but it is usually from 1 hour to 24 hours.

The number average molecular weight of the polyester may be measured by GPC in terms of polystyrene. The number average molecular weight of the polyester is from 1,000 to 1,000,000, preferably from 2,000 to 100,000, and most preferably from 3,000 to 50,000. A molecular weight within the above ranges allows the compatibility of dispersability and developability.

The polyester partial structure that forms a polymer chain in Y is particularly preferably a polyester obtained by the polycondensation of (IV-1) a carboxylic acid and a lactone, or the polycondensation of (IV-2) hydroxyl group-containing carboxylic acid, from the viewpoint of easy production.

In the pigment dispersion composition according to the first aspect of the invention, another polymer compound described below, which is different from the polymer dispersant, may be used.

Examples of the additional polymer compound include a natural resin, a modified natural resin, a synthetic resin, and a synthetic resin modified with a natural resin.

As the natural resin, rosin is representative, and examples of the modified natural resin include a rosin derivative, a cellulose derivative, a rubber derivative, a protein derivative, and an oligomer thereof. Examples of the synthetic resin include an epoxy resin, an acrylic resin, a maleic acid resin, a butyral resin, a polyester resin, a melamine resin, a phenol resin, and a polyurethane resin. Examples of the synthetic resin modified with a natural resin include a rosin-modified maleic acid resin, and a rosin-modified phenol resin.

Examples of the synthetic resin include a polyamidoamine and a salt thereof, a polycarboxylic acid and a salt thereof, a high molecular weight unsaturated acid ester, a polyurethane, a polyester, a poly(meth)acrylate, a (meth)acryl copolymer, and a naphthalenesulfonic acid formalin condensate.

The content of the dispersant in the pigment dispersion composition according to the first aspect of the invention is, in terms of mass ratio between the pigment (total pigment including at least the azo pigment represented by Formula (1)) and the dispersant (i.e., total pigment including at least the azo pigment represented by Formula (1): dispersant), preferably from 1:0.1 to 1:2, more preferably from 1:0.2 to 1:1, and still more preferably from 1:0.4 to 1:0.7.

Solvent and Others

The pigment dispersion composition according to the first aspect of the invention may be appropriately produced using a solvent.

Specific examples of the solvent preferably include fatty acid esters such as ethyl acetate, butyl acetate, ethylene glycol monomethyl ether acetate, or propylene glycol monoethyl ether acetate; ketones such as acetone, methyl ethyl ketone, methyl isobutyl ketone, cyclohexanone, or diacetone alcohol; aromatic compounds such as benzene, toluene or xylene; alcohols such as methanol, ethanol, n-propanol, isopropanol, or n-butanol; glycols such as ethylene glycol, diethylene glycol, triethylene glycol, tetraethylene glycol, polyethylene glycol, propylene glycol, dipropylene glycol, tripropylene glycol, polypropylene glycol, trimethylene glycol, or hexanetriol; glycerin; alkylene glycol monoalkyl ethers such as ethylene glycol monomethyl ether, ethylene glycol monoethyl ether, diethylene glycol monomethyl ether, diethylene glycol monoethyl ether, propylene glycol monomethyl ether, or propylene glycol monoethyl ether; alkylene glycol dialkyl ethers such as triethylene glycol dimethyl ether, triethylene glycol diethyl ether, tetraethylene glycol dimethyl ether, or tetraethylene glycol diethyl ether; ethers such as tetrahydrofuran, dioxane, or diethylene glycol diethyl ether; alkanol amines such as monoethanolamine, diethanolamine, or triethanolamine; a nitrogen-containing polar organic solvent such as N,N-dimethylformamide, N,N-dimethylacetamide, N-methyl-2-pyrrolidone, 2-pyrrolidone, or 1,3-dimethyl-2-imidazolidinone; and water.

Among these solvents, a water soluble solvent may be mixed with water and used as an aqueous medium. Further, at least two kinds of solvents selected from the above except water may be mixed and used as an oily medium.

The pigment dispersion composition according to the first aspect of the invention may further contain an additional component, if necessary.

Red Colored Composition According to Second Aspect

The red colored composition according to the second aspect of the invention is a red colored composition which contains at least (A) a red pigment, (B) a yellow pigment, and (C) a dispersant, and provides a colored transmitting film satisfying all the characteristics (1) to (5) when the colored transmitting film having a film thickness of 0.6 μm is formed using the red colored composition:

(1) a transmission ratio of 50% is obtained in the light wavelength range of from 583 nm to less than 587 nm;

(2) a transmission ratio for the light having a wavelength of 400 nm is 15% or less;

(3) a transmission ratio for the light having a wavelength of 525 nm is 5% or less;

(4) a transmission ratio for the light having a wavelength of 600 nm is 75% or more; and (5) a transmission ratio for the light having a wavelength of 700 nm is 95% or more.

The red colored composition according to the second aspect of the invention is characterized in that: when the red colored composition is used to form a colored transmitting film having film thickness of 0.6 μm, the colored transmitting film satisfying all the characteristics (1) to (5).

In the second aspect, the solid matter means to include all of the components contained in the composition except a solvent, and a component that is liquid at room temperature (25° C.) is also included in the solid matter.

The colored transmitting film, which is a subject of transmission ratio measurement, may be produced by spin coating of the red colored composition on a glass substrate to form a coating film and drying the coating film using a hot plate (100° C.).

In the second aspect of the invention, the transmission ratio is a value obtained by measurement of the thus-produced colored transmitting film, as a subject of measurement, using an Instantaneous Multi-Photometry System (trade name: MCPD-3000, manufactured by Otsuka Electronics Co., Ltd.).

It is possible to control the red colored composition according to the second aspect of the invention to satisfy all the properties (1) to (5), by controlling the types of red pigment and yellow pigment, their content ratio, and/or their particle diameters, or the like.

Hereinbelow, each component included in the red colored composition according to the second aspect of the invention is explained in greater detail.

Pigment

The red colored composition according to the second aspect of the invention contains at least a pigment, and it contains at least (A) a red pigment and (B) a yellow pigment.

According to the second aspect of the invention, the pigment may be used either singly or in combination of two or more thereof.

Herein, explanations are given to the pigment.

Unlike dyes that are dissolved in water or an organic solvent and used in a molecule dispersion state, pigments are finely dispersed in a solvent as solid particles of molecular aggregates or the like.

More specifically, pigments are in a state in which molecules are very strongly combined to each other due to aggregation energy caused by the strong interaction among pigment molecules. Journal of the Imaging Society of Japan, Vol. 43, page 10 (2004), for example, discloses that van der Waals force among the molecules, hydrogen binding among the molecules, or the like is required to make such a state.

To increase van der Waals force among the molecules, it may be considered to introduce an aromatic group, a polar group and/or a heteroatom to the molecules. Further, to form a hydrogen bond among the molecules, it may be considered to introduce a substituent containing a hydrogen atom for binding to a heteroatom of the molecule and/or to introduce an electron-donating substituent, or the like. It is believed that high polarity of the whole molecule is preferable. As such, for an azo pigment, it is considered that a chain group such as an alkyl group is preferably relatively short, and a molecular weight/azo group ratio is preferably relatively small.

From the viewpoints of the above, the pigment molecule preferably contains an amide bond, a sulfone amide bond, an ether bond, a sulfone group, an oxycarbonyl group, an imide group, a carbamoylamino group, a heterocycle, a benzene ring, or the like.

The red colored composition according to the second aspect of the invention preferably contains a red pigment as a main pigment. Herein, the term “main pigment” means a pigment which is contained in an amount of 60% by mass or more with respect to the total mass of pigments contained in the red colored composition.

The content ratio between (A) a red pigment and (B) a yellow pigment (i.e., “A:B”) is, in terms of mass, preferably from 100:50 to 100:15, more preferably from 100:30 to 100:15, and still more preferably from 100:25 to 100:15.

The volume average particle diameter of the pigments included in the red colored composition according to the second aspect of the invention (i.e., the pigments including at least the red pigment and yellow pigment) is preferably from 1 nm to 250 nm. The volume average particle diameter of the pigment particle means a particle diameter of the pigments itself or a particle diameter including an adhered additive when an additive such as a dispersant is adhered on the pigment.

In the second aspect of the invention, as an apparatus for measuring the volume average particle diameter of the pigment in the red colored composition, a particle size analyzer NANOTRAC UPA-EX150 (trade name, manufactured by Nikkiso Co., Ltd.) is used. The measurement is carried out using 3 ml of the pigment dispersion composition placed in a measuring cell, and according to a predetermined measuring method. As parameters incorporated for the measurement, ink viscosity and density of pigment are used for viscosity and density of the dispersion particle, respectively.

The volume average particle diameter of the pigment included in the red colored composition according to the second aspect of the invention is preferably from 2 nm to 100 nm, and more preferably from 2 nm to 50 nm. From the viewpoint of obtaining good spectral characteristics, the volume average particle diameter of the pigment is particularly preferably from 2 nm to 30 nm, and most preferably from 2 nm to 15 nm.

The total content of the pigment(s) included in the red colored composition according to the second aspect of the invention is preferably in the range of from 1 to 35% by mass, and more preferably in the range of 2 to 25% by mass. When the content is within the above ranges, physical properties of dispersed materials, such as surface tension and viscosity are easily controlled, and therefore desirable.

(A) Red Pigment

Examples of the red pigment used in the second aspect include, among compounds classified as "pigment" according to COLOR INDEX (C. I.; published by The Society of Dyers and Colourists), the pigments given with the color index (C. I.) number as follows:

C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279; and an azo pigment represented by the following Formula (1).

Among these red pigments, an azo pigment represented by Formula (1) is more preferable.

Azo Pigment Represented by Formula (1)

A red pigment suitably used in the second aspect of the invention is an azo pigment represented by the following Formula (1).

(1)

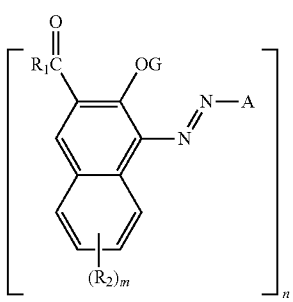

In Formula (1), G represents a hydrogen atom, an aliphatic group, an aryl group, or a heterocyclic group; $R_1$ represents an amino group, an aliphatic oxy group, an aliphatic group, an aryl group, or a heterocyclic group; and $R_2$ represents a substituent;

A represents any one of the groups represented by the following formulae (A-1) to (A-32);

m represents an integer from 0 to 5, and n represents an integer from 1 to 4;

when n represents 2 (i.e., when n=2), the azo pigment is a dimer in which two moieties each independently represented by Formula (1) are linked via $R_1$, $R_2$, A, or G;

when n represents 3 (i.e., when n=3), the azo pigment is a trimer in which two moieties each independently represented by Formula (1) are linked via $R_1$, $R_2$, A, or G;

when n represents 4 (i.e., when n=4), the azo pigment is a tetramer in which three moieties each independently represented by Formula (1) are linked via $R_1$, $R_2$, A, or G; and Formula (1) is free from an ionic hydrophilic group, in other words, Formula (1) has no ionic hydrophilic group.

(A-1)

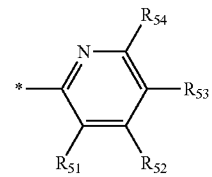

(A-2)

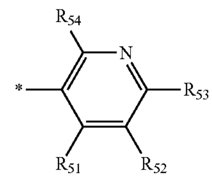

(A-3)

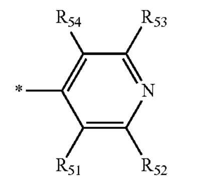

(A-4)

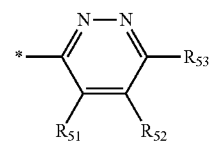

(A-5)

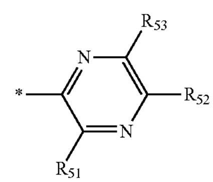

(A-6)

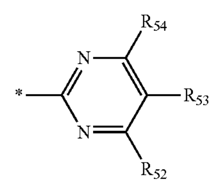

(A-7)

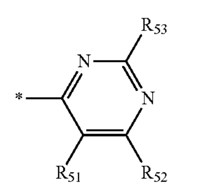

(A-8)

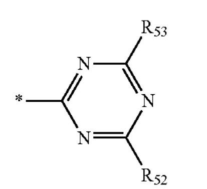

(A-9)

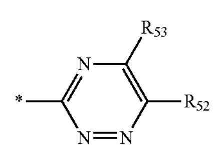

-continued
(A-10)
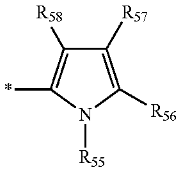
(A-11)
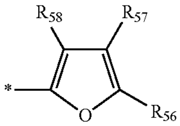
(A-12)
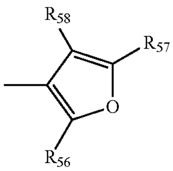
(A-13)
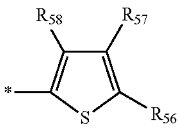
(A-14)
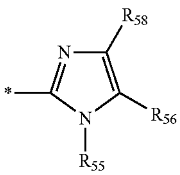
(A-15)
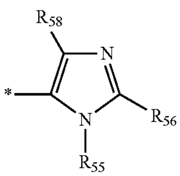
(A-16)
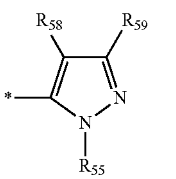
(A-17)
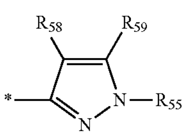
(A-18)
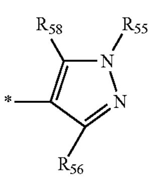
(A-19)
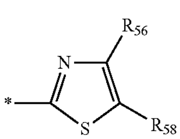
-continued
(A-20)
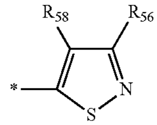
(A-21)
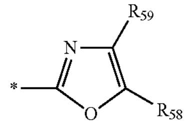
(A-22)
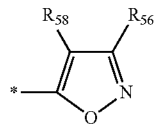
(A-23)
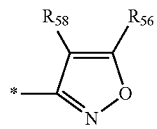
(A-24)
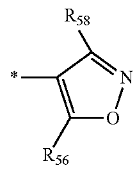
(A-25)
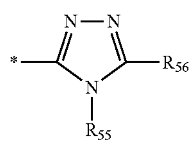
(A-26)
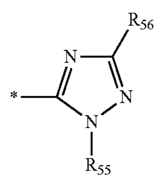
(A-27)
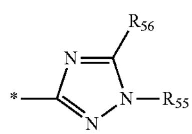
(A-28)
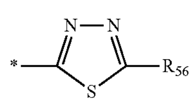
(A-29)
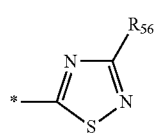
(A-30)
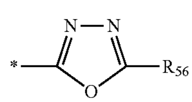

-continued (A-31)

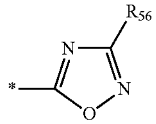

(A-32)

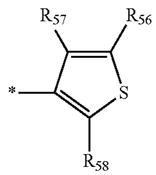

In Formulae (A-1) to (A-32), $R_{51}$ to $R_{59}$ each independently represent a hydrogen atom or a substituent, and adjacent substituents may be bound to each other to form a 5-membered to 6-membered ring; and * indicates a bonding position to an azo group in Formula (1).

Due to its specific structure, the compound represented by Formula (1) is capable of easily forming intermolecular interactions between pigment molecules, and as having low solubility in water or an organic solvent, it may be prepared as an azo pigment.

Further, as having the specific structure, the azo pigment represented by Formula (1) exhibits excellent color characteristics such as coloring ability and color tone, and also good durability such as resistance to light and ozone, or the like.

Specifically, a red colored pattern of a color filter formed using the red colored composition according to the second aspect of the invention containing an azo pigment represented by Formula (1) exhibits good spectral characteristics as red color.

Hereinbelow, the azo pigment represented by Formula (1) is explained in greater detail.

First, the aliphatic group, aryl group, heterocyclic group, and substituent in Formula (1) are explained.

The aliphatic group in Formula (1) of the second aspect has the same definition as the aliphatic group in Formula (1) of the first aspect, and the details thereof (including preferred scopes) are also the same.

The aryl group in Formula (1) of the second aspect has the same definition as the aryl group in Formula (1) of the first aspect, and the details thereof (including preferred scopes) are also the same.

The heterocyclic group in Formula (1) of the second aspect has the same definition as the heterocyclic group in Formula (1) of the first aspect, and the details thereof (including preferred scopes) are also the same.

Further, the substituent in Formula (1) of the second aspect has the same definition as the substituent in Formula (1) of the first aspect, and the details thereof (including preferred scopes) are also the same.

From the viewpoint of solubility, the azo pigment according to the second aspect of the invention does not contain an ionic hydrophilic group (for example, a carboxyl group, a sulfo group, a phosphono group, or a quaternary ammonium group) as a substituent. When an ionic hydrophilic group is contained, it is preferable that the ionic hydrophilic group is contained as a salt formed with a multivalent metal cation (e.g., magnesium, calcium, or barium), and is more preferably a lake pigment.

From the viewpoint of solubility, the azo pigment represented by Formula (1) does not contain an ionic hydrophilic group (for example, a carboxyl group, a sulfo group, a phosphono group, or a quaternary ammonium group) as a substituent.

The aliphatic group represented by G in Formula (1) of the second aspect has the same definition as the aliphatic group in Formula (1) of the first aspect, and the details thereof (including preferred scopes) are also the same.

The aryl group represented by G in Formula (1) of the second aspect has the same definition as the aryl group in Formula (1) of the first aspect, and the details thereof (including preferred scopes) are also the same.

The heterocyclic group represented by G in Formula (1) of the second aspect has the same definition as the heterocyclic group in Formula (1) of the first aspect, and the details thereof (including preferred scopes) are also the same.

In the second aspect, G is preferably a hydrogen atom. This is because that an intramolecular hydrogen bond or an intramolecular crossed hydrogen bond may be easily formed.

The amino group represented by $R_1$ in the second aspect has the same definition as the amino group represented by $R_1$ in Formula (1) of the first aspect, and the details thereof (including preferred scopes) are also the same.

The aliphatic oxy group represented by $R_1$ in the second aspect has the same definition as the aliphatic oxy group represented by $R_1$ in Formula (1) of the first aspect, and the details thereof (including preferred scopes) are also the same.

The aliphatic group represented by $R_1$ in the second aspect has the same definition as the aliphatic group represented by $R_1$ in Formula (1) of the first aspect, and the details thereof (including preferred scopes) are also the same.

The aryl group represented by $R_1$ in the second aspect has the same definition as the aryl group represented by $R_1$ in Formula (1) of the first aspect, and the details thereof (including preferred scopes) are also the same.

The heterocyclic group represented by $R_1$ in the second aspect has the same definition as the heterocyclic group represented by $R_{11n}$ Formula (1) of the first aspect, and the details thereof (including preferred scopes) are also the same.

The substituent represented by $R_2$ in the second aspect has the same definition as the substituent represented by $R_2$ in Formula (1) of the first aspect, and the details thereof (including preferred scopes) are also the same.

Furthermore, m and n in the second aspect have the same definitions as m and n in Formula (1) of the first aspect, respectively, and the details thereof (including preferred scopes) are also the same.

Formula (A-1) to (A-32) each represented by A in the second aspect have the same definitions as A in Formula (1) of the first aspect, and the details thereof (including preferred scopes) are also the same.

From the viewpoint of the effect of the second aspect of the invention, it is more preferable that the azo pigment represented by Formula (1) of the second aspect is the azo pigment represented by Formula (2) of the first aspect. The azo pigment represented by Formula (2) of the second aspect has the same definition as the azo pigment represented by Formula (2) of the first aspect, and the details thereof (including preferred scopes) are also the same.

Tautomers of the azo pigment represented by Formula (1) or Formula (2) are also included in the scope of the second aspect of the invention. Although Formula (1) or Formula (2) correspond to an extreme structure of various tautomers the azo pigment can have in terms of a chemical structure, a tautomer having a structure other than those described herein may be used, or a mixture containing plural tautomers may be used.

For example, the azo pigment represented by Formula (1) includes a tautomer of azohydrazone that is represented by the following Formula (1'). The pigment represented by Formula (1') of the second aspect has the same definition as defined in the first aspect, and the details thereof (including preferred scopes) are also the same.

Specific examples of the azo pigment represented by Formula (1) according to the second aspect are the same as those of the azo pigment represented by Formula (1) according to the first aspect.

Regarding an exemplary method for producing the azo pigment represented by Formula (1) according to the second aspect, the azo pigment represented by Formula (1) according to the second aspect may be produced by the same method as the method for producing the azo pigment represented by Formula (1) according to the first aspect.

In the second aspect, the average primary particle diameter of the azo pigment represented by Formula (1) is preferably 100 nm or less, and more preferably 80 nm or less.

In the second aspect, by performing solvent salt milling, for example, the average primary particle diameter of the azo pigment represented by Formula (1) may be easily controlled to be within the above ranges. The average primary particle diameter of the azo pigment may be also controlled by dry milling, or the like.

In the second aspect, it is preferable to use an azo pigment represented by Formula (1) which has been subjected to solvent salt milling to have an average primary particle diameter of preferably 100 nm or less, and more preferably 80 nm or less.

(B) Yellow Pigment

Examples of the yellow pigment used in the second aspect include, among compounds classified as "pigment" according to COLOR INDEX (C. I.; published by The Society of Dyers and Colourists), the pigments given with the color index (C. I.) number as follows:

C. I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214.

Among the yellow pigments, C. I. Pigment Yellow 11, 24, 108, 109, 110, 138, 139, 150, 151, 154, 167, 180, and 185 are preferable. From the viewpoint of spectral characteristics, C.I Pigment Yellow 139 is more preferable.

Other Pigments

The pigment dispersion composition according to the second aspect of the invention may further contain an additional pigment other than (A) a red pigment and (B) a yellow pigment, as long as the purpose of the second aspect of the invention is not impaired.

The additional pigments are not specifically limited, and examples thereof include the additional pigments used in the first aspect, and the details thereof (including preferred scopes) are also the same.

As for the additional pigments used in the second aspect, a compound classified as "pigment" according to COLOR INDEX (C. I.; published by The Society of Dyers and Colourists) may be used, and examples thereof include compounds given with the color index (C. I.) number as follows:

C. I. Pigment Orange 2, 5, 13, 16, 17:1, 31, 34, 36, 38, 43, 46, 48, 49, 51, 52, 55, 59, 60, 61, 62, 64, 71, 73;

C. I. Pigment Green 7, 10, 36, 37, 58;

C. I. Pigment Blue 1, 2, 15, 15:1, 15:2, 15:3, 15:4, 15:6, 16, 22, 60, 64, 66, 79, a pigment in which Cl substituent of 79 is modified to OH, 80;

C. I. Pigment Violet 1, 19, 23, 27, 32, 37, 42;

C. I. Pigment Brown 25, 28; and

C. I. Pigment Black 1, 7.

However, the additional pigment used in the second aspect of the invention is not limited to them.

Among the above, pigments that are preferably used include the followings:

C. I. Pigment Orange 36, 71;

C. I. Pigment Red 122, 150, 171, 175, 177, 209, 224, 242, 254, 255, 264;

C. I. Pigment Violet 19, 23, 29, 32;

C. I. Pigment Blue 15:1, 15:3, 15:6, 16, 22, 60, 66;

C. I. Pigment Green 7, 36, 37, 58; and

C. I. Pigment Black 1, 7.

Further, an inorganic pigment may be used as the additional pigment, and specific examples thereof include titanium oxide, barium sulfate, calcium carbonate, zinc oxide, lead sulfate, lead yellow, zinc sulfide, red iron (III) oxide, cadmium red, ultramarine, Prussion blue, chromium oxide green, cobalt green, amber, titan black, synthetic iron black, and carbon black.

In particular, from the viewpoint of further improving spectral characteristics (i.e., color tone) of a red colored pattern (i.e., red color filter), the pigment dispersion composition according to the second aspect of the invention preferably contains at least one pigment having a color selected from red, yellow, orange and violet, in addition to the azo pigment represented by Formula (1). At least one pigment given with a C. I. number as exemplified above may be selected and used as such pigment. As a result, transmission ratio in a relatively short wavelength range (e.g., wavelength of 500 nm or less, and more preferably wavelength of 400 nm or less) is additionally inhibited, and thus more favorable red color is obtained.

When the azo pigment represented by Formula (1) is used in combination with a pigment other than the azo pigment (in particular, a pigment having a color selected from red, yellow, orange and violet) in a red colored composition according to the second aspect of the invention, the content of the additional pigment is preferably 50% by mass or less, more preferably 40% by mass or less, and still more preferably 30% by mass or less, with respect to the total mass of the pigment contained in the red colored composition according to the second aspect of the invention (or the colored curable composition according to the second aspect of the invention).

The lower limit of the content of the additional pigment (in particular, a pigment having a color selected from red, yellow, orange and violet) other than the azo pigment represented by formula (1) is not particularly limited. However, from the viewpoint of controlling the spectral characteristics, the lower limit is preferably 5% by mass, and more preferably 10% by mass.

The total mass of pigment(s) contained in the red colored composition according to the second aspect of the invention is preferably from 30% by mass to 65% by mass, more preferably from 45% by mass to 65% by mass, and still more preferably from 55% by mass to 65% by mass, with respect to the solid contents.

Dispersant

The red colored composition according to the second aspect of the invention further contains at least one dispersant.

The dispersant is not specifically limited, and a well known pigment dispersant may be used.

Preferred examples of the dispersant include a nitrogen atom-containing graft copolymer and a polymer compound containing at least one repeating unit selected from the repeating units represented by Formula (I) and Formula (II) shown below.

Nitrogen Atom-Containing Graft Copolymer

The nitrogen atom-containing graft copolymer preferably has a repeating unit in which a nitrogen atom is contained in the main chain thereof. In particular, a graft copolymer which has a repeating unit represented by Formula (A) and/or a repeating unit represented by Formula (B), as described in the first aspect, is preferable. The graft copolymer used in the second aspect which has a repeating unit represented by Formula (A) and/or a repeating unit represented by Formula (B) has the same definition as defined in the first aspect, and the details thereof (including preferred scopes) are also the same.

Polymer Compound Containing at Least One Repeating Unit Selected from Repeating Units Represented by Formula (I) and Formula (II)

From the viewpoint of further improving dispersion stability, it is preferable that the dispersant used in the second aspect of the invention is a polymer compound (hereinbelow, may be referred to as "specific polymer according to the second aspect") which contains at least one repeating unit selected from the group consisting of a repeating unit represented by the following Formula (I) and a repeating unit represented by the following Formula (II).

(I)

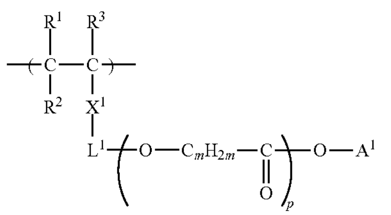

(II)

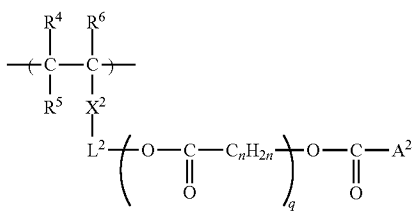

In Formulae (I) and (II), $R^1$ to $R^6$ each independently represent a hydrogen atom or a monovalent organic group, $X^1$ and $X^2$ each independently represent —CO—, —C(═O)O—, —CONH—, —OC(═O)—, or a phenylene group, $L^1$ and $L^2$ each independently represent a single bond or a divalent organic linking group, $A^1$ and $A^2$ each independently represent a monovalent organic group, m and n each independently represent an integer from 2 to 8, and p and q each independently represent an integer from 1 to 100.

Formulae (I) and (II) are explained in greater detail.

In Formula (I) and (II), $R^1$ to $R^6$ each independently represent a hydrogen atom or a monovalent organic group. As a monovalent organic group, a substituted or unsubstituted alkyl group is preferable. As an alkyl group, an alkyl group having 1 to 12 carbon atoms is preferable, an alkyl group having 1 to 8 carbon atoms is more preferable, and an alkyl group having 1 to 4 carbon atoms is particularly preferable.

When the alkyl group has a substituent, examples of the substituent include a hydroxyl group, and an alkoxy group (an alkoxy group having preferably 1 to 5 carbon atoms, and more preferably 1 to 3 carbon atoms, such as a methoxy group, an ethoxy group, or a cyclohexyloxy group).

Preferred examples of the alkyl group include a methyl group, an ethyl group, a propyl group, an n-butyl group, an i-butyl group, a t-butyl group, an n-hexyl group, a cyclohexyl group, a 2-hydroxyethyl group, a 3-hydroxypropyl group, a 2-hydroxypropyl group, and a 2-methoxyethyl group.

In Formulae (I) and (II), R', $R^2$, $R^4$, and $R^5$ preferably represent a hydrogen atom, and $R^3$ and $R^6$ each preferably represent a hydrogen atom or a methyl group in terms of adsorption efficiency onto a pigment surface.

In Formulae (I) and (II), $X^1$ and $X^2$ each independently represent —CO—, —C(═O)O—, —CONH—, —OC(═O)—, or a phenylene group. Of these, —C(═O)O—, —CONH—, or a phenylene group is preferable in terms of adsorption to pigment, and —C(═O)O— is most preferable.

In Formula (I) and (II), $L^1$ and $L^2$ each independently represent a single bond or a divalent organic linking group. As a divalent organic linking group, a substituted or unsubstituted alkylene group, or a divalent organic linking group having the alkylene group and a heteroatom or a partial structure including a heteroatom is preferable. Herein, the alkylene group is preferably an alkylene group having 1 to 12 carbon atoms, more preferably an alkylene group having 1 to 8 carbon atoms, and particularly preferably an alkylene group having 1 to 4 carbon atoms. Further, examples of the hetero atom in the partial structure containing a hetero atom include an oxygen atom, a nitrogen atom, and a sulfur atom. Of these, an oxygen atom or a nitrogen atom is preferable.

Specific examples of the preferred alkylene group include a methylene group, an ethylene group, a propylene group, a trimethylene group, and a tetramethylene group.

When the alkylene group has a substituent, examples of the substituent include a hydroxyl group.

As for the divalent organic linking group, a group in which a heteroatom or a partial structure including the hetero atom selected from —C(═O)—, —OC(═O)— and —NHC(═O)— is contained at an end of the alkylene group and which is linked to an adjacent oxygen atom via the hetero atom or the partial structure including the hetero atom is preferable in terms of adsorption property to the pigment. Herein, the adjacent oxygen atom means an oxygen atom which is bonded to $L^1$ of Formula (I) and $L^2$ of Formula (II) at the side chain terminal.

In Formula (I) and (II), $A^1$ and $A^2$ each independently represent a monovalent organic group. The monovalent organic group is preferably a substituted or unsubstituted alkyl group, or a substituted or unsubstituted aryl group.

Preferred examples of the alkyl group include a linear, branched or cyclic alkyl group having 1 to 20 carbon atoms, and specific examples thereof include a methyl group, an ethyl group, a propyl group, a butyl group, a pentyl group, a hexyl group, a heptyl group, an octyl group, a nonyl group, a decyl group, a undecyl group, a dodecyl group, a tridecyl group, a hexadecyl group, an octadecyl group, an eicosyl group, an isopropyl group, an isobutyl group, a s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group.

As a substituent for the substituted alkyl group, a monovalent non-metal atomic group other than hydrogen is used. Preferred examples thereof include a halogen atom (—F, —Br, —Cl, —I), a hydroxyl group, an alkoxy group, an aryloxy group, a mercapto group, an alkylthio group, an arylthio group, an alkyldithio group, an aryldithio group, an amino group, a N-alkylamino group, a N,N-dialkylamino group, a N-arylamino group, a N,N-diarylamino group, a N-alkyl-N-arylamino group, an acyloxy group, a carbamoyloxy group, a N-alkylcarbamoyloxy group, a N-arylcarbamoyloxy group, a N,N-dialkylcarbamoyloxy group, a N,N-diarylcarbamoyloxy group, a N-alkyl-N-arylcarbamoyloxy group, an alkylsulfoxy group, an arylsulfoxy group, an acyloxy group, an acylthio group, an acylamino group, a N-alkylacylamino group, a N-arylacylamino group, a ureido group, a N'-alkylureido group, a N',N'-dialkylureido group, a N'-arylureido group, a N',N'-diarylureido group, a N'-alkyl-N'-arylureido group, a N-alkylureido group, a N-arylureido group, a N'-alkyl-N-alkylureido group, a N'-alkyl-N-arylureido group, a N',N'-dialkyl-N-alkylureido group, a N',N'-dialkyl-N-arylureido group, a N'-aryl-N-alkylureido group, a N'-aryl-N-arylureido group, a N',N'-diaryl-N-alkylureido group, a N',N'-diaryl-N-arylureido group, a N'-alkyl-N'-aryl-N-alkylureido group, a N'-alkyl-N'-aryl-N-arylureido group, an alkoxycarbonylamino group, an aryloxycarbonylamino group, a N-alkyl-N-alkoxycarbonylamino group, a N-alkyl-N-aryloxycarbonylamino group, a N-aryl-N-alkoxycarbonylamino group, a N-aryl-N-aryloxycarbonylamino group, a formyl group, an acyl group, a carboxyl group, an alkoxycarbonyl group, an aryloxycarbonyl group, a carbamoyl group, a N-alkylcarbamoyl group, a N,N-dialkylcarbamoyl group, a N-arylcarbamoyl group, a N,N-diarylcarbamoyl group, a N-alkyl-N-arylcarbamoyl group, an alkylsulfinyl group, an arylsulfinyl group, an alkylsulfonyl group, an arylsulfonyl group, a sulfo group ($—SO_3H$) and its conjugate base group (hereinbelow, referred to as a sulfonate group), alkoxysulfonyl group, an aryloxysulfonyl group, a sulfinamoyl group, a N-alkylsulfinamoyl group, a N,N-dialkylsulfinamoyl group, a N-arylsulfinamoyl group, a N,N-diarylsulfinamoyl group, a N-alkyl-N-arylsulfinamoyl group, a sulfamoyl group, a N-alkylsulfamoyl group, a N,N-dialkylsulfamoyl group, a N-arylsulfamoyl group, a N,N-diarylsulfamoyl group, a N-alkyl-N-arylsulfamoyl group, a phosphono group ($—PO_3H_2$) and its conjugate base group (hereinbelow, referred to as a phosphonate group), dialkylphosphono group ($—PO_3(alkyl)_2$), diarylphosphono group ($—PO_3(aryl)_2$), alkylarylphosphono group ($—PO_3(alkyl)(aryl)$), monoalkylphosphono group ($—PO_3H(alkyl)$) and its conjugate base group (hereinbelow, referred to as an alkylphosphonate group), monoarylphosphono group ($—PO_3H(aryl)$) and its conjugate base group (hereinbelow, referred to as an arylphosphonate group), phosphonooxy group ($—OPO_3H_2$) and its conjugate base group (hereinbelow, referred to as a phosphonate oxy group), dialkylphosphonooxy group ($—OPO_3(alkyl)_2$), diarylphosphonooxy group ($—OPO_3(aryl)_2$), alkylarylphosphonooxy group ($—OPO_3(alkyl)(aryl)$), monoalkylphosphonooxy group ($—OPO_3H(alkyl)$) and its conjugate base group (hereinbelow, referred to as an alkylphosphonate oxy group), monoarylphosphonooxy group ($—OPO_3H(aryl)$) and its conjugate base group (hereinbelow, referred to as an arylphosphonate oxy group), cyano group, a nitro group, an aryl group, a heteroaryl group, an alkenyl group, an alkynyl group, and a silyl group.

Specific examples of the alkyl group for the above substituents include the alkyl group described above, and they may have an additional substituent.

As the additional substituent, an alkoxy group, an aryloxy group, an alkylthio group, an arylthio group, a N,N-dialkylamino group, a N,N-diarylamino group, a N-alkyl-N-arylamino group, an acyloxy group, an aryl group, a heteroaryl group, an alkenyl group, an alkynyl group, or a silyl group is preferable in terms of dispersion stability.

Specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, a N-phenylcarbamoylphenyl group, a phenyl group, a cyanophenyl group, a sulfophenyl group, a sulfonate phenyl group, a phosphonophenyl group, and a phosphonate phenyl group.

From the viewpoints of dispersion stability and developability, $A^1$ and $A^2$ preferably each independently represent a linear alkyl group having 1 to 20 carbon atoms, a branched alkyl group having 3 to 20 carbon atoms, or a cyclic alkyl group having 5 to 20 carbon atoms. More preferably, $A^1$ and $A^2$ each independently present a linear alkyl group having 4 to 15 carbon atoms, a branched alkyl group having 4 to 15 carbon atoms, or a cyclic alkyl group having 6 to 10 carbon atoms. Still more preferably, $A^1$ and $A^2$ each independently represent a linear alkyl group having 6 to 10 carbon atoms or a branched alkyl group having 6 to 12 carbon atoms.

In Formulae (I) and (II), m and n each independently represent an integer from 2 to 8, and from the viewpoints of dispersion stability and developability, preferably an integer from 4 to 6, and more preferably 5.

In Formulae (I) and (II), p and q each independently represent an integer from 1 to 100. Two or more compounds having different p and/or q may be mixed. From the viewpoints of dispersion stability and developability, p and q are each preferably from an integer of from 5 to 60, more preferably from 5 to 40, and still more preferably from 5 to 20.

From the viewpoint of the dispersion stability, the specific polymer according to the second aspect preferably contains the repeating unit represented by Formula (1).

Further, the repeating unit represented by Formula (1) is preferably a repeating unit represented by the following Formula (I)-2.

(I)-2

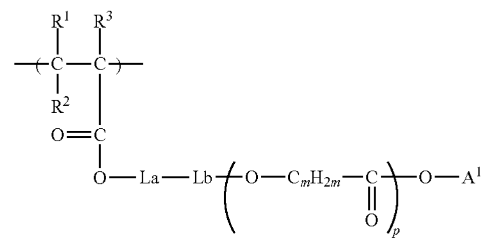

In Formulae (I)-2, $R^1$ to $R^3$ each independently represent a hydrogen atom or a monovalent organic group, La represents an alkylene group having 2 to 10 carbon atoms, Lb represents —C(═O)— or —NHC(═O)—, $A^1$ represents a monovalent organic group, m represents an integer from 2 to 8, and p represents an integer from 1 to 100.

Each of the repeating units represented by Formulae (I), (II) and (I)-2 may be introduced as a repeating unit of a copolymer compound, by polymerization or copolymerization of a monomer represented by the following Formula (i), (ii) or (i)-2.

(i)

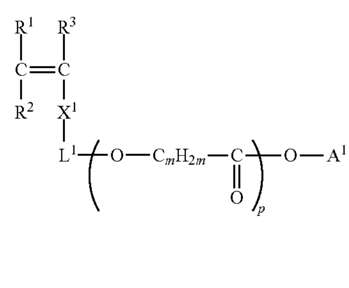

-continued (ii)

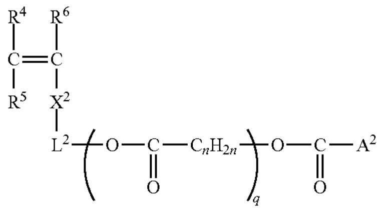

(i)-2

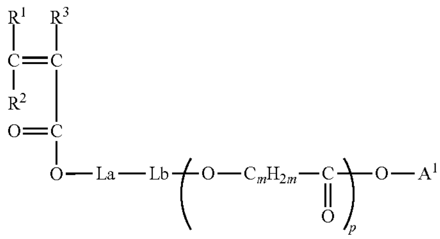

In Formulae (i), (ii), and (i)-2, $R^1$ to $R^6$ each independently represent a hydrogen atom or a monovalent organic group, $X^1$ and $X^2$ each independently represent —CO—, —C(═O)O—, —CONH—, —OC(═O)—, or a phenylene group, $L^1$ and $L^2$ each independently represent a single bond or a divalent organic linking group, La represents an alkylene group having 2 to 10 carbon atoms, Lb represents —C(═O)— or —NHC(═O)—, $A^1$ and $A^2$ each independently represent a monovalent organic group, m and n each independently represent an integer from 2 to 8, and p and q each independently represent an integer from 1 to 100.

Hereinbelow, specific examples of monomers represented by Formula (i), (ii) or (i)-2 [i.e., monomers (XA-1) to (XA-23)] are shown. However, the invention is not limited to them.

(XA-1)

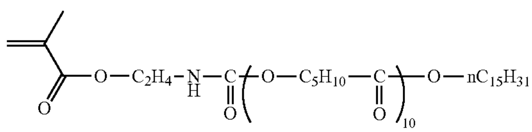

(XA-2)

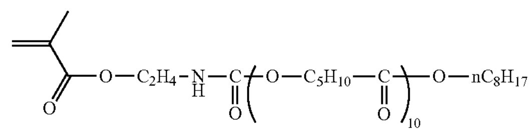

(XA-3)

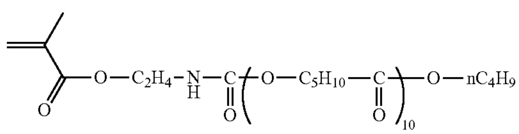

(XA-4)

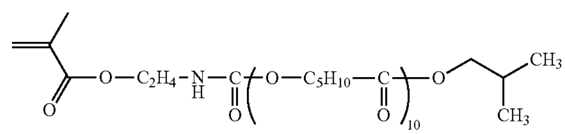

(XA-5)

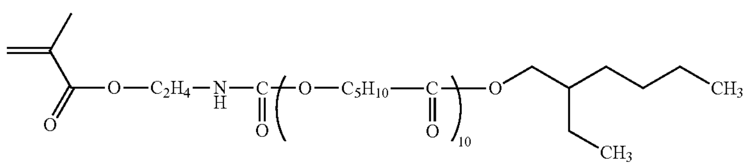

(XA-6)

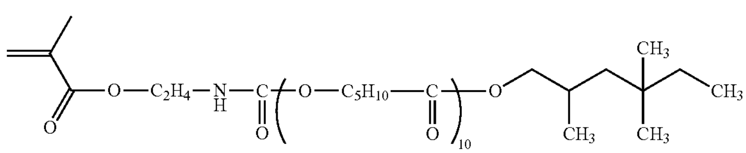

(XA-7)

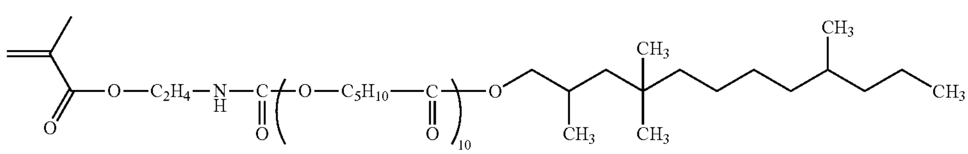

(XA-8)

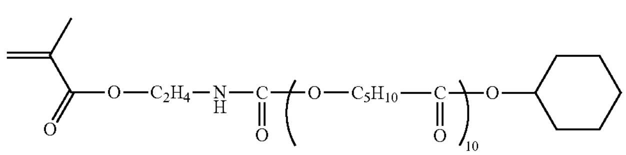

(XA-9)

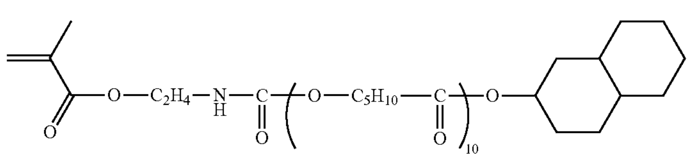

-continued
(XA-10)
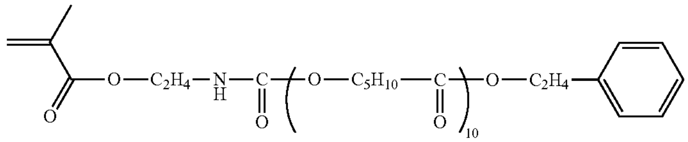
(XA-11)
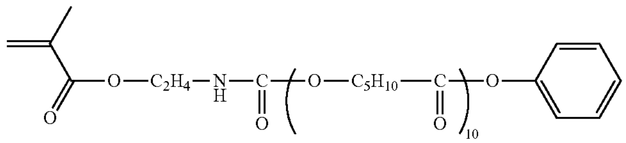
(XA-12)
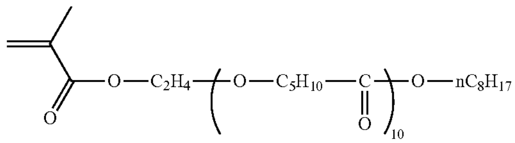
(XA-13)
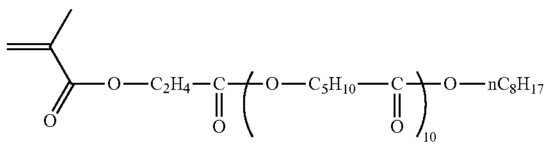
(XA-14)
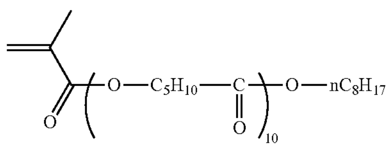
(XA-15)
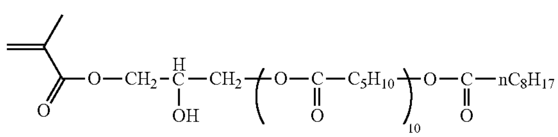
(XA-16)
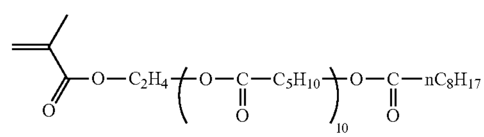
(XA-17)
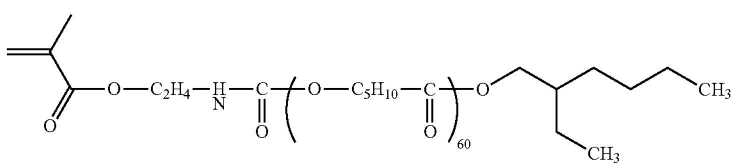
(XA-18)
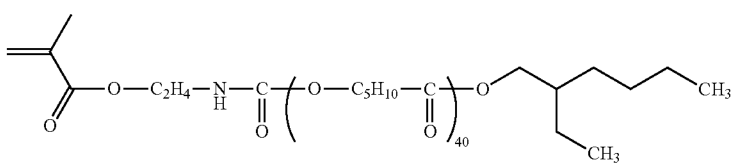
(XA-19)
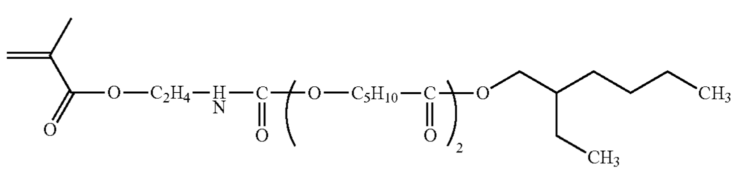
(XA-20)
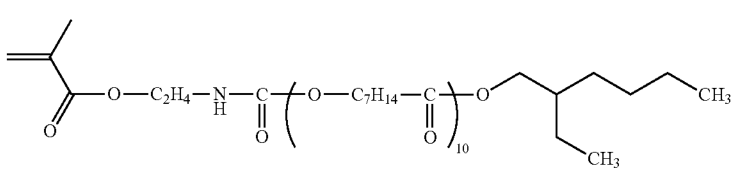

-continued (XA-21)

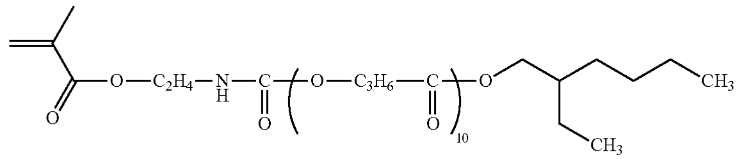

(XA-22)

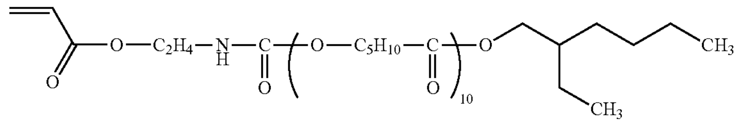

(XA-23)

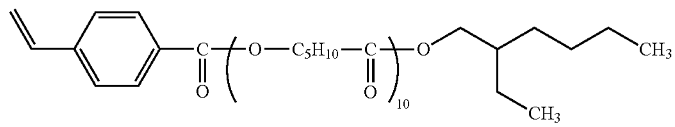

The specific polymer according to the second aspect contains at least one repeating unit selected from the repeating unit represented by Formulae (I) and the repeating unit represented by (II), and may contain one type of the repeating unit, or two or more types of the repeating units.

In the specific polymer according to the second aspect, the contents of the repeating units represented by Formulae (I) and (II) are not specifically limited. However, when the total repeating units contained in the polymer is 100% by weight, it is preferable that any one of the repeating units represented by Formulae (I) and (II) is contained in an amount of 5% by mass or more, more preferably in an amount of 50% by mass or more, and still more preferably in an amount of from 50% by mass to 80% by mass.

For the purpose of increasing adsorption to the pigment, the specific polymer according to the second aspect is preferably a polymer compound obtained by copolymerizing a monomer having a functional group capable of adsorbing to a pigment and a monomer represented by Formula (i), (ii) or (i)-2.

Specific examples of the monomer having a functional group capable of adsorbing to a pigment include a monomer having an acidic group, a monomer having an organic pigment structure or a heterocyclic structure, a monomer having a basic nitrogen atom, and a monomer having an ionic group. Of these, from the viewpoint of adsorption to a pigment, a monomer having an acidic group and a monomer having an organic pigment structure or a heterocyclic structure are preferable.

Examples of the monomer having an acidic group include a vinyl monomer having a carboxyl group and a vinyl monomer having a sulfonic acid group.

Examples of the vinyl monomer having a carboxyl group include (meth)acrylic acid, vinyl benzoic acid, maleic acid, maleic acid monoalkyl ester, fumaric acid, itaconic acid, crotonic acid, cinnamic acid, and an acrylic acid dimer. Further, an addition product of a monomer having a hydroxyl group, such as 2-hydroxyethyl(meth)acrylate, and a cyclic anhydride such as maleic anhydride, phthalic anhydride, succinic anhydride, or cyclohexane dicarboxylic acid anhydride; ω-carboxy-polycaprolactone mono(meth)acrylate, or the like may be also used. Further, as a precursor of carboxyl group, a monomer having an anhydride such as maleic anhydride, itaconic anhydride, and citraconic anhydride may be used. Of these, from the viewpoint of avoiding development of a non-exposed area, an addition product of a monomer having a hydroxyl group, such as 2-hydroxyethyl(meth)acrylate, and a cyclic anhydride such as maleic anhydride, phthalic anhydride, succinic anhydride, or cyclohexane dicarboxylic acid anhydride is preferable.

Examples of the vinyl monomer having a sulfonic acid group include 2-acrylamide-2-methylpropane sulfonic acid. Examples of the vinyl monomer having a phosphoric acid group include mono(2-acryloyloxyethyl ester) phosphate and mono(1-methyl-2-acryloyloxyethyl ester) phosphate.

The specific polymer according to the second aspect preferably contains a repeating unit derived from the monomer having an acidic group. By having such a repeating unit, a colored curable composition that exerts excellent removability of a non-exposed area at the time of development when the pigment dispersion composition according to the second aspect of the invention is used for producing the colored curable composition.

The specific polymer according to the second aspect may contain one type of a repeating unit derived from the monomer having an acidic group, or two or more types of repeating units derived from the monomer having an acidic group.

In the specific polymer according to the second aspect, the content of acidic group to be introduced to a side chain by the monomer having an acidic group is preferably 50 mgKOH/g or more, and particularly preferably from 50 mgKOH/g to 200 mgKOH/g. Specifically, from the viewpoint of inhibiting generation of precipitates in a developer, it is preferable that the content of a repeating unit derived from a monomer having an acidic group is 50 mgKOH/g or more. In order to effectively inhibit the occurrence of secondary aggregates that are aggregates of a primary pigment particle or to effectively weaken the aggregation force among the secondary aggregates, the content of acidic group is preferably from 50 mgKOH/g to 200 mgKOH/g.

Examples of the monomer having an organic pigment structure or a heterocyclic structure include any one selected from the group consisting of certain monomers, maleimide and maleimide derivatives that are described in paragraphs [0048] to [0070] in JP-A No. 2009-256572.

Examples of the monomer having a basic nitrogen atom include (meth)acrylic acid esters such as N,N-dimethylamino ethyl(meth)acrylate, N,N-dimethylamino propyl(meth)acrylate, 1-(N,N-dimethylamino)-1,1-dimethyl methyl(meth) acrylate, N,N-dimethylamino hexyl(meth)acrylate, N,N-diethylamino ethyl(meth)acrylate, N,N-diisopropylamino ethyl(meth)acrylate, N,N-di-n-butylamino ethyl(meth)acrylate, N,N-di-1-butylamino ethyl(meth)acrylate, morpholinoethyl(meth)acrylate, piperidino ethyl(meth)acrylate, 1-pyrrolidino ethyl(meth)acrylate, N,N-methyl-2-pyrrolidylamino ethyl(meth)acrylate, or N,N-methylphenylamino ethyl (meth)acrylate; (meth)acrylamides such as N—(N',N'-dimethylamino ethyl)acrylamide, N—(N',N'-dimethylamino ethyl)methacrylamide, N—(N',N'-diethylamino ethyl)acrylamide, N—(N',N'-diethylamino ethyl)methacrylamide, N—(N',N'-dimethylaminopropyl)acrylamide, N—(N',N'-dimethylaminopropyl)methacrylamide, N—(N',N'-diethylaminopropyl)acrylamide, N—(N',N'-diethylaminopropyl) methacrylamide, 2-(N,N-dimethylamino)ethyl(meth) acrylamide, 2-(N,N-diethylamino)ethyl(meth)acrylamide, 3-(N,N-diethylamino)propyl(meth)acrylamide, 3-(N,N-dimethylamino)propyl(meth)acrylamide, 1-(N,N-dimethylamino)-1,1-dimethylmethyl(meth)acrylamide, 6-(N,N-diethylamino)hexyl(meth)acrylamide, morpholino(meth) acrylamide, piperidino(meth)acrylamide, or N-methyl-2-pyrrolidyl(meth)acrylamide; and as styrenes such as N,N-dimethylamino styrene or N,N-dimethylaminomethyl styrene.

Further, a monomer having a urea group, a urethane group, a hydrocarbon group which has 4 or more carbon atoms and has a coordinating oxygen atom, an alkoxysilyl group, an epoxy group, an isocyanate group or a hydroxyl group may be used. Specifically, examples thereof include monomers of the following structures.

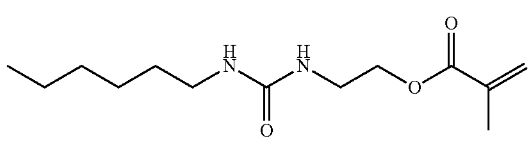

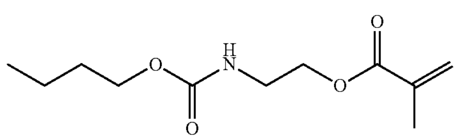

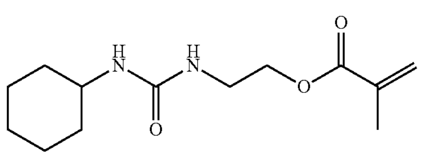

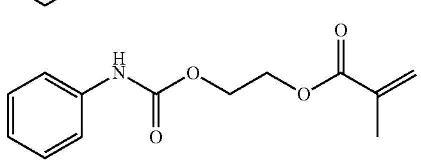

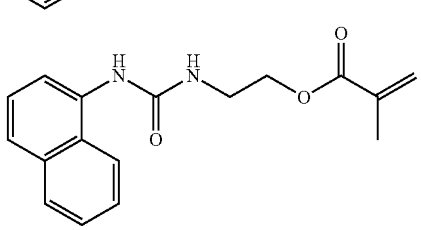

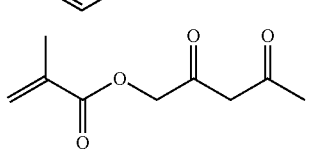

-continued

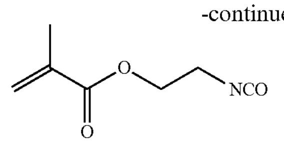

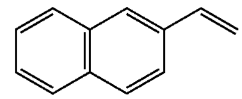

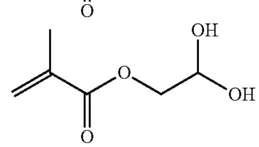

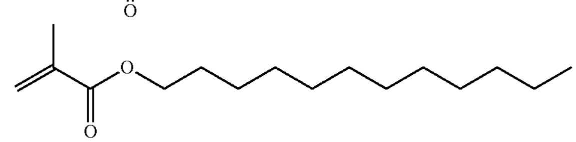

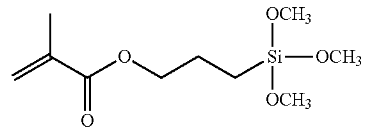

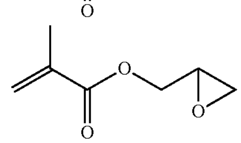

Examples of the monomer having an ionic group include vinyl monomers having an ionic group (such as anionic vinyl monomers and cationic vinyl monomers). Examples of the anionic vinyl monomers include alkali metal salts of the vinyl monomers having an acidic group, and salts between the vinyl monomers having an acidic group and organic amines (for example, tertiary amines such as triethylamine or dimethylaminoethanol). Examples of the cationic vinyl monomers include monomers obtained by quaternizing the nitrogen-containing vinyl monomers with any of the followings: an alkyl halide (alkyl group: C1 to C18, halogen atom: chlorine atom, bromine atom, or iodine atom); a benzyl halide such as benzyl chloride or benzyl bromide; an ester of an alkylsulfonic acid (alkyl group: C1 to C18) such as methanesulfonic acid; an alkyl ester of an arylsulfonic acid such as benzene sulfonic acid or toluenesulfonic acid (alkyl group: C1 to C18); or a dialkyl sulfate (alkyl group: C1 to C4), and dialkyldiallylammonium salts.

The monomer having a functional group capable of adsorbing to a pigment may be appropriately selected depending on the type of the pigment to be dispersed. The monomer may be used either singly or in a combination of two or more thereof.

The specific polymer may further contain a repeating unit derived from a copolymerizable vinyl monomer, as long as the effect of the polymer is not impaired.

The vinyl monomer capable of being used in the second aspect of the invention is not specifically limited. Preferred examples of the monomer include (meth)acrylic acid esters, crotonic acid esters, vinyl esters, maleic acid diesters, fumaric acid diesters, itaconic acid diesters, (meth)acrylamides, vinyl ethers, vinyl alcohol esters, styrenes, and (meth)acrylonitriles. Specific examples of the vinyl monomer include the compounds described below. When it is aimed to mean one or both of "acryl" and "methacryl" in this specification, it can be simply described as "(meth)acryl."

Examples of the (meth)acrylic acid esters include methyl (meth)acrylate, ethyl(meth)acrylate, n-propyl(meth)acrylate, isopropyl(meth)acrylate, n-butyl(meth)acrylate, isobutyl (meth)acrylate, t-butyl(meth)acrylate, n-hexyl(meth)acrylate, cyclohexyl(meth)acrylate, t-butylcyclohexyl(meth)

acrylate, 2-ethylhexyl(meth)acrylate, t-octyl(meth)acrylate, dodecyl(meth)acrylate, octadecyl(meth)acrylate, acetoxyethyl(meth)acrylate, phenyl(meth)acrylate, 2-hydroxyethyl (meth)acrylate, 2-methoxyethyl(meth)acrylate, 2-ethoxyethyl(meth)acrylate, 2-(2-methoxyethoxy)ethyl(meth) acrylate, 3-phenoxy-2-hydroxypropyl(meth)acrylate, benzyl (meth)acrylate, diethylene glycol monomethyl ether(meth) acrylate, diethylene glycol monoethyl ether(meth)acrylate, triethylene glycol monomethyl ether(meth)acrylate, triethylene glycol monoethyl ether(meth)acrylate, polyethylene glycol monomethyl ether(meth)acrylate, polyethylene glycol monoethyl ether(meth)acrylate, β-phenoxyethoxyethyl (meth)acrylate, nonylphenoxy polyethylene glycol(meth) acrylate, dicyclopentenyl(meth)acrylate, dicyclopentenyloxyethyl(meth)acrylate, trifluoroethyl(meth)acrylate, octafluoropentyl(meth)acrylate, perfluorooctylethyl(meth) acrylate, dicyclopentanyl(meth)acrylate, tribromophenyl (meth)acrylate, and tribromophenyloxy ethyl(meth)acrylate.

Examples of the crotonic acid esters include butyl crotonate and hexyl crotonate.

Examples of the vinyl esters include vinyl acetate, vinyl propionate, vinyl butyrate, vinyl methoxyacetate, and vinyl benzoate.

Examples of the maleic acid diesters include dimethyl maleate, diethyl maleate, and dibutyl maleate.

Examples of the fumaric acid diesters include dimethyl fumarate, diethyl fumarate, and dibutyl fumarate.

Examples of the itaconic acid diesters include dimethyl itaconate, diethyl itaconate, and dibutyl itaconate.

Examples of the (meth)acrylamides include (meth)acrylamide, N-methyl(meth)acrylamide, N-ethyl(meth)acrylamide, N-propyl(meth)acrylamide, N-isopropyl(meth)acrylamide, N-n-butylacryl(meth)amide, N-t-butyl(meth) acrylamide, N-cyclohexyl(meth)acrylamide, N-(2-methoxyethyl)(meth)acrylamide, N,N-dimethyl(meth) acrylamide, N,N-diethyl(meth)acrylamide, N-phenyl(meth) acrylamide, N-benzyl(meth)acrylamide, (meth) acryloylmorpholine, and diacetone acrylamide.

Examples of the vinyl ethers include methylvinyl ether, butylvinyl ether, hexylvinyl ether, and methoxyethylvinyl ether.

Examples of the styrenes include styrene, methylstyrene, dimethylstyrene, trimethylstyrene, ethylstyrene, isopropylstyrene, butylstyrene, hydroxystyrene, methoxystyrene, butoxystyrene, acetoxystyrene, chlorostyrene, dichlorostyrene, bromostyrene, chloromethylstyrene, hydroxystyrene protected with a group deprotectable by an acidic material (e.g., t-Boc), methyl vinyl benzoate, and α-methylstyrene.

A preferred embodiment of the specific polymer according to the second aspect is a copolymer obtained by copolymerizing a monomer represented by Formula (i), (ii) or (i)-2 and a monomer having an acidic group or a monomer having an organic pigment structure or a heterocyclic structure. In a more preferable embodiment, the specific polymer is a copolymer obtained by copolymerizing at least a monomer represented by Formula (i)-2 and a monomer having an acidic group.

According to the above embodiments, a pigment dispersion composition having excellent adsorption to a pigment and excellent developability is provided.

Regarding the preferable molecular weight of the specific polymer according to the second aspect, the specific polymer preferably has a weight average molecular weight (Mw) in the range of from 5,000 to 100,000, and preferably has a number average molecular weight (Mn) in the range of from 2,500 to 50,000. More preferably, the weight average molecular weight (Mw) is in the range of from 10,000 to 50,000, and the number average molecular weight (Mn) is in the range of from 5,000 to 30,000. Most preferably, the weight average molecular weight (Mw) is in the range of from 10,000 to 30,000, and the number average molecular weight (Mn) is in the range of from 5,000 to 15,000.

Specifically, from the viewpoint of effective loosening of secondary aggregates, that are the aggregate of the primary particles of pigment, or effective inhibition of re-aggregation, the weight average molecular weight (Mw) of the specific polymer according to the second aspect is preferably 1,000 or more. Further, from the viewpoint of developability when a color filter is produced using a colored curable composition containing the red composition according to the second aspect of the invention, the weight average molecular weight (Mw) of the specific polymer according to the second aspect is preferably 30,000 or less.

The specific polymer related to the second aspect may be produced by a common radical polymerization by using a monomer represented by Formula (i), (ii) or (i)-2 and another radical polymerizable compound (any of the various monomers described above) as a copolymerization component.

In general, suspension polymerization or solution polymerization is used. Examples of a solvent used for producing the specific polymer include ethylene dichloride, cyclohexanone, methyl ethyl ketone, acetone, methanol, ethanol, propanol, butanol, ethylene glycol monomethyl ether, ethylene glycol monoethyl ether, 2-methoxyethyl acetate, 1-methoxy-2-propanol, 1-methoxy-2-propyl acetate, N,N-dimethylformamide, N,N-dimethylacetamide, dimethylsulfoxide, toluene, ethyl acetate, methyl lactate, and ethyl lactate. The solvents may be used either singly, or in combination of two or more thereof.

When radical polymerization is employed, a radical polymerization initiator may be used, and a chain transfer agent (such as 2-mercapto ethanol or dodecyl mercaptan) may be additionally used.

Alkali-Soluble Resin

The red colored composition according to the second aspect of the invention may contain an alkali-soluble resin.

In an embodiment, it is preferable that the alkali-soluble resin contains a polymer (a) obtained by polymerizing a monomer component which essentially contains a compound represented by Formula (ED) (hereinbelow, it may be referred to as "ether dimer"). By using the polymer (a), a cured coating film having excellent heat resistance and transparency may be produced when the red colored composition according to the second aspect of the invention is applied to a colored curable composition.

As an example of the alkali-soluble resin, a benzyl(meth) acrylate/(meth)acrylic acid copolymer or a multi-component copolymer of benzyl(meth)acrylate/(meth)acrylic acid/other monomers are preferable. In addition to them, other examples include a copolymerization product of 2-hydroxyethylmethacrylate, and 2-hydroxypropyl(meth)acrylate/polystyrene macromonomer/benzylmethacrylate/methacrylic acid copolymer, 2-hydroxy-3-phenoxypropylacrylate/polymethylmethacrylate macromonomer/benzylmethacrylate/methacrylic acid copolymer, 2-hydroxyethylmethacrylate/polystyrene macromonomer/methylmethacrylate/methacrylic acid copolymer, and 2-hydroxyethylmethacrylate/polystyrene macromonomer/benzylmethacrylate/methacrylic acid copolymer that are described in JP-A No. 7-140654.

In order to improve crosslinking efficiency of a colored curable composition which contains the red colored composition according to the second aspect of the invention, an alkali-soluble resin having a polymerizable group may be used.

As the alkali-soluble resin having a polymerizable group, an alkali-soluble resin having an allyl group, a (meth)acryl group, or an aryloxyalkyl group in a side chain thereof is useful. Examples of the alkali-soluble resin having a polymerizable group include a urethane-modified acryl resin containing a polymerizable double bond, which is obtained by reacting an isocyanate group with an OH group in advance to leave one unreacted isocyanate group, and reacting a compound having a (meth)acryloyl group with an acryl resin containing a carboxyl group; an acryl resin containing an unsaturated group, which is obtained by reacting an acryl resin containing a carboxyl group with a compound having both of an epoxy group and a polymerizable double bond in the molecule; an acid pendant-type epoxy acrylate resin; an acryl resin containing a polymerizable double bond, which is obtained by reacting an acryl resin containing an OH group with a dibasic acid anhydride having a polymerizable double bond; a resin obtained by reacting an acryl resin containing an OH group with a compound having isocyanate and a polymerizable group; and a resin obtained by base treatment of a resin having an ester group in a side chain thereof, wherein the ester group has a leaving group such as a halogen atom or a sulfonate group at a position or 13 position as described in JP-A Nos. 2002-229207 and 2003-335814.

The acid value of the alkali-soluble resin is preferably from 30 mgKOH/g to 200 mgKOH/g, more preferably from 50 mgKOH/g to 150 mgKOH/g, and still more preferably from 70 to 120 mgKOH/g.

The weight average molecular weight (Mw) of the alkali-soluble resin is preferably from 2,000 to 50,000, more preferably from 5,000 to 30,000, and still more preferably from 7,000 to 20,000.

When the alkali-soluble resin is contained in the red colored composition according to the second aspect, the content thereof is preferably from 1 to 15% by mass, more preferably from 2 to 12% by mass, and still more preferably from 3 to 10% by mass, with respect to the total solid matters in the composition.

The content (mass ratio) of the dispersant (e.g., the specific polymer described above) in the red colored composition according to the second aspect of the invention with respect to the pigment is as follows: i.e., a ratio "total pigment including the red pigment and yellow pigment": "dispersant" is preferably from 1:0.1 to 1:2, more preferably from 1:0.2 to 1:1, and still more preferably from 1:0.4 to 1:0.7.

Pigment Derivative

The red colored composition according to the second aspect of the invention may contain a pigment derivative such as an anthraquinone derivative, a triazine derivative, a diketopyrrolopyrrole pigment, a phthalocyanine pigment, or an azo pigment derivative.

When a combination of the pigment derivative and a dispersant is used in the red colored composition according to the second aspect of the invention, the dispersion stability when the azo pigment represented by Formula (1) is used is further improved.

The pigment derivatives may be used either singly or in combination of two or more thereof.

In the second aspect of the invention, a pigment derivative to which a moiety having an affinity with a dispersant or a polar group has been introduced is adsorbed to a pigment, and is used as an adsorption point for the dispersant. Accordingly, the pigment is capable of being dispersed as a fine particle in the pigment dispersion composition, and re-aggregation thereof is inhibited. In other words, modification of the surface of a pigment with the pigment derivative exhibits an effect of promoting the adsorption of a polymer dispersant such as the specific polymer.

A preferred example of the pigment derivative is an azo pigment derivative.

Specifically, the azo pigment derivative is a compound in which the azo pigment is included as a main backbone and, as a substituent, an acidic group, a basic group, or an aromatic group is added in a side chain.

As an azo pigment derivative used in the second aspect of the invention, those described in JP-A Nos. 11-49974, 11-189732, 10-245501, 2006-265528, 8-295810, 11-199796, 2005-234478, 2003-240938, 2001-356210, and 2000-239554 may be used.

Among the azo pigment derivatives described above, the azo pigment derivative used in the second aspect of the invention is preferably a compound represented by the following Formula (P1), from the viewpoint of further increasing dispersion stability.

A-N=N—X—Y (P1)

In Formula (P1), A is a component capable of forming an azo pigment with X—Y, and A may be arbitrarily selected as long as it is a compound capable of forming an azo pigment by coupling with a diazonium compound. Hereinbelow, specific examples of A are shown. However, the invention is not limited to these specific examples.

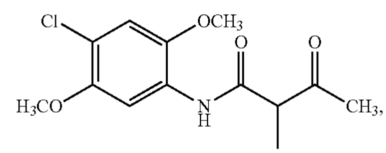

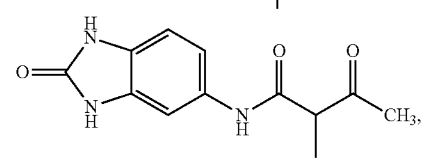

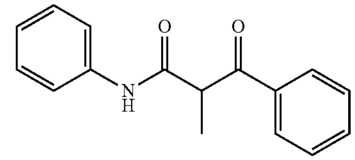

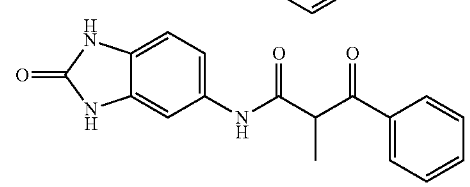

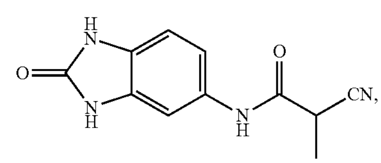

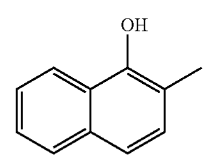

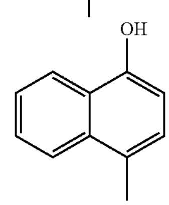

-continued

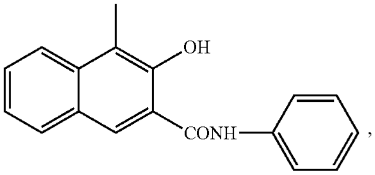

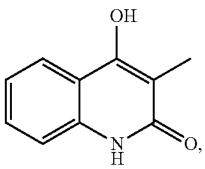

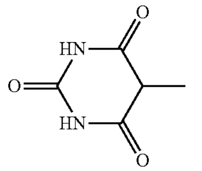

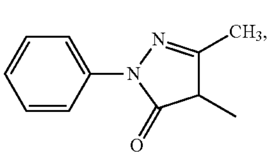

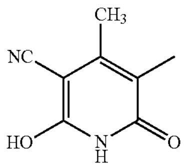

In Formula (P1), X represents a single bond (which means that Y is directly bonded to —N═N—) or a group selected from the following divalent linking groups having the following structural formulae.

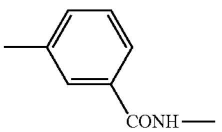

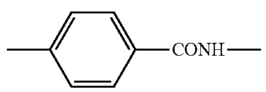

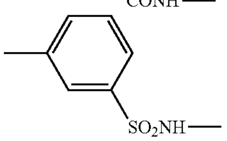

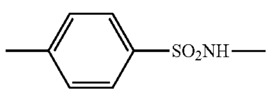

-continued

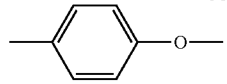

In Formula (P1), Y is a group represented by the following Formula (P2).

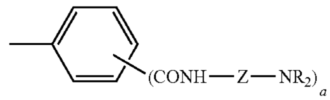

(P2)

In Formula (P2), Z represents a lower alkylene group, and Z is expressed as —$(CH_2)_b$— in which b represents an integer from 1 to 5, and preferably 2 or 3. In Formula (P2), —$NR_2$ represents a lower alkylamino group, or a 5- to 6-membered saturated heterocycle containing a nitrogen atom. When —$NR_2$ is a lower alkylamino group, it is expressed as —$N(C_nH_{2n+1})_2$, in which n represents an integer from 1 to 4, and preferably 1 or 2. When —$NR_2$ is a 5- or 6-membered saturated heterocycle containing a nitrogen atom, the heterocycle represented by the following structure is preferable.

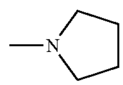

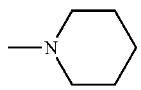

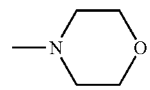

In Formula (P2), Z and —$NR_2$ each may be substituted by a lower alkyl group or an alkoxy group. In Formula (P2), a is 1 or 2, and preferably 2.

Hereinbelow, specific examples (i.e., specific examples 1 to 22) of the compound represented by Formula (P1) are shown. However, the invention is not limited to these specific examples.

1.

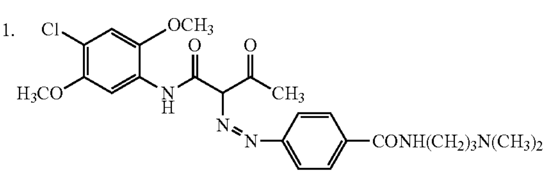

2.

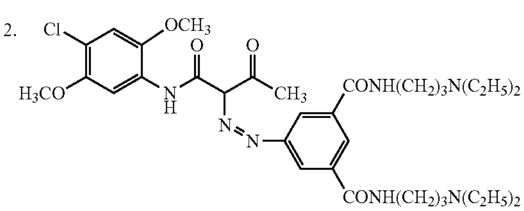

3.

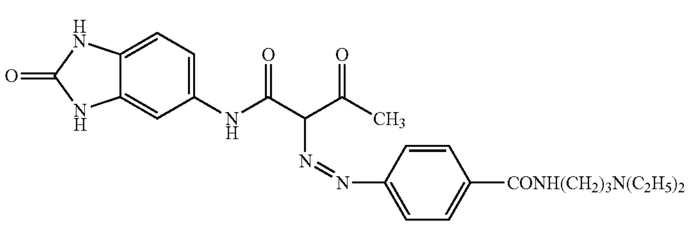

4.

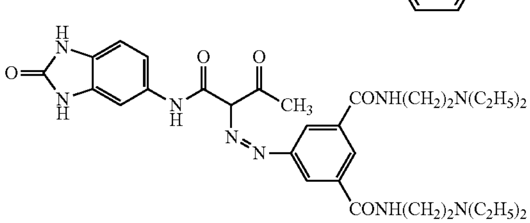

5.

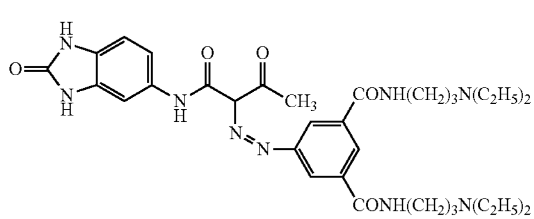

-continued
6.
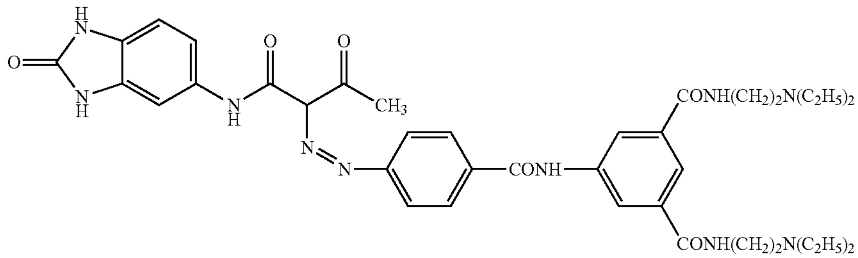
7.
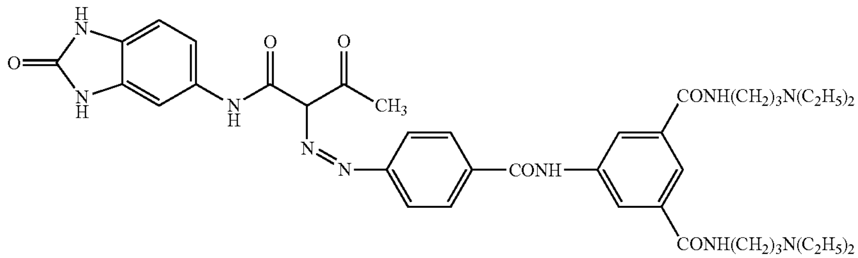
8.
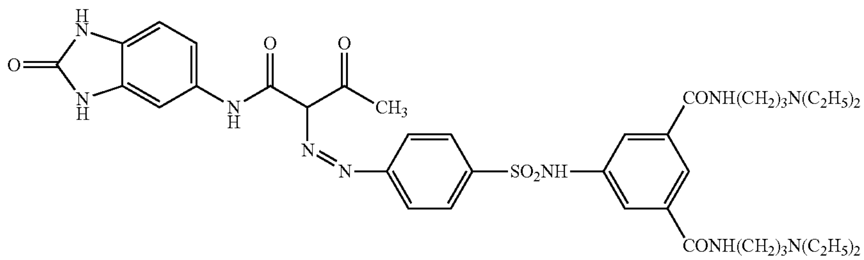
9.
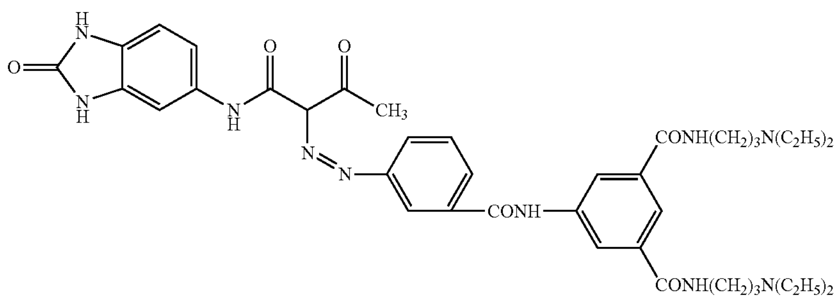
10.
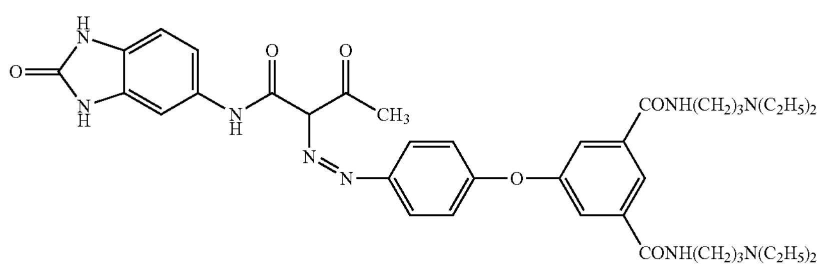
11.
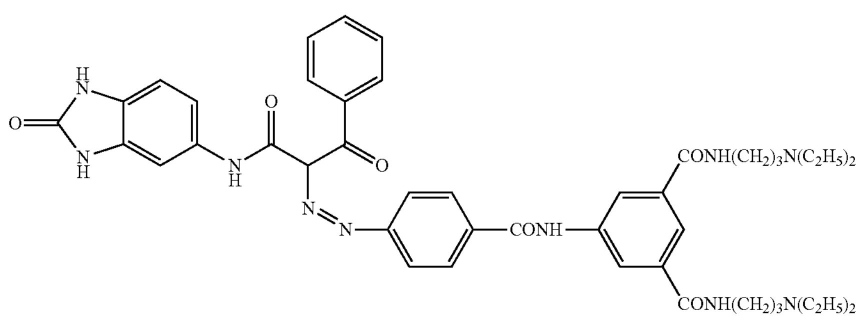

-continued
12.
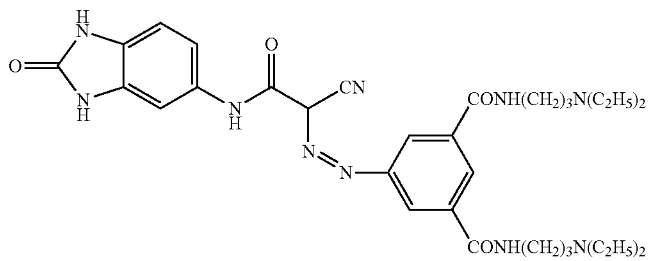
13.
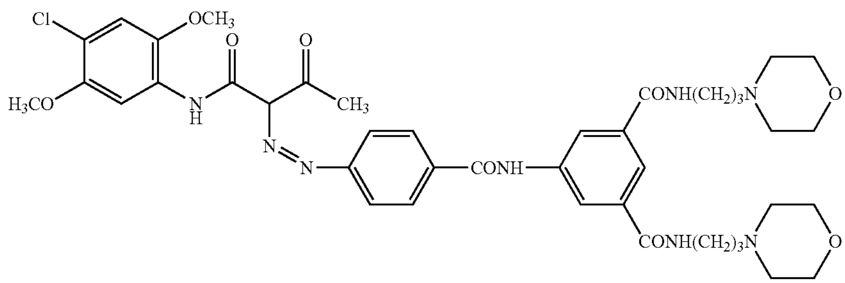
14.
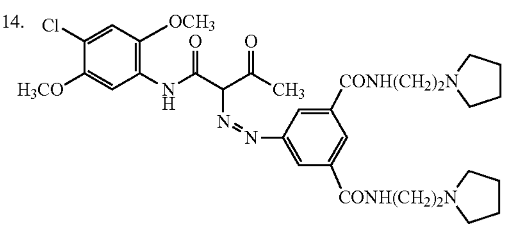
15.
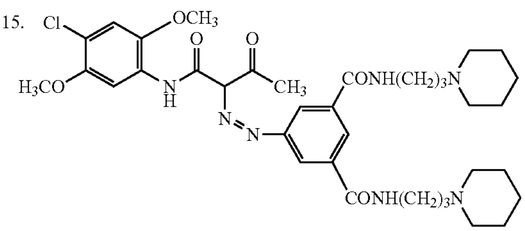
16.
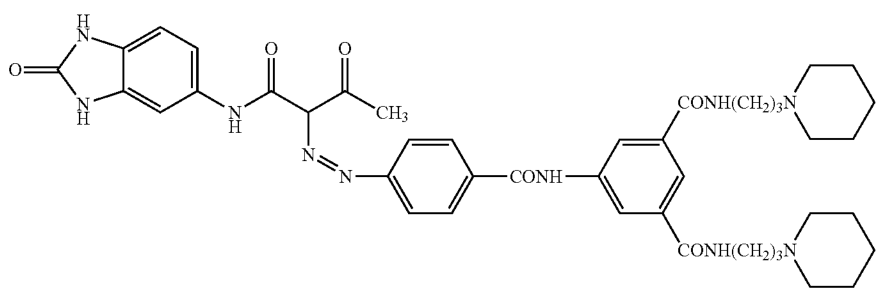
17.
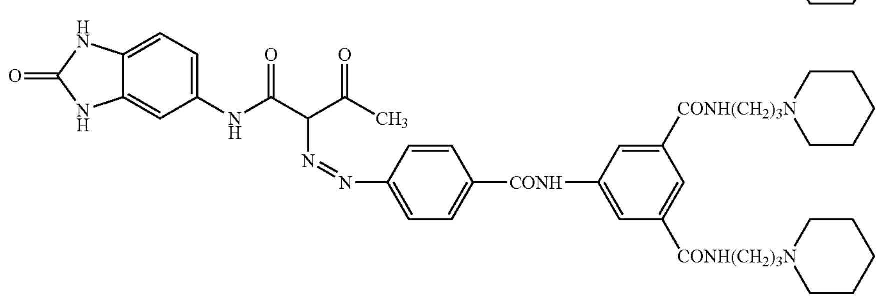
18.
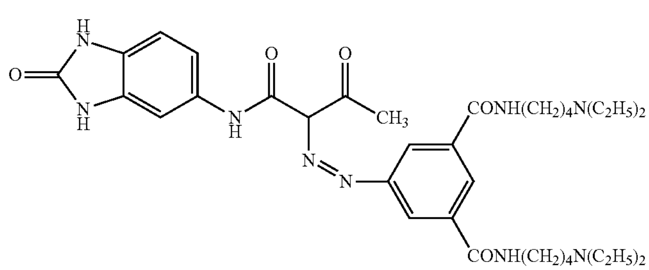

-continued

19.

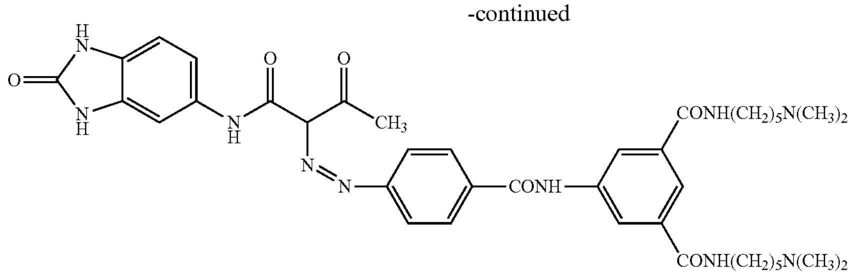

20.

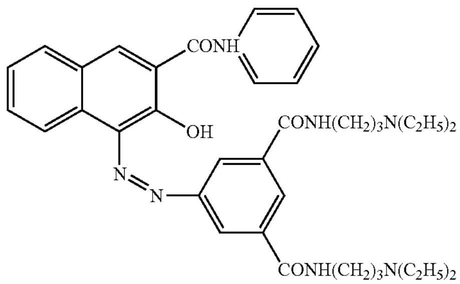

21.

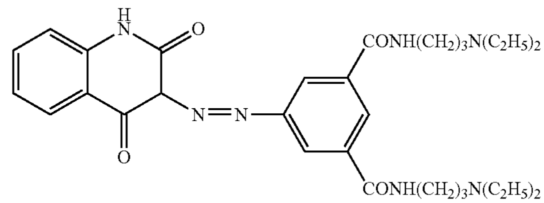

22.

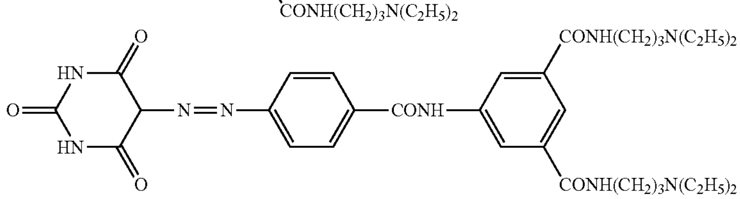

The content of the pigment derivative in the red colored composition according to the second aspect of the invention is preferably in the range of from 0.1% by mass to 80% by mass, more preferably in the range of from 1% by mass to 65% by mass, and still more preferably in the range of from 3% by mass to 50% by mass, with respect to the total pigments including a red pigment such as the azo pigment represented by Formula (1) and a yellow pigment. When the content of the pigment derivative is within the above ranges, dispersion of pigment is easily carried out while maintaining the viscosity low, and also dispersion stability after dispersion is improved.

By applying this red colored composition to a color filter, heat resistance of a color filter is improved. In addition, a color filter having a high transmission ratio, excellent color characteristics, and a high contrast is obtained.

Solvent and Others

The red colored composition according to the second aspect of the invention may be suitably produced by using a solvent.

Examples of the solvent used in the second aspect are the same as those used for production of the pigment dispersion composition according to the first aspect.

Among the solvents, the water-soluble solvent may be mixed with water and used as an aqueous medium. Further, at least two kinds of solvents selected from the above except water may be mixed and used as an oil medium. In such case, it is preferable to use a mixture solvent containing at least two selected from methyl 3-ethoxypropionate, methyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate.

In the second aspect, the content of the organic solvent in the red colored composition is, from the viewpoint of coating property, preferably in an amount of from 5 to 80% by mass, more preferably from 5 to 60% by mass, and still more preferably from 10 to 50% by mass, with respect to the total solid content concentration in the composition.

If necessary, the red colored composition according to the second aspect of the invention may further contain other components in addition to those described above.

Production of Pigment Dispersion Composition According to First Aspect and Red Colored Composition According to Second Aspect The pigment dispersion composition according to the first aspect and the red colored composition according to the second aspect may be prepared by conducting a mixing and dispersing process in which mixing and dispersing are performed using any of various mixers and dispersers.

The mixing and dispersing process is preferably composed of kneading dispersion and a fine-dispersing treatment subsequent thereto. However, the kneading dispersion may be omitted.

The pigment dispersion composition according to the first aspect of the invention is preferably obtained by dispersing the azo pigment represented by Formula (1) of the first aspect, a derivative having an acidic functional group, a dispersant and a solvent, using a disperser.

The red colored composition according to the second aspect of the invention is preferably obtained by dispersing a red pigment, specifically, the azo pigment represented by Formula (1) of the second aspect, a yellow pigment, a dispersant, an azo pigment derivative, and a solvent, using a disperser.

Examples of a disperser which may be used in the first or second aspect include a simple stirrer, an impeller stirring system, an in-line stirring system, a mill system (e.g., a colloid mill, a ball mill, a sand moll, a bead mill, an attritor, a roll mill, a jet mill, a paint shaker or an agitator), an ultrasonication system, and a high pressure dispersion homogenizer system (e.g., a high pressure homogenizer such as GAULIN Homogenizer, microfluidizer, and DeBEE2000 which are commercially available).

More specifically, the pigment dispersion composition according to the first aspect of the invention may be obtained by subjecting the azo pigment represented by Formula (1) of the first aspect, a derivative having an acidic functional group, a dispersant and a solvent to a fine dispersing treatment using beads which are made of glass, zirconia or the like and have a particle diameter of from 0.01 mm to 1 mm, and using mainly a vertical or horizontal sand grinder, a pin mill, a slit mill, a ultrasonic disperser or the like.

More specifically, the red colored composition according to the second aspect of the invention may be obtained by treating the azo pigment represented by Formula (1) of the second aspect, a yellow pigment, a dispersant, an azo pigment derivative, and a solvent according to the same method as described above.

Before performing the fine dispersion treatment using beads, a kneading and dispersing treatment may be performed using a twin roll mill, a triple roll mill, a ball mill, a trommel mill, a disperser, a kneader, a co-kneader, a homogenizer, a blender, or a single or twin screw extruder, while applying a strong shear force.

The details of the kneading and dispersing are described in T. C. Patton "Paint Flow and Pigment Dispersion" (John Wiley and Sons Inc., 1964) and the like. The method described therein can be also employed in the invention.

Colored Curable Composition According to First Aspect

The colored curable composition according to the first aspect of the invention contains the pigment dispersion composition according to the first aspect of the invention, a photopolymerization initiator, and a polymerizable compound.

By having such configuration, the colored curable composition according to the first aspect of the invention is capable of retaining adhesion property of a colored pattern to a support and inhibiting the occurrence of residue, even when a relatively severe development condition is employed for forming a colored pattern on a support.

Further, according to the colored curable composition according to the first aspect of the invention, dispersion stability of the azo pigment represented by Formula (1) is improved, and when the composition is formed into a colored pattern, heat resistance of the colored pattern is also improved. The reason why heat resistance of the colored pattern is improved by increasing the dispersion stability remains uncertain. However, it is assumed that it is because the decrease in a transmission ratio due to pigment aggregation is inhibited. However, the first aspect of the invention is not limited by this assumption.

Colored Curable Composition According to Second Aspect

The colored curable composition according to the second aspect of the invention contains the red colored composition according to the second aspect of the invention, a photopolymerization initiator, and a polymerizable compound.

By having such configuration, the colored curable composition according to the second aspect of the invention exerts improved dispersion stability of a pigment such as the azo pigment represented by Formula (1), and, when the composition is formed into a fine colored pattern, pattern property of the colored pattern is also improved.

Photopolymerization Initiator

The colored curable compositions according to the first or second aspect of the invention contains a photopolymerization initiator.

As the photopolymerization initiator, at least one selected from the group consisting of a benzophenone photopolymerization initiator, an acetophenone photopolymerization initiator, a benzoin photopolymerization initiator, a benzoin ether photopolymerization initiator, a thioxanthone photopolymerization initiator, an anthraquinone photopolymerization initiator, a naphthoquinone photopolymerization initiator, a triazine photopolymerization initiator, and oxime photopolymerization initiator may be used. The photopolymerization initiator may be used in combination with a sensitizing agent well known in the art.

Among the above, from the viewpoint of pattern formability (i.e., pattern curability) and inhibition of generation of development residues, or the like, an oxime photopolymerization initiator is preferable.

As an oxime photopolymerization initiator, a compound which initiates and promotes polymerization of a radical polymerizable monomer is preferable. A compound having absorption in the wavelength range of 300 to 500 nm is more preferable. Regarding the reason why the oxime photopolymerization initiator is favorable, it is believed that efficiency of dissociation by light is extremely high so that high curability is obtained, and therefore a rectangular pattern is formed after development.

Examples of the oxime photopolymerization initiator used in the first or second aspect of the invention include compounds described in J. C. S. Perkin II (1979) 1653-1660, J. C. S. Perkin II (1979) 156-162, Journal of Photopolymer Science and Technology (1995) 202-232, JP-A Nos. 2000-66385 and 2000-80068 (paragraphs [0004] to [0296]), JP-B No. 1004-534797, JP-A No. 2001-233842, WO-02/100903 A1, JP-A No. 2006-342166 (paragraphs [0004] to [0264]), or the like.

From the viewpoint of effectively achieving the improvement of pattern formability and the inhibition of generation of development residues, the compound represented by the following Formula (O-I) is preferable as the oxime initiator.

(0-1)

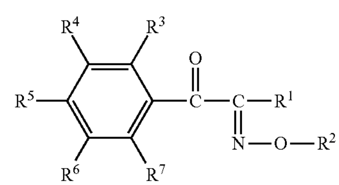

In Formula (O-I), $R^1$ represents a substituted or unsubstituted alkyl group or a substituted or unsubstituted aryl group; $R^2$ represents a substituted or unsubstituted acyl group, a substituted or unsubstituted alkyl group, a substituted or unsubstituted aryl group, a substituted or unsubstituted alkenyl group, a substituted or unsubstituted alkynyl group, or a substituted or unsubstituted acetyl group; and $R^3$, $R^4$, $R^5$, $R^6$ and $R^7$ each independently represent a hydrogen atom or a monovalent organic group. At least two of $R^3$, $R^4$, $R^5$, $R^6$ and $R^7$ may bind to each other to form a 5-membered ring or a 6-membered ring.

Herein, examples of the substituent which may be introduced to the alkyl group, aryl group or acyl group include a methyl group, an ethyl group, an n-propyl group, an n-butyl group, an i-propyl group, a t-butyl group, a chloro group, and a bromo group.

In Formula (O—I), $R^1$ is preferably an alkyl group having 1 to 12 carbon atoms or a 4-(C1 to C4 alkylthio)phenyl group, and $R^2$ is preferably an acetyl group or an acyl group.

When $R^3$, $R^4$, $R^5$, $R^6$ or $R^7$ represents a monovalent organic group, preferred examples of the organic group include a methyl group, an ethyl group, a methoxy group, an ethoxy group, a phenoxy group, and a thiophenoxy group. Of these, a phenoxy group and a thiophenoxy group are preferable.

Further, $R^3$, $R^4$, $R^6$ and $R^7$ are preferably a hydrogen atom, and $R^5$ is preferably a group represented by —$SR^8$, in which $R^8$ represents a substituted or unsubstituted phenyl group. An example of the more preferred $R^1$ is the group represented by the following formula.

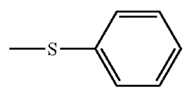

Among the oxime initiators represented by Formula (O-I), a preferred oxime initiator is a compound represented by the following Formula (O-II).

(O-II)

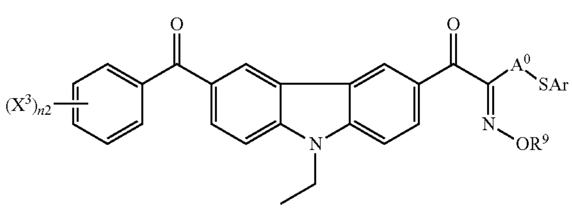

In Formula (O-II), $R^9$ has the same definition as $R^2$ in Formula (O-I); $X^3$ represents a monovalent substituent, and when n2 represents an integer from 2 to 5, plural $X^3$'s may be the same as or different from each other; $A^0$ represents a divalent organic group; Ar represents an aryl group; and n2 represents an integer from 1 to 5.

Examples of the monovalent organic group represented by $X^3$ in Formula (O-II) include a methyl group, an ethyl group, an n-propyl group, an n-butyl group, an i-propyl group, a t-butyl group, a methoxy group, and an ethoxy group.

Examples of the divalent organic group represented by $A^0$ in Formula (O-II) include an alkylene group having 1 to 12 carbon atoms, a cyclohexylene group having 1 to 12 carbon atoms, and an alkenylene group having 1 to 12 carbon atoms.

The aryl group represented by Ar in Formula (O-II) is preferably a substituted or unsubstituted aryl group having 6 to 30 carbon atoms Examples of the substituent which may be introduced to the aryl group include a methyl group, an ethyl group, an n-propyl group, an n-butyl group, an i-propyl group, a t-butyl group, a methoxy group, and an ethoxy group.

In particular, from the viewpoint of increasing sensitivity and inhibiting coloration over heating time, Ar is preferably a substituted or unsubstituted phenyl group.

In the first and second aspects of the invention, specific examples of the oxime photoinitiator include Compounds (I-1) to (I-6) shown below. Particularly preferred compounds are Compounds (I-2) to (I-6) that are encompassed within the scope of Formula (O-I). Among them, Compound (I-2) is most preferable because the generation of development residues is extremely small.

(I-1)

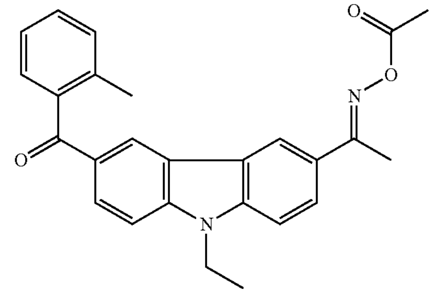

(I-2)

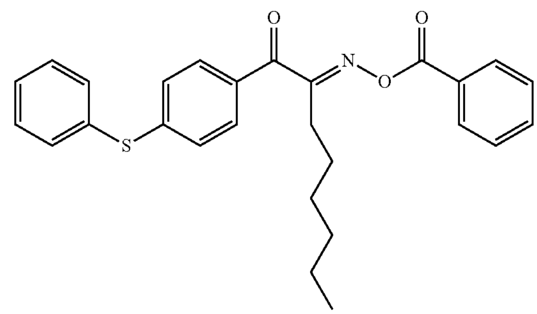

(I-3)

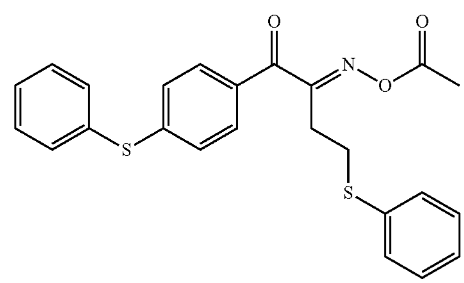

(I-4)

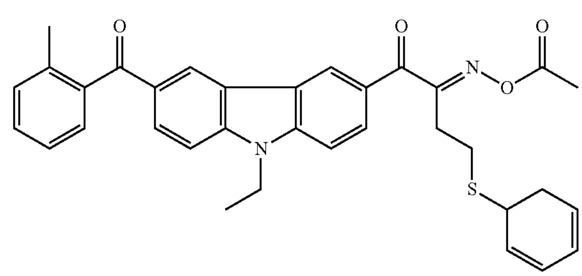

(I-5)

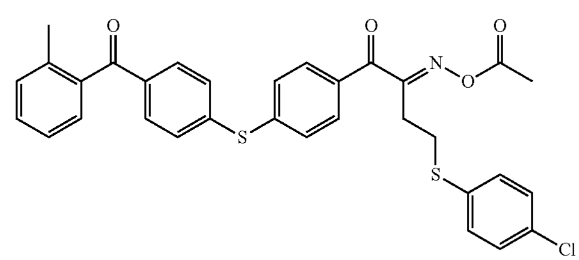

-continued (I-6)

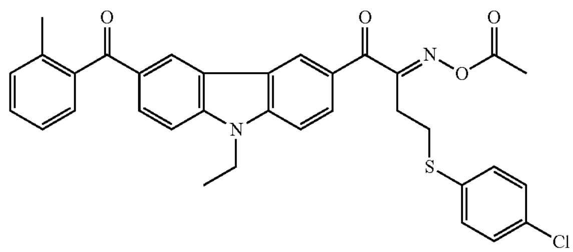

Specific compound names of oxime photopolymerization initiators which may be used in the first and second aspect of the invention include 2-(O-benzoyloxime)-1-[4-(phenylthio)phenyl]-1,2-butanedione, 2-(O-benzoyloxime)-1-[4-(phenylthio)phenyl]-1,2-pentanedione, 2-(O-benzoyloxime)-1-[4-(phenylthio)phenyl]-1,2-hexanedione, 2-(O-benzoyloxime)-1-[4-(phenylthio)phenyl]-1,2-heptanedione, 2-(O-benzoyloxime)-1-[4-(phenylthio)phenyl]-1,2-octanedione, 2-(O-benzoyloxime)-1-[4-(methylphenylthio)phenyl]-1,2-butanedione, 2-(O-benzoyloxime)-1-[4-(ethylphenylthio)phenyl]-1,2-butanedione, 2-(O-benzoyloxime)-1-[4-(butylphenylthio)phenyl]-1,2-butanedione, 1-(O-acetyloxime)-1-[9-ethyl-6-(2-methylbenzoyl)-9H-carbazol-3-yl]ethanone, 1-(O-acetyloxime)-1-[9-methyl-6-(2-methylbenzoyl)-9H-carbazol-3-yl]ethanone, 1-(O-acetyloxime)-1-[9-propyl-6-(2-methylbenzoyl)-9H-carbazol-3-yl]ethanone, 1-(O-acetyloxime)-1-[9-ethyl-6-(2-ethylbenzoyl)-9H-carbazol-3-yl]ethanone, and 1-(O-acetyloxime)-1-[9-ethyl-6-(2-butylbenzoyl)-9H-carbazol-3-yl]ethanone. However, the invention is not limited to them.

Specific examples of the particularly preferred oxime photopolymerization initiator include 2-(O-benzoyloxime)-1-[4-(phenylthio)phenyl]-1,2-octanedione and 1-(O-acetyloxime)-1-[9-ethyl-6-(2-methylbenzoyl)-9H-carbazol-3-yl] ethanone. Examples of the oxime photopolymerization initiator include CGI-124 and CGI-242 (trade names, manufactured by Ciba Specialty Chemicals Inc.).

The content of the photopolymerization initiator (e.g., oxime photopolymerization initiator) in the colored curable composition according to the first or second aspect of the invention is preferably from 1.0% by mass to 15.0% by mass, more preferably from 1.0% by mass to 12.5% by mass, still more preferably from 1.0% by mass to 10.0% by mass, and particularly more preferably from 1.0% by mass to 5.0% by mass, with respect to the total solid contents. Within the above ranges, more favorable sensitivity, pattern formability, and evenness of coating film are obtained.

In particular, in the second aspect, favorable sensitivity, pattern formability, and evenness of coating film are obtained when the content is within the above ranges.

In this specification, the solid contents of a colored curable composition to specify the mixing ratio include all of the components contained in the composition from which the solvent has been removed, and a liquid component (e.g., a liquid polymerizable compound) at room temperature (25° C.) is also included in the solid content.

Polymerizable Compound

The colored curable composition according to the first or second aspect of the invention contains at least one polymerizable compound.

As a polymerizable compound, a polymerizable compound well known in the art may be used. Although it is possible to use a monofunctional polymerizable compound, a polyfunctional polymerizable compound is preferable from the viewpoint of further improving pattern formability, and a trifunctional or higher-functional polymerizable compound is more preferable.

The polymerizable compound is preferably an addition polymerizable compound having at least one ethylenically unsaturated double bond. More preferably, it is selected from a compound having at least one terminal, ethylenically unsaturated double bond, or preferably at least two terminal, ethylenically unsaturated double bonds. These compounds are well known in the art, and they may be used in the invention without particular limitation. The polymerizable compound has chemical forms of a monomer, a prepolymer, that is, a dimer, a trimer, or an oligomer, a mixture thereof, a copolymer thereof, and the like, for example.

Examples of the monomer and the copolymer thereof include unsaturated carboxylic acids (for example, acrylic acid, methacrylic acid, itaconic acid, crotonic acid, isocrotonic acid, maleic acid, and the like), esters thereof, and amides thereof. Preferably, esters of an unsaturated carboxylic acid and an aliphatic polyhydric alcohol compound, or amides of an unsaturated carboxylic acid and an aliphatic poly-amine compound may be used. Moreover, an addition reaction product of unsaturated carboxylic acid esters, or amides having a nucleophilic substituent such as a hydroxyl group, an amino group, or a mercapto group, and monofunctional or polyfunctional isocyanates or epoxys, or dehydration condensation reaction products with a monofunctional or polyfunctional carboxylic acid, or the like may also be used preferably. Moreover, addition reaction products of unsaturated carboxylic acid esters or amides having an electrophilic substituent such as an isocyanate group, or an epoxy group, and monofunctional or polyfunctional alcohols, amines or thiols, and further, substitution reaction products of unsaturated carboxylic acid esters or amides having a leaving substituent such as a halogen group or a tosyloxy group, and monofunctional or polyfunctional alcohols, amines, or thiols are also preferable. Further, as another example, a compound group in which the unsaturated carboxylic acid described above is displaced by unsaturated phosphonic acid, styrene, vinyl ether, or the like may be used.

Further, the polymerizable compounds described in paragraphs [0118] to [0128] of JP-A No. 2009-256572 may be also used as a polymerizable compound.

From the viewpoint of pattern formability, or the like, the polymerizable compound used in the first or second aspect of the invention is preferably a photopolymerizable compound described in paragraphs [0029] to [0056] of JP-A No. 2009-244807 or in paragraphs [0038] to [0051] of JP-A No. 2009-229761 (i.e., polymerizable compound), i.e., at least one polymerizable compound selected from the group of compounds represented by the following Formula (M-i) or (M-ii).

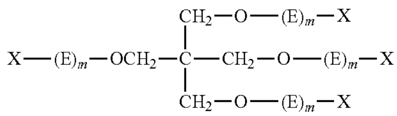

(M-i)

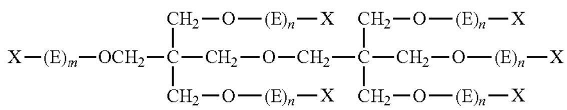

(M-ii)

In Formula (M-i) and (M-ii), E's each independently represent —$((CH_2)_yCH_2O)$— or —$((CH_2)_yCH(CH_3)O)$—, in which y's each independently represent an integer from 0 to 10; X's each independently represent an acryloyl group, a methacryloyl group, a hydrogen atom, or a carboxyl group.

In Formula (M-i), the total number of acryloyl groups and methacryloyl groups is 3 or 4; m's each independently represents an integer from 0 to 10; and the total of m's is an integer from 0 to 40; and when the total of m's is 0, any one of X's is a carboxyl group.

In Formula (M-ii), the total number of acryloyl groups and methacryloyl groups is 5 or 6; n's each independently represent an integer from 0 to 10; and the total of n's is an integer from 0 to 60; and when the total of n's is 0, any one of X's is a carboxyl group.

In Formula (M-i), m's are each preferably an integer from 0 to 6, and more preferably an integer from 0 to 4. Further, the total of m's is preferably an integer from 2 to 40, more preferably an integer from 2 to 16, and still more preferably an integer from 4 to 8.

In Formula (M-ii), n's are each preferably an integer from 0 to 6, and more preferably an integer from 0 to 4. Further, the total of n's is preferably an integer from 3 to 60, more preferably an integer from 3 to 24, and still more preferably an integer from 6 to 12.

Further, —$((CH_2)_yCH_2O)$— or —$((CH_2)_yCH(CH_3)O)$— in Formula (M-i) or Formula (M-ii) preferably has the form in which the terminal at the oxygen atom side is bonded to X.

The compounds represented by Formula (M-i) or (M-ii) may be used either singly or in combination of two or more thereof. In particular, a compound in which all of the six X's in Formula (M-ii) is an acryloyl group is preferable.

A compound represented by Formula (M-i) or (M-ii) may be produced by a process of connecting an open-ring structure to pentaerythritol or dipentaerythritol via ring-opening addition reaction of ethylene oxide or propylene oxide, which is a known conventional process, and a process of introducing a (meth)acryloyl group to the terminal hydroxyl group of the open-ring structure by reacting with (meth)acryloyl chloride, for example. Each process is well known in the art, and a person skilled in the art may easily synthesize the compounds represented by Formula (M-i) or (M-ii).

Among the compounds represented by Formula (M-i) or (M-ii), pentaerythritol and/or dipentaerythritol derivatives are more preferable. Specific examples thereof include the compounds represented by the following Formulae (a) to (f) (hereinbelow, also referred to as "exemplary compound (a) to (f)"), and among them, the exemplary compounds (a), (b), (c), and (f) are preferable.

(a)

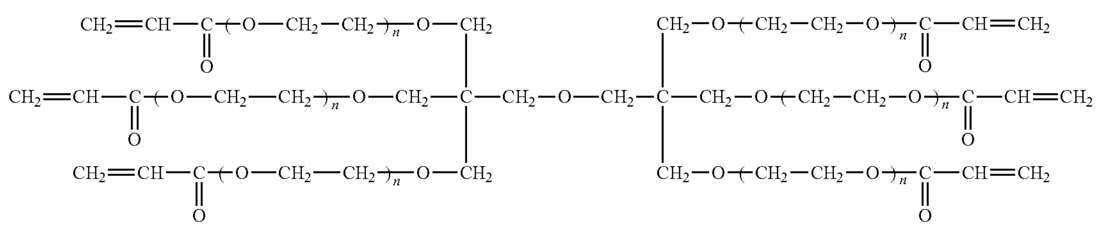

(Total of n's is 6.)

(b)

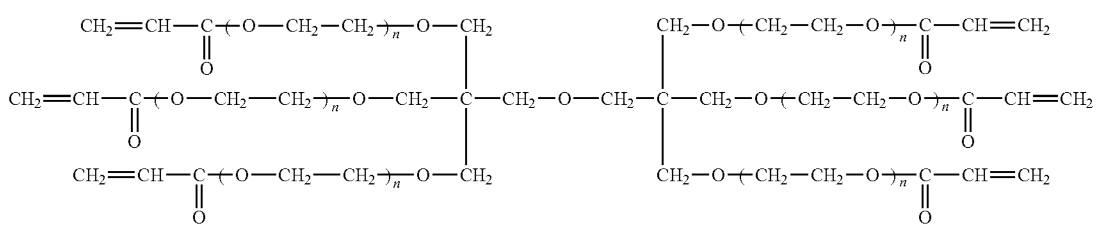

(Total of n's is 12.)

(c)

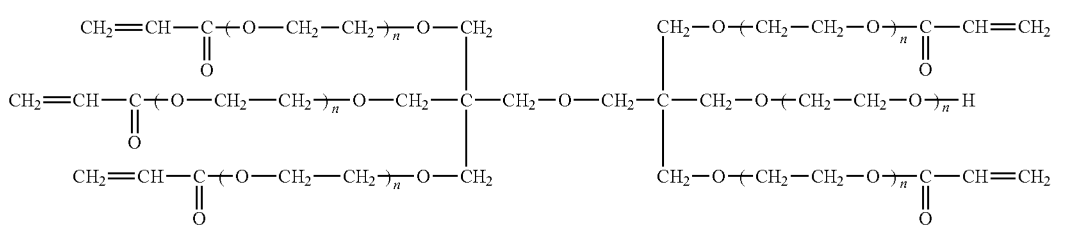

(Total of n's is 12.)

-continued (d)

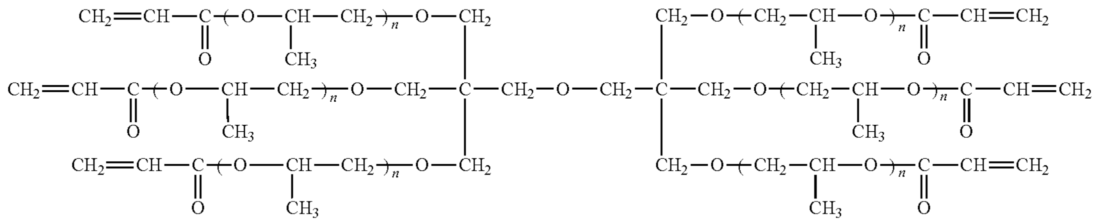

(Total of n's is 6)

(e)

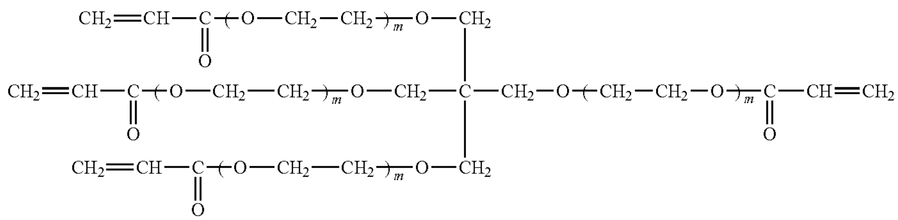

(Total of n's is 4)

(f)

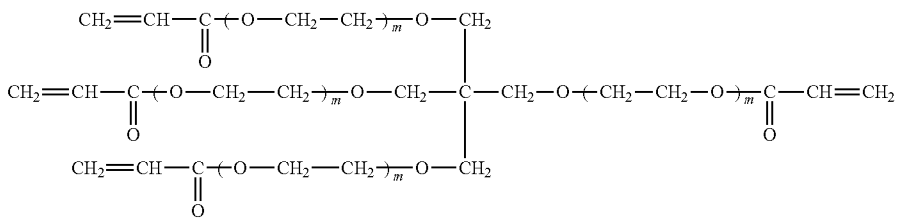

(Total of n's is 12)

Examples of the commercially available compound represented by Formula (M-i) or (M-ii) (i.e., specific photopolymerizable compound) include SR-494 (trade name, manufactured by Sartomer Company Inc.; which is a tetrafunctional acrylate having four ethylene oxy groups), DPCA-60 (trade name, manufactured by Nippon Kayaku Co., Ltd.; which is a hexa-functional acrylate having six pentylene oxy groups), and TPA-330 (trade name, manufactured by Nippon Kayaku Co., Ltd.; which is a tri-functional acrylate having three isobutylene oxy groups).

The content of the polymerizable compound in the colored curable composition according to the first or second aspect of the invention is preferably from 5% by mass to 70% by mass, and more preferably from 10% by mass to 60% by mass, with respect to the total solid contents.

Alkali-Soluble Resin

The colored curable composition according to the first or second aspect of the invention preferably contains an alkali-soluble resin.

When an alkali-soluble resin is contained in the colored curable composition and such composition is used for pattern formation by a photolithography method, the pattern formability is further improved.

The alkali-soluble resin may be suitably selected from alkali-soluble resins which are linear organic high-molecular polymers having in a molecule thereof (preferably, a molecule which has an acrylic copolymer or a styrene copolymer as a main chain) at least one group which enhances alkali solubility (e.g., a carboxyl group, a phosphate group, or a sulfonate group). Among them, a resin which is soluble in an organic solvent and capable of being developed with a weak alkali aqueous solution is more preferable.

For production of an alkali-soluble resin, for example, a method involving a known radical polymerization method may be applied. When producing an alkali-soluble resin according to a radical polymerization method, polymerization conditions such as the temperature, the pressure, the type and amount of radical initiator, or the type of solvent may be easily set by a person skilled in the art, and may be determined experimentally.

The linear organic high-molecular polymer used in the first aspect is preferably a polymer having carboxylic acid in a side chain thereof. Examples thereof include methacrylic acid copolymers, acrylic acid copolymers, itaconic acid copolymers, crotonic acid copolymers, maleic acid copolymers and partially-esterified maleic acid copolymers such as those described in JP-A No. 59-44615, JP-B Nos. 54-34327, 58-12577, and 54-25957, JP-A Nos. 59-53836 and 59-71048; acidic cellulose derivatives having carboxylic acid in a side chain thereof; and products obtained by addition of an acid anhydride to polymers having a hydroxyl group. Preferable examples also include high-molecular polymers having a (meth)acryloyl group in a side chain thereof.

Of these, benzyl(meth)acrylate/(meth)acrylic acid copolymer and multi-component copolymers composed of benzyl (meth)acrylate/(meth)acrylic acid/other monomer(s) are preferable.

Further, copolymers obtained by copolymerization of 2-hydroxyethyl methacrylate are also preferable examples.

In addition to the above, examples include 2-hydroxypropyl(meth)acrylate/polystyrene macromonomer/benzylmethacrylate/methacrylic acid copolymer, 2-hydroxy-3-phenoxypropylacrylate/polymethylmethacrylate macromonomer/benzylmethacrylate/methacrylic acid copolymer, 2-hydroxyethylmethacrylate/polystyrene macromonomer/methylmethacrylate/methacrylic acid copolymer, and 2-hydroxyethylmethacrylate/polystyrene macromonomer/benzylmethacrylate/methacrylic acid copolymer, which are described in JP-A No. 7-140654.

In regard to the alkali-soluble resin used in the first aspect of the invention, a copolymer of (meth)acrylic acid and other monomer(s) copolymerizable therewith is particularly preferable. Here, "(meth)acrylic acid" is a generic term encompassing acrylic acid and methacrylic acid, and "(meth)acrylate" is a generic term encompassing acrylate and methacrylate; the same applies hereinafter.

Examples of other monomers copolymerizable with (meth)acrylic acid include alkyl (meth)acrylates, aryl (meth) acrylates and vinyl compounds. Herein, hydrogen atoms of the alkyl groups or hydrogen atoms of the aryl groups may be replaced by a substituent.

Specific examples of the alkyl (meth)acrylates and the aryl (meth)acrylates include methyl(meth)acrylate, ethyl(meth) acrylate, propyl(meth)acrylate, butyl(meth)acrylate, isobutyl (meth)acrylate, pentyl(meth)acrylate, hexyl(meth)acrylate, octyl(meth)acrylate, phenyl(meth)acrylate, benzyl(meth) acrylate, tolyl(meth)acrylate, naphthyl(meth)acrylate, and cyclohexyl(meth)acrylate.

Examples of the vinyl compounds include styrene, α-methylstyrene, vinyltoluene, glycidyl methacrylate, acrylonitrile, vinyl acetate, N-vinylpyrrolidone, tetrahydrofurfuryl methacrylate, polystyrene macromonomer, polymethyl methacrylate macromonomer, $CH_2{=}CR^1R^2$, and $CH_2{=}C(R^1)(COOR^3)$, in which $R^1$ represents a hydrogen atom or an alkyl group having 1 to 5 carbon atoms, $R^2$ represents an aromatic hydrocarbon ring having 6 to 10 carbon atoms and $R^3$ represents an alkyl group having 1 to 8 carbon atoms or an aralkyl group having 6 to 12 carbon atoms.

The copolymerizable monomers may be used singly, or in combination of two or more thereof.

The copolymerizable monomer is preferably at least one selected from $CH_2{=}CR^1R^2$, $CH_2{=}C(R^1)(COOR^3)$, phenyl (meth)acrylate, benzyl(meth)acrylate and styrene, and is particularly preferably $CH_2{=}CR^1R^2$ and/or $CH_2{=}C(R^1)(COOR^3)$.

When included, the content of the alkali-soluble resin in the colored curable composition according to the first aspect is preferably from 1% by mass to 30% by mass, more preferably from 1% by mass to 25% by mass, and particularly preferably from 2% by mass to 20% by mass, with respect to the total solid contents of the composition.

The linear organic high-molecular polymer used as an alkali-soluble resin in the second aspect is preferably a polymer having carboxylic acid in a side chain thereof. Examples thereof include methacrylic acid copolymers, acrylic acid copolymers, itaconic acid copolymers, crotonic acid copolymers, maleic acid copolymers and partially-esterified maleic acid copolymers, and acidic cellulose derivatives, and products obtained by addition of an acid anhydride to a polymer having a hydroxyl group. In particular, a copolymer of (meth) acrylic acid and other monomer copolymerizable therewith is preferred as an alkali-soluble resin. Examples of the monomer copolymerizable with (meth)acrylic acid include alkyl (meth)acrylate, aryl(meth)acrylate, and a vinyl compound. Examples of the alkyl(meth)acrylate and aryl(meth)acrylate include methyl(meth)acrylate, ethyl(meth)acrylate, propyl (meth)acrylate, butyl(meth)acrylate, isobutyl(meth)acrylate, pentyl(meth)acrylate, hexyl(meth)acrylate, octyl(meth)acrylate, phenyl(meth)acrylate, benzyl(meth)acrylate, tolyl (meth)acrylate, naphthyl(meth)acrylate, and cyclohexyl (meth)acrylate. Examples of the vinyl compound include styrene, α-methylstyrene, vinyltoluene, glycidyl methacrylate, acrylonitrile, vinyl acetate, N-vinylpyrrolidone, tetrahydrofurfuryl methacrylate, polystyrene macromonomer, and polymethyl methacrylate macromonomer.

As for the alkali-soluble resin used in the second aspect, it is preferable that the alkali-soluble resin contains a polymer (a) obtained by polymerizing a monomer component which essentially contains a compound represented by the following Formula (ED) (hereinbelow, may be referred to as "ether dimer").

By using the polymer (a), a cured coating film having excellent heat resistance and transparency is produced using the colored curable composition according to the second aspect of the invention.

(ED)

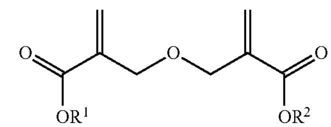

In Formula (ED), $R^1$ and $R^2$ each independently represent a hydrogen atom or a substituted or unsubstituted hydrocarbon group having 1 to 25 carbon atoms.

Among $R^1$ and $R^2$ in Formula (ED), the substituted or unsubstituted hydrocarbon group having 1 to 25 carbon atoms is not specifically limited. However, examples thereof include a linear or branched alkyl group such as a methyl group, an ethyl group, a n-propyl group, an isopropyl group, a n-butyl group, an isobutyl group, a t-butyl group, a t-amyl group, a stearyl group, a lauryl group, or a 2-ethylhexyl group; an aryl group such as a phenyl group; a cycloaliphatic group such as a cyclohexyl group, a t-butylcyclohexyl group, a dicyclopentadienyl group, a tricyclodecanyl group, an isobornyl group, an adamantyl group, or a 2-methyl-2-adamantyl group; an alkyl group substituted with an alkoxy, such as a 1-methoxyethyl group or a 1-ethoxyethyl group; and an alkyl group substituted with an aryl group such as a benzyl group. Of these, a primary or a secondary carbon substituent such as a methyl group, an ethyl group, a cyclohexyl group, or a benzyl group, which is difficult to dissociated by acid or heat, is preferable from the viewpoint of heat resistance.

Specific examples of ether dimer include dimethyl-2,2'-[oxybis(methylene)]bis-2-propenoate,
diethyl-2,2'-[oxybis(methylene)]bis-2-propenoate,
di(n-propyl)-2,2'-[oxybis(methylene)]bis-2-propenoate,
di(isopropyl)-2,2'-[oxybis(methylene)]bis-2-propenoate,
di(n-butyl)-2,2'-[oxybis(methylene)]bis-2-propenoate,
di(isobutyl)-2,2'-[oxybis(methylene)]bis-2-propenoate,
di(t-butyl)-2,2'-[oxybis(methylene)]bis-2-propenoate,
di(t-amyl)-2,2'-[oxybis(methylene)]bis-2-propenoate,
di(stearyl)-2,2'-[oxybis(methylene)]bis-2-propenoate,
di(lauryl)-2,2'-[oxybis(methylene)]bis-2-propenoate,
di(2-ethylhexyl)-2,2'-[oxybis(methylene)]bis-2-propenoate,
di(1-methoxyethyl)-2,2'-[oxybis(methylene)]bis-2-propenoate,
di(1-ethoxyethyl)-2,2'-[oxybis(methylene)]bis-2-propenoate,
dibenzyl-2,2'-[oxybis(methylene)]bis-2-propenoate,
diphenyl-2,2'-[oxybis(methylene)]bis-2-propenoate,
dicyclohexyl-2,2'-[oxybis(methylene)]bis-2-propenoate,
di(t-butylcyclohexyl)-2,2'-[oxybis(methylene)]bis-2-propenoate, di(dicyclopentadienyl)-2,2'-[oxybis(methylene)]bis-2-propenoate,
di(tricyclodecanyl)-2,2'-[oxybis(methylene)]bis-2-propenoate,
di(isobornyl)-2,2'-[oxybis(methylene)]bis-2-propenoate,
diadamantyl-2,2'-[oxybis(methylene)]bis-2-propenoate, and
di(2-methyl-2-adamantyl)-2,2'-[oxybis(methylene)]bis-2-propenoate. Of these,
dimethyl-2,2'-[oxybis(methylene)]bis-2-propenoate,
diethyl-2,2'-[oxybis(methylene)]bis-2-propenoate,
dicyclohexyl-2,2'-[oxybis(methylene)]bis-2-propenoate, and
dibenzyl-2,2'-[oxybis(methylene)]bis-2-propenoate are particularly preferable. The ether dimers may be used singly, or in combination two or more thereof.

The proportion of the ether dimer in a monomer used for obtaining the polymer (a) is not specifically limited. However, from the viewpoint of transparency and heat resistance of a coating film formed using the colored curable resin composition according to the second aspect, the content of the ether dimer is preferably from 2 to 60% by mass, more preferably from 5 to 55% by mass, and still more preferably from 5 to 50% by mass, with respect to the total monomer components.

The polymer (a) may be a copolymer obtained by copolymerization of the ether dimer with other monomer(s).

Examples of other monomer(s) copolymerizable with the ether dimer include a monomer for introducing an acid group, a monomer for introducing a radical polymerizable double bond, a monomer for introducing an epoxy group, and still other co-polymerizable monomers that are different from them. Only one type thereof may be used, or two or more types thereof may be used.

Examples of the monomer for introducing an acid group include a monomer having a carboxyl group, such as (meth)acrylic acid or itaconic acid; a monomer having a phenolic hydroxyl group, such as N-hydroxyphenylmaleimide; and a monomer having a carboxylic acid anhydride group, such as maleic anhydride or itaconic anhydride. Of these, (meth)acrylic acid is preferable.

The monomer for introducing an acid group may be a monomer capable of providing an acid group after polymerization, and examples thereof include a monomer having a hydroxyl group, such as 2-hydroxyethyl(meth)acrylate; a monomer having an epoxy group, such as glycidyl(meth)acrylate; and a monomer having an isocyanate group, such as 2-isocyanate ethyl(meth)acrylate. When a monomer for introducing a radical polymerizable double bond is used or when a monomer capable of providing an acid group after polymerization is used, it is necessary to perform a treatment of providing an acid group after polymerization. The treatment of providing an acid group after polymerization varies depending on the type of monomer. The following treatments may be mentioned, for example. When a monomer having a hydroxyl group is used, a treatment including adding an acid anhydride such as succinic anhydride, tetrahydrophthalic anhydride, or maleic anhydride is performed, for example. When a monomer having an epoxy group is used, a treatment including adding a compound having an amino group and an acid group, such as N-methylamino benzoic acid or N-methylamino phenol, may be performed, or a method including adding an acid anhydride such as succinic anhydride, tetrahydrophthalic anhydride, or maleic anhydride to the hydroxyl group generated after the addition of acid such as (meth)acrylic acid may be performed, for example. When a monomer having an isocyanate group is used, a treatment including adding a compound having a hydroxyl group and an acid group such as 2-hydroxybutyric acid may be performed, for example.

When the monomer used for obtaining the polymer (a) contains a monomer for introducing an acid group, the content ratio of the monomer for introducing an acid group is not specifically limited, but is preferably from 5 to 70% by mass, and more preferably from 10 to 60% by mass, with respect to the total monomer components.

Examples of the monomer for introducing a radical polymerizable double bond include a monomer having a carboxyl group, such as (meth)acrylic acid or itaconic acid; a monomer having a carboxylic acid anhydride group, such as maleic anhydride or itaconic anhydride; and a monomer having an epoxy group, such as glycidyl(meth)acrylate, 3,4-epoxycyclohexylmethyl(meth)acrylate, or o- (or m- or p-)vinylbenzylglycidyl ether. When a monomer for introducing a radical polymerizable double bond is used, it is necessary to perform a treatment of providing a radical polymerizable double bond after polymerization. The treatment of providing a radical polymerizable double bond after polymerization varies depending on the type of monomer. The following treatments may be mentioned, for example. When a monomer having a carboxyl group, such as (meth)acrylic acid or itaconic acid is used, a treatment including adding a compound which has a radical polymerizable double bond and an epoxy group, such as glycidyl(meth)acrylate is performed, 3,4-epoxycyclohexylmethyl(meth)acrylate, and o- (or m- or p-)vinylbenzylglycidyl ether. When a monomer having a carboxyl acid anhydride group like maleic anhydride and itaconic anhydride is used, there is a treatment of adding a compound which has a radical polymerizable double bond and a hydroxyl group like 2-hydroxyethyl(meth)acrylate, for example. When a monomer having an epoxy group like glycidyl(meth)acrylate, 3,4-epoxycyclohexylmethyl(meth)acrylate, and o- (or m- or p-)vinylbenzylglycidyl ether is used, there is a treatment of adding a compound which has a radical polymerizable double bond and an acid group like (meth)acrylic acid, for example.

When the monomer used for obtaining obtain the polymer (a) contains a monomer for introducing a radical polymerizable double bond, the content ratio of the monomer for introducing a radical polymerizable double bond is not specifically limited, but is preferably from 5 to 70% by mass, and more preferably from 10 to 60% by mass, with respect to the total monomer components.

Examples of the monomer for introducing an epoxy group include glycidyl(meth)acrylate, 3,4-epoxycyclohexylmethyl (meth)acrylate, and o- (or m- or p-)vinylbenzylglycidyl ether When the monomer used for obtaining the polymer (a) contains a monomer for introducing an epoxy group, the content ratio of the monomer for introducing an epoxy group is not specifically limited, but is preferably from 5 to 70% by mass, and more preferably from 10 to 60% by mass, with respect to the total monomer components.

Examples of the copolymerizable monomer include (meth) acrylic acid esters such as methyl (meth)acrylate, ethyl (meth)acrylate, n-propyl (meth)acrylate, isopropyl (meth) acrylate, n-butyl (meth)acrylate, isobutyl (meth)acrylate, t-butyl (meth)acrylate, methyl 2-ethylhexyl (meth)acrylate, cyclohexyl(meth)acrylate, benzyl(meth)acrylate, or 2-hydroxyethyl (meth)acrylate; aromatic vinyl compounds such as styrene, vinyltoluene, or α-methylstyrene; N-substituted maleimides such as N-phenylmaleimide or N-cyclohexylmaleimide; butadiene or substituted butadiene compounds such as butadiene or isoprene; ethylene or substituted ethylene compounds such as ethylene, propylene, vinyl chloride or acrylonitrile; and vinylesters such as vinyl acetate. Of these, methyl(meth)acrylic acid, cyclohexyl(meth)acrylic acid, benzyl(meth)acrylic acid, and styrene are preferable from the viewpoint of providing good transparency and not impairing heat resistance.

When the monomer used for obtaining the polymer (a) contains the copolymerizable monomer, the content ratio of the copolymerizable monomer is not specifically limited, but is preferably 95% by mass or less, and more preferably 85% by mass or less.

The weight average molecular weight of the polymer (a) is not specifically limited. However, from the viewpoint of the viscosity of the colored curable resin composition according to the second aspect and heat resistance of a coating film produced using the composition, the weight average molecular weight is preferably from 2,000 to 200,000, more preferably from 5,000 to 100,000, and still more preferably from 5,000 to 20,000.

Further, when the polymer (a) has an acid group, the acid value thereof is preferably from 30 to 500 mgKOH/g, and more preferably from 50 to 400 mgKOH/g.

The polymer (a) may be easily obtained by polymerization of the monomer described above which at least essentially contains the ether dimer. In this case, cyclization occurs simultaneously with the polymerization, forming a tetrahydropyran ring structure.

The polymerization method used for synthesis of the polymer (a) is not specifically limited and various conventional polymerization methods may be employed. In particular, solution polymerization is preferable. More specifically, the polymer (a) may be synthesized according to the synthetic method for the polymer (a) described in JP-A No. 204-300204.

Hereinbelow, exemplary compounds of the polymer (a) are shown. However, the invention is not limited to them. Composition ratios for the following exemplary compounds are given in mol %.

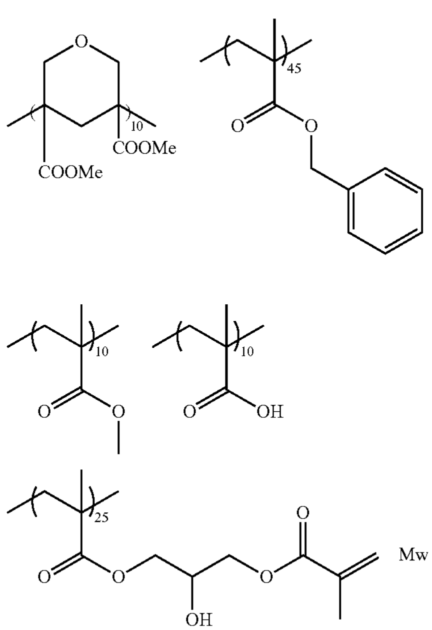

Mw = 12000

-continued

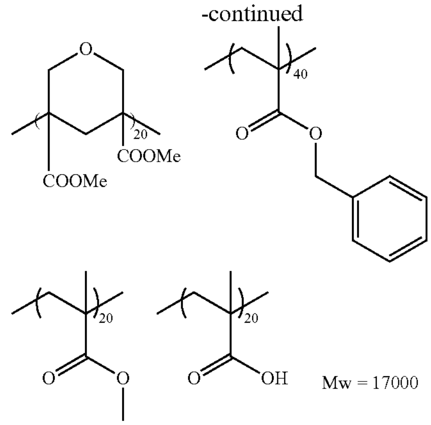

Mw = 17000

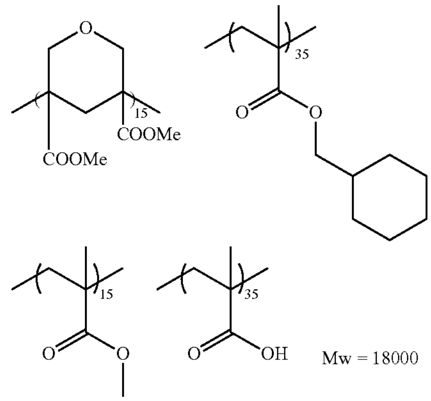

Mw = 18000

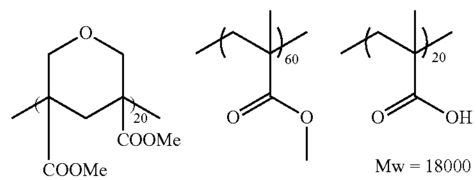

Mw = 18000

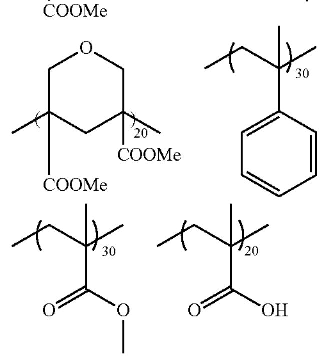

Mw = 18000

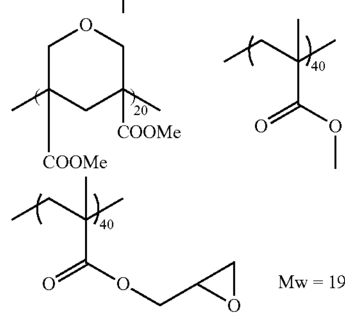

Mw = 19000

Preferred examples of the alkali-soluble resin include benzyl(meth)acrylate/(meth)acrylic acid copolymer; a multi-component copolymer made of benzyl(meth)acrylate/(meth) acrylic acid/other monomer; a copolymer of 2-hydroxyethylmethacrylate; and 2-hydroxypropyl(meth) acrylate/polystyrene macromonomer/benzyl methacrylate/methacrylic acid copolymer, 2-hydroxy-3-phenoxypropylacrylate/polymethylmethacrylate macromonomer/benzylmethacrylate/methacrylic acid copolymer, 2-hydroxyethylmethacrylate/polystyrene macromonomer/methylmethacrylate/methacrylic acid copolymer, and 2-hydroxyethylmethacrylate/polystyrene macromonomer/benzylmethacrylate/methacrylic acid copolymer, which are described in JP-A No. 7-140654.

In order to improve crosslinking efficiency of the colored curable composition according to the second aspect of the invention, an alkali-soluble resin having a polymerizable group may be used.

As an alkali-soluble resin having a polymerizable group, an alkali-soluble resin having an allyl group, a (meth)acryl group, or an aryloxyalkyl group in a side chain thereof is useful. Examples of the alkali-soluble resin having a polymerizable group include an urethane-modified acryl resin containing a polymerizable double bond, which is obtained by reacting an isocyanate group with an OH group in advance to leave one unreacted isocyanate group, and reacting a compound having a (meth)acryloyl group with an acryl resin containing a carboxyl group; an acryl resin containing an unsaturated group, which is obtained by reacting an acryl resin containing a carboxyl group with a compound having both of an epoxy group and a polymerizable double bond in the molecule; an acid pendant-type epoxy acrylate resin; an acryl resin containing a polymerizable double bond, which is obtained by reacting an acryl resin containing an OH group with a dibasic acid anhydride having a polymerizable double bond; a resin obtained by reacting an acryl resin containing an OH group with a compound having isocyanate and a polymerizable group; and a resin obtained by base treatment of a resin having an ester group in a side chain thereof, wherein the ester group has a leaving group such as a halogen atom and a sulfonate group at α position or β position as described in JP-A Nos. 2002-229207 and 2003-335814.

The acid value of the alkali-soluble resin used in the second aspect is preferably from 30 mgKOH/g to 200 mgKOH/g, more preferably from 50 mgKOH/g to 150 mgKOH/g, and still more preferably from 70 to 120 mgKOH/g.

Further, the weight average molecular weight (Mw) of the alkali-soluble resin used in the second aspect is preferably from 2,000 to 50,000, more preferably from 5,000 to 30,000, and still more preferably from 7,000 to 20,000.

In the second aspect, the content of the alkali-soluble resin in the colored curable composition is preferably from 0.5% by mass to 15% by mass, more preferably from 1% by mass to 12% by mass, and still more preferably from 1% by mass to 10% by mass, with respect to the total solid contents in the composition.

Solvent

The colored curable composition according to the first or second aspect of the invention may be appropriately produced using the respective components described above, and a solvent.

Specific examples of the solvent to be used include esters such as ethyl acetate, n-butyl acetate, isobutyl acetate, amyl formate, isoamyl acetate, isobutyl acetate, butyl propionate, isopropyl butyrate, ethyl butyrate, butyl butyrate, alkyl esters, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, or ethyl ethoxyacetate; alkyl 3-oxypropionate esters such as methyl 3-oxypropionate or ethyl 3-oxypropionate; methyl 3-methoxypropionate, ethyl 3-methoxypropionate, methyl 3-ethoxypropionate, ethyl 3-ethoxypropionate, methyl 2-oxypropionate, ethyl 2-oxypropionate, propyl 2-oxypropionate, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, ethyl 2-ethoxy-2-methylpropionate, methyl pyruvate, ethyl pyruvate, propyl pyruvate, methyl acetoacetate, ethyl acetoacetate, methyl 2-oxobutanoate, ethyl 2-oxobutanoate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol methyl ether acetate, propylene glycol ethyl ether acetate, and propylene glycol propyl ether acetate; ketones such as methyl ethyl ketone, cyclohexanone, 2-heptanone, or 3-heptanone; and aromatic hydrocarbons such as toluene or xylene.

Of these, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, and propylene glycol methyl ether acetate, and the like are preferable.

The solvents may be used either singly, or in combination of two or more thereof.

Surfactant

From the viewpoint of improving coating property, the colored curable composition of the first or second aspect of the invention may contain any one of various surfactants. As a surfactant, various surfactants such as a fluorine-containing surfactant, a nonionic surfactant, a cationic surfactant, an anionic surfactant, or a silicone surfactant may be used.

In particular, regarding the colored curable composition according to the first aspect of the invention, liquid properties (particularly, fluidity) of a coating liquid is improved when it is prepared to contain a fluorine-containing surfactant, and accordingly coating thickness uniformity and liquid-saving properties are improved.

In other words, when a film is formed using a coating liquid obtained using the colored curable composition including a fluorine-containing surfactant, the surface tension between a substrate and the coating liquid is decreased, thereby the wettability on the substrate and the coating properties on the substrate are improved. As a result, a film having uniform thickness with reduced thickness unevenness is formed even when a thin film of about a few μm is formed with a small liquid amount.

The fluorine content of the fluorine-containing surfactant is preferably from 3% by mass to 40% by mass, more preferably from preferably 5% by mass to 30% by mass, and particularly preferably 7% by mass to 25% by mass. A fluorine content within the above ranges is effective in terms of coating thickness uniformity and liquid-saving properties, and provides favorable solubility in the colored curable composition.

Examples of the fluorine-containing surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, MEGAFACE F780, MEGAFACE F781 (trade names, all manufactured by DIC Corporation), FLUORAD FC430, FLUORAD FC431, FLUORAD FC171 (trade name, manufactured by Sumitomo 3M), SURFLON S-382, SURFLON SC-101, SURFLON SC-103, SURFLON SC-104, SURFLON SC-105, SURFLON SC1068, SURFLON SC-381, SURFLON SC-383, SURFLON 5393, SURFLON KH-40 (trade names, all manufactured by Asahi Glass Co., Ltd.), and SOLSPERSE 20000 (trade name, manufactured by Lubrizol, Japan).

The fluorine-containing surfactant is effective particularly in prevention of coating unevenness or thickness unevenness when a thin coating film is formed using the colored photosensitive composition according to the second aspect of the invention. It is effective also in slit coating of the colored photosensitive composition according to the second aspect of the invention, in which liquid supply shortage tends to occur.

Specific examples of the nonionic surfactant used in the first or second aspect include glycerol, trimethylol propane, trimethylol ethane, and ethoxylates and propoxylates thereof (e.g., glycerol propoxylate or glycerin ethoxylate), polyoxyethylene lauryl ether, polyoxyethylene stearyl ether, polyoxyethylene oleyl ether, polyoxyethylene octylphenyl ether, polyoxyethylene nonyl phenyl ether, polyethylene glycol dilaurate, polyethylene glycol distearate, and sorbitan fatty esters (for example, trade names: PLURONIC L10, L31, L61, L62, 10R5, 17R2, 25R2, and TETRONIC 304, 701, 704, 901, 904, 150R1, all manufactured by BASF).

Specific examples of the cationic surfactant used in the first or second aspect include a phthalocyanine derivative (for example, trade name: EFKA-745, manufactured by Morishita & Co., Ltd.), organosiloxane polymer KP341 (trade name, manufactured by Shin-Etsu Chemical Co., Ltd.), (meth)acrylic (co)polymer POLY-FLOW No. 75, No. 90, No. 95 (trade names, all manufactured by Kyoeisha Chemical Co., Ltd.), and WO01 (trade name, manufactured by Yusho Co., Ltd.).

Specific examples of the anionic surfactant used in the first or second aspect include WO04, WO05, and WO17 (trade names, all manufactured by Yusho Co., Ltd.).

Examples of the silicone surfactant used in the first or second aspect include "TORAY SILICONE DC3PA", "TORAY SILICONE SH7PA", "TORAY SILICONE DC11PA", "TORAY SILICONE SH21PA", "TORAY SILICONE SH28PA", "TORAY SILICONE SH29PA", "TORAY SILICONE SH30PA", "TORAY SILICONE SH8400" (trade names, all manufactured by Dow Corning Toray Co., Ltd.), "TSF-4440", "TSF-4300", "TSF-4445", "TSF-4460", "TSF-4452" (trade names, all manufactured by Momentive Performance Materials Worldwide Inc.), "KP341", "KF6001", "KF6002", (trade names, all manufactured by Shin-Etsu Silicones), and "BYK307", "BYK323", "BYK330" (trade names, all manufactured by BYK-Chemie).

The surfactants may be used either singly, or in combination of two or more thereof.

The amount of the surfactant to be added is preferably from 0.001% by mass to 2.0% by mass, and more preferably from 0.005% by mass to 1.0% by mass, with respect to the total mass of the colored photosensitive composition according to the first or second aspect.

Thermal Polymerization Inhibitor

A thermal polymerization inhibitor (i.e., polymerization inhibitor) may be added to the colored curable composition according to the first or second aspect of the invention.

Examples of a useful thermal polymerization inhibitor include hydroquinone, p-methoxy phenol, di-t-butyl-p-cresol, pyrogallol, t-butyl catechol, benzoquinone, 4,4'-thiobis(3-methyl-6-t-butylphenol), and 2-mercaptobenzimidazole.

Other Components

If necessary, the colored curable composition according to the first or second aspect of the invention may include various additives such as sensitizing pigments, epoxy resins, fluorine-containing organic compounds, thermal polymerization initiators, thermally-polymerizable components, fillers, polymer compounds other than the alkali-soluble resin, adhesion promoters exemplified by a silane coupling agent, antioxidants, UV absorbents, or aggregation inhibitors.

As an additional component, each components described in paragraphs [0155] to of JP-A No. 2009-256572 may be used, for example.

The colored curable composition according to the first aspect of the invention may be produced by adding a polymerizable compound and a photopolymerization initiator, and if necessary, an additive such as an alkali-soluble resin, a solvent, or a surfactant, to the pigment dispersion composition according to the first aspect of the invention.

The colored curable composition according to the first aspect of the invention may retain adhesion property of a colored pattern to a support and also inhibit the occurrence of residue even when a relatively severe development condition is employed for forming a colored pattern on a support, and therefore, a fine colored area having inhibited occurrence of residue defect, or the like is formed. Further, as it contains a pigment dispersion composition having the azo pigment represented by the Formula (1), dispersability of the pigment is excellent and color characteristics are also excellent.

Thus, the colored curable composition may be preferably used for forming a colored area of a color filter which requires fine and good color characteristics (in particular, a color filter for a solid state imaging device).

When the colored curable composition according to the second aspect of the invention contains the azo pigment represented by Formula (1) of the second aspect as a red pigment, dispersability of the pigment and color characteristics become even more excellent.

The colored curable composition according to the second aspect of the invention is preferably used for forming a colored area of a color filter which requires fine and good color characteristics. Examples of the color filter include a color filter for a solid state imaging device, a color filter for a liquid crystal display device, and a color filter for an organic EL display device, or the like. In particular, a color filter for a solid state imaging device is preferable.

Color Filter for Solid State Imaging Device and Method for Producing the Same

The method for producing a color filter for a solid state imaging device, according to the first or second aspect of the invention includes: applying the colored curable composition according to the first or second aspect of the invention on a substrate to form a colored curable composition layer (herein after, also referred to simply as "colored curable composition layer formation process"); exposing the colored curable composition layer to light through a mask (herein after, also referred to simply as "exposure process"); and developing the colored curable composition layer after the exposure to form a colored pattern (herein after, also referred to as "colored pixel") (herein after, also referred to simply as "development process").

Further, the color filter for a solid state imaging device according to the first or second aspect of the invention is produced by the method of producing a color filter for a solid state imaging device, according to the first or second aspect of the invention.

The color filter for a solid state imaging device according to the first or second aspect of the invention contains at least a red colored pattern (i.e., red pixel) produced by the method of producing a color filter for a solid state imaging device according to the first or second aspect of the invention. Regarding a specific configuration of the color filter for a solid state imaging device of the invention, a color filter having multicolor in which the red colored pattern is combined with other colored pattern (e.g., a color filter having at least three colors of at least the red colored pattern above, a blue pattern, and a green pattern) is preferable.

Hereinbelow, the color filter for a solid state imaging device may be simply referred to as a "color filter."

Colored Curable Composition Layer Formation Process

In the colored curable composition layer formation process, a colored curable composition layer is formed by applying the colored curable composition according to the first or second aspect of the invention on a support.

Examples of the support which may be used in the process include a substrate for a solid state imaging device, wherein an imaging device (light-collecting device) such as a CCD (Charge Coupled Device) or a CMOS (Complementary Metal-Oxide Semiconductor) is formed on a substrate (e.g., silicone substrate), or the like.

In the invention, the colored pattern may be formed on the side of a substrate for a solid state imaging device at which the solid state imaging device is formed (i.e., front side), or it may be formed on the side of a substrate at which the solid state imaging device is not formed (i.e., back side).

Between each imaging device in a solid state imaging device or on back side of a substrate for a solid state imaging device, a light-shielding film may be formed.

Further, if necessary, a pre-coating layer may be formed on a support to improve adhesion to an upper layer, to prevent diffusion of materials, or to improve evenness of substrate surface.

As the application method for the colored curable composition according to the first or second aspect of the invention onto the support, various coating methods such as a slit coating method, an ink jet coating method, a rotation coating method, a cast coating method, a roll coating method, or a screen printing method may be used.

The film thickness of the colored curable composition according to the first aspect is preferably from 0.1 μm to 10 μm, more preferably from 0.2 μm to 5 μm, and still more preferably from 0.2 μm to 3 μm.

The film thickness of the colored curable composition according to the second aspect is preferably from 0.1 μm to 5 μm, more preferably from 0.2 μm to 2 μm, and still more preferably from 0.2 μm to 1 μm.

According to the first or second aspect, the colored curable composition layer coated on the substrate may be dried (pre-baked) using a hot plate, an oven, or the like at the temperature of from 50° C. to 140° C. for 10 seconds to 300 seconds.

Exposure Process

In the exposure process, the colored curable composition layer formed in the colored curable composition layer forming process is exposed via a mask having a predetermined mask pattern by using an exposing device such as a stepper.

As the radiation to be used at the time of the exposure, ultraviolet rays such as a g-ray or an i-ray may preferably be used (particularly preferably, it is an i-ray). The irradiation amount (exposure amount) is preferably from 30 to 1500 $mJ/cm^2$, more preferably from 50 to 1000 $mJ/cm^2$, and most preferably 80 to 500 $mJ/cm^2$.

Development Process

Subsequently, by carrying out the alkaline development process, the colored curable composition layer in an area which is not exposed with light during the light exposure process is eluted with an alkaline aqueous solution, so that only the photocured portion remains.

As the developing liquid, an organic alkaline developing liquid without damaging an imaging device or a circuit in the base is preferable. The developing temperature is usually from 20° C. to 30° C., and the developing time was conventionally from 20 seconds to 90 seconds. However, to further remove the residue, it is sometimes carried out for 120 seconds to 180 seconds in recent days. To still further improve the removability of the residue, sometimes a process of emptying the developing solution every 60 seconds and refilling with fresh one is repeated several times.

Examples of the alkaline agent which is used in the developing liquid include organic base compounds such as aqueous ammonia, ethylamine, diethylamine, dimethyl ethanolamine, tetramethyl ammonium hydroxide, tetraethyl ammonium hydroxide, choline, pyrrole, piperidine, and 1,8-diazabicyclo-[5,4,0]-7-undecene. An alkaline aqueous solution obtained by diluting these alkaline agents in pure water so as to have the concentration of 0.001% by mass to 10% by mass, and preferably 0.01% by mass to 1% by mass is preferably used as a developing liquid.

In the developing liquid used in the first aspect, an inorganic alkali may be used, and preferred examples of the inorganic alkali include sodium hydroxide, potassium hydroxide, sodium carbonate, sodium hydrogen carbonate, sodium silicate, and sodium metasilicate.

In the case of using a developing liquid of such an alkaline aqueous solution, it is generally washed (rinsed) with pure water after the development.

Subsequently, after removing the excess developing liquid by washing and drying, it is preferable to carry out a heating treatment (post-baking)

When a multi-colored pattern is formed, the above processes are repeated in order for each color to form a cured film. As a result, a color filter is obtained.

The post baking is a heat treatment after development for completing the curing, and the heat curing treatment is generally carried out at 100° C. to 240° C., preferably at 200° C. to 240° C. in the first aspect. In the second aspect, the heat curing treatment is generally carried out at 150° C. to 240° C., and preferably at 180° C. to 240° C.

The post-baking treatment may be performed continuously or in a batch manner using a heater such as a hot plate, a convection oven (hot air circulating dryer), or a high frequency heating machine so that the coated film after development is placed under the above condition.

If necessary, the production method according to the first or second aspect of the invention may further include a process other than the processes described above, which is well known in methods of producing a color filter for a solid state imaging device. For example, after performing the colored curable composition layer formation process, the exposure process, and the development process described in detail above, a process of curing the resulting colored pattern by heating and/or exposing to light may be performed if necessary.

When the colored curable composition according to the first or second aspect of the invention is used, clogging of a nozzle of a discharge section or a pipe of a coating apparatus or contamination of the colored curable composition or the pigment in a coater due to their adhesion, precipitation, or drying may occur. Thus, in order to effectively wash the contamination caused by the colored curable composition according to the first or second aspect of the invention, it is preferable that the solvent for the composition is used as a washing liquid. Further, the washing liquids disclosed in JP-A Nos. 7-128867, 7-146562, 8-278637, 2000-273370, 2006-85140, 2006-291191, 2007-2101, 2007-2102, and 2007-281523, or the like may be also suitably used as an agent for washing the colored curable composition according to the first or second aspect of the invention.

Among the above, alkylene glycol monoalkyl ether carboxylate and alkylene glycol monoalkyl ether are preferable.

The solvents may be used either singly or in combination of two or more thereof. When two or more solvents are mixed, it is preferable that a solvent having no hydroxyl group is admixed with a solvent having a hydroxyl group. The weight ratio between a solvent having no hydroxyl group and a solvent having a hydroxyl group (i.e., solvent having no hydroxyl group/solvent having a hydroxyl group) is from 1/99 to 99/1, preferably from 10/90 to 90/10, and more preferably from 20/80 to 80/20. A mixture solvent of propylene glycol monomethyl ether acetate (PGMEA) and propylene glycol monomethyl ether (PGME) with ratio (PGMEA/PGME) of 60/40 is particularly preferable. Further, in order to improve the penetration property of a washing liquid to contaminants, the surfactant described above in relation to the composition may be added to the washing liquid.

By using the colored curable composition according to the first aspect of the invention, the color filter for a solid state imaging device of the first aspect of the invention has little peeling defect and little residue defect, and the colored pattern has excellent heat resistance. Further, since the colored curable composition is formed using the azo pigment represented by Formula (1), spectral characteristics of red color is excellent.

By using the colored curable composition according to the second aspect of the invention, the color filter for a solid state imaging device of the second aspect of the invention has excellent spectral characteristics, inhibited occurrence of development residue, and excellent heat resistance of colored pattern. Further, when the color filter is formed using the azo pigment represented by Formula (1), spectral characteristics of red color is particularly excellent.

The color filter for a solid state imaging device according to the first or second aspect of the invention may be suitably used in solid state imaging devices such as a CCD or a CMOS, and is particularly suitable for a high resolution CCD or CMOS, or the like having more than one million pixels. The color filter for a solid state imaging device according to the first or second aspect of the invention may be used as a color filter, for example, disposed between a light receiving unit of each pixel of CCD and a micro lens for collecting light.

The film thickness of a colored pattern (i.e., color pixel) in the color filter for a solid state imaging device is preferably 2.0 μm or less, and more preferably 1.0 μm or less.

Further, the size (i.e., pattern width) of a colored pattern (i.e., color pixel) is preferably 2.5 μm or less, more preferably 2.0 μm or less, and still more preferably 1.7 μm or less.

Solid State Imaging Device

The solid state imaging device according to the first or second aspect of the invention has at least the color filter for a solid state imaging device according to the first or second aspect of the invention described above.

The configuration of the solid state imaging device according to the first or second aspect of the invention is not specifically limited as long as it has a configuration having the color filter for a solid state imaging device according to the first or second aspect of the invention and capable of functioning as a solid state imaging device. An example of the configuration is described below.

For example, a configuration is employed, which has plural photodiodes forming a light-collecting area of a solid stage imaging device (such as a CCD image sensor or CMOS image sensor) and a transport electrode formed from polysilicon or the like, on a support; a light-shielding film which is formed from tungsten or the like on the photodiodes and the transport electrode, and has openings only over the light-collecting sections of the photodiodes; a device-protecting film which is formed from silicone nitride or the like and is formed over the light-collecting film to cover the entire surface of the light-shielding film and to cover the light-collecting sections of the photodiodes; and the color filter for a solid state imaging device according to the first or second aspect of the invention formed on the device-protecting film.

Further, a configuration in which a light-collecting unit (e.g., a micro lens, and the same applies hereinafter) is arranged on the device-protecting layer and under the color filter (i.e., a side closer to the support), or a configuration in which a light-collecting unit is arranged on the color filter may be also employed.

EXAMPLES

The invention is more specifically described by referring to examples hereinafter. The materials, reagents, ratios, apparatuses, operations, or the like described in the following examples may be appropriately modified as long as it does not depart from the spirit of the invention. As such, the scope of the invention is not limited to the specific examples given below. In the following examples, unless otherwise indicated, "%" and "parts" mean "% by mass" and "parts by mass", respectively, and "molecular weight" means a weight average molecular weight.

Examples According to First Aspect

Example 1

Preparation of Pigment Dispersion Composition P

Preparation of Pulverized Sulfate of Soda (Pulverized Sodium Sulfate)

Dry air was introduced to a 0.65 MPa jet mill (trade name: SUPER JET MILL, manufactured by NISSHIN ENGINEERING INC., an air flow pulverizer), and then sulfate of soda (manufactured by Mitajiri Chemical Industry Co., Ltd., neutral anhydrous sulfate of soda, having an average particle diameter of 20 μm) was supplied as a raw material at a rate of 20 kg/hr and pulverized continuously. The pulverized sulfate of soda released from the pulverizer was collected en bloc using a bug filter.

The pulverized sulfate of soda was added to isobutyl alcohol and dispersed with ultrasonication (for 1 min). The particle size distribution thereof was measured using a particle diameter measuring device (trade name: MT-3300II, manufactured by NIKKISO CO., LTD., MicroTrac particle size analyzer). As a result, the average particle diameter D50 was found to be 3.19 μm. In addition, particle volume % of the particles which have large particle diameters of 10 μm or more was determined from the particle size distribution data, and it was found to be 0.00 volume %.

Solvent Salt Milling of Pigment

The following Pigment 1 (red pigment), which is the azo pigment represented by Formula (1) of the first aspect, was microfined by solvent salt milling. The details are explained hereinbelow.

Pigment 1

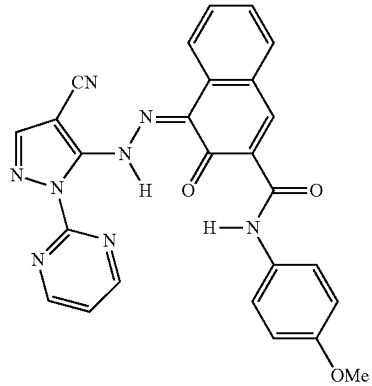

Solvent salt milling of the pigment 1 was performed as described below.

First, to a double-arm kneader (trade name: a 5-L kneader, Σ type, manufactured by Moriyama Company Ltd., hereinbelow, referred to as a "kneader"), pulverized sulfate of soda (3,000 g) was added, and Pigment 1 (300 g) was also added thereto, followed by mixing for 5 min. To the mixture, 900 g of diethylene glycol (DEG) (manufactured by NIPPON SHOKUBAI CO., LTD.) was added and kneaded. While controlling the temperature so that the temperature of the kneaded mixture in the kneader is 50° C., the kneading was carried out for 10 hours (hereinbelow, the kneaded mixture is referred to as "magma"). The above operations correspond to the microfining process.

After completion of the microfining process, the magma was taken out and transferred to a tank of which temperature is controllable. De-ionized water (20 L) was added to the tank in advance. The magma was stirred and dispersed for 2 hours at a revolution number of 150 rpm using a stirring apparatus. The resulting dispersion was transferred to a nutsche and filtered. After the filtration, the resultant was washed with de-ionized water until the electrical conductivity of the washing waste became 3 μS/cm or less. The washed microfined pigment having a high moisture content is referred to as "pigment paste".

The pigment paste after washing was taken out, placed on a drying tray (which is made of SUS304 which is an austenite steel defined by a standard for stainless steel bars, such as JIS G4303), transferred to a dryer, and dried for 15 hours at 80 to 105° C. The microfined pigment after drying is referred to as a "dry block".

The dry block was pulverized using a pulverizer (trade name: SAMPLE MILL SK-M2, manufactured by KYORITSU Electric Corporation, a small-size pulverizer).

In this way, solvent salt milling of Pigment 1 was performed. Pigment 1 obtained after the solvent salt milling was used for the preparation of a red pigment dispersion composition P.

Preparation of Pigment Dispersion Composition P

A liquid mixture having the following formulation was mixed and dispersed for 2 hours using a beads mill to prepare a pigment dispersion composition P.

Formulation:

Mixture of Pigment 1 obtained by the solvent salt milling and Pigment Yellow 139 (PY139) (weight ratio [Pigment 1/PY139]=100/30): 11.80 parts Compound 1 shown below (triazine derivative having an acidic functional group): 1.31 parts Dispersant 1 shown below: 6.59 parts Propylene glycol monomethyl ether acetate (PGMEA): 80.29 parts In the pigment dispersion composition P, Pigment 1 is a main pigment and Pigment Yellow 139 is an additional pigment.

Compound 1

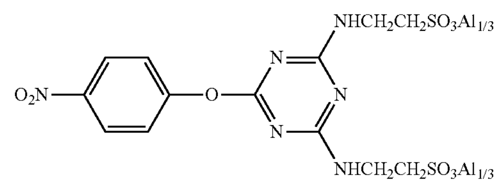

Disperant 1

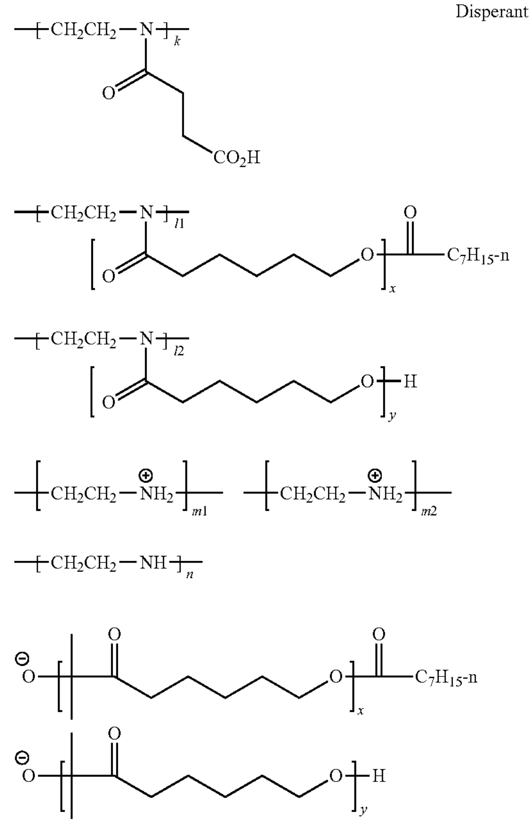

k / (l1+l2) / (m1+m2) / n = 10/50/5/35 x+y=40 Mw 24,000 Mw/Mn=1,6

The dispersant 1 may be synthesized with reference to the synthetic examples described in paragraphs [0245] to [0247] of JP-A No. 2009-203462.

The red pigment dispersion composition P thus obtained was subjected to volume average particle diameter measurement using a particle size analyzer NANOTRAC UPA (trade name: UPA-EX150, manufactured by Nikkiso Co., Ltd.). As a result, the volume average particle diameter thereof was found to be 10 nm.

Preparation of Red Colored Curable Composition R

The pigment dispersion composition P was mixed and stirred to have the following formulation, and as a result, a red colored curable composition R was prepared.

Formulation:

Pigment dispersion composition P: 10.28 parts

Polymerizable compound: compound described above as exemplary compound (b): 0.15 parts Oxime photopolymerization initiator CGI-124 (trade name, manufactured by Ciba Specialty Chemicals Inc.): 0.07 parts Polymerization inhibitor (p-methoxyphenol): 0.01 parts Resin (benzyl methacrylic acid/methacrylic acid/methacrylic acid-2-hydroxyethyl copolymer, molar ratio 60/20/20, weight average molecular weight=15,000): 1.14 parts Fluorine-containing surfactant (1.0% propylene glycol monomethyl ether acetate solution of MEGAFACE F781 (trade name, manufactured by DIC)): 0.63 parts Solvent (propylene glycol monomethyl ether acetate (hereinbelow, referred to as "PGMEA")): 2.73 parts Production of Substrate Having Undercoat Layer Formed Thereon An 8-inch silicone wafer which had undergone device formation (i.e., substrate for a solid state imaging device) was heat-treated for 30 min. in an oven at 200° C. Subsequently, a curable resin solution "CYCLOMER P ACA Z230AA" (trade name, manufactured by DAICEL CHEMICAL INDUSTRIES, LTD.) was applied by coating on the substrate to have a dry film thickness of 0.3 μm, and dried for 5 min by heating on a hot plate at 230° C., thereby forming an undercoat layer. As a result, a substrate having an undercoat layer formed thereon was obtained.

Production of Red Color Filter

The red colored curable composition R prepared as described above was applied by coating on the device-formed surface of the substrate having an undercoat layer formed thereon, thereby forming a photocurable coating film. Then, a heat treatment (i.e., pre-baking) was carried out using a hot plate at 100° C. for 120 seconds, so as to have a dry film thickness of the coating film of 1.0 μm.

Subsequently, using an i-ray stepper exposing device FPA-3000i5+ (trade name, manufactured by Canon Inc.), pattern exposure was conducted at a wavelength of 365 nm and with an exposure amount of 200 mJ/cm$^2$ through a photomask to form a red pixel of 1.0 μm square size.

Thereafter, the silicon wafer having the irradiated coating film thereon was placed on a horizontal rotatable table of a spin-shower developing device (trade name: Type DW-30, manufactured by Chemitronics Co., Ltd.), and paddle development was carried out three times at 23° C. for 60 seconds using a 60% diluted solution of CD-2000 (trade name, manufactured by FUJIFILM Electronic Materials Co., Ltd.), thereby forming a red colored pattern on the silicon wafer.

While the silicon wafer having the red colored pattern formed thereon was fixed on the horizontal rotatable table by a vacuum chuck system, and rotated at a rotational frequency of 50 r.p.m. using a rotating device, a rinse treatment was carried out by showering pure water from a jet nozzle from above the rotational center, followed by spray drying.

Next, the resulting product was heated for 5 min on a hot plate at 220° C., thereby obtaining a red colored pattern (i.e., red color filter) on the silicone wafer.

Evaluation of Adhesiveness (Peeling of Colored Pattern)

The silicone wafer having the red color filter attached thereon was observed under an optical microscope (magnification: 100 times). Fifty views per wafer were randomly extracted, and the number of the peeled pattern was actually counted, and the peel occurrence ratio in the colored pattern was calculated. Results are shown in Table 1.

As shown in Table 1, the peel occurrence ratio in the colored pattern is less than 1%. Accordingly, it was confirmed that peeling of a colored pattern is sufficiently inhibited in the red color filter obtained in the Examples according to the first aspect of the invention.

Note that, a peel occurrence ratio in a colored pattern of 3% or less is recognized as a practically admissible level.

Evaluation of Residue

The silicone wafer having the red color filter attached thereon was examined using a defect inspector ComPLUS3 (trade name, manufactured by Applied Materials Technology). After identifying the defect area, the amount (number/cm$^2$) of residue defects on a microscopic image of the defect area was calculated.

Note that, a residue defect amount of 3.0 defects/cm$^2$ or less is recognized as a practically admissible level. Results are shown in Table 1.

Spectrophotometric Determination

A red color film was formed in the same manner as in the production of a red color filter, except that the 8-inch silicone wafer which had undergone device formation was changed to a glass substrate and the pattern exposure was changed to entire surface exposure. Then, the spectral characteristics (i.e., transmission ratios at respective wavelengths) of the red color film were measured using MCPD-3000 (trade name, manufactured by Otsuka Electronics Co., Ltd.).

According to the measured spectral characteristics, the transmission ratio in the range of from 350 nm to 400 nm was relatively low, and the transmission ratio in the wavelength range of from 650 nm to 750 nm was relatively high.

Thus, it was confirmed that the colored pattern of the color filter obtained in the Examples according to the first aspect of the invention exhibits red color with good spectral characteristics.

Evaluation of Heat Resistance

A red color film was formed in the same manner as in the production of a red color filter, except that the 8-inch silicone wafer which had undergone device formation was changed to a glass substrate and the pattern exposure was changed to entire surface exposure.

The resulting red color film was exposed to heat at 220° C. for 60 min under the atmosphere, and color difference (ΔE*ab) before and after the exposure was measured using a spectrophotometer MCPD-3000 (trade name, manufactured by Otsuka Electronics Co., Ltd.). Based on the measured color difference (ΔE*ab), heat resistance was evaluated.

A smaller color difference ΔE*ab indicates better heat resistance. The evaluation results are shown in Table 1.

Examples 2 to 15 and Comparative Example 1

A pigment dispersion composition, a colored curable composition, and a red color filter were produced in the same manner as in Example 1 except that types of the main pigment, additional pigment, pigment derivative, and dispersant were changed to those shown in Table 1 below. Thereafter, the evaluation was carried out in the same manner as in Example 1.

The evaluation results are shown in Table 1.

TABLE 1

| | Pigment dispersion composition | | | | Evaluation result | | |
|---|---|---|---|---|---|---|---|
| | Major pigment | Additional pigment | Derivative having acidic functional group or Comparative compound | Dispersant | Peeling | Residue (number/cm$^2$) | Heat resistance |
| Example 1 | Pigment 1 | Pigment 4 | Compound 1 | Dispersant 1 | Less than 1% | 0.17 | 3 |
| Example 2 | Pigment 2 | Pigment 4 | Compound 1 | Dispersant 1 | Less than 1% | 0.21 | 6 |
| Example 3 | Pigment 3 | Pigment 4 | Compound 1 | Dispersant 1 | Less than 1% | 0.21 | 9 |
| Example 4 | Pigment 1 | Pigment 4 | Compound 2 | Dispersant 1 | Less than 1% | 2.67 | 3 |
| Example 5 | Pigment 1 | Pigment 4 | Compound 3 | Dispersant 1 | Less than 1% | 1.76 | 3 |
| Example 6 | Pigment 1 | Pigment 4 | Compound 4 | Dispersant 1 | Less than 1% | 2.14 | 3 |
| Example 7 | Pigment 1 | Pigment 4 | Compound 1 | Dispersant 2 | About 1% | 0.72 | 3 |
| Example 8 | Pigment 1 | Pigment 4 | Compound 1 | Dispersant 3 | About 1% | 0.86 | 3 |
| Example 9 | Pigment 1 | Pigment 4 | Compound 1 | Dispersant 4 | About 1% | 0.60 | 3 |
| Example 10 | Pigment 1 | Pigment 4 | Compound 1 | Dispersant 5 | About 2% | 0.44 | 3 |
| Example 11 | Pigment 1 | Pigment 5 | Compound 1 | Dispersant 1 | Less than 1% | 0.24 | 5 |
| Example 12 | Pigment 1 | Pigment 6 | Compound 1 | Dispersant 1 | Less than 1% | 0.31 | 7 |
| Example 13 | Pigment 1 | Pigment 7 | Compound 1 | Dispersant 1 | Less than 1% | 0.24 | 6 |
| Example 14 | Pigment 1 | Pigment 8 | Compound 1 | Dispersant 1 | Less than 1% | 1.50 | 5 |
| Example 15 | Pigment 1 | Pigment 9 | Compound 1 | Dispersant 1 | Less than 1% | 1.92 | 4 |
| Comparative example 1 | Pigment 1 | Pigment 4 | Compound 5 | Dispersant 1 | About 5% | 0.29 | 10 |

Details of respective components shown in Table 1 are as follows.

Pigment 2

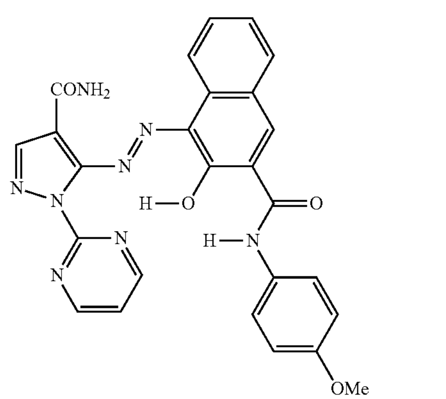

-continued

Pigment 3

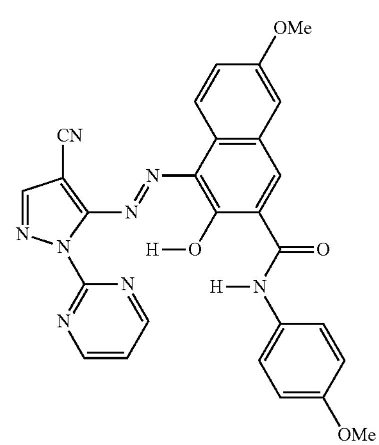

Pigment 4: Pigment Yellow 139
Pigment 5: Pigment Yellow 150
Pigment 6: Pigment Yellow 185
Pigment 7: Pigment Red 254
Pigment 8: Pigment Orange 71
Pigment 9: Pigment Violet 29

Compound 2

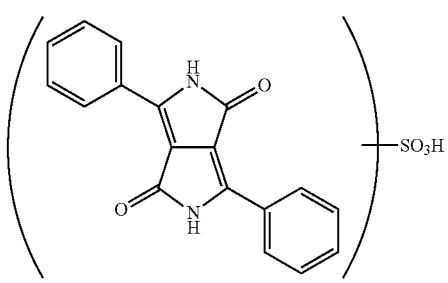

Compound 3

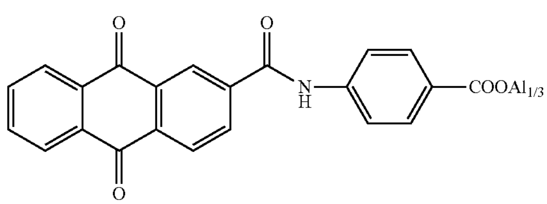

-continued

Compound 4

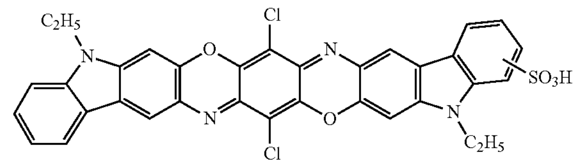

Compound 5

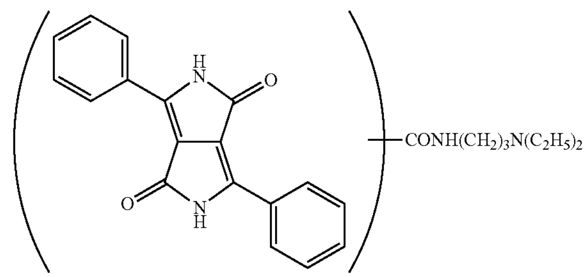

Dispersant 2: 100/50/2 reaction product of 2,4-tolylene diisocyanate/polybutylene adipate (molecular weight: 2,000)/N,N-diethyl-1,3-propanediamine (molecular weight: 10,000)

Dispersant 3: benzyl methacrylate/2-ethylhexyl methacrylate/2-dimethylamino ethyl methacrylate (weight ratio: 30/30/40) copolymer (weight average molecular weight: 12,000)

Dispersant 4: methacrylic acid/2-hydroxyethyl methacrylate/N-phenylmaleimide/styrene/n-butyl methacrylate copolymer (weight ratio=30/30/12/18/10, weight average molecular weight=12,000)

Dispersant 5: dispersant having the following structure (weight average molecular weight: 25,000)

Dispersant 5

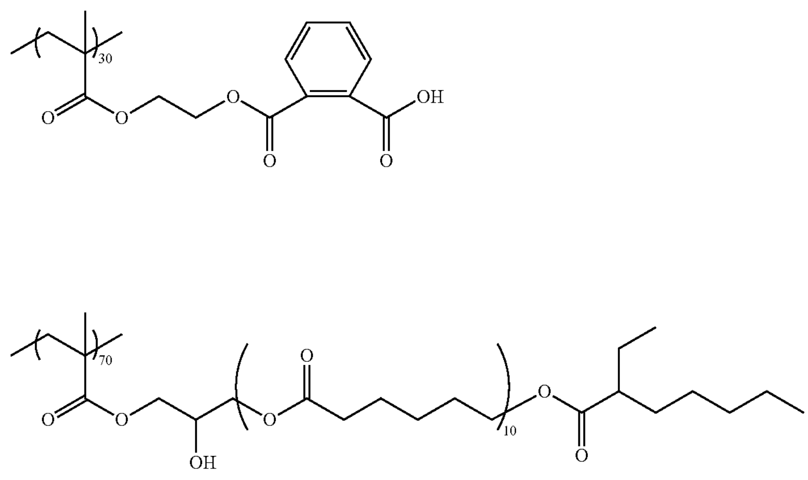

As shown in Table 1, when the colored curable compositions including the pigment dispersions of Examples 1 to 15 containing the azo pigment, acidic functional group-containing derivative, and dispersant were used, good adhesiveness of a colored pattern was achieved, and good pattern formability with a small amount of residues was achieved.

Note that, although the examples explained above relates to an embodiment in which a red color filter is formed on a silicon wafer which has undergone device formation. However, the invention is not limited to this embodiment.

Example 16

A solid state imaging device was produced as follows.

Preparation of Colored Curable Composition

A green colored curable composition was prepared in the same manner as in Example 1 except that Pigment 1 used in Example 1 was changed to Pigment Green 36.

A blue colored curable composition was prepared in the same manner as in Example 1 except that Pigment 1 used in Example 1 was changed to Pigment Blue 15: 6, and Pigment 4 used in Example 1 was changed to Pigment Violet 23.

As for a red colored curable composition, the red colored curable composition R prepared in Example 1 was used.

Production of Device Formed Silicone Wafer Having Undercoat Layer Formed Thereon On a silicone wafer which had undergone device formation by a known method, an undercoat layer was formed in the same manner as in the production of a substrate having an undercoat layer formed thereon in Example 1. As a result, a device-formed silicone wafer on which an undercoat layer has been attached was produced.

Production of Solid State Imaging Device

Exposure to light, development, rinsing, and post-baking were performed in the same manner as in Example 1, except that the green colored curable composition prepared as described above was used instead of the red colored curable composition R for producing a red color filter of Example 1, and the photomask used for light exposure in Example 1 was changed to a mask for forming a checkered pattern of 1.0 μm square size, whereby a green pattern was formed on the device-formed silicone wafer having an undercoat layer formed thereon.

Subsequently, a red pattern was formed on the silicone wafer having the green pattern formed thereon in the same manner as the formation of the green pattern except that the red colored curable composition R was used.

Subsequently, a blue pattern was formed on the silicone wafer having the green pattern and red pattern formed thereon in the same manner as the formation of the green pattern except that the blue colored curable composition prepared above was used.

In this way, a color filter for a solid state imaging device, having a green pattern, a red pattern and a blue pattern was produced.

Further, according to a well known method, a solid state imaging device to which the color filter for a solid state imaging device had been incorporated was produced.

The solid state imaging device thus obtained was used to take an image, and it was found that the image quality was favorable.

Examples According to Second Aspect

Example 2-1

Preparation of Pigment Dispersion Composition 2-P

Pigment 1 was obtained in the same manner as in the production of Pigment 1 used in Example 1 according to the first aspect of the invention. Hereinbelow, Pigment 1 used in the Examples according to the second aspect is referred to as "Pigment 2-1". Pigment 2-1 obtained after the solvent salt milling was used for the preparation of a pigment dispersion composition 2-P.

Pigment Yellow 139 (PY139) was prepared as Pigment 2-4, and subjected to microfining by solvent salt milling, similar to that used for Pigment 2-1, and the resulting pigment after solvent salt milling was used as Pigment 2-4.

The average primary particle diameter of Pigment 2-1 after salt milling was determined using a scanning electron microscope, and was found to be 60 nm. The particle diameter of Pigment 2-4 was determined in the same manner as Pigment 2-1, and was found to be 30 nm.

Preparation of Pigment Dispersion Composition 2-P

A liquid mixture having the following formulation was mixed and dispersed for 2 hours using a beads mill, to prepare a pigment dispersion composition P, which is the red colored composition used in the second aspect of the invention.

Formulation

- Mixture of Pigment 2-1 obtained by solvent salt milling and Pigment Yellow 139 (PY139) (weight ratio [Pigment 1/PY139]=100/30): 11.8 parts
- Compound 2-1 shown below (azo pigment derivative): 1.2 parts
- Dispersant 2-1 shown below (weight average molecular weight=35,000, acid group in a side chain: 100 mgKOH/g): 4.8 parts
- Propylene glycol monomethyl ether acetate (herein after, abbreviated as "PGMEA"):
  82.2 parts In the pigment dispersion composition 2-P, Pigment 2-1 was a main pigment and Pigment Yellow 139 was Pigment 2-4, that is an additional pigment.

Pigment derivative (2-1)

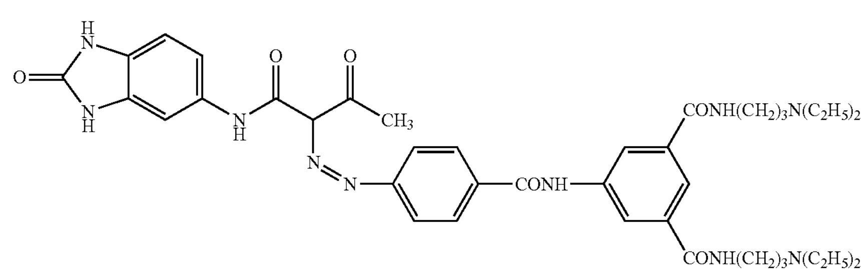

-continued

Dispersant (2-1)

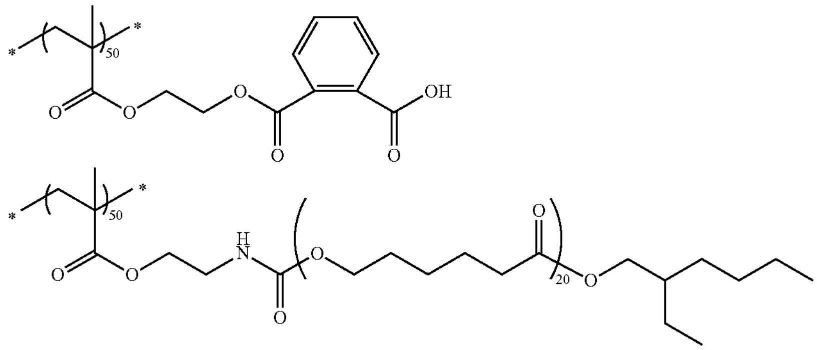

The red pigment dispersion composition 2-P obtained was subjected to volume average particle diameter measurement using a particle size analyzer NANOTRAC UPA (trade name: UPA-EX150, manufactured by Nikkiso Co., Ltd.). As a result, the diameter was found to be 5 nm.

Evaluation of Dispersion Stability

A viscosity i.e., η1 (unit: mPa·s) immediately after dispersion of the red pigment dispersion composition 2-P, and a viscosity i.e., η2 (unit: mPa·s) one week after keeping the red pigment dispersion composition 2-P at room temperature (25° C., the same applies hereinafter), were measured using a Type E viscometer (trade name: $R^E$-85L, manufactured by Toki Sangyo Co., Ltd.). Thereafter, the viscosity increase [η2-η1] was calculated. Based on the calculated viscosity increase, the dispersion stability was evaluated according to the following evaluation criteria. The evaluation results are shown in Table 1. A smaller viscosity increase indicates better dispersion stability.

Evaluation Criteria

A: viscosity increase is 2 mPa·s or less.

B: viscosity increase is more than 2 mPa·s and less than 3 mPa·s.

C: viscosity increase is more than 3 mPa·s and less than 4 mPa·s.

D: viscosity increase is more than 4 mPa·s.

Preparation of Red Colored Curable Composition 2-R

The red pigment dispersion composition 2-P was mixed and stirred to have the following formulation, and as a result, a red colored curable composition 2-R was prepared.

Formulation:

Red colored pigment dispersion composition 2-P: 58.3 parts

Polymerizable compound (exemplary compound (b)): 0.7 parts

Oxime photopolymerization initiator CGI-124 (trade name, manufactured by Ciba Specialty Chemicals Inc.): 0.6 parts Polymerization inhibitor (p-methoxyphenol): 0.0003 parts Alkali-soluble resin 2-1 (polymer (a) obtained by polymerization of monomer components which essentially contain an ether dimer, with the following structure; weight average molecular weight=12,000): 1.1 parts Fluorine-containing surfactant: a 1.0% PGMEA solution of MEGAFACE F781 (trade name, manufactured by DIC): 4.2 parts Solvent (propylene glycol monomethyl ether acetate): 15.1 parts Alkali-soluble resin 2-1

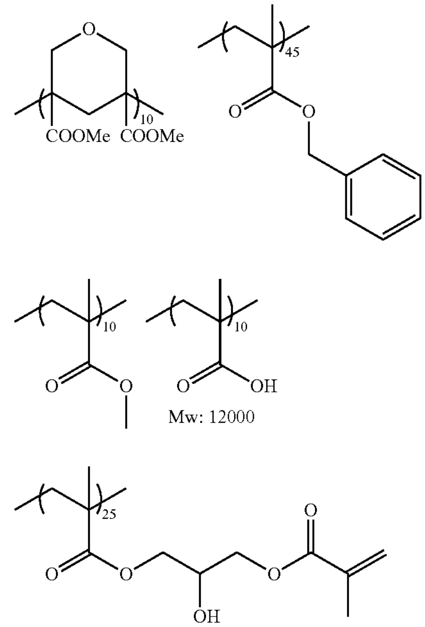

The compositional ratios of the alkali soluble resin 2-1 are in mol %. Further, the alkali soluble resin 2-1 was synthesized with reference to the method disclosed in JP-A No. 2004-300204.

Production of Red Color Filter

The red colored curable composition 2-R prepared as described above was applied by coating on the device-formed surface of an 8-inch silicone wafer (i.e., substrate for a solid state imaging device) to which hexamethyl disilazane had been sprayed in advance, thereby forming a photocurable coating film. Then, a heat treatment (pre-baking) was carried out using a hot plate at 100° C. for 180 seconds, so as to have a dry film thickness of the coating film of 0.6 μm.

Subsequently, using an i-ray stepper exposing device FPA-3000i5+ (trade name, manufactured by Canon Inc.), pattern exposure was conducted at a wavelength of 365 nm and with an exposure amount of 150 mJ/$cm^2$ through a photomask to form a red pixel of 1.0 μm square size.

Thereafter, the silicon wafer having the irradiated coating film thereon was placed on a horizontal rotatable table of a spin-shower developing device (trade name: Type DW-30, manufactured by Chemitronics Co., Ltd.), and paddle development was carried out at 23° C. for 180 seconds using a 40% diluted solution of CD-2000 (trade name, manufactured by FUJIFILM Electronic Materials Co., Ltd.), thereby forming a red colored pattern on the silicon wafer.

While the silicon wafer having the red colored pattern formed thereon was fixed on the horizontal rotatable table by a vacuum chuck system, and rotated at a rotational frequency of 50 r.p.m. using a rotating device, a rinse treatment was carried out by showering pure water from a jet nozzle from above the rotational center, followed by spray drying.

Next, the resulting product was heated for 5 min on a hot plate at 200° C., thereby obtaining a red colored pattern (i.e., red color filter) on the silicone wafer.

The pattern shape of the thus-obtained red color filter was observed under an optical microscope (magnification ratio: ×1000) and a scanning electron microscope (SEM) (magnification ratio: ×20000). As a result, it was found that the pattern shape was good and the pattern formability was also good.

Evaluation of Development Residue

The silicone wafer having the red color filter formed thereon was observed under a scanning electron microscope (SEM) (magnification ratio; ×20,000), and the development residue was evaluated according to the following evaluation criteria.

Evaluation Criteria:

A: Number of residues was less than 10/area (view).

B: Number of residues was 10 or more but less than 30/area (view).

C: Number of residues was 30 or more but less than 50/area (view).

D: Number of residues was 50 or more/area (view).

It was confirmed that the area in which the color pattern produced in Example 2-1 was not formed had an evaluation result of "A", and the generation of development residues was inhibited.

Measurement of Spectral Characteristics

A red color film having a dry film thickness of 0.6 μm was formed on a glass substrate in the same manner as in the production of a red color filter, except that the 8-inch silicone wafer which had undergone device formation was changed to the glass substrate, and the pattern exposure was changed to entire surface exposure.

The spectral characteristics (i.e., transmission ratios at respective wavelengths) of the red color film were measured using MCPD-3000 (trade name, manufactured by Otsuka Electronics Co., Ltd.).

Regarding the spectral characteristics of the red color film produced in Example 2-1, a transmission ratio at 400 nm was 9%, a transmission ratio at 525 nm was 3%, a transmission ratio at 600 nm was 81%, and a transmission ratio at 700 nm was 99%. Based on these results, it was confirmed that the red color film of Example 2-1 exhibits red color with good spectral characteristics.

Examples 2-2 to 2-15, and Comparative Examples 2-1 to 2-10

A pigment dispersion composition, a colored curable composition, and a red color filter were produced in the same manner as in Example 2-1 except that types of the main pigment, additional pigment, pigment derivative, and dispersant used in Example 2-1 were changed to those shown in Table 2 below. Thereafter, the evaluation was carried out in the same manner as in Example 2-1.

Further, Pigment 2-1 used in Comparative Example 2-1, Pigment 2-2 used in Comparative Example 2-3, and Pigment 2-3 used in Comparative Example 2-5 had not been subjected to microfining by solvent milling.

The evaluation results of Examples 2-1 to 2-18 and Comparative Examples 2-1 to 2-3 are shown in Table 2 below.

In Table 2, when a transmission ratio of 50% is obtained, the actual value of the wavelength (nm) at which the transmission ratio of 50% is obtained (i.e., characteristic (1) of the second aspect of the invention) are shown. Further, with regard to the transmission ratios at 400 nm, 525 nm, 600 nm, and 700 nm (i.e., characteristic (2) to (5) of the second aspect of the invention), those satisfying each characteristics according to the second aspect of the invention are indicated by "A", while those not satisfying the characteristics are indicated by "D".

The pattern shape of the red color filter obtained was observed under an optical microscope (magnification ratio: ×1000) and a scanning electron microscope (SEM) (magnification ratio: ×20000). As a result, it was found that the red color filter obtained has good pattern shape and also good pattern formability.

TABLE 2

| | Major pigment | | Additional pigment | | | | | Spectral characteristics | | | | |
|---|---|---|---|---|---|---|---|---|---|---|---|---|
| | Type | Particle diameter after milling | Type | Particle diameter after milling | Dispersant | Dispersion stability | Wavelength at which transmission ratio of 50% is obtained | 400 nm (10% or less) | 525 nm (5% or less) | 600 nm (75% or more) | 700 nm (95% or more) | Development residue |
| Example 2-1 | Pigment 2-1 | 60 nm | Pigment 2-4 | 30 nm | Dispersant 2-1 | A | 585 nm | A | A | A | A | A |
| Example 2-2 | Pigment 2-1 | 60 nm | Pigment 2-4 | 30 nm | Dispersant 2-2 | B | 585 nm | A | A | A | A | A |
| Example 2-3 | Pigment 2-1 | 60 nm | Pigment 2-4 | 30 nm | Dispersant 2-3 | B | 585 nm | A | A | A | A | B |
| Example 2-4 | Pigment 2-1 | 60 nm | Pigment 2-4 | 30 nm | Dispersant 2-4 | A | 585 nm | A | A | A | A | A |
| Example 2-5 | Pigment 2-2 | 60 nm | Pigment 2-4 | 30 nm | Dispersant 2-1 | A | 585 nm | A | A | A | A | A |

TABLE 2-continued

| | Major pigment | | Additional pigment | | | | Wavelength | Spectral characteristics | | | | |
|---|---|---|---|---|---|---|---|---|---|---|---|---|
| | Type | Particle diameter after milling | Type | Particle diameter after milling | Dispersant | Dispersion stability | at which transmission ratio of 50% is obtained | 400 nm (10% or less) | 525 nm (5% or less) | 600 nm (75% or more) | 700 nm (95% or more) | Development residue |
| Example 2-6 | Pigment 2-2 | 60 nm | Pigment 2-4 | 30 nm | Dispersant 2-2 | B | 585 nm | A | A | A | A | A |
| Example 2-7 | Pigment 2-2 | 60 nm | Pigment 2-4 | 30 nm | Dispersant 2-3 | B | 585 nm | A | A | A | A | B |
| Example 2-8 | Pigment 2-2 | 60 nm | Pigment 2-4 | 30 nm | Dispersant 2-4 | A | 585 nm | A | A | A | A | A |
| Example 2-9 | Pigment 2-3 | 60 nm | Pigment 2-4 | 30 nm | Dispersant 2-1 | A | 585 nm | A | A | A | A | A |
| Example 2-10 | Pigment 2-3 | 60 nm | Pigment 2-4 | 30 nm | Dispersant 2-2 | B | 585 nm | A | A | A | A | A |
| Example 2-11 | Pigment 2-3 | 60 nm | Pigment 2-4 | 30 nm | Dispersant 2-3 | B | 585 nm | A | A | A | A | B |
| Example 2-12 | Pigment 2-3 | 60 nm | Pigment 2-4 | 30 nm | Dispersant 2-4 | A | 585 nm | A | A | A | A | A |
| Example 2-13 | Pigment 2-1 | 60 nm | Pigment 2-4 | 30 nm | Dispersant 2-5 | C | 585 nm | A | A | A | A | C |
| Example 2-14 | Pigment 2-2 | 60 nm | Pigment 2-4 | 30 nm | Dispersant 2-5 | C | 585 nm | A | A | A | A | C |
| Example 2-15 | Pigment 2-3 | 60 nm | Pigment 2-4 | 30 nm | Dispersant 2-5 | C | 585 nm | A | A | A | A | C |
| Comparative example 2-1 | Pigment 2-1 | 150 nm | Pigment 2-4 | 30 nm | Dispersant 2-4 | A | 595 nm | A | A | A | D | D |
| Comparative example 2-2 | Pigment 2-1 | 60 nm | None | 30 nm | Dispersant 2-4 | A | 585 nm | D | A | A | A | A |
| Comparative example 2-3 | Pigment 2-2 | 150 nm | Pigment 2-4 | 30 nm | Dispersant 2-4 | A | 595 nm | A | A | A | D | D |
| Comparative example 2-4 | Pigment 2-2 | 60 nm | None | 30 nm | Dispersant 2-4 | A | 585 nm | D | A | A | A | A |
| Comparative example 2-5 | Pigment 2-3 | 150 nm | Pigment 2-4 | 30 nm | Dispersant 2-4 | A | 595 nm | A | A | A | D | D |
| Comparative example 2-6 | Pigment 2-3 | 60 nm | None | 30 nm | Dispersant 2-4 | A | 585 nm | D | A | A | A | A |
| Comparative example 2-7 | Pigment 2-5 | 60 nm | Pigment 2-4 | 30 nm | Dispersant 2-4 | A | 582 nm | A | D | A | A | A |
| Comparative example 2-8 | Pigment 2-5 | 60 nm | None | 30 nm | Dispersant 2-4 | A | 582 nm | D | A | A | A | A |
| Comparative example 2-9 | Pigment 2-6 | 60 nm | Pigment 2-4 | 30 nm | Dispersant 2-4 | A | 592 nm | D | D | A | A | A |
| Comparative example 2-10 | Pigment 2-6 | 60 nm | None | 30 nm | Dispersant 2-4 | A | 592 nm | D | D | D | A | A |

Respective components shown in Table 2 are as follows.

Pigment 2-2

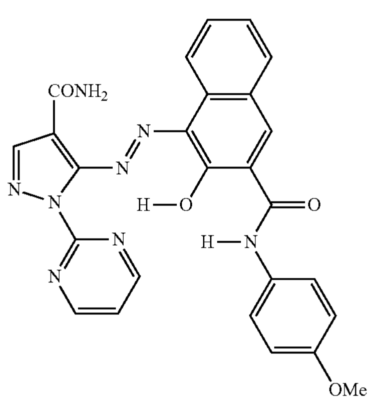

-continued

Pigment 2-3

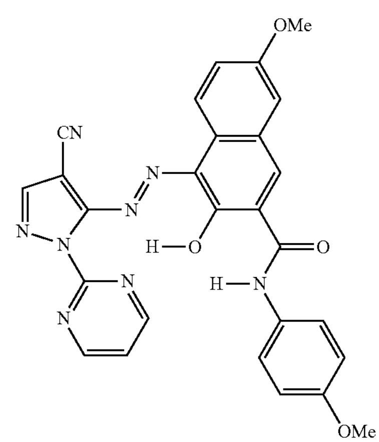

Pigment 2-4: Pigment Yellow 139
Pigment 2-5: Pigment Red 254
Pigment 2-6: Pigment Red 177

Dispersant 2-2

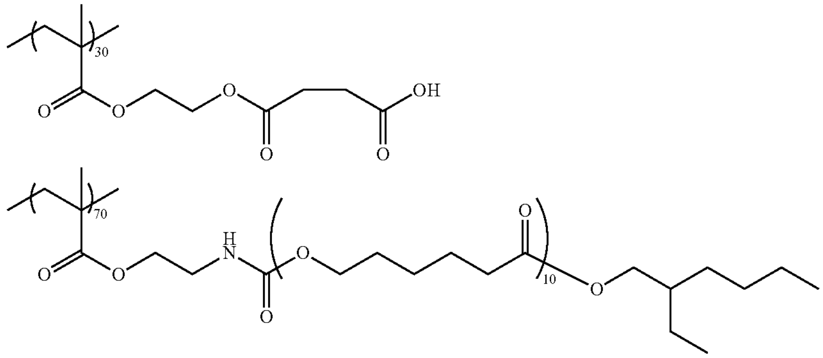

Dispersant 2-3

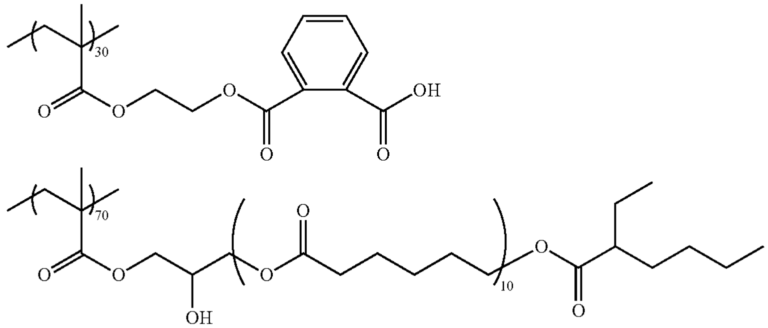

Dispersant 204

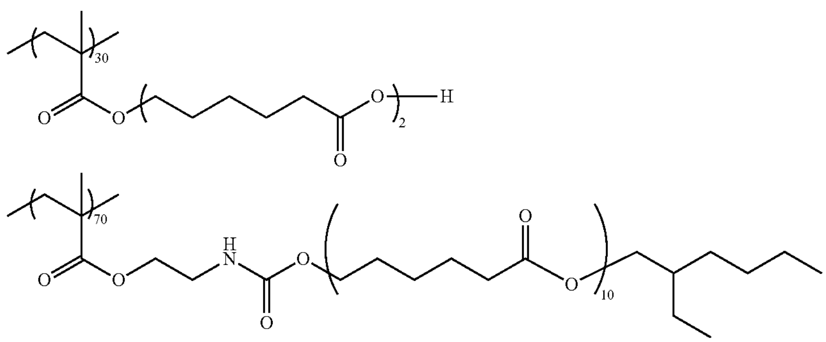

The weight average molecular weight of the dispersant 2-2 is 28,500, and the amount of an acidic acid contained in side chain thereof is 73 mgKOH/g.

The weight average molecular weight of the dispersant 2-3 is 30,000, and the amount of an acidic acid contained in side chain thereof is 60 mgKOH/g.

The weight average molecular weight of the dispersant 2-4 is 21,000, and the amount of an acidic acid contained in side chain thereof is 55 mgKOH/g.

As shown in Table 2, the pigment dispersion compositions of the examples according to the second aspect (i.e., the red colored composition according to the second aspect of the invention) each exhibited a small viscosity increase and good dispersion stability. Further, the examples using the dispersant 2-1 to 2-4 exhibited particularly good dispersion stability. Still further, the spectrophotometric spectrum of a color filter, which was produced using such a pigment dispersion composition, showed excellent spectral characteristics, and the colored pattern had inhibited occurrence of the development residue.

Dispersant 2-5

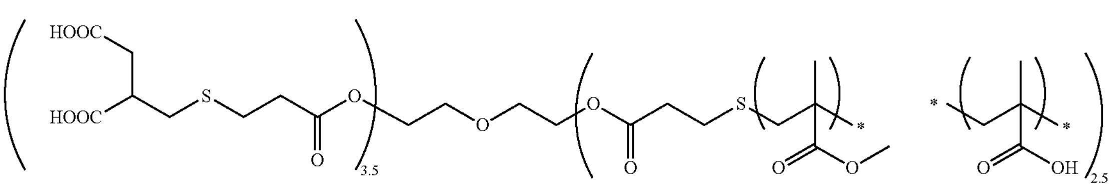

Meanwhile, no good spectral characteristics were obtained when the pigment dispersion compositions of Comparative Examples 2-1, 2-2, 2-4, 2-5, 2-7, 2-8, and 2-10 to 2-13 were used.

What is claimed is:

1. A pigment dispersion composition, comprising:

an azo pigment represented by the following Formula (1);

at least one compound selected from the group consisting of an organic pigment derivative having an acidic functional group, an anthraquinone derivative having an acidic functional group, and a triazine derivative having an acidic functional group; and a dispersant:

(1)

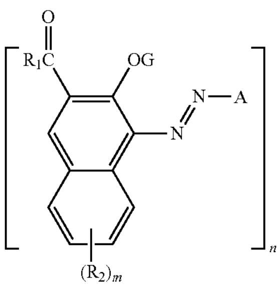

wherein, in Formula (1), G represents a hydrogen atom, an aliphatic group, an aryl group, or a heterocyclic group; $R_1$ represents an amino group, an aliphatic oxy group, an aliphatic group, or a heterocyclic group; $R_2$ represents a substituent;

A represents any one of groups represented by the following Formula (A-1) to (A-32);

m represents an integer of 0 to 5;

when m represents an integer of 2 to 5, plural $R_2$'s may be the same as or different from each other;

n represents an integer of 1 to 4;

when n represents 2, the azo pigment is a dimer in which two moieties each independently represented by Formula (1) are linked via $R_1$, $R_2$, A, or G;

when n represents 3, the azo pigment is a trimer in which three moieties each independently represented by Formula (1) are linked via $R_1$, $R_2$, A, or G;

when n represents 4, the azo pigment is a tetramer in which four moieties each independently represented by Formula (1) are linked via $R_1$, $R_2$, A, or G; and Formula (1) is free from an ionic hydrophilic group:

(A-1)

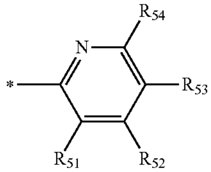

(A-2)

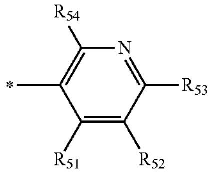

-continued (A-3)

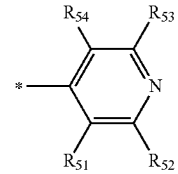

(A-4)

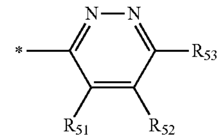

(A-5)

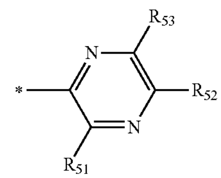

(A-6)

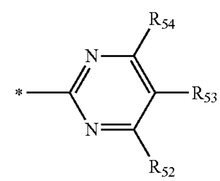

(A-7)

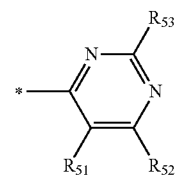

(A-8)

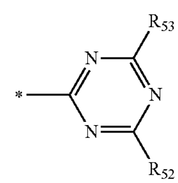

(A-9)

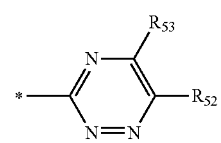

(A-10)

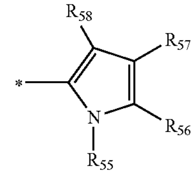

(A-11)

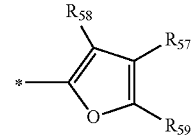

-continued
(A-12)
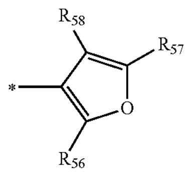
(A-13)
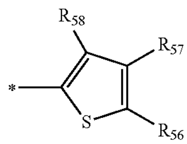
(A-14)
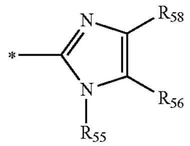
(A-15)
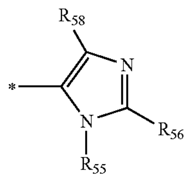
(A-16)
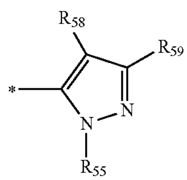
(A-17)
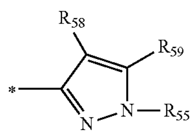
(A-18)
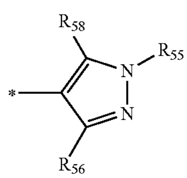
(A-19)
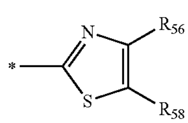
(A-20)
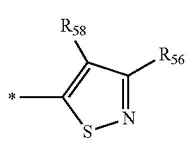
(A-21)
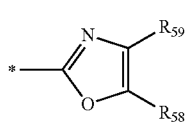
-continued
(A-22)
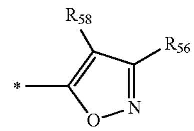
(A-23)
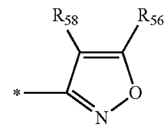
(A-24)
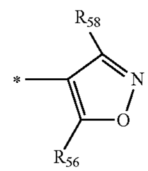
(A-25)
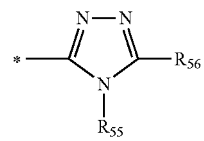
(A-26)
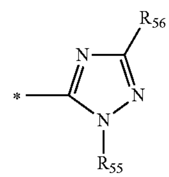
(A-27)
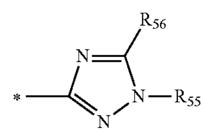
(A-28)
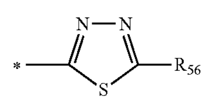
(A-29)
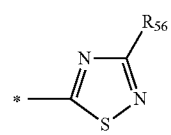
(A-30)
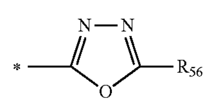
(A-31)
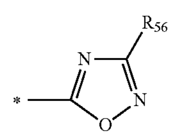
(A-32)
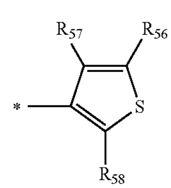

wherein, in Formulae (A-1) to (A-32), $R_{51}$ to $R_{59}$ each independently represent a hydrogen atom or a substituent; adjacent substituents may be bond to form a 5-membered or 6-membered ring; and * represents a binding position to an azo group in Formula (1).

2. The pigment dispersion composition according to claim 1, wherein the azo pigment represented by Formula (1) comprises an azo pigment represented by the following Formula (2):

(2)

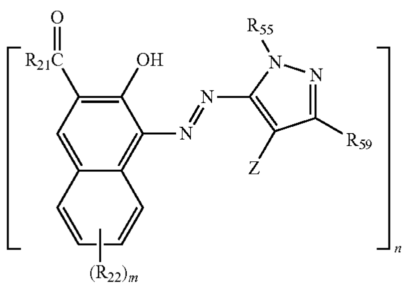

wherein, in Formula (2), $R_{21}$ represents an amino group, an aliphatic oxy group, an aliphatic group, an aryl group, or a heterocyclic group; $R_{22}$ represents a substituent; $R_{55}$ and $R_{59}$ each independently represent a hydrogen atom or a substituent;

m represents an integer of 0 to 5, and when m represents an integer of 2 to 5, plural $R_{22}$'s may be the same as or different from each other;

n represents an integer of 1 to 4;

Z represents an electron-attracting group having a Hammett's substituent constant σp of 0.2 or more;

when n represents 2, the azo pigment is a dimer in which two moieties each independently represented by Formula (2) are linked via $R_{21}$, $R_{22}$, $R_{55}$, $R_{59}$, or Z;

when n represents 3, the azo pigment is a trimer in which three moieties each independently represented by Formula (2) are linked via $R_{21}$, $R_{22}$, $R_{55}$, $R_{59}$, or Z;

when n represents 4, the azo pigment is a tetramer in which four moieties each independently represented by Formula (2) are linked via $R_{21}$, $R_{22}$, $R_{55}$, $R_{59}$, or Z;

Formula (2) is free from an ionic hydrophilic group.

3. The pigment dispersion composition according to claim 1, wherein the at least one compound selected from the group consisting of an organic pigment derivative having an acidic functional group, an anthraquinone derivative having an acidic functional group, and a triazine derivative having an acidic functional group comprises a triazine derivative having a sulfo group or a carboxyl group.

4. The pigment dispersion composition according to claim 1, wherein the dispersant comprises a dispersant containing a nitrogen atom.

5. The pigment dispersion composition according to claim 1, wherein the dispersant comprises a resin comprising (i) a main chain moiety having a nitrogen atom; (ii) a group X which comprises a functional group having a pKa of 14 or less and is bound to a nitrogen atom present on the main chain moiety, and (iii) a side chain comprising an oligomer chain or polymer chain Y having a number average molecular weight of from 500 to 1,000,000.

6. The pigment dispersion composition according to claim 1, wherein the azo pigment represented by Formula (1) comprises an azo pigment which has undergone solvent salt milling.

7. The pigment dispersion composition according to claim 1, further comprising a pigment having a color tone selected from the group consisting of red, yellow, orange, and violet.

8. A colored curable composition, comprising:

the pigment dispersion composition according to claim 1;

a photopolymerization initiator; and a polymerizable compound.

9. The colored curable composition according to claim 8, wherein the photopolymerization initiator comprises an oxime photopolymerization initiator.

10. A method of producing a color filter for a solid state imaging device, comprising:

applying the colored curable composition according to claim 8 onto a support to form a colored curable composition layer;

exposing the colored curable composition layer to light through a mask; and developing the colored curable composition layer after the exposure to form a colored pattern.

11. A color filter for a solid state imaging device, which is produced by the method of producing a color filter according to claim 10.

12. A solid state imaging device, comprising the color filter according to claim 11.

13. A red colored composition, comprising:

a red pigment;

a yellow pigment; and a dispersant, wherein when a colored transmitting film having a thickness of 0.6 μm is formed using the red colored composition, the colored transmitting film satisfies all the following characteristics (1) to (5):

(1) a transmission ratio of 50% is obtained in a light wavelength range of from 583 nm to less than 587 nm;

(2) a transmission ratio for light having a wavelength of 400 nm is 15% or less;

(3) a transmission ratio for light having a wavelength of 525 nm is 5% or less;

(4) a transmission ratio for light having a wavelength of 600 nm is 75% or more; and (5) a transmission ratio for light having a wavelength of 700 nm is 95% or more.

14. The red colored composition according to claim 13, wherein the red pigment comprises an azo pigment represented by the following Formula (1):

(1)

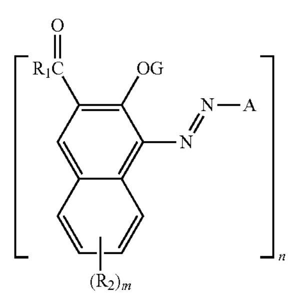

wherein, in Formula (2), G represents a hydrogen atom, an aliphatic group, an aryl group, or a heterocyclic group; $R_1$ represents an amino group, an aliphatic oxy group, an aliphatic group, or a heterocyclic group; $R_2$ represents a substituent;

A represents any one of groups represented by the following Formula (A-1) to (A-32);

m represents an integer of 0 to 5;

when m represents an integer of 2 to 5, plural $R_2$'s may be the same as or different from each other;

n represents an integer of 1 to 4;

when n represents 2, the azo pigment is a dimer in which two moieties each independently represented by Formula (1) are linked via $R_1$, $R_2$, A, or G;

when n represents 3, the azo pigment is a trimer in which three moieties each independently represented by Formula (1) are linked via $R_1$, $R_2$, A, or G;

when n represents 4, the azo pigment is a tetramer in which four moieties each independently represented by Formula (1) are linked via $R_1$, $R_2$, A, or G; and Formula (1) is free from an ionic hydrophilic group:

(A-1)

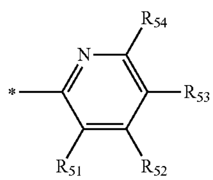

(A-2)

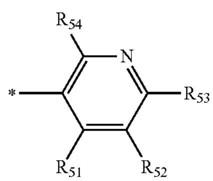

(A-3)

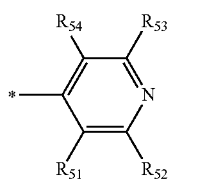

(A-4)

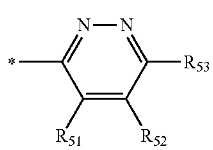

(A-5)

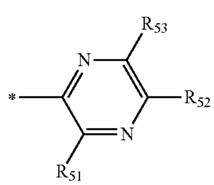

(A-6)

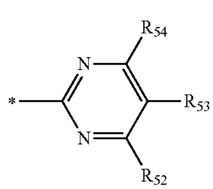

(A-7)

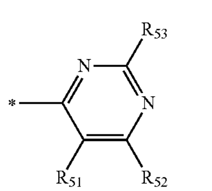

-continued (A-8)

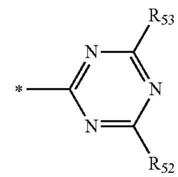

(A-9)

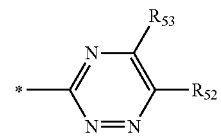

(A-10)

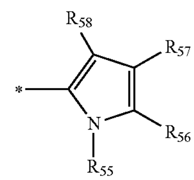

(A-11)

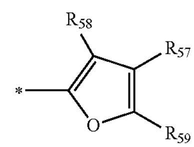

(A-12)

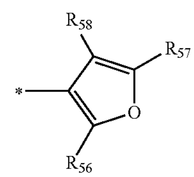

(A-13)

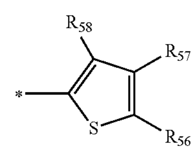

(A-14)

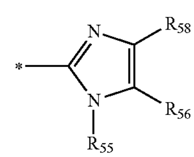

(A-15)

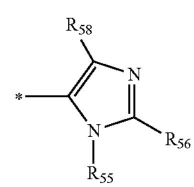

(A-16)

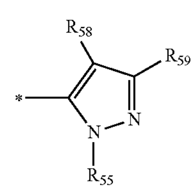

-continued (A-17)

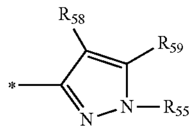

(A-18)

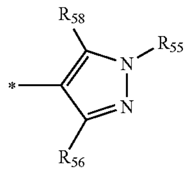

(A-19)

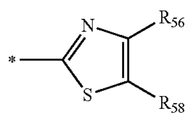

(A-20)

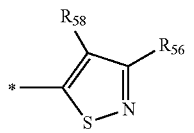

(A-21)

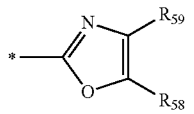

(A-22)

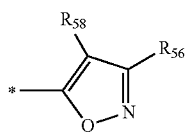

(A-23)

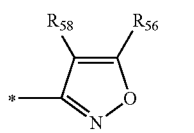

(A-24)

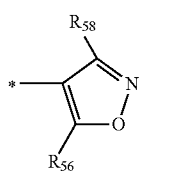

(A-25)

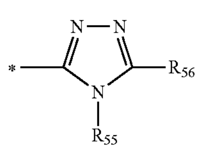

(A-26)

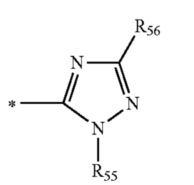

(A-27)

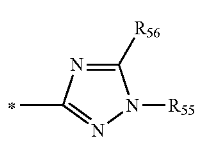

-continued (A-28)

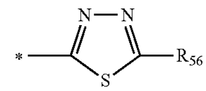

(A-29)

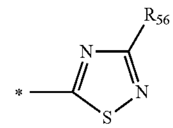

(A-30)

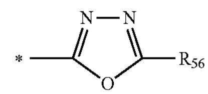

(A-31)

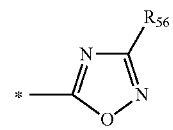

(A-32)

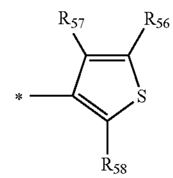

wherein, in Formulae (A-1) to (A-32), $R_{51}$ to $R_{59}$ each independently represent a hydrogen atom or a substituent; adjacent substituents may be bond to form a 5-membered or 6-membered ring; and * represents a binding position to an azo group in Formula (1).

15. The red colored composition according to claim 14, wherein the azo pigment represented by Formula (1) comprises an azo pigment represented by the following Formula (2):

(2)

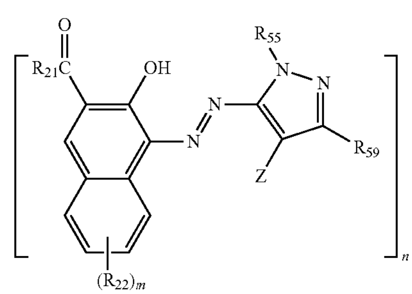

wherein, in Formula (2), $R_{21}$ represents an amino group, an aliphatic oxy group, an aliphatic group, an aryl group, or a heterocyclic group; $R_{22}$ represents a substituent; $R_{55}$ and $R_{59}$ each independently represent a hydrogen atom or a substituent;

m represents an integer of 0 to 5, and when m represents an integer of 2 to 5, plural $R_{22}$'s may be the same as or different from each other;

n represents an integer of 1 to 4;

Z represents an electron-attracting group having a Hammett's substituent constant σp of 0.2 or more;

when n represents 2, the azo pigment is a dimer in which two moieties each independently represented by Formula (2) are linked via $R_{21}$, $R_{22}$, $R_{55}$, $R_{59}$, or Z;

when n represents 3, the azo pigment is a trimer in which three moieties each independently represented by Formula (2) are linked via $R_{21}$, $R_{22}$, $R_{55}$, $R_{59}$, or Z;

when n represents 4, the azo pigment is a tetramer in which four moieties each independently represented by Formula (2) are linked via $R_{21}$, $R_{22}$, $R_{55}$, $R_{59}$, or Z;

Formula (2) is free from an ionic hydrophilic group.

16. The red colored composition according to claim 14, wherein the azo pigment represented by Formula (1) comprises an azo pigment which has undergone solvent salt milling, and the particle diameter of the azo pigment after the solvent salt milling is 100 nm or less.

17. The red colored composition according to claim 13, wherein the yellow pigment comprises C. I. Pigment Yellow 139.

18. The red colored composition according to claim 13, wherein the dispersant comprises a polymer compound comprising at least one repeating unit selected from a repeating unit represented by the following Formula (I) and a repeating unit represented by the following Formula (II):

(I)

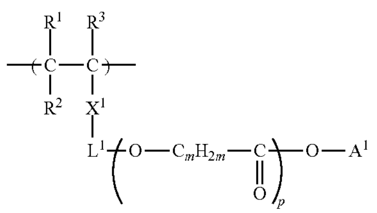

(II)

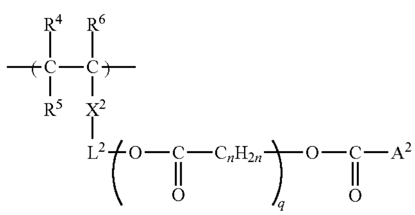

wherein, in Formula (I), $R^1$ to $R^6$ each independently represent a hydrogen atom or a monovalent organic group;

$X^1$ and $X^2$ each independently represent —CO—, —C(═O)O—, —CONH—, —OC(═O)—, or a phenylene group;

$L^1$ and $L^2$ each independently represent a single bond or a divalent organic linking group;

$A^1$ and $A^2$ each independently represent a monovalent organic group;

m and n each independently represent an integer from 2 to 8; and p and q each independently represent an integer from 1 to 100.

19. The red colored composition according to claim 18, wherein the polymer compound comprises an acidic group at a side chain thereof, in an amount of from 50 mgKOH/g to 200 mgKOH/g.

20. A colored curable composition, comprising:

the red colored composition according to claim 13;

a photopolymerization initiator; and a polymerization initiator.

21. The colored curable composition according to claim 20, wherein the photopolymerization initiator comprises an oxime photopolymerization initiator.

22. A method of producing a color filter for a solid state imaging device, comprising:

applying the colored curable composition according to claim 20 onto a support to form a colored curable composition layer;

exposing the colored curable composition layer to light through a mask; and developing the colored curable composition layer after the exposure to form a colored pattern.

23. A color filter for a solid state imaging device, which is produced by the method of producing a color filter according to claim 22.

24. A solid state imaging device, comprising the color filter according to claim 23.

* * * * *